(12) United States Patent
Sasaki et al.

(10) Patent No.: US 8,057,969 B2
(45) Date of Patent: Nov. 15, 2011

(54) DYE-CONTAINING NEGATIVE CURABLE COMPOSITION, COLOR FILTER AND METHOD FOR PRODUCING THE SAME

(75) Inventors: Tomoya Sasaki, Shizuoka-ken (JP); Toru Fujimori, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 900 days.

(21) Appl. No.: 11/790,554

(22) Filed: Apr. 26, 2007

(65) Prior Publication Data

US 2007/0254240 A1 Nov. 1, 2007

(30) Foreign Application Priority Data

Apr. 26, 2006 (JP) ................................. 2006-122423
Aug. 31, 2006 (JP) ................................. 2006-236326

(51) Int. Cl.
*G02B 5/20* (2006.01)
*G03F 7/00* (2006.01)

(52) U.S. Cl. ......................................... 430/7; 430/270.1
(58) Field of Classification Search ..................... None
See application file for complete search history.

(56) References Cited

U.S. PATENT DOCUMENTS

| | | | |
|---|---|---|---|
| 6,087,050 A * | 7/2000 | Itano et al. | 430/7 |
| 2005/0253119 A1 | 11/2005 | Araki | |
| 2006/0051685 A1 | 3/2006 | Fujimori et al. | |
| 2007/0212623 A1 * | 9/2007 | Takakuwa et al. | 430/7 |

FOREIGN PATENT DOCUMENTS

| | | |
|---|---|---|
| EP | 1168048 A1 | 1/2002 |
| EP | 1168049 A1 | 1/2002 |
| JP | 62-180302 A | 8/1987 |
| JP | 2986796 B2 | 1/1999 |
| JP | 11-223720 A | 8/1999 |
| JP | 2000-80068 A | 3/2000 |
| JP | 2001-233842 A | 8/2001 |
| JP | 2003-295427 A | 10/2003 |
| JP | 2004-295116 A | 10/2004 |
| JP | 2004-534797 A | 11/2004 |
| JP | 2005-99488 A | 4/2005 |
| JP | 2006 047677 A | 2/2006 |
| JP | 2006 072135 A | 3/2006 |
| WO | WO 2004/050653 A2 | 6/2004 |
| WO | WO 2005/080337 A1 | 9/2005 |
| WO | 2006/024618 A | 3/2006 |

OTHER PUBLICATIONS

Computer-generated translation of JP 2003-295427 (Oct. 2003).*
Office Action issued Apr. 5, 2011 in Japanese Application No. 2006-122423.

* cited by examiner

*Primary Examiner* — John A. McPherson
(74) *Attorney, Agent, or Firm* — Sughrue Mion, PLLC

(57) ABSTRACT

The present invention provides a dye-containing negative curable composition comprising at least two dyes (A), an oxime photopolymerization initiator (B) and a radical polymerizable monomer (C); or a dye-containing negative curable composition comprising at east two organic-solvent soluble dyes (A), an oxime photopolymerization initiator (B), a radical polymerizable monomer (C) and an organic solvent (D), wherein the moisture content of the composition is less than 1% by mass relative to the total amount of the composition.

17 Claims, No Drawings

_(1)_

DYE-CONTAINING NEGATIVE CURABLE COMPOSITION, COLOR FILTER AND METHOD FOR PRODUCING THE SAME

CROSS-REFERENCE TO RELATED APPLICATION

This application claims priority under 35 USC 119 from Japanese Patent Application Nos. 2006-122423 and 2006-236326, the disclosures of which are incorporated by reference herein.

BACKGROUND

1. Field of the Invention

The present invention relates to a dye-containing negative curable composition suitable for forming a color filter used for liquid crystal display devices and solid-state image pickup devices, a dye-containing color filter and a method for producing the same.

2. Related Art

Known methods for producing a color filter used for liquid crystal display devices (LCD) and solid state image pick-up devices (CCD, CMOS, etc.) include a dying method, printing method, electrodeposition method and pigment dispersion method.

Of these methods, the pigment dispersion method is a method for producing the color filter by a photolithographic method using a colored radiation-sensitive composition in which a pigment is dispersed in various photosensitive compositions. Since a pigment is used as a colorant, the method is advantageous in stability against light and heat. In addition, positional accuracy is high since the filter is patterned by the photolithographic method, and the method has been widely used for favorably producing a color filter for highly precise color displays having a large screen size.

When the color filter is produced by the pigment dispersion method, a coating film is formed by applying a radiation sensitive composition with a spin coater or roll coater followed by drying on glass substrate, colored pixels are formed by patterned exposure and development of the coating film, and the color filter is obtained by repeating this procedure for each color depending on the number of hues. Known examples of such pigment dispersion method include using a negative photosensitive composition in which a photopolymerizable monomer and a photopolymerization initiator are used together in an alkali-soluble resin (for example, see Japanese Patent Application Laid-Open (JP-A) Nos. 2-199403, 4-76062, 5-273411, 6-184482 and 7-140654).

On the other hand, the color filter for the solid state image pickup device has been required to be further fine and precise. However, it is difficult to attempt to further improve resolution in the conventional pigment dispersion system, since color unevenness tends to appear due to a relatively coarse particle diameter of the pigment. Accordingly, the pigment dispersion method has not been suitable for the uses such as the solid state image pick-up device (CCD) in which fine patters are required.

In view of the above-mentioned problems, a method using a dye in place of the pigment has been proposed as a solving method (for example, see JP-A No. 2005-99488).

In view of the above-mentioned problems, a technique using an organic solvent-soluble dye (may be simply referred to the "dye" hereinafter) in place of the pigment has been proposed as another solving method (for example, see JP-A No. 2005-99488).

In another technique for producing the colored photosensitive resin composition containing a dye, the moisture content in the composition is restricted within a specified range in order to suppress minute patterns after development from being peeled and to suppress incidence of penetration of the patterns into the substrate form appearing (for example, see JP-A No. 2003-29542).

The composition containing the dye is usually poor in light resistance as compared with the composition containing the pigment. For improving light resistance, an alcohol-soluble Ni or Co compound or a transition metal complex is added in vitreous colored filters (see, for example, Japanese Patent No. 2986796, and JP-A Nos. 11-223720 and 2004-295116).

SUMMARY

The present invention has been made in view of the above circumstances and provides a dye-containing negative curable composition, a color filter and a method for producing the same.

A first aspect of the invention provides a dye-containing negative curable composition comprising at least two dyes (A) independently selected from a heterocyclic azo compound, a phthalocyanine compound or an azomethine compound, at least one oxime photopolymerization initiator (B) and at least one radical-polymerizable monomer (C).

A second aspect of the invention provides a dye-containing negative curable composition comprising at least two organic solvent-soluble dyes (A) independently selected from heterocyclic azo compounds, phthalocyanine compounds or azomethine compounds, at least one oxime photopolymerization initiator (B), at least one radical-polymerizable monomer (C) and at least one organic solvent (D), wherein the moisture content of the composition is less than 1% by mass relative to the total amount of the composition.

DETAILED DESCRIPTION OF THE INVENTION (First Aspect)

A first aspect of the invention is based on findings that a combination of a specified dye and an oxime photopolymerization initiator is effective for time-dependent stability of the composition after preparation, and improvement and stabilization of patterns formed. The specific means thereof are as follows.

The dye-containing negative curable composition in the first aspect of the present invention as well as the color filter using the dye-containing negative curable composition and the method for producing the same will be described in detail below.

<Dye-Containing Negative Curable Composition>

The dye-containing negative curable composition of the invention (may be referred to the "composition of the invention" hereinafter) comprises at least two dyes (A) independently selected from a heterocyclic azo compound, a phthalocyanine compound or an azomethine compound, at least one oxime photopolymerization initiator (B) (may be referred to "the initiator according to the invention" hereinafter), at least one radical-polymerizable monomer (C), and preferably at least one organic solvent (D), and optionally other components (E) such as a resin (binder), a cross linking agent, a photosensitive agent, a sensitizing agent, a photo acid generating agent and a surfactant.

(A) Dye

The composition of the invention comprises at least two dyes (including an organic solvent-soluble dye) independently selected from heterocyclic azo compounds, phthalocyanine compounds and azomethine compounds. These dyes are advantageous in exhibiting time-dependent stability after preparation and good pattern forming ability by combining with an oxime photopolymerization initiator to be described below.

—Heterocyclic Azo Compound—

The heterocyclic azo compound has an azo group (—N═N—) directly linked to a heterocyclic group.

The heterocyclic group as used herein refers to a group having hetero-atoms (for example nitrogen, sulfur and oxygen atoms) in the ring. While the ring may be either a saturated ring or an unsaturated ring, an unsaturated ring is preferable. The ring may be either a single ring or a condensed ring, and may be either non-substituted or substituted with substituents.

Specific examples of the heterocyclic compound include furan, pyrrole, pyrazole, pyrazoline, imidazole, oxazole, thiazole, triazole, pyrane, pyridine, pyrimidine, pyrazine, triazine, pyridone, isothiazole, thiadiazole, benzothiazole, benzoxazole and benzoisothiazole. Heterocyclic groups containing nitrogen atoms in the ring (nitrogen-containing-heterocyclic compound) are preferable among them, and pyrazole, pyridone, pyridine and pyrimidine are more preferable among them.

The heterocyclic azo compound preferably has an acid group at an arbitrary position. While the kind of the acid group is not restricted so long as it is a functional group dissociable in an aqueous alkali solution, specific examples of the acid group include sulfonic acid, carboxylic acid, phenolic hydroxyl group, sulfonamide and phosphoric acid. These acid groups may form a salt of divalent or higher metals, and examples of the metal include magnesium, calcium, strontium, barium, zinc, aluminum, nickel, copper, cobalt and iron.

The heterocyclic azo compound is (1) a compound having a pyrazole ring as the heterocyclic group directly linked to one of the bonds of the azo group and a heterocyclic group directly linked to the other bond of the azo group, and having the acid group at an arbitrary position in the structure; or (2) a compound having a pyrazole ring as the heterocyclic group directly linked to one of the bonds of the azo group and a pyridine ring as a heterocyclic group directly linked to the other bond of the azo group, and having a carboxylic acid and/or sulfone amide at an arbitrary position in the structure; and (3) a compound having a pyrazole ring as the heterocyclic group directly linked to one of the bonds of the azo group and a pyrimidine ring as a heterocyclic group directly linked to the other bond of the azo group, and having a carboxylic acid and/or sulfone amide at an arbitrary position in the structure is preferable.

Specific examples of the heterocyclic azo compound (compounds A1-1 to A1-24, A2-1 to A2-24 and A3-1 to A3-24) are shown below. However, the invention is not restricted to these specific examples.

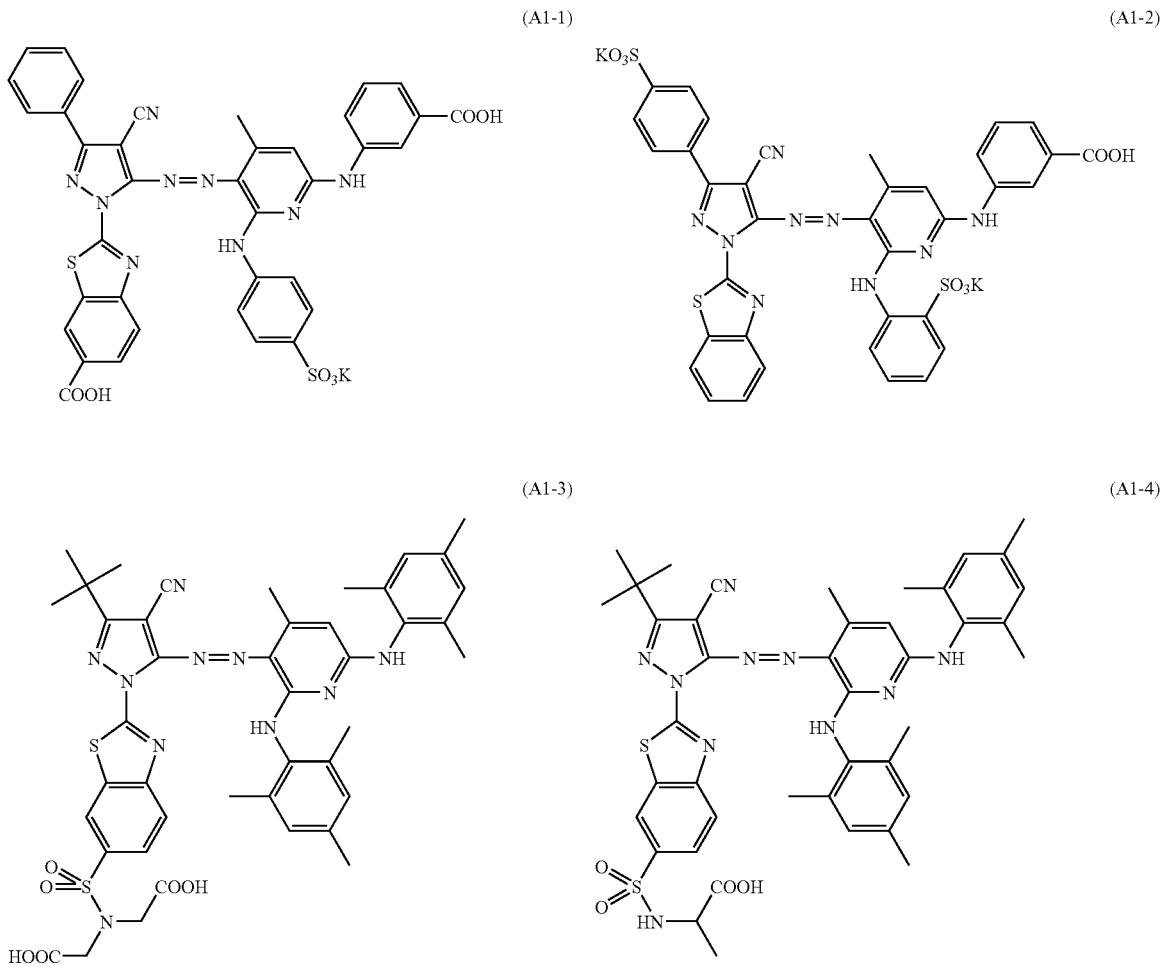

-continued
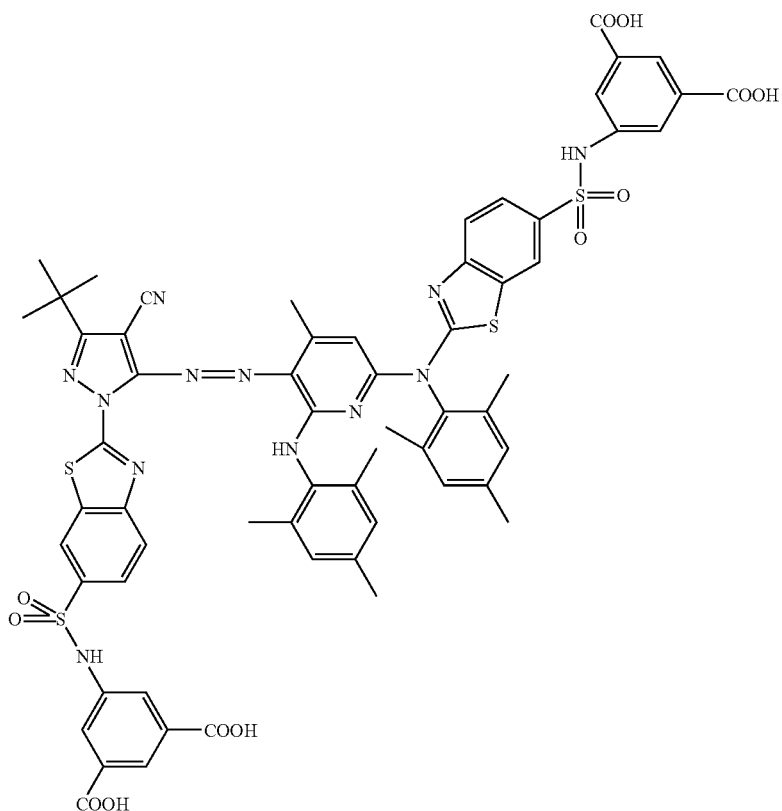
(A1-5)
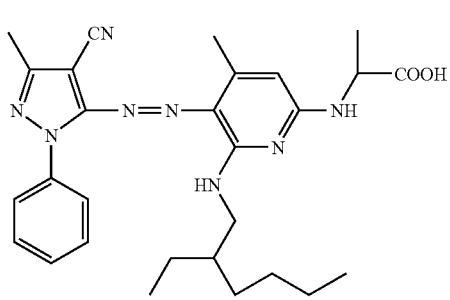
(A1-6)
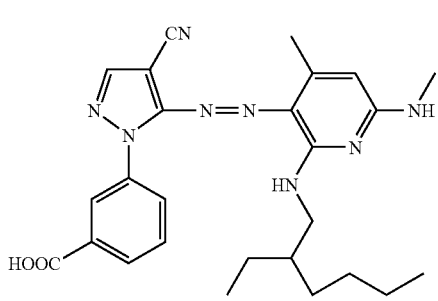
(A1-7)
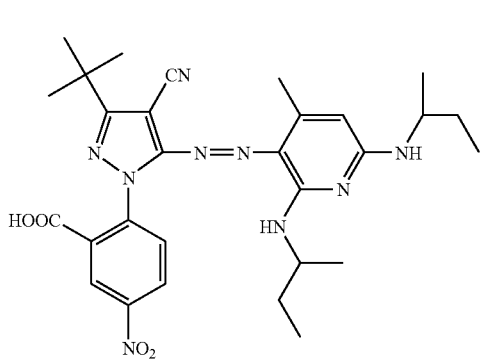
(A1-8)
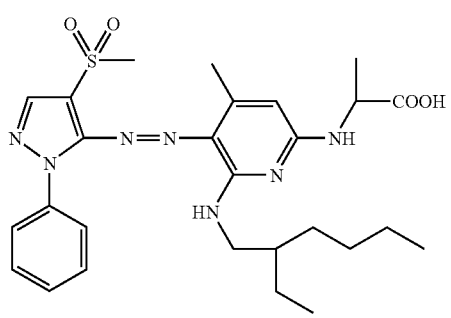
(A1-9)

-continued
(A-10)
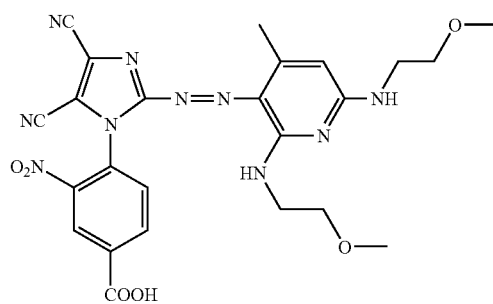
(A1-11)
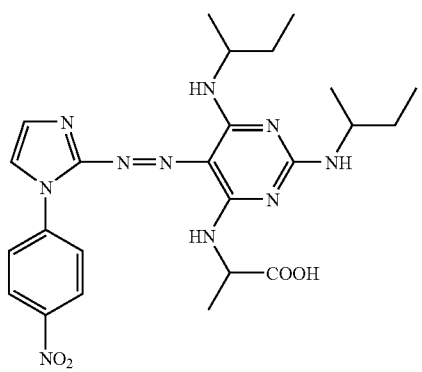
(A1-12)
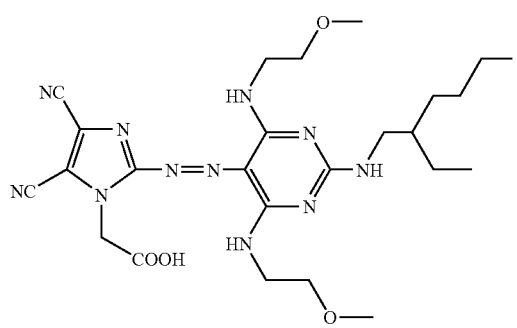
(A1-13)
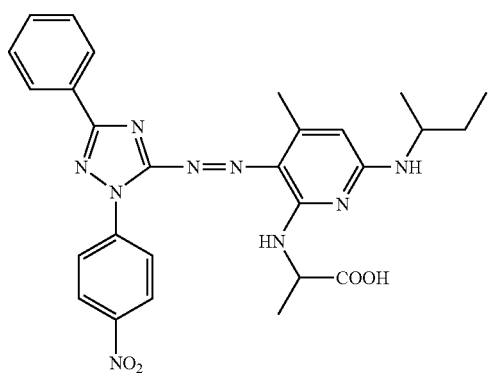
(A1-14)
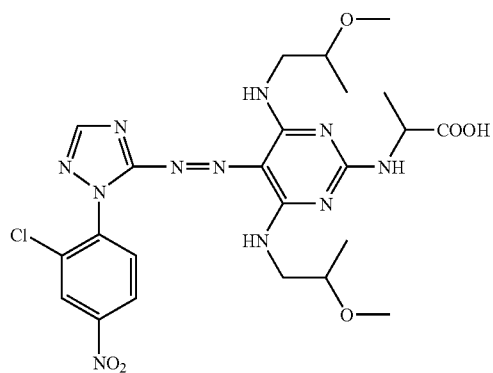
(A1-15)
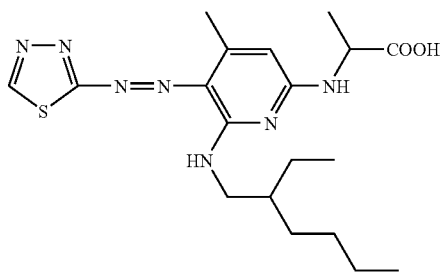
(A1-16)
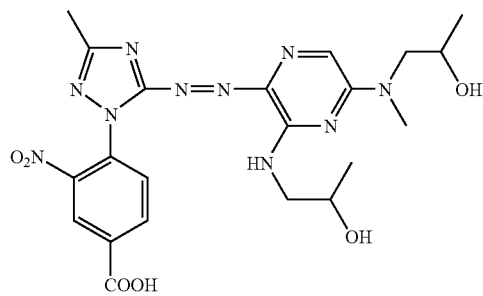
(A1-17)
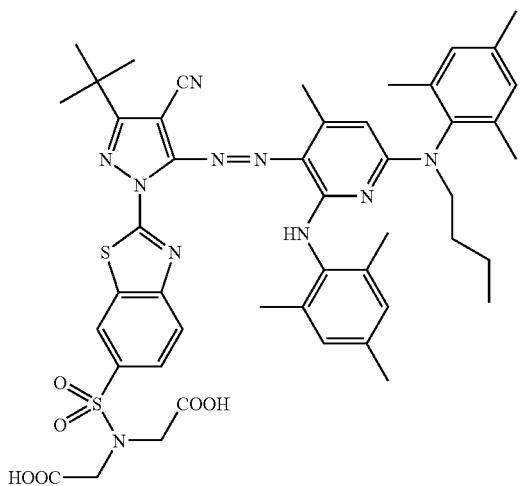

-continued
(A1-18)
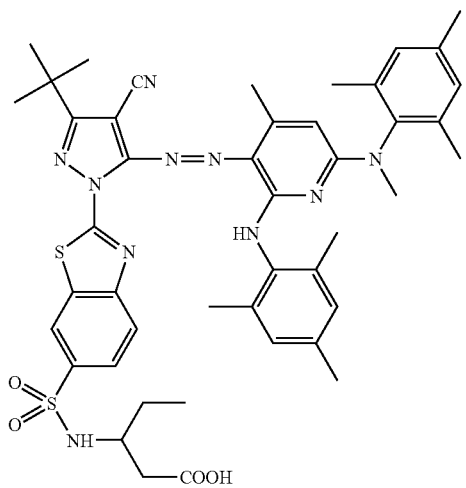
(A1-19)
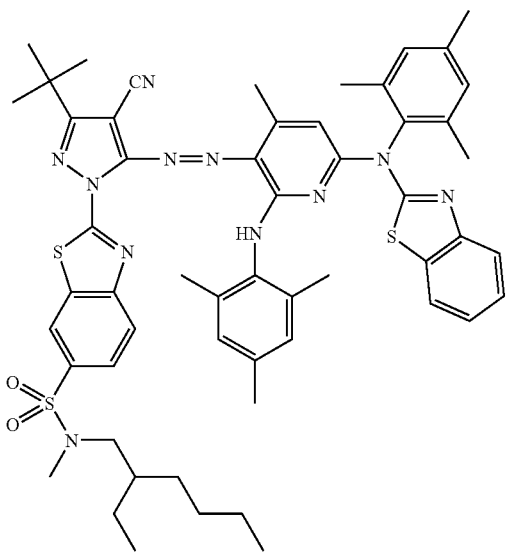
(A1-20)
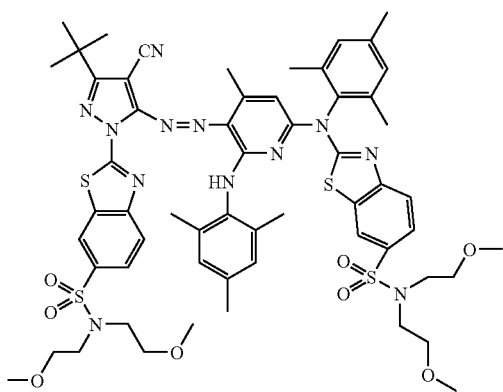
(A1-21)
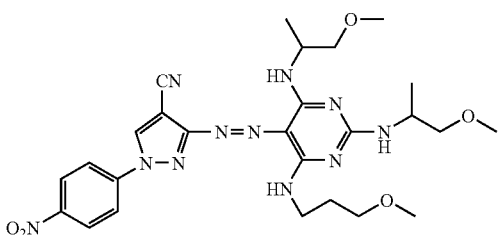
(A1-22)
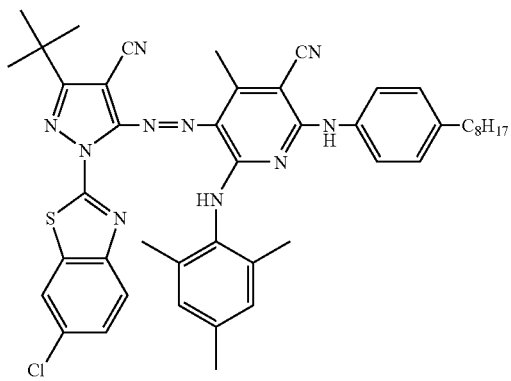
(A1-23)
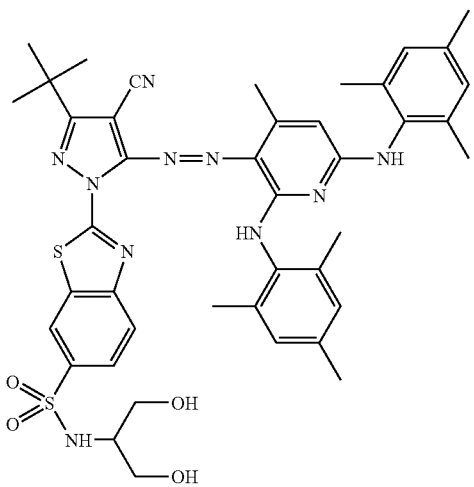

-continued
(A1-24)
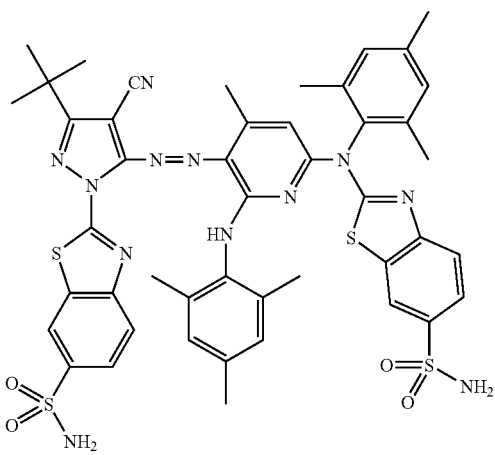
(A2-1)
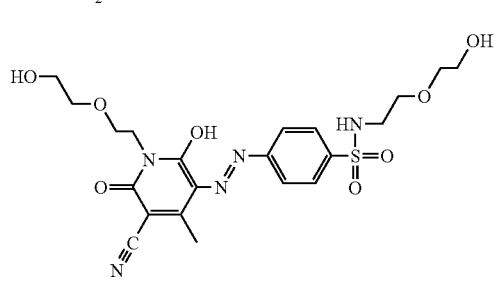
(A2-2)
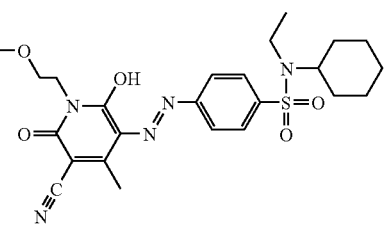
(A2-3)
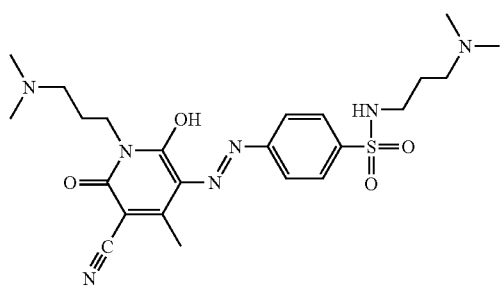
(A2-4)
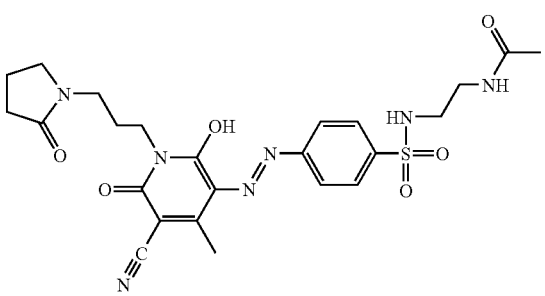
(A2-5)
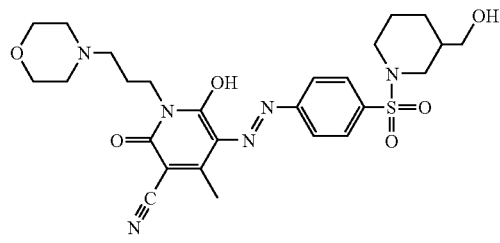
(A2-6)
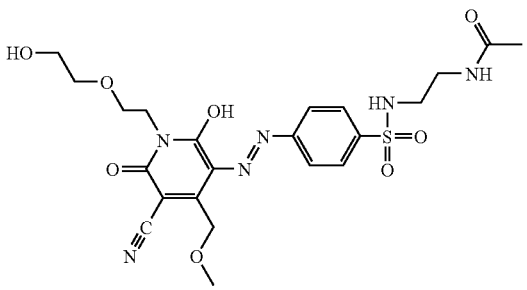
(A2-7)
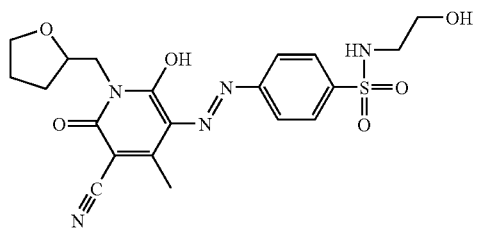
(A2-8)
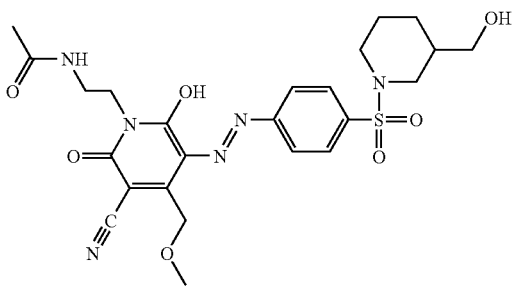

-continued
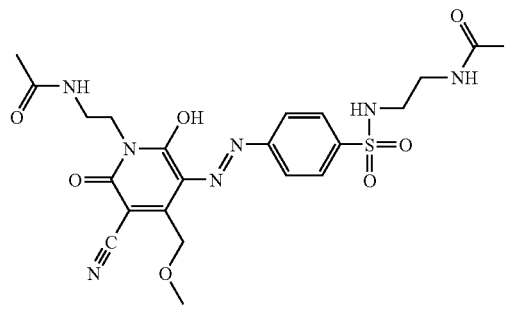
(A2-9)
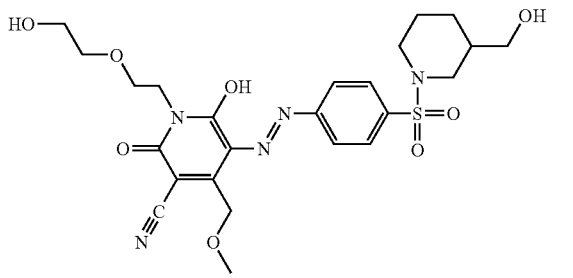
(A2-10)
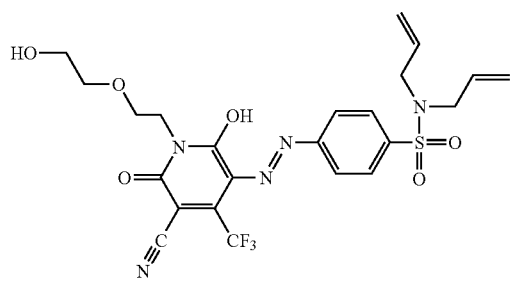
(A2-11)
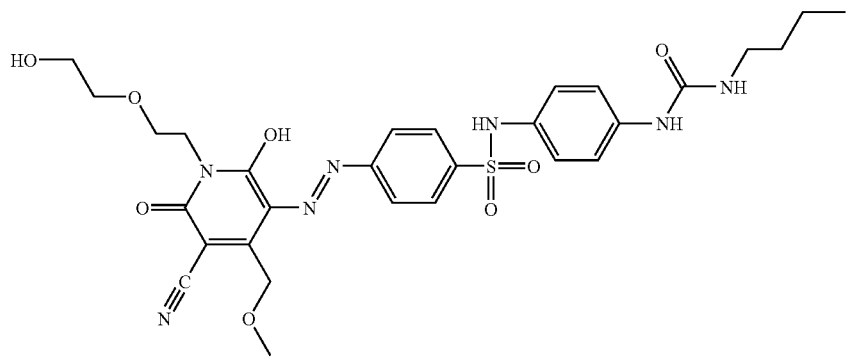
(A2-12)
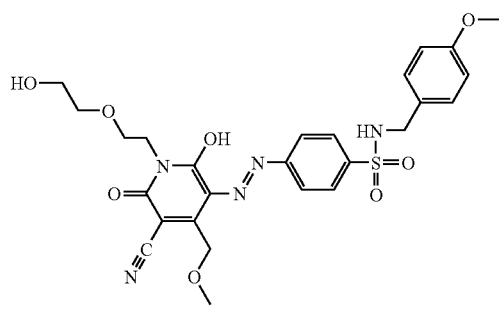
(A2-13)
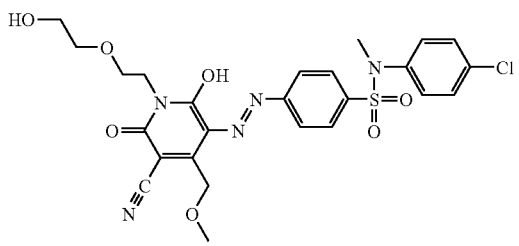
(A2-14)

(A2-15)
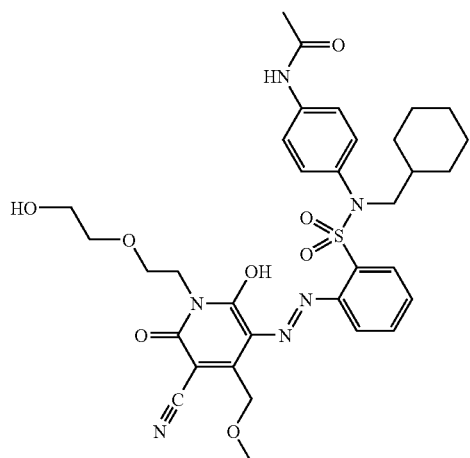
(A2-16)
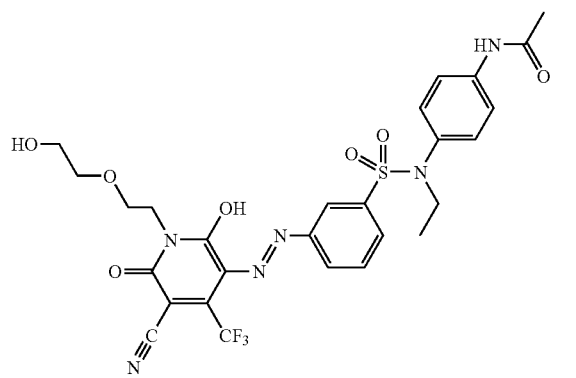
(A2-17)
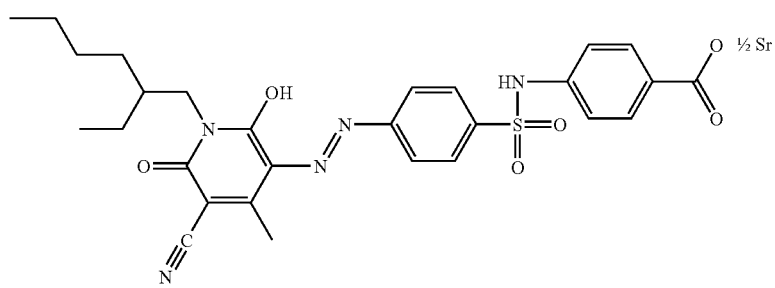
(A2-18)
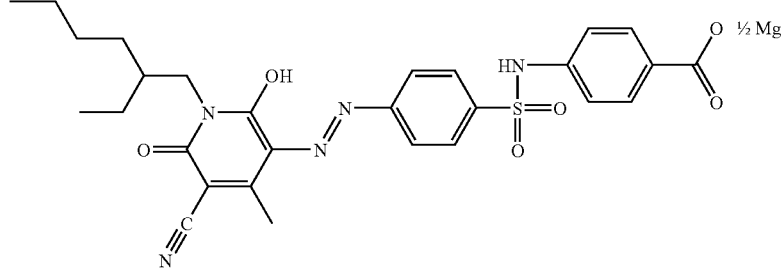
(A2-19)
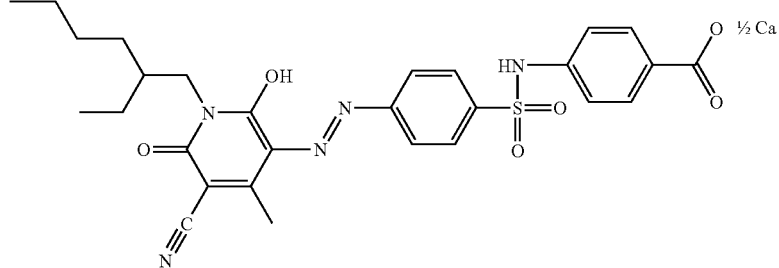
(A2-20)
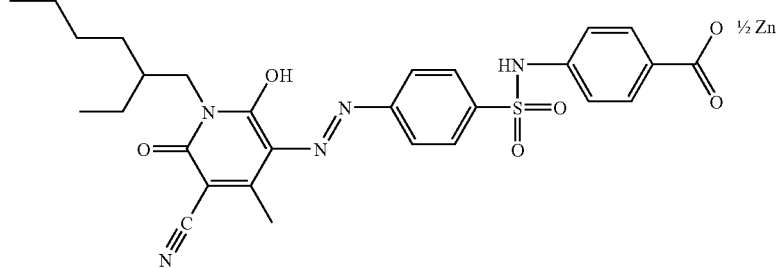

-continued
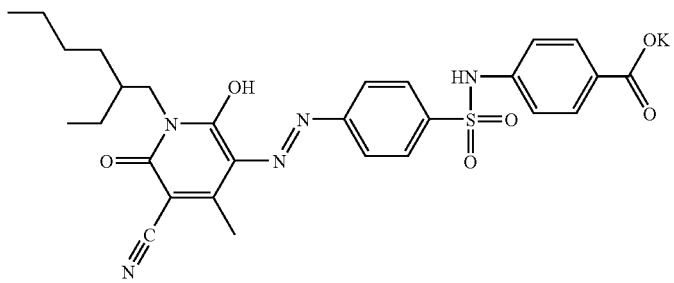
(A2-21)
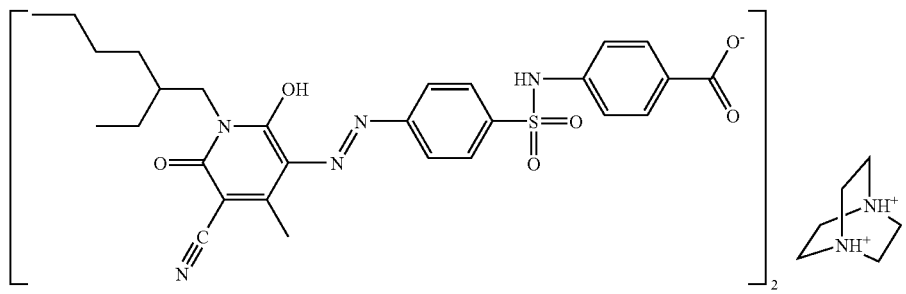
(A2-22)
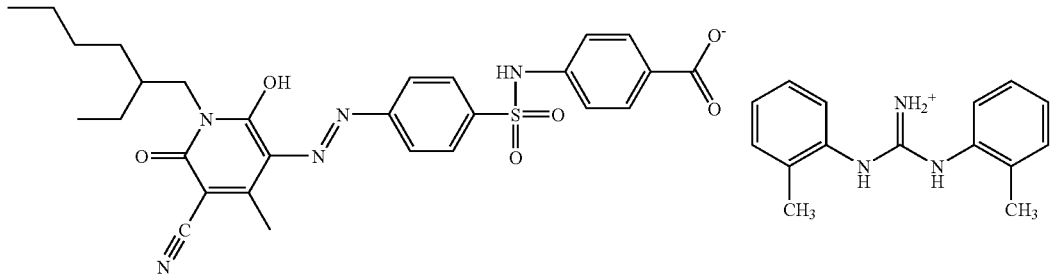
(A2-23)
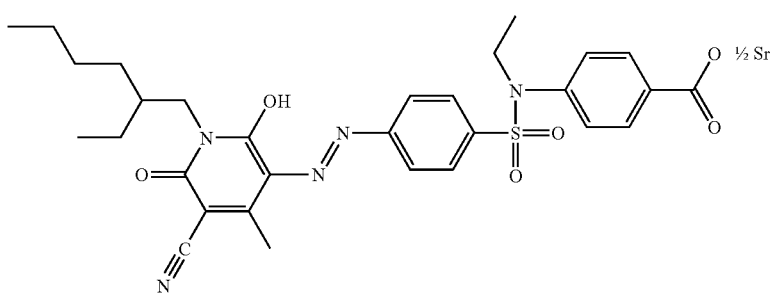
(A2-24)
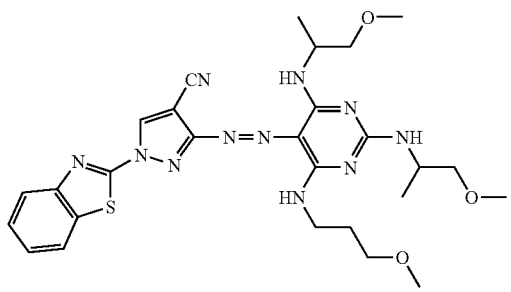
(A3-1)
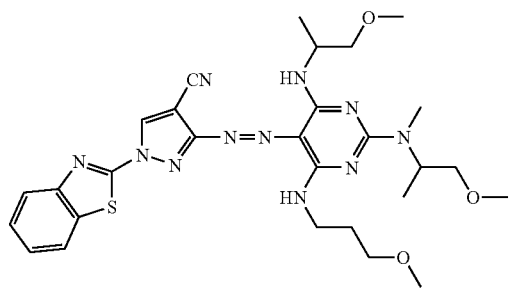
(A3-2)

-continued
(A3-3)
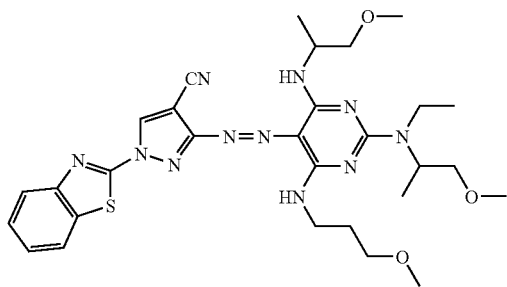
(A3-4)
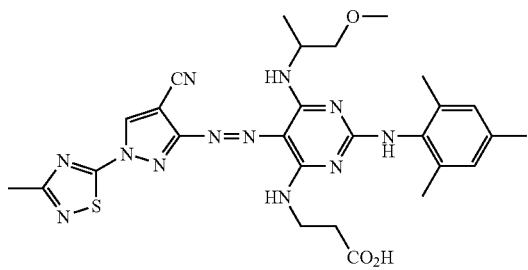
(A3-5)
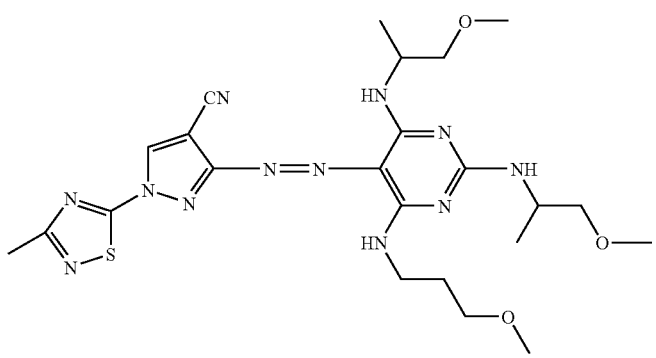
(A3-6)
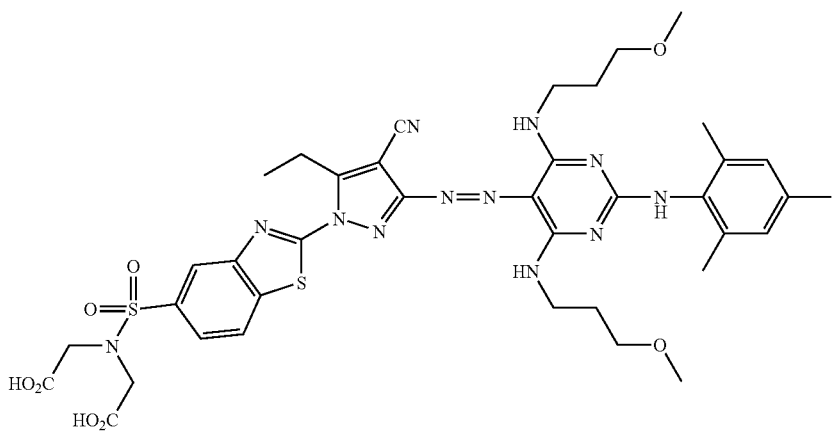
(A3-7)
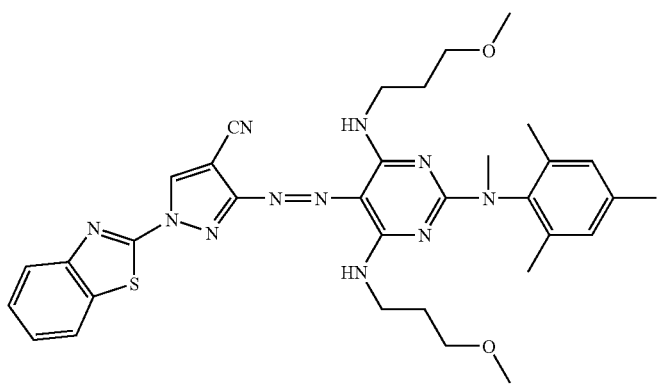

-continued
(A3-8)
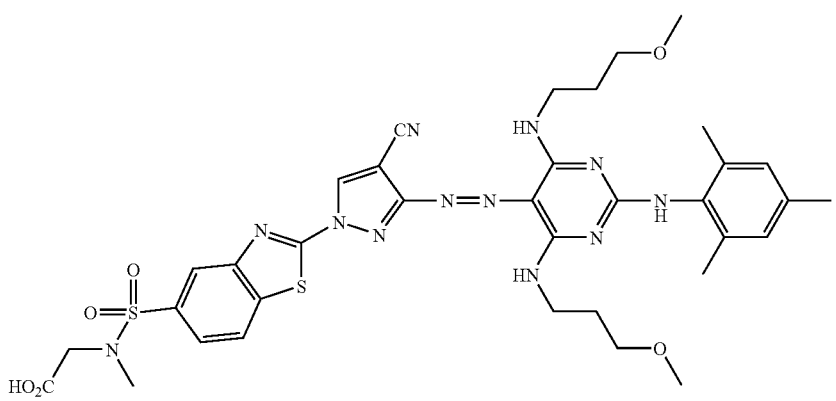
(A3-9)
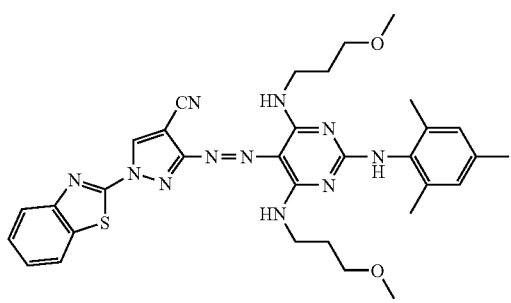
(A3-10)
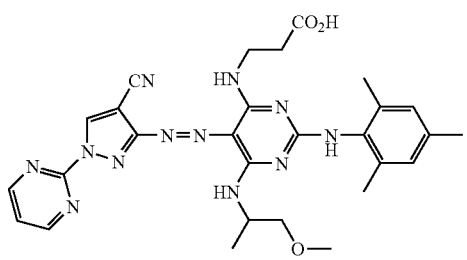
(A3-11)
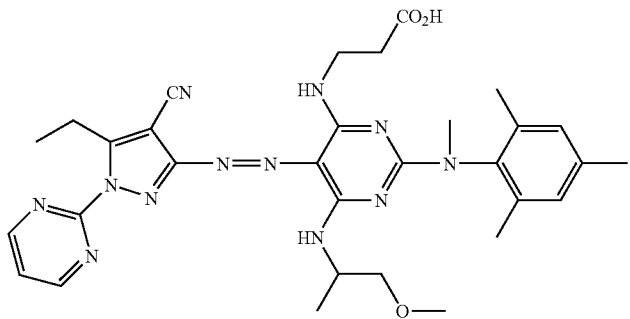
(A3-12)
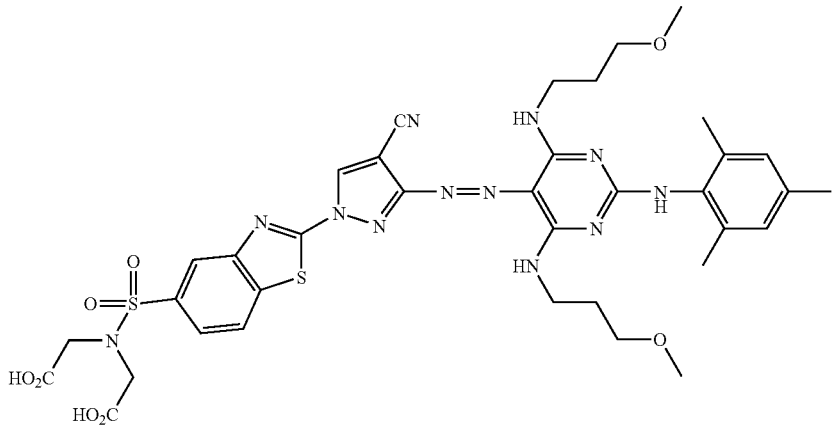

-continued
(A3-13)
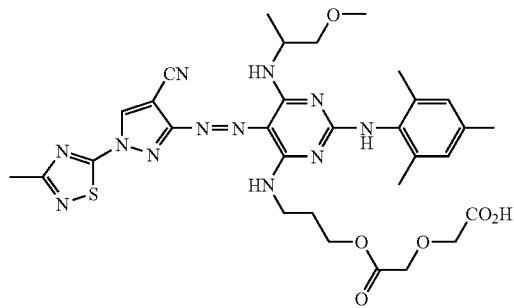
(A3-14)
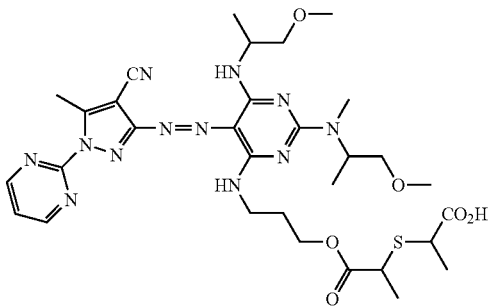
(A3-15)
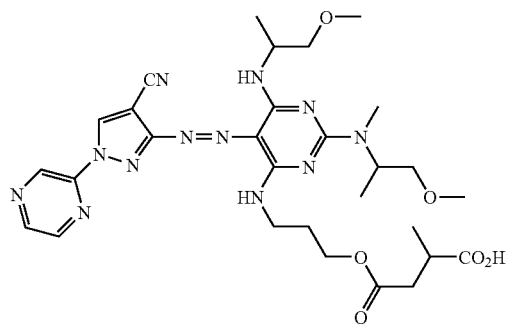
(A3-16)
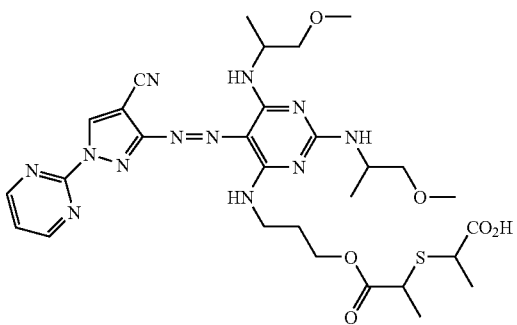
(A3-17)
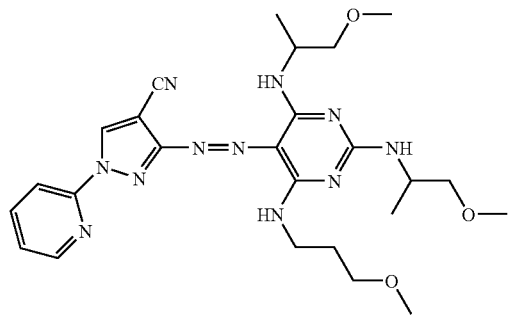
(A3-18)
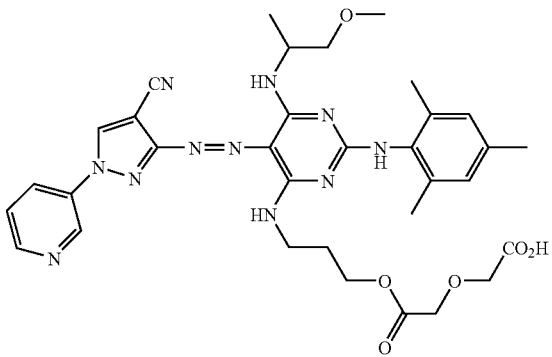
(A3-19)
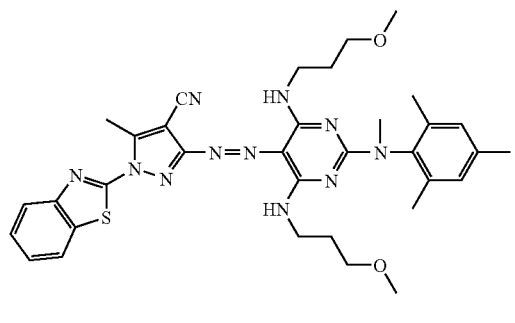
(A3-20)
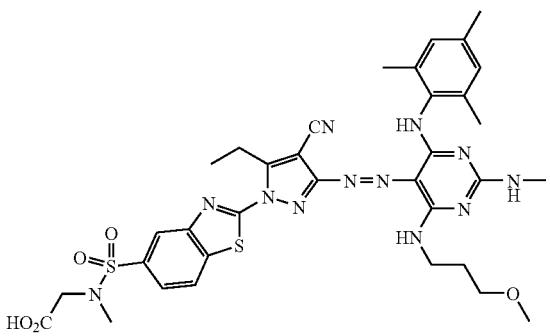

-continued

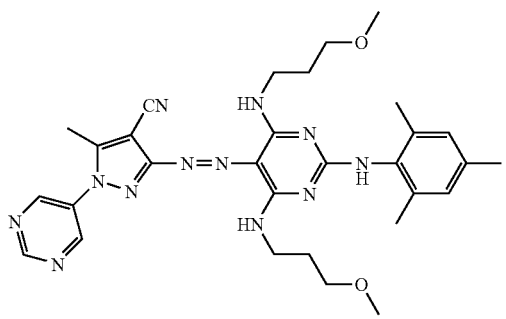
(A3-21)

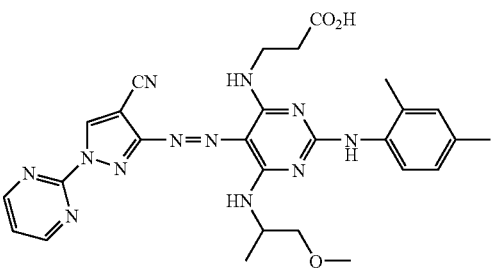
(A3-22)

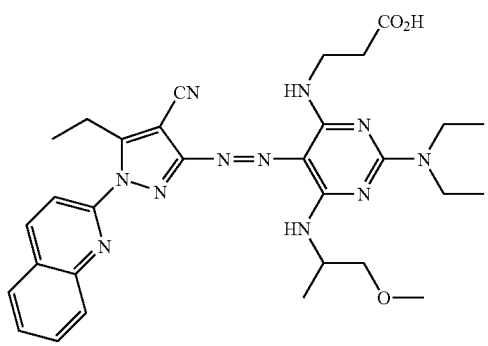
(A3-23)

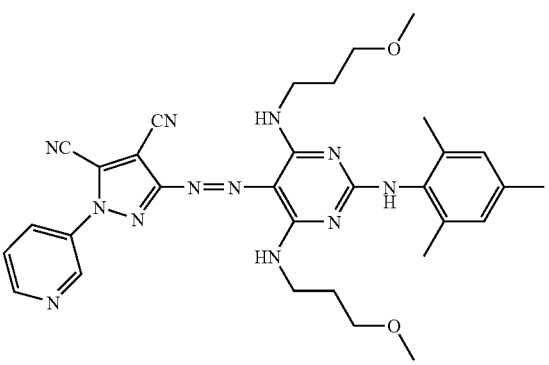
(A3-24)

—Phthalocyanine Compound—

The phthalocyanine compound is represented by the following formula 1.

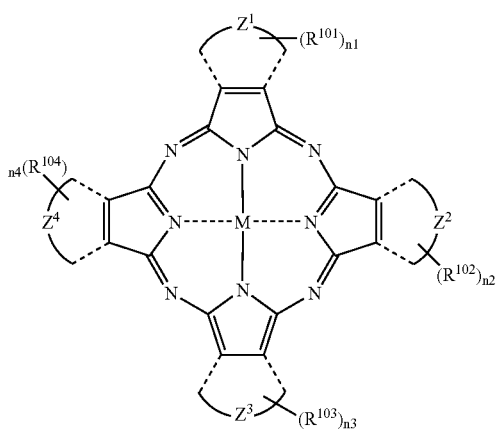

Formula 1

In above-mentioned formula 1, M represents a metal, and examples of the metal include Zn, Mg, Si, Sn, Rh, Pt, Pd, Mo, Mn, Pb, Cu, Ni, Co and Fe; metal chloride such as AlCl, InCl, FeCl, $TiCl_2$, $SnCl_2$, $SiCl_2$ and $GeCl_2$; metal oxides such as TiO and VO; and metal hydroxides such as $Si(OH)_2$. M is preferably Zn, Pd, Cu, Ni, Co or VO; more preferably Zn, Cu, Co or VO; and most preferably Cu.

$Z^1$, $Z^2$, $Z^3$ and $Z^4$ each independently represents an atomic group necessary for forming a six-membered ring including carbon atoms. The six-membered ring may be a saturated ring or an unsaturated ring, may be a heterocyclic group containing the nitrogen atom and the like, may be non-substituted or substituted, may be condensed with other five-membered or six-membered rings, or the condensed ring may further have substituents. Specific examples of the ring include a benzene ring, cyclohexane ring, cyclohexene ring, pyridine ring or naphthalene ring.

$R^{101}$, $R^{102}$, $R^{103}$ and $R^{104}$ each independently represents substituents to be described. At least one of plural substituents represented by $R^{101}$ to $R^{104}$ is preferably an organic group to be described below. The organic group is preferably an organic group containing a sulfur atom (sulfur-containing organic group).

n1, n2, n3 and n4 each independently represents an integer from 0 to 4. The total of n1 to n4 is preferably 1 or more, more preferably 2 or more.

The phthalocyanine compound preferably has an acid group in an arbitrary position in the structure. While any acid group is available so long as it is dissociable in an aqueous alkali solution, specific examples include sulfonic acid, carboxylic acid, phenolic hydroxyl group, sulfonamide and phosphoric acid.

These acid groups may form salts of divalent or higher metals, and examples of the metal include magnesium, calcium, strontium, barium, zinc, aluminum, nickel, copper, cobalt and iron.

The phthalocyanine compound is preferably any one of the following compounds:

(1) a compound in which M is Cu, the six-membered ring formed by $Z^1$, $Z^2$, $Z^3$ and $Z^4$ is a benzene ring, and at least one of plural $R^{101}$ to $R^{104}$ is a sulfur-containing organic group;

(2) a compound in which M is Cu, the six-membered ring formed by $Z^1$, $Z^2$, $Z^3$ and $Z^4$ is a benzene ring and/or a pyridine ring, and at least one of plural $R^{101}$ to $R^{104}$ is a halogen atom or sulfur-containing organic group;

(3) a compound in which M is Cu, the six-membered ring formed by $Z^1$, $Z^2$, $Z^3$ and $Z^4$ is a benzene ring, at least one of plural $R^{101}$ to $R^{104}$ is —SR(R is an organic group to be described below), and the organic group R contains an acid group at its arbitrary position; or (4) a compound in which M is Cu, the six-membered ring formed by $Z^1$, $Z^2$, $Z^3$ and $Z^4$ is a benzene ring and/or a pyridine ring, and at least one of plural $R^{101}$ to $R^{104}$ is a halogen atom or sulfonamide group.

Specific examples of the phthalocyanine compound (compounds A4-1 to A4-19) are shown below. However, the invention is not restricted to these examples.

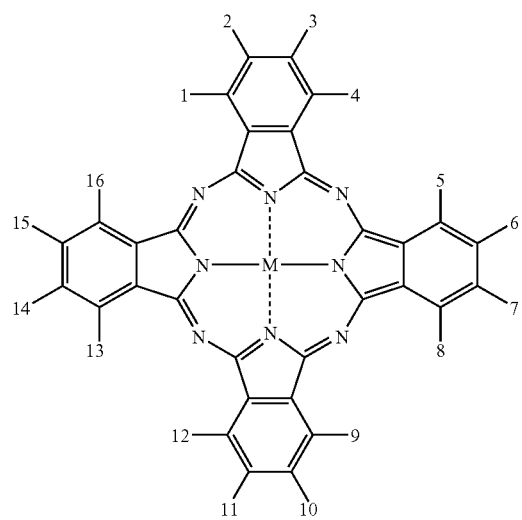

| Compound | M | Substituent at positions 1 or 4, 5 or 8, 9 or 12 and 13 or 16 (Substituents at other 4 positions are hydrogens) | Substituents at other 8 positions |
|---|---|---|---|
| A4-1 | Cu | 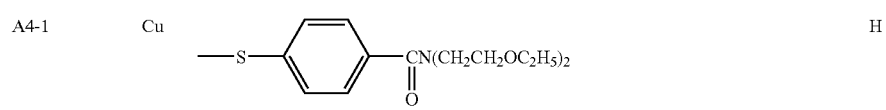 | H |
| A4-2 | Cu | 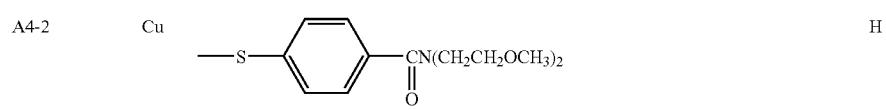 | H |
| A4-3 | Cu | 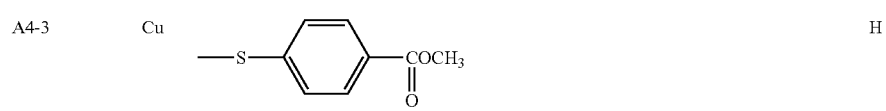 | H |
| A4-4 | Cu | 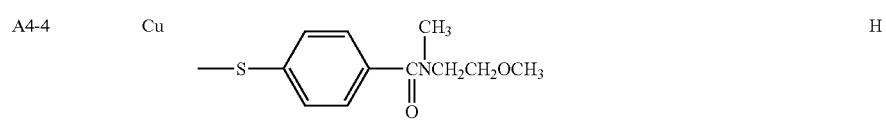 | H |
| A4-5 | Cu | 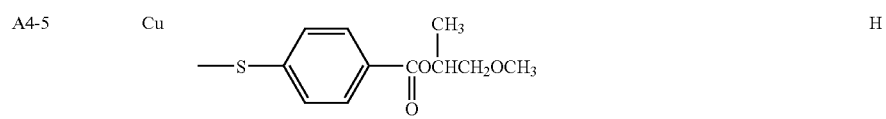 | H |
| A4-6 | Cu | 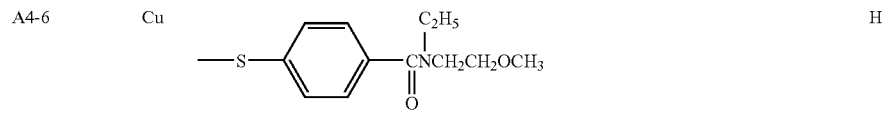 | H |
| A4-7 | Cu | 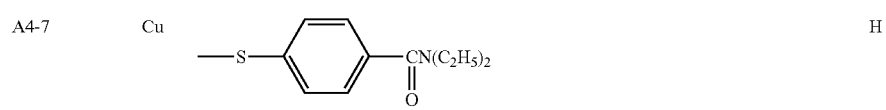 | H |

-continued
| | | | |
|---|---|---|---|
| A4-8 | Cu | 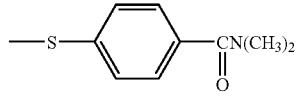 | H |
| A4-9 | Cu | 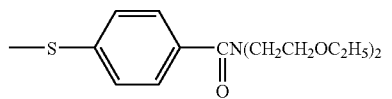 | H |
| A4-10 | Cu | 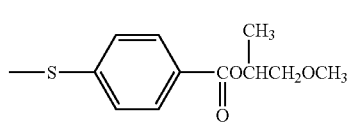 | H |
| A4-11 | Cu | 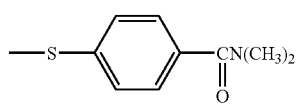 | H |
| A4-12 | Cu | 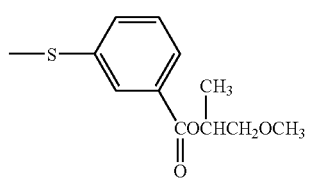 | H |
| A4-13 | Co |  | H |
(A4-14)
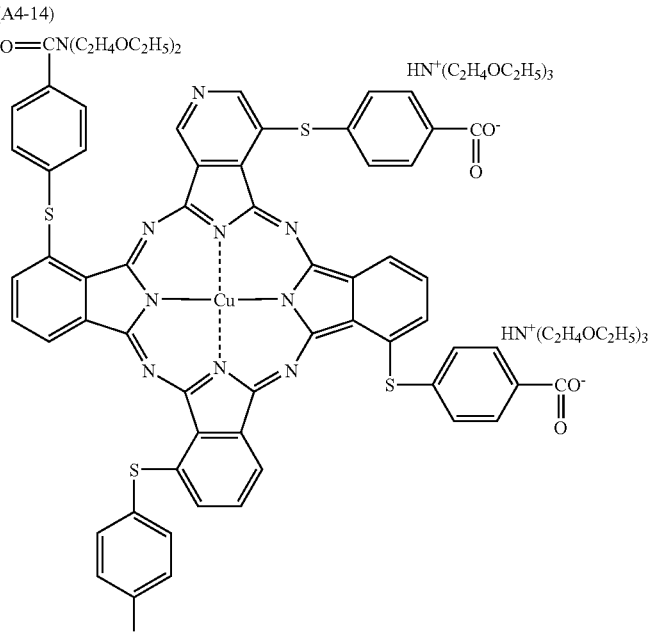

-continued
(A4-15)
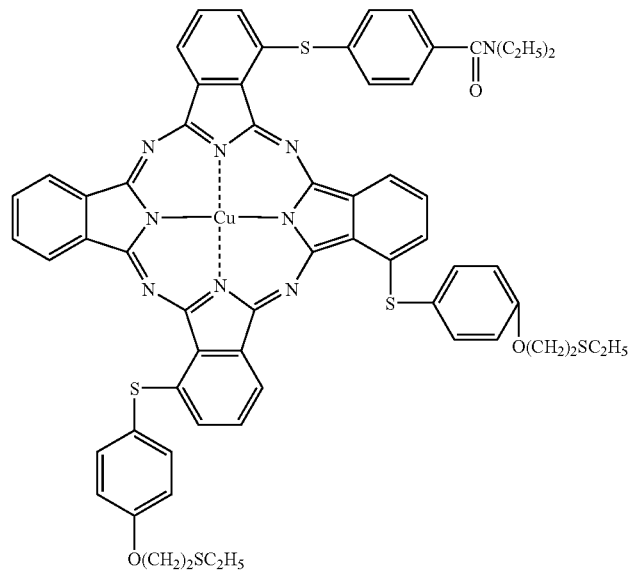
(A4-16)
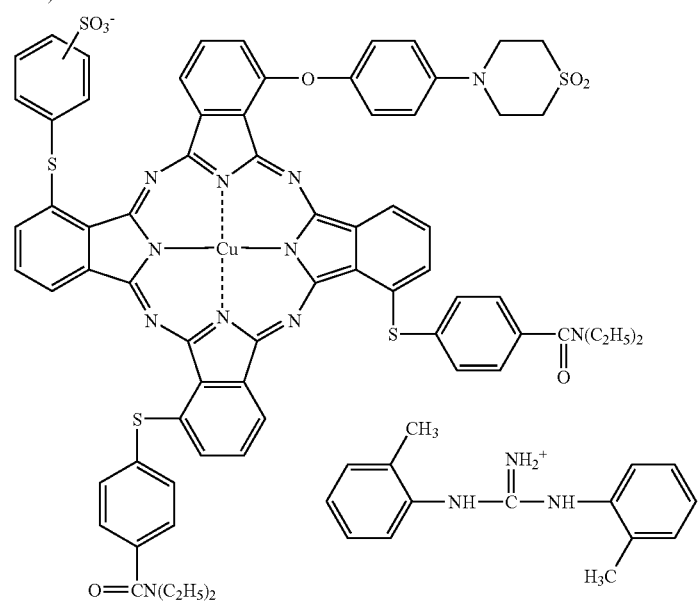

(A4-17)
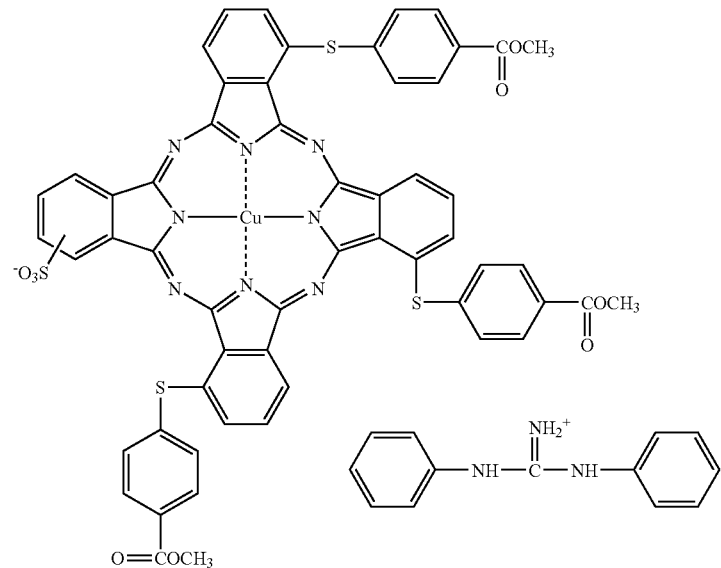
(A4-18)
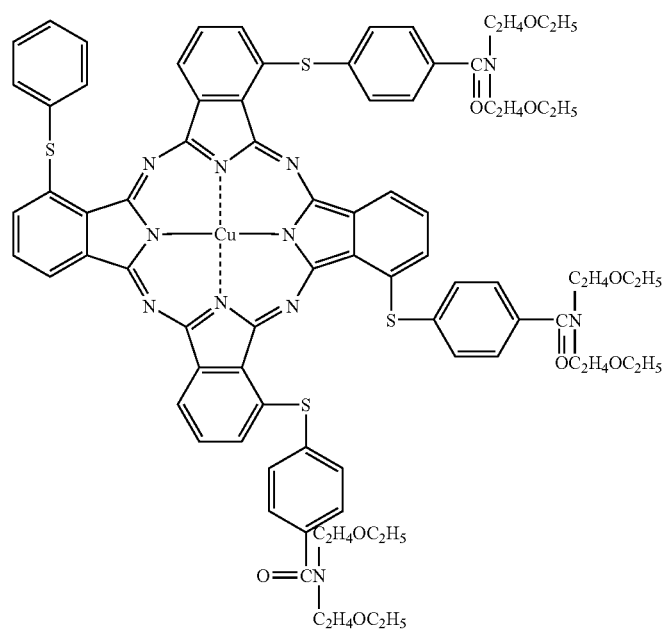

(A4-19)

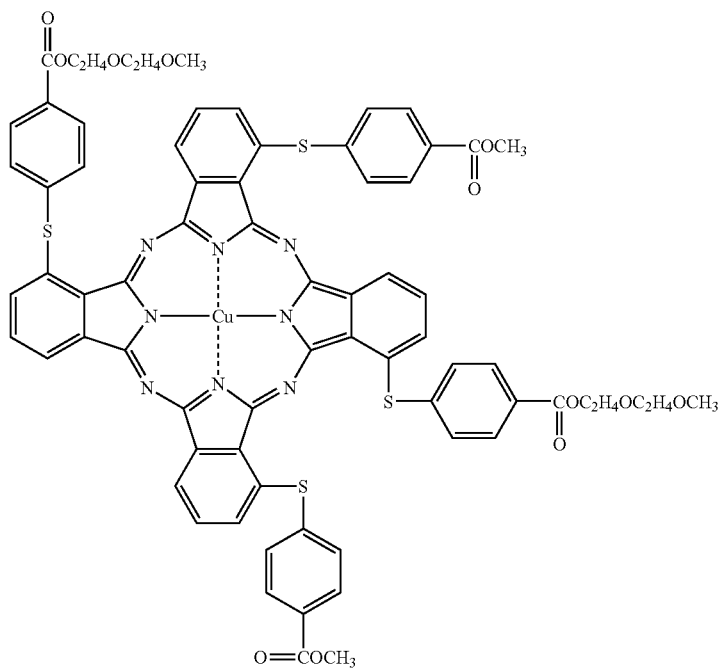

In the following specific examples (A5-1 to A5-38), rings A1, A2, A3 and A4 each independently represents a benzene ring or a pyridine ring. In the case of the pyridine ring, positional isomers having N at different positions exist depending on the orientation of the condensed ring. Each isomer also includes isomers having a substituent at a different position.

| No. of specific Example | Number (benzene) | Number (pyridine) | p | q | $R^{201}$ | $R^{202}$ |
|---|---|---|---|---|---|---|
| A5-1 | 3 | 1 | 1 | 1 | H | $-C_2H_4OC_2H_5$ |
| A5-2 | 3 | 1 | 2 | 2 | H | $-C_2H_4OC_2H_5$ |
| A5-3 | 3 | 1 | 3 | 3 | H | $-C_2H_4OC_2H_5$ |
| A5-4 | 3 | 1 | 1 | 4 | H | $-C_2H_4OC_2H_5$ |
| A5-5 | 3 | 1 | 1 | 1 | $-C_2H_4OC_2H_5$ | $-C_2H_4OC_2H_5$ |
| A5-6 | 3 | 1 | 1 | 1 | H | $-C_3H_6OC_4H_9$ |
| A5-7 | 3 | 1 | 1 | 2 | H | $-C_3H_6OC_4H_9$ |
| A5-8 | 3 | 1 | 1 | 3 | H | $-C_3H_6OC_4H_9$ |
| A5-9 | 3 | 1 | 1 | 4 | H | $-C_3H_6OC_4H_9$ |
| A5-10 | 3 | 1 | 1 | 1 | $-C_2H_4OCH_3$ | $-C_2H_4OCH_3$ |
| A5-11 | 3 | 1 | 1 | 2 | $-C_2H_4OCH_3$ | $-C_2H_4OCH_3$ |
| A5-12 | 3 | 1 | 1 | 3 | $-C_2H_4OCH_3$ | $-C_2H_4OCH_3$ |
| A5-13 | 3 | 1 | 1 | 4 | $-C_2H_4OCH_3$ | $-C_2H_4OCH_3$ |

-continued
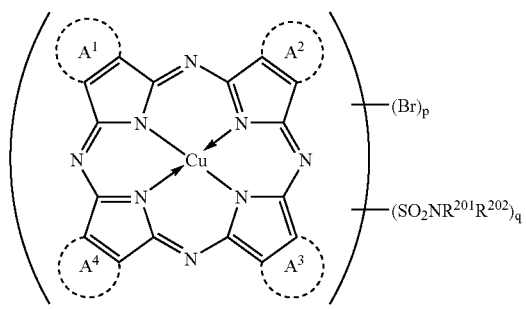
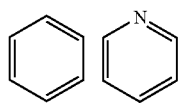
| No. of specific Example | Number | Number | p | q | $R^{201}$ | $R^{202}$ |
|---|---|---|---|---|---|---|
| A5-14 | 3 | 1 | 1 | 2 | —$C_4H_9$ | —$C_4H_9$ |
| A5-15 | 3 | 1 | 1 | 1 | H | —$CH_2$—CH($C_2H_5$)—$C_4H_9$ |
| A5-16 | 3 | 1 | 1 | 2 | H | —$CH_2$—CH($C_2H_5$)—$C_4H_9$ |
| A5-17 | 3 | 1 | 1 | 3 | H | —$CH_2$—CH($C_2H_5$)—$C_4H_9$ |
| A5-18 | 3 | 1 | 1 | 4 | H | —$CH_2$—CH($C_2H_5$)—$C_4H_9$ |
| A5-19 | 3 | 1 | 1 | 1 | H | —$C_3H_6$—$OCH_2$—CH($C_2H_5$)—$C_4H_9$ |
| A5-20 | 3 | 1 | 1 | 2 | H | —$C_3H_6$—$OCH_2$—CH($C_2H_5$)—$C_4H_9$ |
| A5-21 | 3 | 1 | 1 | 3 | H | —$C_3H_6$—$OCH_2$—CH($C_2H_5$)—$C_4H_9$ |
| A5-22 | 3 | 1 | 4 | 2 | H | —$C_3H_6$—$OCH_2$—CH($C_2H_5$)—$C_4H_9$ |
| A5-23 | 3 | 1 | 5 | 2 | H | —$C_2H_4OC_2H_4OC_2H_5$ |
| A5-24 | 3 | 1 | 6 | 1 | —$C_2H_5$ | —$C_2H_4OC_2H_5$ |
| A5-25 | 3 | 1 | 8 | 1 | -i-$C_3H_7$ | —$CH_2O$—$C_2H_4$—(1,3-dioxane) |
| A5-26 | 3 | 1 | 3 | 2 | H | —CH($C_2H_5$)—$CH_2OCH_3$ |

-continued

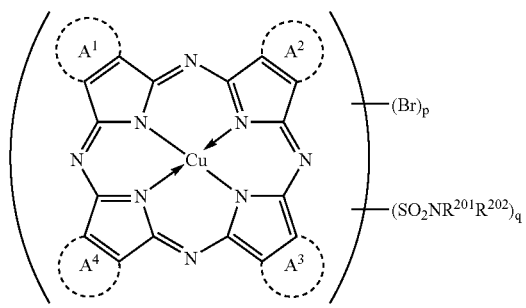

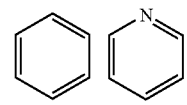

| No. of specific Example | Number (benzene) | Number (pyridine) | p | q | R^{201} | R^{202} |
|---|---|---|---|---|---|---|
| A5-27 | 3 | 1 | 1 | 1 | H | —CH(C$_2$H$_5$)—CH$_2$OC$_2$H$_4$OC$_2$H$_5$ |
| A5-28 | 3 | 1 | 1 | 2 | H | —CH(C$_2$H$_5$)—CH$_2$OC$_2$H$_4$OC$_2$H$_5$ |
| A5-29 | 3 | 1 | 2 | 2 | H | —CH(C$_2$H$_5$)—CH$_2$OC$_2$H$_4$OC$_2$H$_5$ |
| A5-30 | 3 | 1 | 3 | 2 | H | —CH(C$_2$H$_5$)—CH$_2$OC$_2$H$_4$OC$_2$H$_5$ |
| A5-31 | 3 | 1 | 1 | 1 | H | —CH(i-C$_3$H$_7$)—COOCH$_3$ |
| A5-32 | 3 | 1 | 1 | 2 | H | —CH(i-C$_3$H$_7$)—COOCH$_3$ |
| A5-33 | 3 | 1 | 1 | 2 | H | —CH(i-C$_3$H$_7$)—COOCH$_3$ |
| A5-34 | 3 | 1 | 1 | 1 | H | —CH(i-C$_3$H$_7$)—COOCH$_3$ |
| A5-35 | 3 | 1 | 3 | 2 | -n-C$_8$H$_{17}$ | —CH(C$_2$H$_5$)—CH$_2$OC$_2$H$_4$OC$_2$H$_5$ |
| A5-36 | 3 | 1 | 4 | 2 | H | —CH(COOC$_2$H$_4$OC$_2$H$_5$)—COOC$_2$H$_4$OC$_2$H$_5$ |
| A5-37 | 3 | 1 | 1 | 1 | —C$_2$H$_4$OC$_2$H$_4$OC$_2$H$_5$ | —C$_2$H$_4$OC$_2$H$_4$OC$_2$H$_5$ |
| A5-38 | 2 | 2 | 1 | 1 | H | —C$_2$H$_4$OC$_2$H$_5$ |

—Azomethine Compound—

The azomethine compound denotes a compound having the azomethine group (RaC(Rb)=N—) in the molecule. Ra and Rb denote arbitrary organic groups.

A compound containing a heterocyclic group is preferable as the azomethine compound. Examples of the heterocyclic group are the same as those in the above-mentioned heterocyclic azo compounds. Heterocyclic groups having nitrogen atoms in the ring (nitrogen-containing-heterocyclic group) are preferable among them.

Compounds having structures formed by condensation of above-mentioned plural heterocyclic groups are preferable in the invention. Structures formed by condensation of two heterocyclic groups independently selected from a pyrazole, a pyrazoline, an imidazole, a triazole and an oxazole are preferable among them.

The azomethine compound preferably has an acid group at an arbitrary position of the structure. While any kind of the acid group is available so long as it is a functional group dissociable in an aqueous alkali solution, specific examples thereof include sulfonic acid, carboxylic acid, phenolic hydroxyl group, sulfonamide and phosphoric acid. The acid group may form a salt of divalent or higher metal, and examples of the metal include magnesium, calcium, strontium, barium, zinc, aluminum, nickel, copper, cobalt and iron.

The azomethine compound is preferably (1) a compound having a structure formed by condensation of a pyrazoline and a triazole, a nitrogen atom of the azomethine group substituted with an aromatic ring, and an acid group at an arbitrary position in the stricture; and more preferably (2) a compound having a structure formed by condensation of a pyrazoline and 1,2,4-triazole (7H-pyrazolo[1,5-b][1,2,4]triazole or 7H-pyrazolo[5,1-c][1,2,4]triazole from the left side), a quinoline frame as am aromatic ring substituting with the nitrogen atom of the azomethine group, and carboxylic acid and/or sulfonamide at an arbitrary position in the structure.

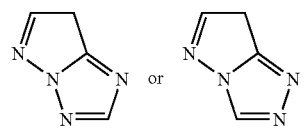

Specific examples (compound A6-1 to A6-28) of the azomethine compound are shown below. However, the invention is not restricted to these specific examples.

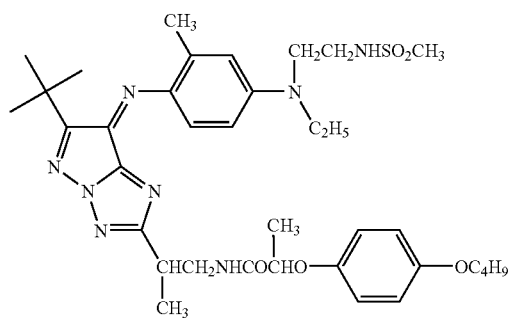

(A6-1)

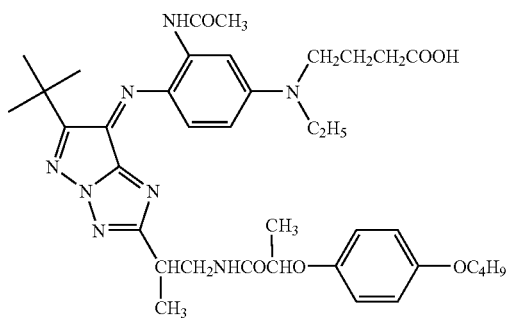

(A6-2)

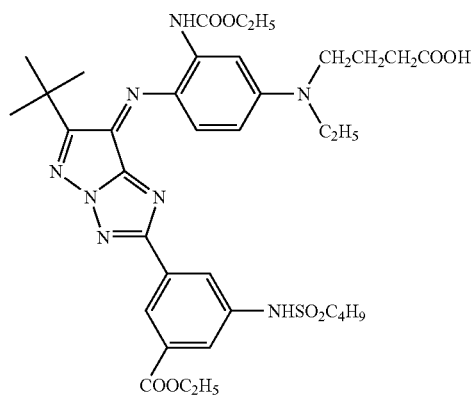

(A6-3)

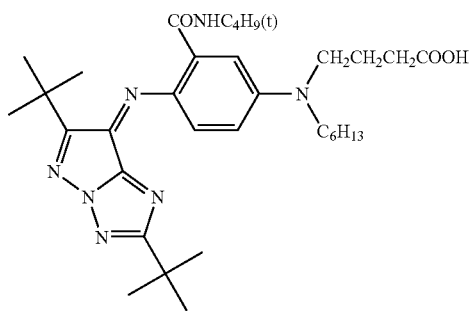

(A6-4)

-continued
(A6-5) 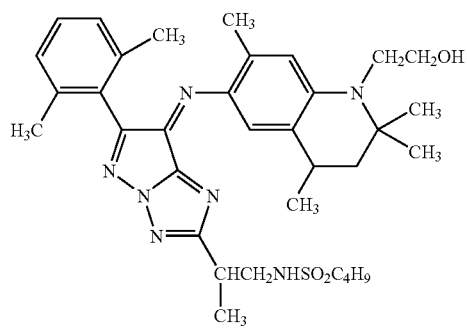
(A6-6) 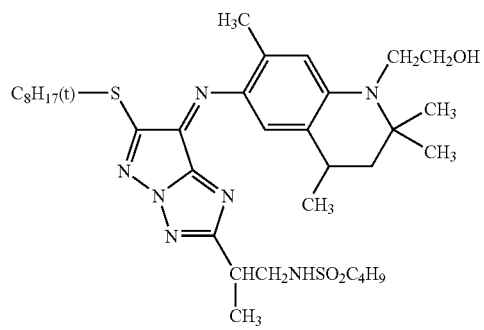
(A6-7) 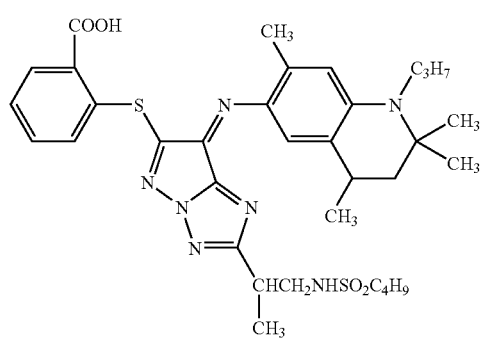
(A6-8) 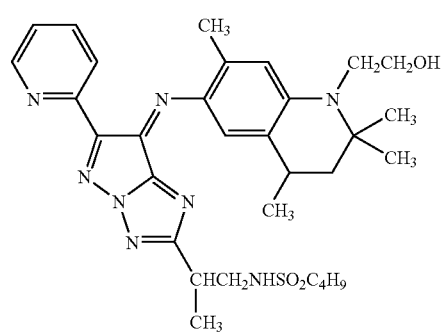
(A6-9) 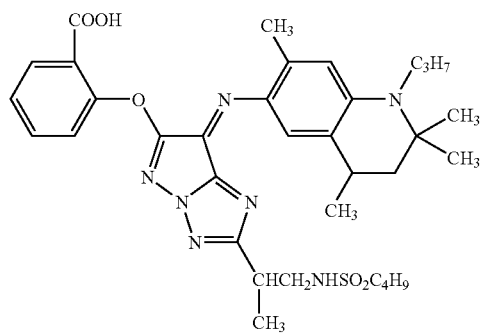
(A6-10) 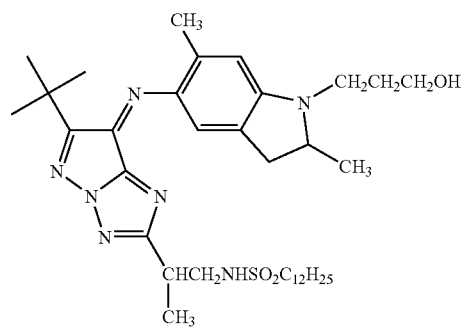
(A6-11) 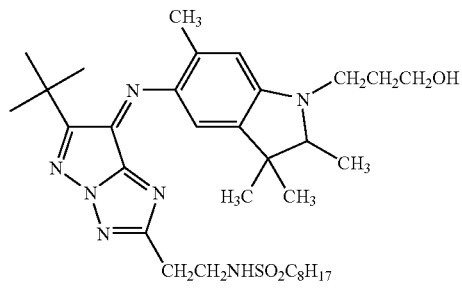
(A6-12) 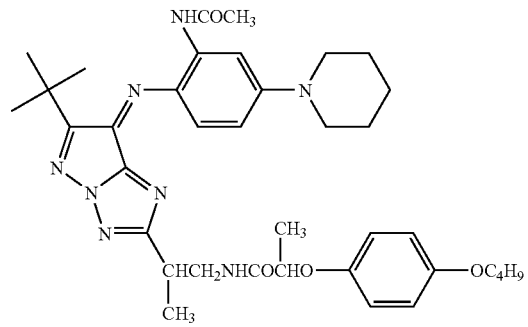

-continued
(A6-13)
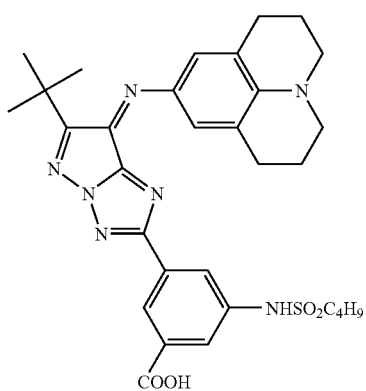
(A6-14)
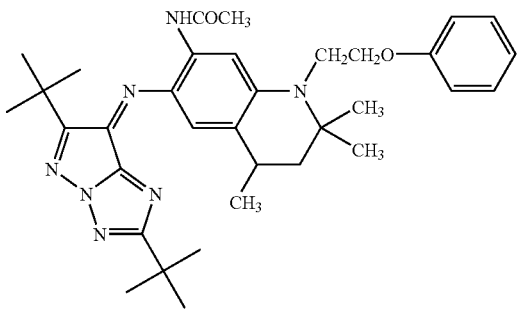
(A6-15)
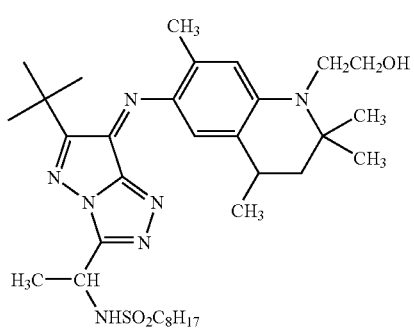
(A6-16)
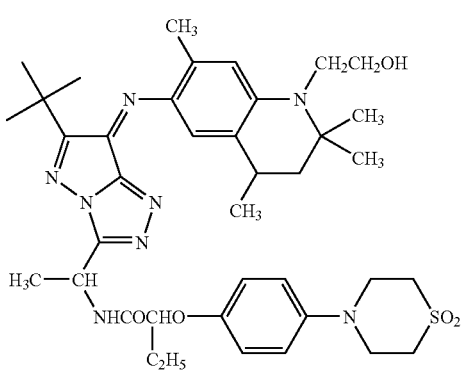
(A6-17)
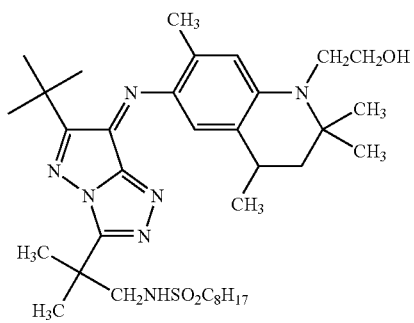
(A6-18)
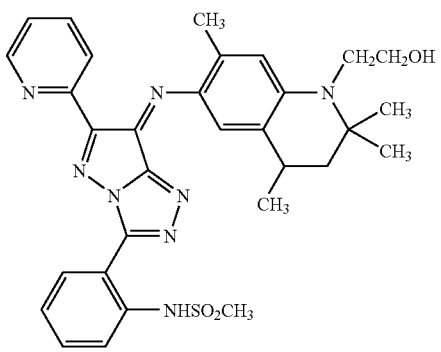
(A6-19)
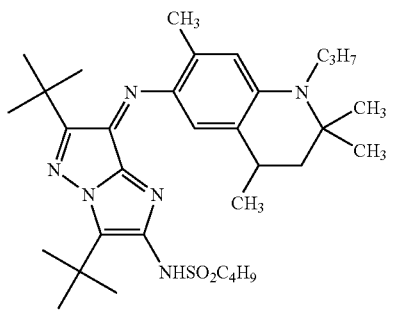
(A6-20)
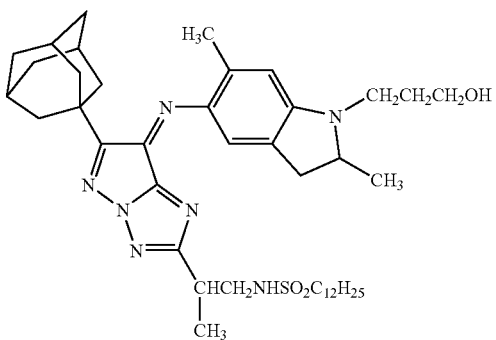

-continued
(A6-21) 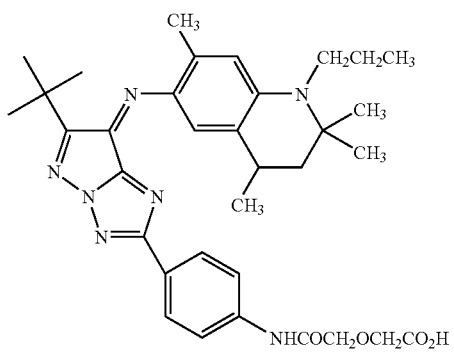
(A6-22) 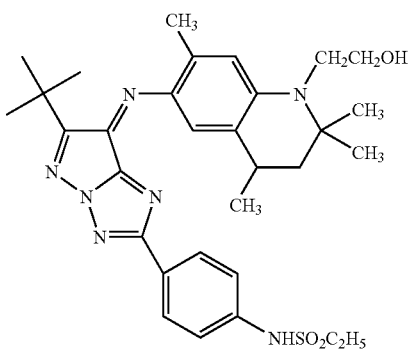
(A6-23) 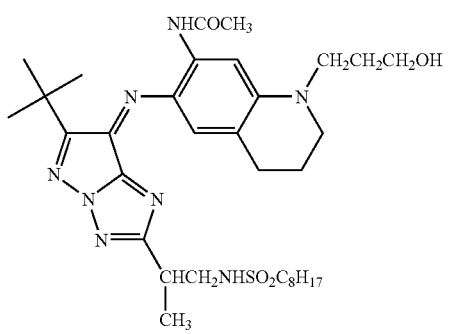
(A6-24) 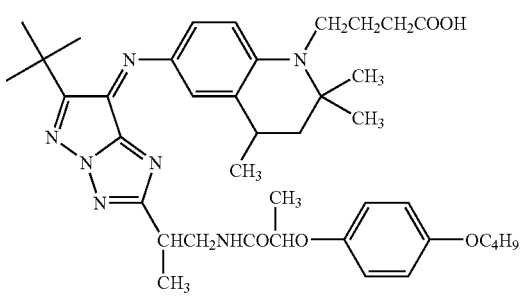
(A6-25) 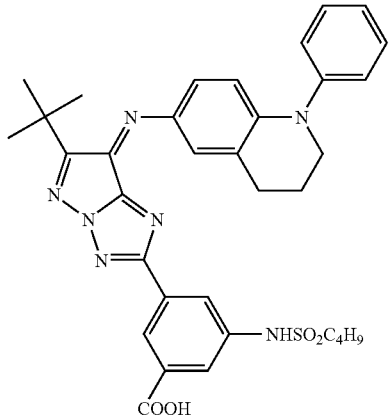
(A6-26) 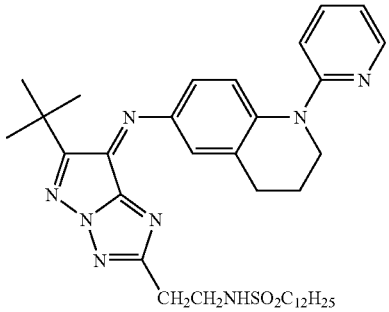
(A6-27) 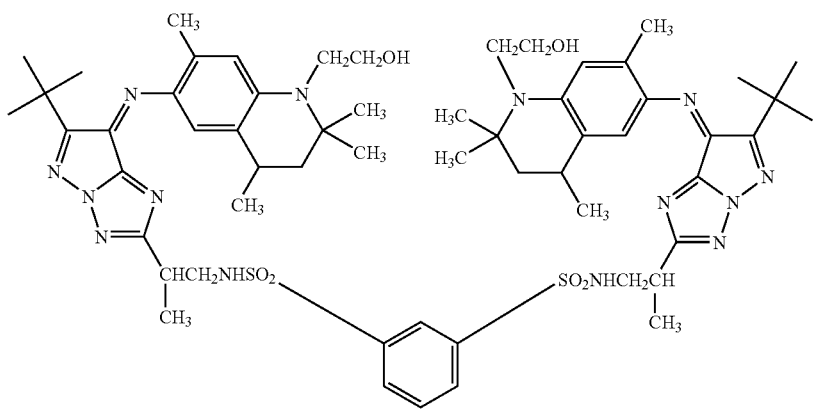

(A6-28)

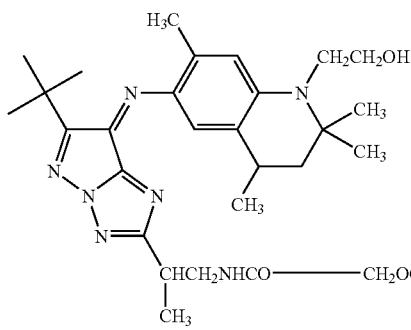 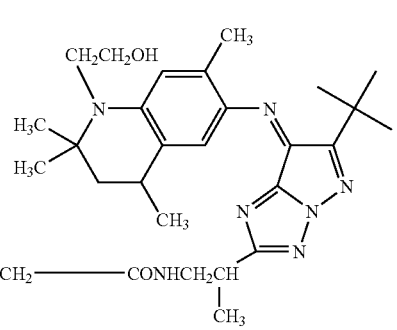

—Description of Substituent—

The substituent in the first aspect of this specification will be described below.

The substituent in the first aspect of this specification denotes an arbitrary group irrespective of inorganic and organic groups, and specifically denotes hydrogen atom, halogen atom, hydroxyl group, cyano group, nitro group, carboxylic acid group, sulfonic acid group, sulfinic acid group, alkyl group (including linear, branched and cyclic groups), alkenyl group (including linear, branched and cyclic groups), alkynyl group, aryl group, heterocyclic group, formyl group, or a group as a combination of one partial group selected from group (A) with one partial group selected from alkyl group, alkenyl group, alkynyl group, aryl group and heterocyclic group:

group A: ether group, amino group, thioether group, ketone group, ester group, amide group, urethane group (carbamoyl group, —O—CO—N—(R)—), urea group (—N(R)—CO—N(R)—), sulfinyl group, (—SO—), sulfonyl group (—SO$_2$—), sulfonic acid ester group (—SO$_2$—O—), sulfonamide group (—SO$_2$—N(R)—), imide group (—CO—N(R)—CO—), sulfonylamide group (—SO$_2$—N(R)—CO—), disulfonylimide group (—SO$_2$—N(R)—SO$_2$—).

R linked to the nitrogen atom in group (A) represents any one of hydrogen atom, alkyl group, alkenyl group, aryl group and heterocyclic group.

The alkyl group in the substituent may be any one of linear, branched and cyclic groups. The cyclic group may be any one of the monocyclic and polycyclic group. The alkyl group is preferably an alkyl group having 1 to 30 carbon atoms, and specific examples of the alkyl group include methyl, ethyl, n-propyl, i-propyl, n-butyl, cyclopentyl, cyclohexyl, norbornyl and adamantyl group. These alkyl group may have further substituent at an arbitrary position of the alkyl group, and the additional substituent include all the above-mentioned alkyl groups including the alkyl group itself. In the case of the cyclic alkyl group, a partial structure selected from group (A) may be inserted into an arbitrary position of the carbon-carbon bond constituting the ring.

The alkenyl group in the above-mentioned substituent may be any one of the linear, branched and cyclic groups. The cyclic group may be any one of the monocyclic and polycyclic groups. The alkenyl group preferably has 1 to 30 carbon atoms, and specific examples of them include vinyl, allyl, 1-methylvinyl, 3-buten-1-yl, cyclopentan-2-ene-1-yl, cyclohexan-2-ene-1-yl and cyclohexan-1-ene-1-yl groups. These alkenyl groups may have other substituents at arbitrary positions thereof, and the additional substituents include all the above-mentioned substituents. A partial structure selected from group (A) may be inserted into an arbitrary position of the carbon-carbon bond constituting the ring.

While the alkynyl group in the above-mentioned substituent is an ethynyl group, hydrogen atom in the ethynyl group may be substituted with another substituent. The substituents include all the above-mentioned substituents.

The aryl group in the above-mentioned substituent may be a monocyclic or condensed ring group so long as it is an aromatic ring, and an aryl group having 6 to 20 carbon atoms is preferable. Specific examples include phenyl group, naphthyl group, anthrile group, phenanthryl group and pyrenyl group. An arbitrary position of these aryl groups may be further substituted with another substituent, and the additional substituents include all the above-mentioned substituents.

The heterocyclic group in the above-mentioned substituent has hetero atoms (for example nitrogen, sulfur and oxygen atoms) in the ring, which may be a saturated ring or unsaturated ring, or a single ring or condensed ring. Examples of the heterocyclic group include tetrahydrofuranyl group, dihydrofuranyl group, tetrahydropyranyl group, dihydropyranyl group, oxocanyl group, dioxanyl group, tetrahydrothiophenyl group, dithianyl group, pyrrolidinyl group, pyrrolinyl group, tetrahydropyridinyl group, piperazinyl group, homopiperazinyl group, piperidinyl group, pyrrolyl group, furyl group, thiophenyl group, benzopyrrolyl group, benzofuryl group, benzothiophenyl group, pyrazolyl group, isoxazolyl group, isothiazolyl group, indazolyl group, benzoisoxazolyl group, benzoisothiazolyl group, imidazolyl group, oxazolyl group, thiazolyl group, benzoimidazolyl group, benzoxazolyl group, benzothiazolyl group, pyridyl group, quinolinyl group, isoquinolinyl group, pyridazinyl group, pyrimidinyl group, pyrazinyl group, cinnolinyl group, phthalazinyl group, quinazolynyl group, quinoxalinyl group, acridinyl group, phenanthrydinyl group, phthalazinyl group, carbazolyl group, uracil group, dithiouracil group, carbolynyl group, purinyl group and thiadiazolyl group. An arbitrary position of these heterocyclic groups may be further substituted with another substituent, and the additional substituents include all the above-mentioned substituents.

The above-mentioned organic group denotes a substituent containing at least carbon atoms of the above-mentioned substituents.

The organic group represented by $R^{101}$ to $R^{104}$ in the phthalocyanine compound is preferably a sulfur-containing organic group, and alkylthio group, arylthio group, alkylsulfonyl group, arylsulfonyl group or sulfonamide group that may have substituents is preferable. The organic groups represented by Ra and Rb in the azomethine compound preferably form a nitrogen-containing-heterocyclic group including Ra and Rb.

—Other Dyes—

The dyes other than the above-mentioned dyes that may be contained in the composition of the invention will be described below.

The other dyes that may be additionally contained (including organic solvent-soluble dyes) are not particularly restricted, and known dyes conventionally used for the color filter may be used. Examples of the pigment available include those described in JP-A Nos. 64-90403, 64-91102, 1-94301, 6-11614, 5-333207, 6-35183, 6-51115 and 6-194828; and Japanese Patent Registration No. 2592207; U.S. Pat. Nos. 4,808,501, 5,667,920 and 5,059,500.

Examples of the chemical structure include those of azo dyes other than those described above; triphenyl methane, anthraquinone, benzylidene, oxonol and phenothiazine dyes; and azomethine dye other than those described above, xanthene dyes, phthalocyanine dyes other than those described above, benzopyrane dyes, indigo dyes and anthrapyridone dyes.

At least one of acid dyes and derivatives thereof may be favorably used for completely removing the dye by development, when a resist system developed with water or an alkali is constructed. It is also advantageous to use at least one dye appropriately selected from direct dyes, basic dyes, mordant dyes, acidic mordant dyes, azoic dyes, dispersion dyes, oil-soluble dyes and food dyes, and derivatives thereof.

Acid dyes and derivatives thereof will be described below. While the acid dye is not particularly restricted so long as it is a pigment having an acidic group such as sulfonic acid, carboxylic acid or phenolic hydroxyl group, the dye is selected in terms of all the required performance such as solubility in organic solvents and developers used for preparation of the composition and development treatment, salt forming ability with basic compound, light absorbance, interaction with other components in the curable composition, light resistance and heat resistance.

While specific examples and preferable examples of the acid dye are described in JP-A No. 2005-227722, the invention is not restricted thereto.

Since solubility of the acid dye as a constituting component in organic solvents used for preparation of the composition may be insufficient in some cases, the acid dye may be preferably used as a derivative.

Derivatives of the acid dye available include inorganic salts of the acid dye having an acidic group such as sulfonic acid and carboxylic acid, salts of acid dye and nitrogen-containing compound and a sulfonamide derivative of the acid dye. While the derivative is not particularly restricted, it is selected in terms of all the required performance such as solubility in organic solvents and developers used for preparation of the composition and development treatment, light absorbance, interaction with other components in the curable composition, light resistance and heat resistance.

Salts of the acid dye and nitrogen-containing compounds will be described below. The method for forming a salt of acid dye and nitrogen-containing compound may be effective in some cases for improving solubility (solubilize in organic solvents), heat resistance and light stability of the acid dye.

The nitrogen-containing compound that forms a salt with acid dye, and the nitrogen-containing compound for obtaining sulfonamide of acid dye by forming an amide bond with the acid dye are selected by taking all of features such as solubility of the salt or amide compound in organic solvents and developers used for preparation or development, salt-forming ability, absorbance and chromatic valance of the dye, interaction of the dye with other components in the dye-containing negative curable composition, and heat resistance and light resistance as a colorant into consideration. The molecular weight of the nitrogen-containing compound is preferably as low as possible when the nitrogen-containing compound is selected only in terms of absorbance and chromatic valance. In particular, the molecular weight is preferably 300 or less, more preferably 280 or less and particularly preferably 250 or less.

While specific examples of the nitrogen-containing compound are shown below, the invention is not restricted thereto. The compounds having no —NH— group in the compounds listed below are not categorized into the nitrogen-containing compound for forming the amide bond.

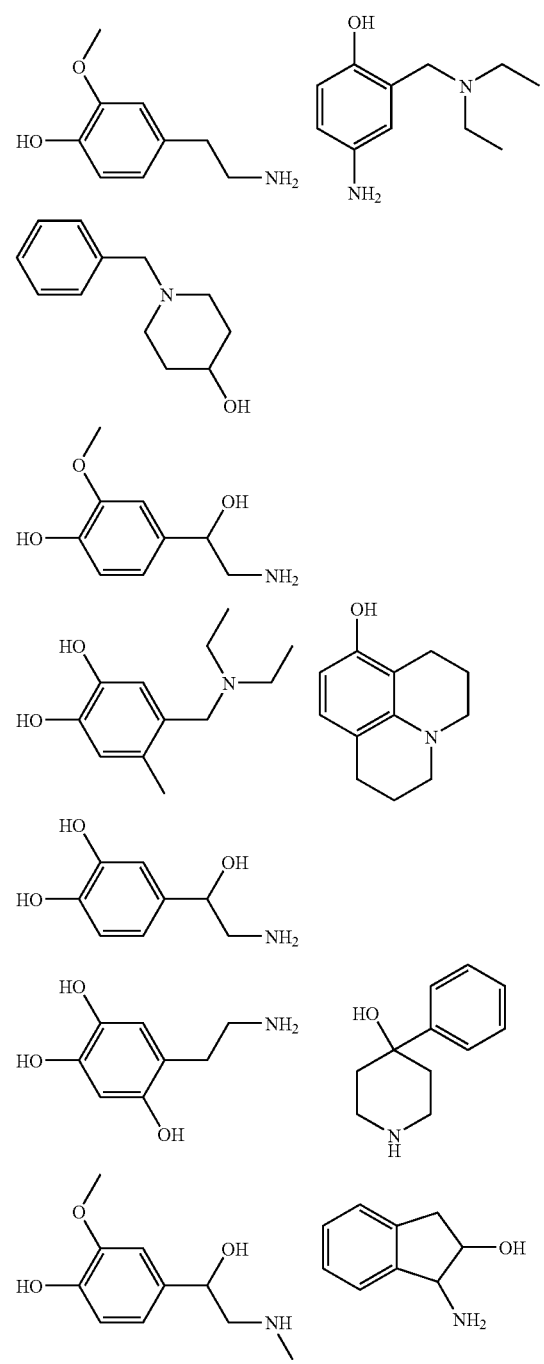

53
-continued
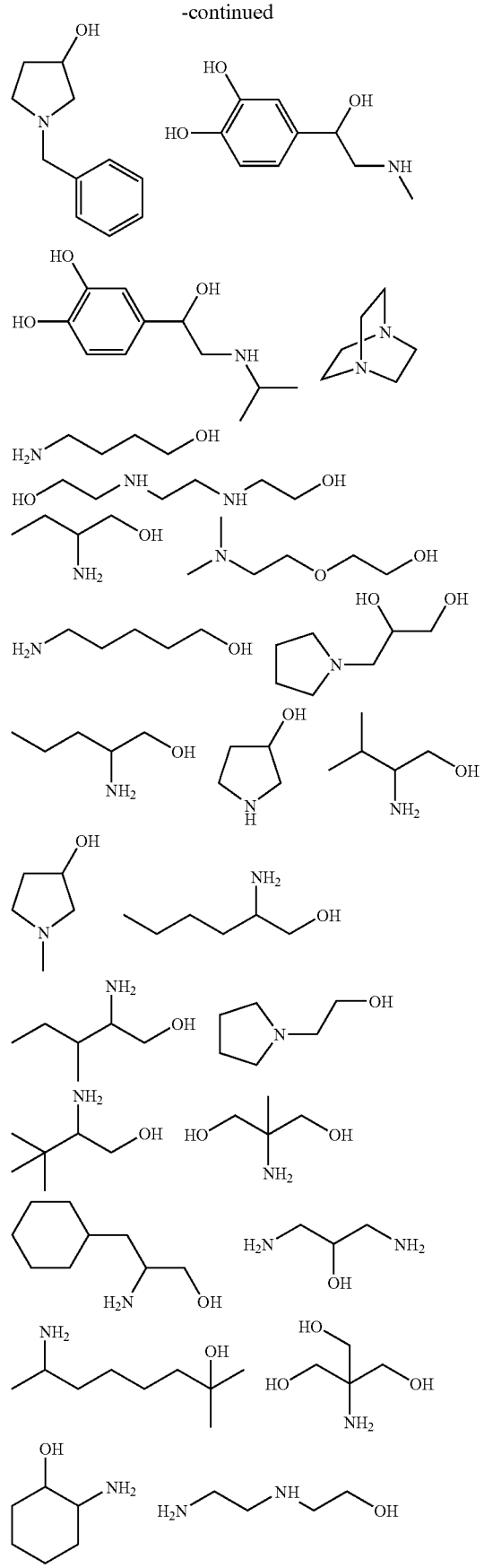
54
-continued
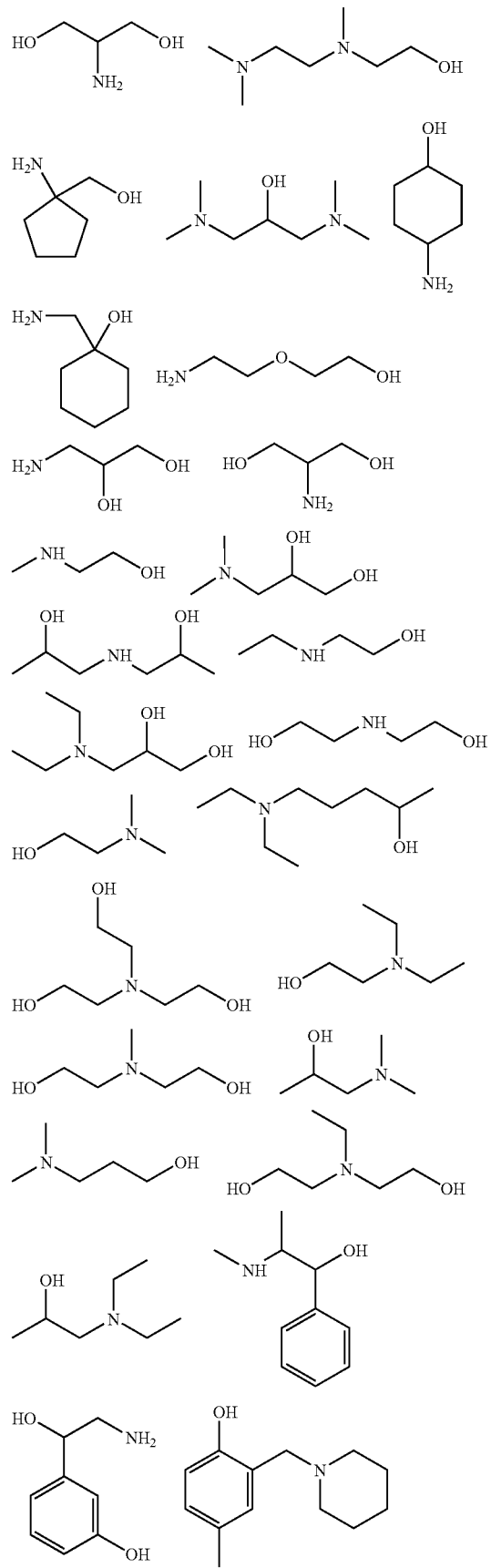

55
-continued
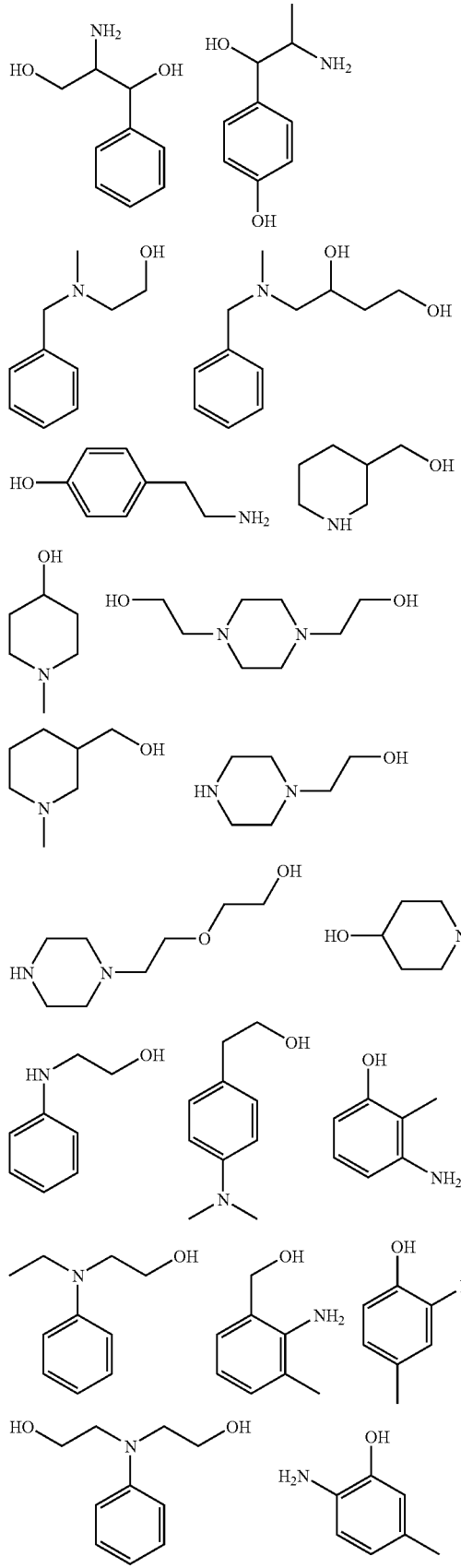
56
-continued
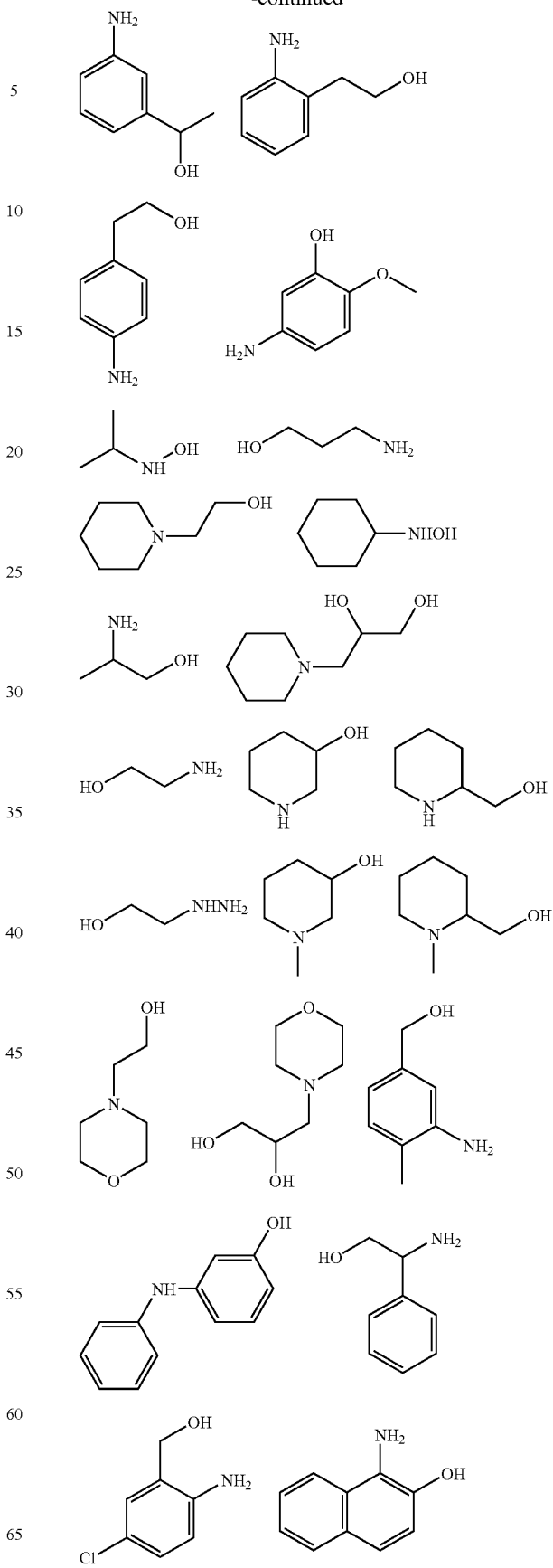

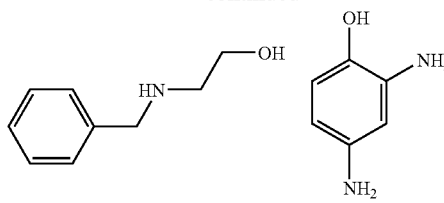

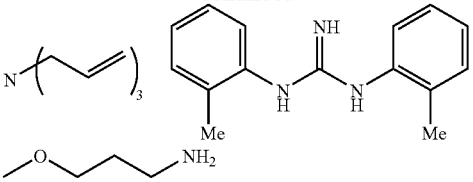

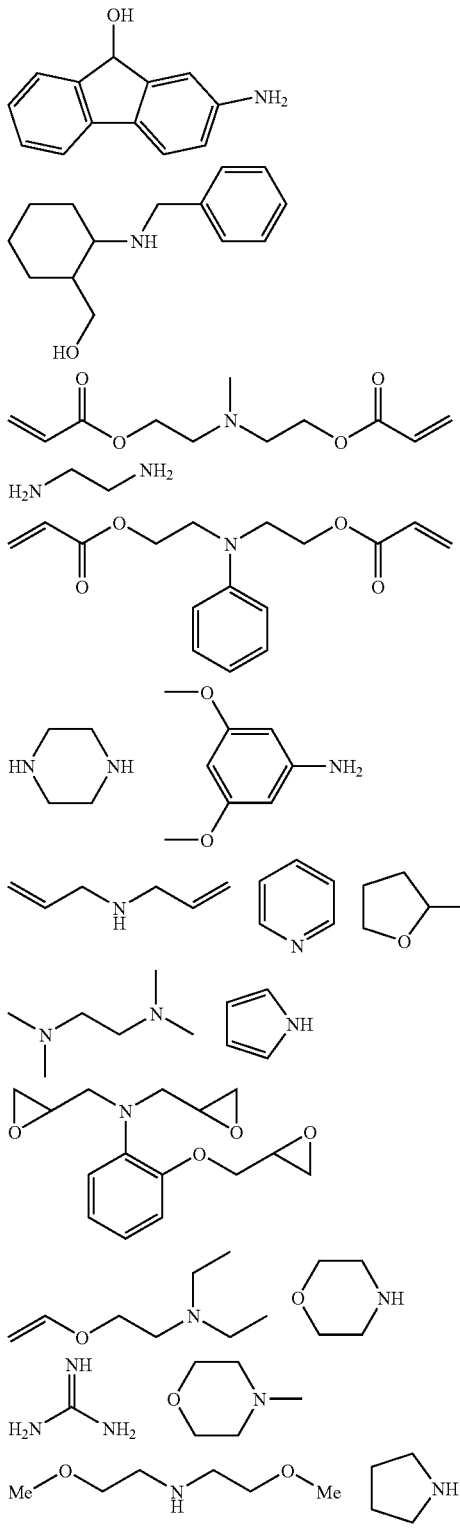

The molar ratio of the nitrogen-containing compound to the acid dye (referred to "n" hereinafter) in the salt between the acid dye and nitrogen-containing compound is described below. The molar ratio n is a value that determines the molar ratio between the acid dye molecule and an amine compound as a counter-ion, and may be freely selected depending on the condition for forming a salt of the acid dye-amine compound. Specifically, n is a value satisfying the relation of $0<n\leq10$ of the number of functional groups in the acid dye in most of the practical purposes, and may be selected by taking all the required performance such as solubility in organic solvents and developers used for preparation of the composition and development treatment, salt forming ability, light absorbance, interaction with other components in the curable composition, light resistance and heat resistance into consideration. When the ratio is selected only in terms of the absorbance, n is preferably a value satisfying the relation of $0<n\leq4.5$, more preferably the relation of $0<n\leq4$, and particularly the relation of $0<n\leq3.5$.

The dye essential in the invention and/or other dyes may have at least one addition polymerizable ethylenically unsaturated bond in the structure thereof. The organic solvent-soluble dye may be linked to a resin.

The concentration of the dye in the total solids in the dye-containing negative curable composition is usually from 0.5 to 97% by mass, preferably from 40 to 95% by mass, and particularly from 45 to 90% by mass, although the concentration differs depending on the kind of the dye.

(B) Oxime Photopolymerization Initiator

The dye-containing negative curable composition of the invention contains at least one oxime photopolymerization initiator (the initiator according to the invention). The oxime photopolymerization initiator is able to cure the curable composition by adding together with a radical polymerizable monomer when the dye-containing negative curable composition is constructed into a negative type.

Examples of the oxime photopolymerization initiator include the compounds described in JP-A Nos. 2000-80068, 2001-233842 and 2001-235858; Japanese Patent Application National Publication Nos. 2002-519732 and 2004-534797; and WO 2005-080337 and 2004-050653, however, it is not limited thereto.

Specific examples of the oxime photopolymerization initiator favorably include 2-(O-benzoyloxime)-1-[4-(phenyltio)phenyl]-1,2-octanedione, 1-(4-methylsulfanyl-phenyl)-butane-1,2-butan-2-oxime-O-acetate, 1-(4-methylsulfanyl-phenyl)-butane-1-onoxime-O-acetate, ethyl hydroxyimino-(4-methylsulfanyl-phenyl)acetate ester-O-acetate, ethyl hydroxyimino-(4-methylsulfanyl-phenyl)acetate ester-O-benzoate and 1-(O-acetyloxime)-1-[9-ethyl-6-(2-methylbenzoyl)-9H-carbazol-3-yl]ethanone.

2-(O-benzoyloxome)-1-[4-(phenyltio)phenyl]-1,2-octanedione and 1-(O-acetyloxime)-1-[9-ethyl-6-(2-methylbenzoyl)-9H-carbazol-3-yl]ethanone are particularly preferable among them.

While the oxime photopolymerization initiator includes isomers (A) and (B) from the chemical structure thereof, a mixture of isomers or one of the isomers may be used.

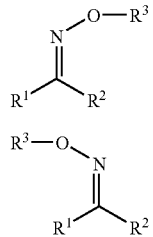

(A)

(B)

In (A) and (B), $R^1$ and $R^2$ represent the above described substituent, and $R^3$ represents the above described organic group. However, $R^1$ and $R^2$ do not simultaneously represent hydrogen atoms.

A plurality of the oxime photopolymerization initiators may be used by mixing in an arbitrary ratio.

Other photopolymerization initiators that may be used together with the oxime photopolymerization initiator will be described below.

The other photopolymerization initiators are not particularly restricted so long as they are able to polymerize monomers having polymerizable groups, and they are preferably selected in terms of characteristics, initiation efficiency, absorption wavelength, availability and cost.

Examples of the other photopolymerization initiators include (tri)halomethyl triazine compounds, α-aminoketone compounds and acylphosphine(oxide) compounds are favorable.

Examples of the (tri)halomethyl triazine compounds include as halomethyl-s-triazine compound such as vinyl-halomethyl-s-triazine compounds described in JP-A No. 59-1281, and 2-(naphto-1-yl)-4,6-bis-halomethyl-s-triazine and 4-(p-aminophenyl)-2,6-dihalomethyl-s-triazine compounds described in JP-A No. 53-133428.

Other examples include 2,4-bis(trichloromethyl)-6-p-methoxystyryl-s-triazine, 2,6-bis(trichloromethyl)-4-(3,4, methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphto-1-yl)-4,6-bis-trichloromethyl-s-triazine, 2-(4-methoxy-naphto-1-yl)-4,6-bis-trichloromethyl-s-triazine, 2-(4-ethoxy-naphto-1-yl)-4,6-bis-trichloromethyl-s-triazine, 2-(4-butoxy-naphto-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)-aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

Examples other than those described above are TAZ series manufactured by Midori Chemical Co. (for example TAZ-107, TAZ-110, TAZ-104, TAZ-109, TAZ-140, TAZ-204, TAZ-113 and TAZ-123).

Examples of the α-aminoketone compound include IRGACURE series manufactured by Ciba Specialty Chemicals, Inc. (for example IRGACURE 907 and IRGACURE 369), 2-methyl-1-phenyl-2-morpholinopropane-1-one, 2-methyl-1-[4-(hexyl)phenyl]-2-morpholinopropane-1-one, and 2-ethyl-2-dimethylamino-1-(4-morpholinophenyl)-butanone-1.

While the acylphosphine (oxide) compounds are not particularly restricted, examples thereof include IRGACURE 819, DAROCUR 4265 and DALOCUR TPO manufactured by Ciba Specialty Chemical Co.

Other known photopolymerization initiators may be used for the dye-containing negative curable composition of the invention other than the above-mentioned photopolymerization initiators. Examples thereof include vicinal polyketal donyl compounds described in U.S. Pat. No. 2,367,660, α-carbonyl compounds described in U.S. Pat. Nos. 2,367,661 and 2,367,670, acyloin ethers described in U.S. Pat. No. 2,448,828, aromatic acyloin compounds substituted with α-hydrocarbons described in U.S. Pat. No. 2,722,512, polynuclear quinone compounds described in U.S. Pat. Nos. 3,046,127 and 2,951,758, combinations of triallyl imidazole dimer/p-aminophenyl ketone described in U.S. Pat. No. 3,549,367, and benzothiazole compounds/trihalomethyl-s-triazine compounds described in Japanese Patent Application Publication (JP-B) No. 51-48516.

Specific examples include at least one active halogen compounds selected from halomethyl oxadiazole compounds and halomethyl-s-triazine compounds, 3-aryl substituted coumalin compounds, lophine dimers, benzophenone compounds and acetophenone compounds and derivatives thereof, and cyclopentadiene-benzene-iron complex and salts thereof.

Examples of active halogen compounds as halomethyl oxadiazole compounds include 2-halomethyl-5-vinyl-1,3,4-oxadiazole compounds described in JP-B No. 57-6096 and 2-trichloromethyl-5-styryl-1,3,4-oxadiazole, 2-trichloromethyl-5-(p-cyanostyryl)-1,3-4-oxadiazole and 2-trichloromethyl-5-(p-methoxystyryl)-1,3-4-oxadiazole.

T-series manufactured by PANCHIM Co., for example T-OMS, T-BMP, T-R and T-B, are also effective. IRGACURE series manufactured by Ciba Specialty Chemicals, Inc., for example IRGACURE 651, IRGACURE 184, IRGACURE 500, IRGACURE 1000, IRGACURE 149, IRGACURE 261 and DAROCUR 1173 are also effective.

Advantageously used other than those described above are 4,4'-bis(diethylamino)-benzophenone, 2-(O-benzoyloxime)-1-[4-(phenylthio)phenyl]-1,2-octanedione, 2-benzyl-2-dimethylamino-4-morpholinobutylophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer and benzoin isopropylether.

Sensitizers and photostabilizers may be used together with the photopolymerization initiator. Specific examples thereof include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, 2,4-diethyl thioxanthone, acridone, 10-butyl-2-chloroacridone, benzyl, dibenzalacetone, p-(dimethylamino)phenylstyryl ketone, p-(dimethylamino)phenyl-p-methylstyryl ketone, benzophenone, p-(dimethylamino)benzophenone (or Michler's ketone), p-(diethylamino)benzophenone and benzoanthrone, benzothiazole compounds described in JP-B No. 51-48516, and TINYVIN 1130 and 400.

The oxime photopolymerization initiator that are essential in the invention and/or other photopolymerization initiators may have at least one group having a surface active function in the structure such as addition polymerizable ethylenically unsaturated double bond, perfluoroalkyl structure or siloxane structure. These initiators also may bind to resin.

The total amount of the photopolymerization initiator in the dye-containing negative curable composition is usually 5% by mass or more relative to the total amount of the solids of the composition. The amount of the photopolymerization initiator is preferably 9% by mass or more, more preferably 12% by mass or more, relative to the total amount of the solids. The upper limit of the total amount of the photopolymerization initiator is usually 40% by mass, preferably 30% by mass or less, and more preferably 20% by mass or less.

The containing ratio of the initiator (oxime photopolymerization initiator) of the invention to the total amount from the view point of the effect of the invention is preferably from 100 to 20% by mass, more preferably from 100 to 30% by mass.

The mass ratio (B'/C') of the total amount (B') of photopolymerization initiator containing the oxime photopolymerization initiator (B) to the total amount (C') of radical polymerizable monomer (C) to be described below in the dye-containing negative curable composition is usually from 0.1 to 1. A ratio from 0.25 to 0.75 is more preferable, and a ratio from 0.3 to 0.70 is still more preferable. The polymerization reaction favorably proceeds when the mass ratio (B'/C') is within the above-mentioned range, and the strength of the film is not deteriorated due to a low molecular weight irrespective of large polymerization rate.

Preferable combination with the oxime photopolymerization comprises any one of the combinations of two compounds of a pyrazole azo compound and a pyridone azo compound, a sulfur-containing organic group-containing phthalocyanine and a pyrazole azo compound, or a sulfur-containing organic group-containing phthalocyanine and a pyrazolotriazole-containing azomethine compound.

It is preferable to add a heat polymerization inhibitor together with the photopolymerization initiator. Useful examples of the heat polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and 2-mercptobenzoimidazole.

(C) Radical Polymerizable Monomer

The dye-containing negative curable composition of the invention contains at least one radical polymerizable monomer. The radical polymerizable monomer is preferably a compound having at least one addition polymerizable ethylenically unsaturated double bond and a boiling point of 100° C. or more under an atmospheric pressure.

Examples of the radical polymerizable monomer include monofunctional acrylates or methacrylate such as polyethyleneglycol mono(meth)acrylate, polypropyleneglycol mono(meth)acrylate and phenoxyethyl(meth)acrylate; polyethyleneglycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate;

compounds adding ethyleneoxide or propyleneoxide followed by (meth)acrylating polyfunctional alcohols such as trimethylolpropane tri(acryloyloxypropyl) ether, tri(acryloyloxyethyl)isocyanulate, glycerin and trimethylol ethane; urethane acrylates described in JP-B Nos. 48-41708 and 50-6034 and JP-A No. 51-37193; polyester acrylates described in JP-A No. 48-64183 and JP-B Nos. 49-43191 and 52-30490; and polyfunctional acrylates and methacrylates such as epoxy acrylates such as epoxy acrylates as reaction products of epoxy resins and (meth)acrylic acid, and mixtures thereof. Other examples are those introduced as light-curable monomers and oligomers in Journal of Adhesion Society of Japan, Vol. 20, No. 7, p 300-308.

Radical polymerizable monomers containing carboxyl group such as those represented by formulae (V-1) and (V-2) described below may be also favorably used other than those described above. In formulae (V-1) and (V-2), the terminal at the carbon atom side is linked to R, X or W when T or G is an oxyalkylene group.

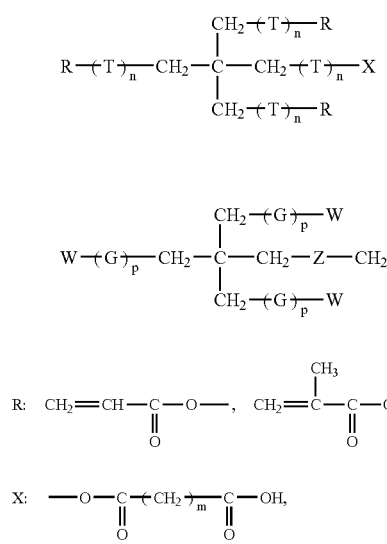

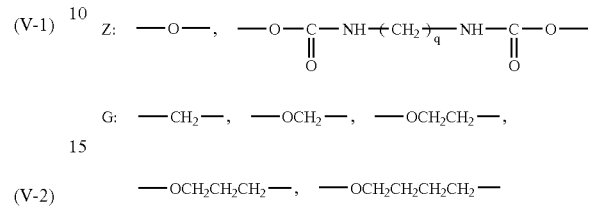

T: —CH$_2$—, —OCH$_2$—, —OCH$_2$CH$_2$—,

—OCH$_2$CH$_2$CH$_2$—, —OCH$_2$CH$_2$CH$_2$CH$_2$—

Z: —O—, —O—C(=O)—NH—(CH$_2$)$_q$—NH—C(=O)—O—

G: —CH$_2$—, —OCH$_2$—, —OCH$_2$CH$_2$—,

—OCH$_2$CH$_2$CH$_2$—, —OCH$_2$CH$_2$CH$_2$CH$_2$—

In formula (V-1), n is an integer from 0 to 14, and m is an integer from 1 to 8. In formula (V-2), W is R or X having the same meaning as in formula (V-1), and three or more of Ws within six Ws are R. p is an integer from 0 to 14, and q is an integer from 1 to 8. Plural R, X, T and G in one molecule may be the same or different to one another.

Favorable examples of the radical polymerizable monomers represented by above-mentioned formulae (V-1) and (V-2) are specifically shown in the following examples (compounds M-1 to M-12), and compounds M-2, M-3 and M-5 are preferable among them.

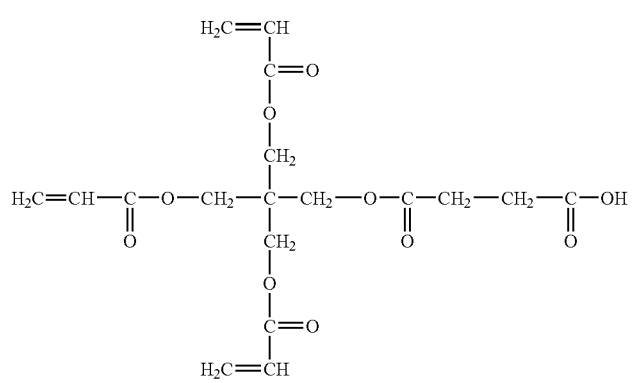

(M-1)

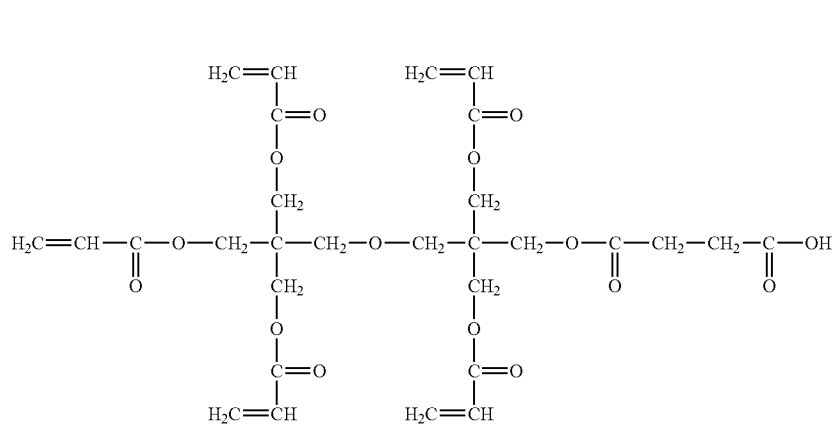

(M-2)

-continued
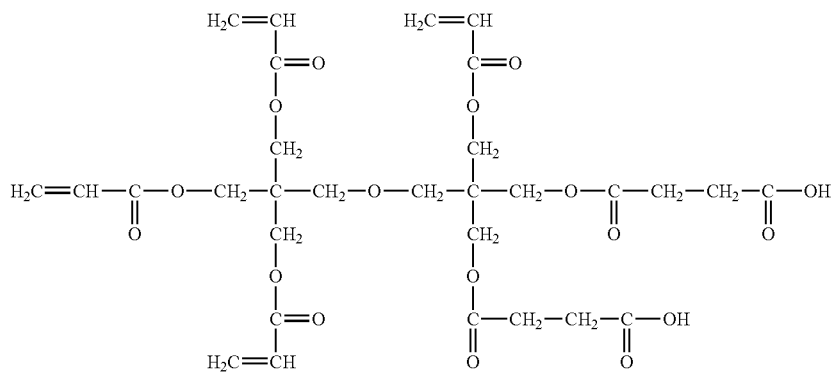
(M-3)
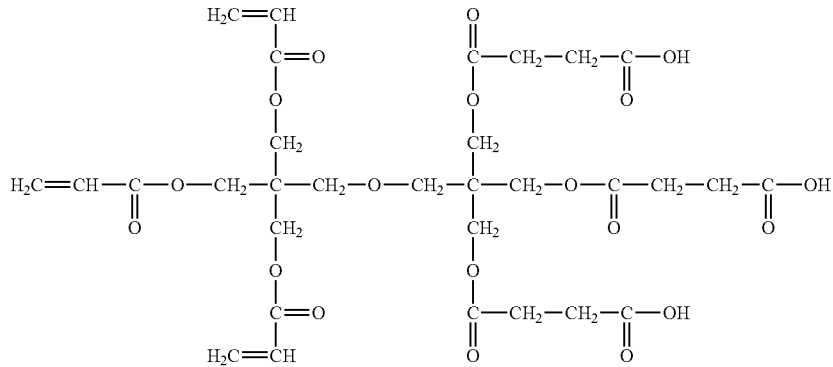
(M-4)
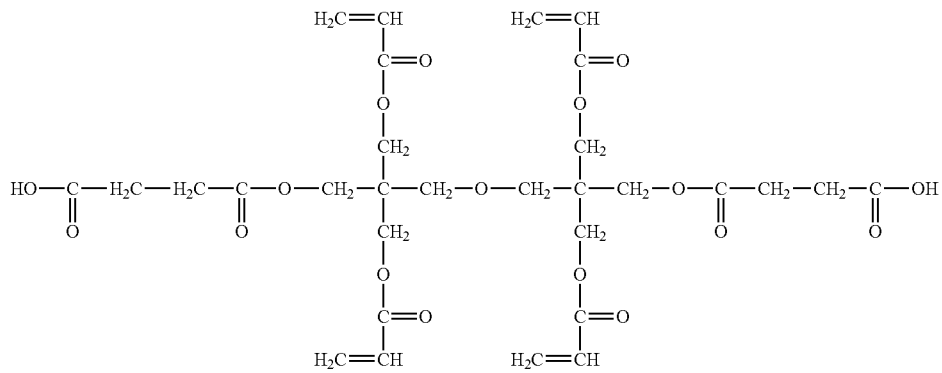
(M-5)
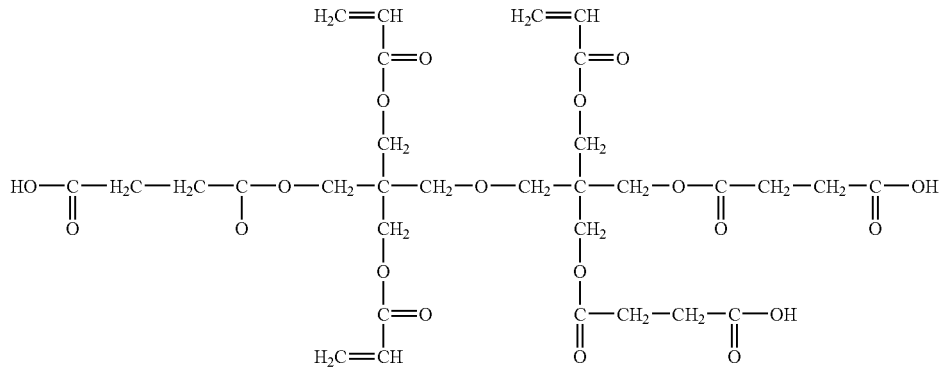
(M-6)

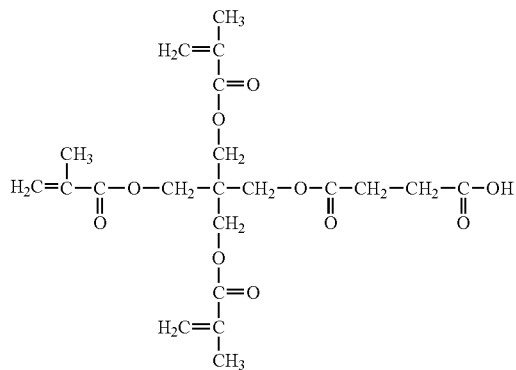
(M-7)
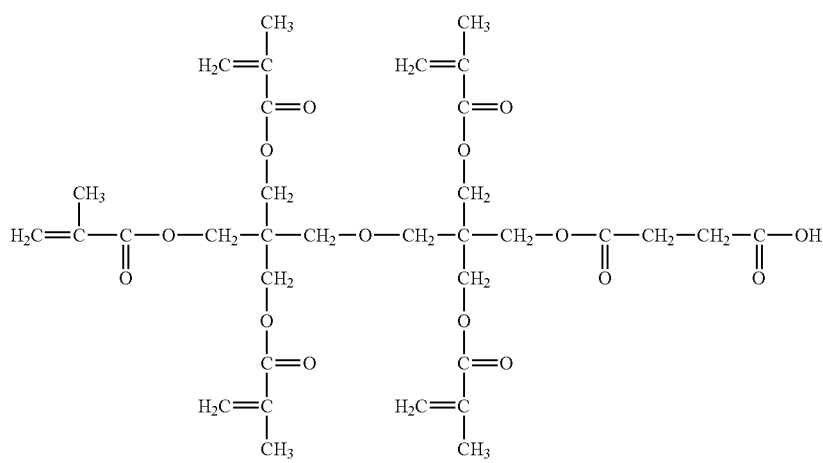
(M-8)
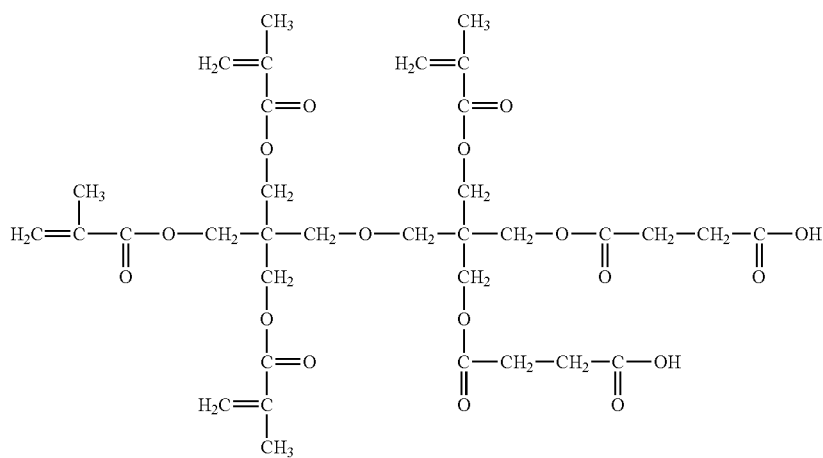
(M-9)

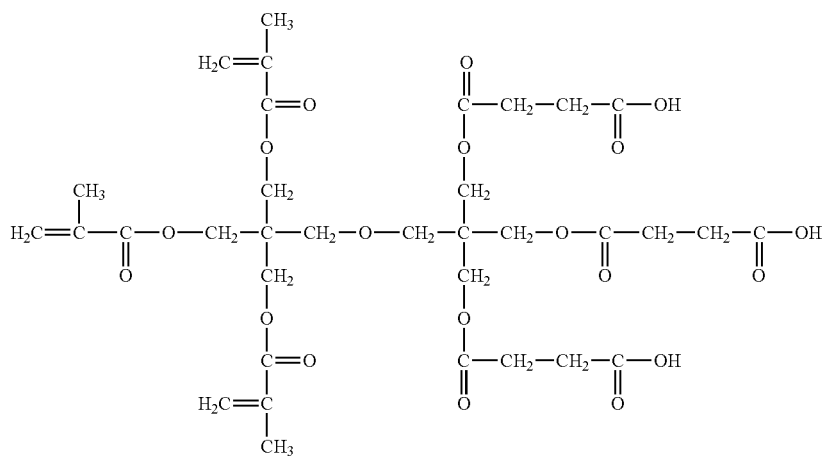

(M-10)

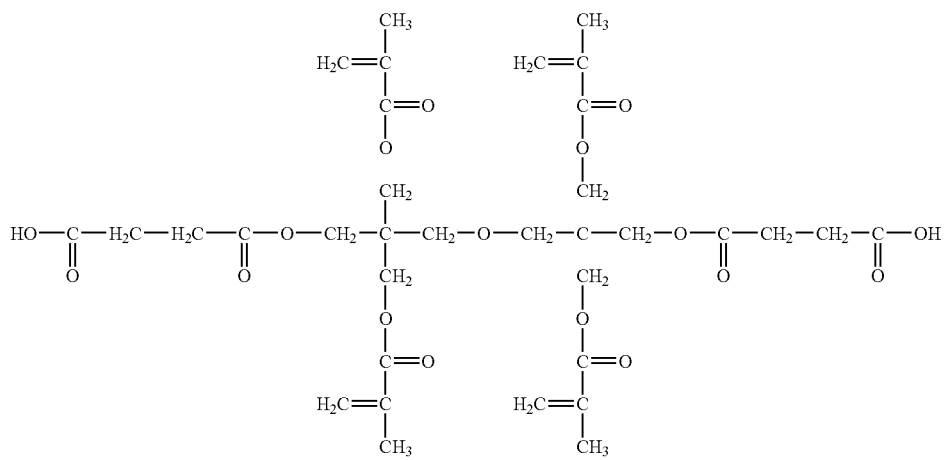

(M-11)

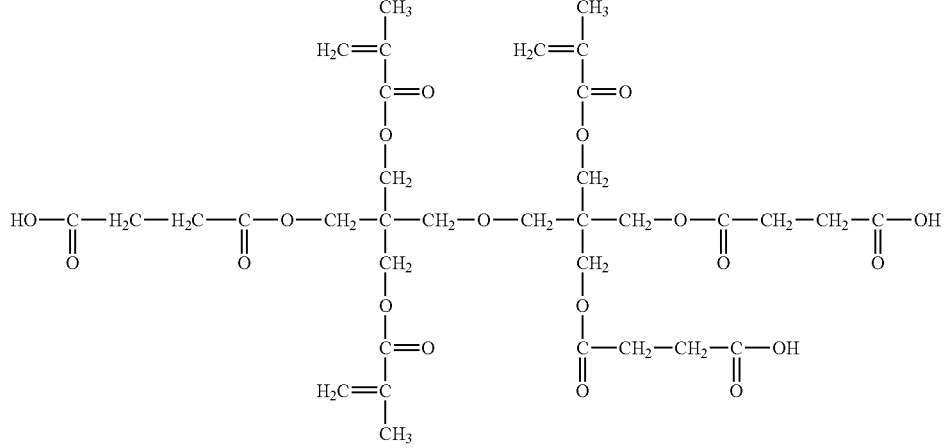

(M-12)

The content of the radical polymerizable monomer in the dye-containing negative curable composition is preferably 20% by mass or more, more preferably 30% by mass or more and most preferably 35% by mass or more in the total solids of the composition as a ratio of the solid fraction.

(D) Organic Solvent

An organic solvent (simply referred to a solvent in the specification) may be used for preparing the dye-containing negative curable composition of the invention. While the solvent is not basically restricted so long as it satisfies solubility of each component and applicability of the dye-containing negative curable composition, the solvent is preferably selected by taking solubility of the dye and alkali-soluble binder, applicability and safety into consideration.

Preferable examples of the organic solvent include esters such as ethyl acetate, n-butyl acetate, isobutyl acetate, amyl formate, isoamyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate;

3-oxypropionic acid alkyl esters such as methyl 3-oxypropionate and ethyl 3-oxypropionate, for example methyl 3-methoxypropionate, ethyl 3-methoxypropionate, methyl 3-ethoxypropionate and ethyl 3-ethoxypropionate; 2-oxypropionic acid alkyl esters such as methyl 2-oxypropionate, ethyl 2-oxypropionate and propyl 2-oxypropionate, for example methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methyl propionate and ethyl 2-ethoxy-2-methylpropionate; methylpyruvate, ethyl pyruvate, propyl pyruvate, methyl acetoacetate, ethyl acetoacetate, methyl 2-oxobutanate and ethyl 2-oxobutanate;

ethers such as diethyleneglycol dimethyl ether, tetrahydrofuran, ethyleneglycol monomethyl ether, ethyleneglycol monoethyl ether, methyl cellosolve acetate, ethyl cellosolve acetate, ethyl carbitol acetate, butyl carbitol acetate, diethyleneglycol monomethyl ether, diethyleneglycol monoethyl ether, diethyleneglycol monobutyl ether, propyleneglycol methyl ether, propyleneglycol methyl ether acetate, propyleneglycol ethyl ether acetate and propyleneglycol propyl ether acetate;

ketones such as methylethyl ketone, cyclohexanone, cyclopentanone, 2-heptanone and 3-heptanone; and aromatic hydrocarbons such as toluene and xylene.

Methyl 3-ethoxypropionate, ethyl 3-ethoxypropionate, ethyl cellosolve acetate, ethyl lactate, diethyleneglycol dimethyl ether, butyl acetate, methyl 3-methoxypropionate, 2-heptanone, cyclohexanone, cyclopentanone, ethyl carbitol acetate, butyl carbitol acetate, propyleneglycol methyl ether and propyleneglycol methyl ether acetate are more preferable among them.

One or a plurality of them are preferably selected from cyclohexanone, ethyl lactate, propyleneglycol monomethyl ether acetate, propyleneglycol monomethyl ether and ethyl 3-ethoxypropionate in terms of solubility of each component and viscosity after preparation, and one or both of propyleneglycol monomethyl ether and ethyl 3-ethoxypropionate are more preferably selected in terms of time dependent stability of the liquid and applicability.

(E) Other Components

Resin (Binder)—

Resins (binders) may be used in the dye-containing negative curable composition of the invention. The resin may be appropriately selected from those known in the art irrespective of alkali soluble or alkali insoluble.

The resin is favorably a resin soluble in an alkali solution (referred to alkali-soluble binder hereinafter). The alkali-soluble binder hereinafter will be described below.

While the alkali-soluble binder is not particularly restricted so long as it is soluble in an alkali solution, it is preferably selected in terms of heat resistance, developability and availability.

The alkali-soluble binder is preferably a linear organic polymer soluble in an organic solvent and is able to be developed with an aqueous weak alkali solution. Examples of such linear organic polymer include polymers having carboxylic acids at the side chains such as methacrylic acid copolymers, acrylic acid copolymers, itaconic acid copolymers, crotonic acid copolymers, maleic acid copolymers and partially esterified maleic acid copolymers, and acidic cellulose derivatives having carboxylic acids at the side chains described in JP-A Nos. 59-44615, 59-53836 and 59-71048, and JP-B Nos. 54-34327, 58-12577 and 54-25957, are also useful.

Other useful polymers are those having hydroxyl groups to which an acid anhydride is added, polyhydroxystyrene resins, polysiloxane resins, poly(2-hydroxyethyl(meth) acrylate), polyvinyl pyrrolidone, polyethylene oxide and polyvinyl alcohol.

Monomers having hydrophilic groups may be copolymerized, and examples of such monomers include alkoxyalkyl (meth)acrylate, hydroxyalkyl(meth)acrylate, glycerol (meth) acrylate, (meth)acrylamide, N-methylol acrylamide, sec- or tert-alkyl acrylamide, dialkylaminoalkyl(meth)acrylate, morpholine (meth)acrylate, N-vinyl pyrrolidone, N-vinyl caprolactam, vinyl imidazole, vinyl triazole, methyl(meth) acrylate, ethyl(meth)acrylate, branched or linear propyl (meth)acrylate, branched or linear butyl(meth)acrylate and phenoxyhydroxypropyl(meth)acrylate.

Monomers comprising tetrahydrofulfuryl group, phosphate site, phosphate ester site, quaternary ammonium salt site, ethyleneoxy chain, propyleneoxy chain, sulfonic acid group and salts thereof, and morpholinoethyl group are also useful as hydrophilic monomers.

Polymers may have polymerizable groups at the side chains from the view point of improving cross-linking efficiencies, and polymers having aryl group, (meth)acrylic group and aryloxyalkyl group at the side chains are also useful. While examples of the polymer having these polymerizable groups are shown below, the polymer is not restricted thereto so long as it contains an alkali soluble group such as COOH group, OH group or ammonium group and contains carbon-carbon unsaturated bond.

Specific examples available include compounds obtained by allowing a compound having an epoxy ring reactive to the OH group and carbon-carbon unsaturated bond (for example compound such as glycidyl acrylate) to react with a copolymer of, for example, 2-hydroxyethyl acrylate having a OH group, methacrylic acid having a COOH group and a acrylic or vinyl monomer copolymerizable with these monomers.

Monomers having an epoxy ring as well as monomers having acid anhydride, isocyanate or acryloyl group may be used as monomers reactive to the OH group. A reaction product obtained by allowing a compound, which is obtained by allowing a compound having an epoxy ring to react with an unsaturated carboxylic acid such as acrylic acid, to react with a saturated or unsaturated polybasic acid anhydride may be also used as described in JP-A Nos. 6-102669 and 6-1938.

Examples of the compound having both an alkali soluble group such as COOH group and a carbon-carbon unsaturated bond include DIANAL NR series (trade name: manufactured by Mitsubishi Rayon Co.), PHOTOMER 6173 (trade name: COOH group-containing polyurethane acrylic oligomer, manufactured by Diamond Shamrock Co.), VISCOAT R-264 and KS resist 106 (trade names: manufactured by Osaka Organic Chemistry Co.), CYCLOMER P series, PLAKCEL CF 200 series (trade names: manufactured by Daicel Chemical Industry Co.) and EBECRYL 3800 (trade name: manufactured by Daicel UCB Co.)

When a resin (binder) is contained, the content thereof in the dye-containing negative curable composition of the resin is usually from 0.5 to 90% by mass relative to the amount of the total solids of the composition.

—Surfactant—

A surfactant may be further used in the composition of the invention. The surfactant may be selected from known surfactants depending on the object.

Examples of the preferable surfactant include nonionic surfactants, for example polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitane monostearate, sorbitane monooleate, sorbitan trioleate and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorinated surfactant or silicon surfactant such as EFTOP EF301, EF303 and EF352 (trade names: manufactured by Shin-Akita Kasei Co.), MEGAFACE F171 and F173 (trade name: manufactured by Dainippon Ink & Chemicals, Inc.), FLUORAD FC430 and FC431 (trade names: manufactured by Sumitomo 3M Co.), ASAHI GUARD AG710, SURFLON S-382, SC101, SC102, SC103, SC104, SC105 and SC106 (trade names: manufactured by Asahi Glass Co.), and TROYSOL S-366 (trade name: manufactured by Troy Chemical Co.); organosiloxane polymer KP341 (trade name: manufactured by ShinEtsu Chemical Co.), and acrylic or methacrylic (co)polymerized POLYFLOW Nos. 75 and 95 (trade names, manufactured by Kyoeisha Oil and Fat Chemical Co.).

The surfactant preferably comprises any one or plural of fluorinated and/or silicon surfactant (fluorinated surfactant and silicon surfactant, or a surfactant containing both fluorine atom and silicon atoms).

Examples of the surfactant include those described in JP-A Nos. 62-36663, 61-226746, 61-226745, 62-170950, 63-34540, 7-230165, 8-62834, 9-54432, 9-5988 and 2002-277862, and U.S. Pat. Nos. 5,405,720, 5,360,692, 5,529,881, 5,296,330, 5,436,098, 5,576,143, 5,294,511 and 5,824,451. Commercially available surfactants may be directly used.

Examples of the commercially available surfactant include fluorinated surfactants or silicon surfactant such as EFTOP EF301 and EF303 (trade names: manufactured by Shin Akita Kasei Co.), FLUORAD FC430 and 431 (trade names: manufactured by Sumitomo 3M Co.), MEGAFACE F171, F173, F176, F189 and R08 (trade names: manufactured by Dainippon Ink & Chemicals, Inc.), SURFLON S-382, SC101, 102, 103, 104, 105, 106 (trade names: manufactured by Asahi Glass Co.), and TROYSOL S-366 (trade name: manufactured by Troy Chemical Co.). Polysiloxane polymer KP-341 (trade name: manufactured by ShinEtsu Chemical Industry Co.) may be used as the silicon surfactant.

Surfactants using polymers having fluoro-aliphatic groups derived from fluoro-aliphatic compounds produced by a telomerization method (also referred to a telomer method) or an oligomerization method (also referred to an oligomer method) may be used as the surfactants other than the above-mentioned known surfactants. The fluoro-aliphatic compound can be synthesized according to the method described in JP-A No. 2002-90991.

The polymer having the fluoro-aliphatic group is preferably a copolymer of a monomer having a fluoro-aliphatic group and (poly(oxyalkylene))acrylate and/or (poly (oxyalkylene))methacrylate, and the monomer may be either irregularly distributed or form block copolymers in the polymer. Examples of the poly(oxyalkylene) group include poly (oxyethylene) group, poly(oxypropylene) group and poly (oxybutylene) group, and may be a unit having alkylenes with different chain lengths in the same chain such as a block linkage group of poly(oxyethylene-oxypropylene-oxyethylene) and a block linkage group of poly(oxyethylene-oxypropylene). The copolymer of a monomer having the fluoroaliphatic group and (poly(oxyalkylene)acrylate (or methacrylate) may be a binary copolymer as well as a ternary or higher copolymer in which monomers having plural kinds of fluoro-aliphatic groups and plural kinds of (poly(oxyalkylene))acrylates (or methacrylates) are simultaneously copolymerized.

Examples of the commercially available surfactant include MEGAFACE F178, F470, F473, F475, F476, F472 (trade names: manufactured by Dainippon Ink and Chemical Co.). Other examples include a copolymer of acrylate (or methacrylate) having $C_6F_{13}$ group and (poly(oxyalkylene))acrylate (or methacrylate); a copolymer of acrylate (or methacrylate) having $C_6F_{13}$ group, (poly(oxyethylene))acrylate (or methacrylate) and (poly(oxypropylene))acrylate (or methacrylate); a copolymer of acrylate (or methacrylate) having $C_8F_{17}$ group and (poly(oxyalkylene))acrylate (or methacrylate); and a copolymer of acrylate (or methacrylate) having $C_8F_{17}$ group, (poly(oxyethylene))acrylate (or methacrylate), and (poly(oxypropylene))acrylate (or methacrylate).

These surfactants may be added, alone or as a combination of some of them.

When the composition contains a surfactant, the content of the surfactant in the dye-containing negative curable composition is preferably from 0.0001 to 5% by mass, more preferably from 0.01 to 1% by mass, relative to the total mass of the composition.

—Cross-Linking Agent—

A film that has been more highly cured can be obtained in the invention by additionally using a cross-linking agent. The cross-linking agent will be described below.

The cross-linking agent is not particularly restricted so long as it is able to cure the film by a cross-linking reaction. Examples of the cross linking agent include (a) epoxy resin, (b) melamine compound, guanamine compound, glycoluril compound or urea compound, substituted with at least one substituent selected from methylol group, alkoxymethyl group and acyloxymethyl group, and (c) phenol compound, naphthol compound or hydroxyanthracene compound, substituted with at least one substituent selected from methylol group, alkoxymethyl group and acyloxymethyl group. Polyfunctional epoxy resins are preferable among them.

The epoxy resin (a) may be any epoxy resins having the epoxy group and being able to form cross links. Examples of the epoxy resin include divalent glycidyl group-containing low molecular weight compounds such as bisphenol A diglycidyl ether, ethyleneglycol diglycidyl ether, butanediol diglycidyl ether, hexanediol diglycidyl ether, dihydroxybiphenyl diglycidyl ether, phthalic acid diglycidyl ester and N,N-diglycidyl aniline; trivalent glycidyl group-containing low molecular weight compounds represented by trimethylolpropane triglycidyl ether, trimethylolphenol triglycidyl ether and Tris P-PA triglycidyl ether; tetravalent glycidyl group-containing low molecular weight compounds represented by pentaerythritol tetraglycidyl ether and tetramethylol bisphenol A tetraglycidyl ether; polyvalent glycidyl group-containing low molecular weight compounds such as dipentaerythritol pentaglycidiy ether and dipentaerythritol hexaglycidiyl ether; and glycidyl group-containing polymer compounds represented by polyglycidyl(meth)acrylate and 1,2-epoxy-4-(2-oxylanyl)cyclohexane adduct of 2,2-bis(hydroxymethyl)-1-butanol.

While the number of substitution of the methylol group, alkoxymethyl group and acyloxymethyl group contained in cross-linking agent (b) is from 2 to 6 in the melamine compound, from 2 to 4 in the glycoluril compound, guanamine compound and urea compound, the number is preferably from 5 to 6 in the melamine compound, and from 3 to 4 in the glycoluril compound, guanamine compound and urea compound.

The melamine compound, guanamine compound, glycoluril compound and urea compound are collectively named as compounds according to (b) (methylol group-containing compound, alkoxymethyl group-containing compound or acyloxymethyl group-containing compound).

The methylol group-containing compound according to (b) is obtained by heating the alkoxymethyl group-containing compound according to (b) in the presence of an acid catalyst such as hydrochloric acid, sulfuric acid, nitric acid or methanesulfonic acid in alcohol. The acyloxymethyl group-containing compound according to (b) is obtained by mixing the methylol group-containing compound according to (b) with acyl chloride with stirring in the presence of a basic catalyst.

Specific examples of the compound according to (b) having the above-mentioned substituent will be described below.

Examples of the melamine compound include hexamethylol melamine, hexamethoxymethyl melamine or compounds in which 1 to 5 methylol groups of hexamethylol melamine are methoxymethylated or mixtures thereof; and hexamethoxyethyl melamine, hexaacyloxymethyl melamine or compounds in which 1 to 5 methylol groups of hexamethylol melamine are acyloxymethylated or mixtures thereof.

Examples of the guanamine compound include tetramethylol guanamine, tetramethoxymethyl guanamine or compounds in which 1 to 3 methylol groups of tetramethylol guanamine are methoxymethylated or mixtures thereof; or tetramethoxyethyl guanamine, tetraacyloxymethyl gyanamine or compounds in which 1 to 3 methylol groups of tetramethylol guanamine are acyloxymethylated or mixtures thereof.

Examples of the glycoluril compound include tetramethylol glycoluril, tetramethoxymethyl glycoluril or compounds in which 1 to 3 methylol groups of tetramethylol glycoluril are methoxymethylated or mixtures thereof; or compounds in which 1 to 3 methylol groups of tetramethylol glycoluril are acyloxymethylated or mixtures thereof.

Examples of the urea compound include tetramethylol urea, tetramethoxymethyl urea, compounds in which 1 to 3 methylol groups of tetramethylol urea are methoxymethylated or mixtures thereof, or tetramethoxyethyl urea.

The compounds according to (b) may be used alone, or as a combination thereof.

The cross-linking compound (c), or the phenol compound, naphthol compound or hydroxyanthracene compound, substituted with at least one group selected from methylol group, alkoxymethyl group and acyloxymethyl group suppresses intermixing of an overcoat photoresist by heat cross-linking as the cross-linking agent (b) does, while it further enhances the strength of the film. These compounds are collectively named as the compounds according to (c) (methylol group-containing compounds, alkoxymethyl group-containing compounds or acyloxymethyl group-containing compounds).

The number of methylol groups, acyloxymethyl groups or alkoxymethyl groups contained in the cross-linking agent (c) necessary is at least 2 per one molecule, and compounds in which all the positions 2 and 4 of the phenol compound as a frame are substituted are preferable. All of the ortho and para positions to the OH group of the naphthol compound and hydroxyanthracene compound that serve as frames are preferably substituted.

The position 3 or 5 of the phenol compound may be substituted or non-substituted. The positions other than the ortho position to the OH group in the naphthol compound may be substituted or non-substituted.

The methylol group-containing compound according to (c) is obtained by using a compound in which the ortho position or para position to the phenolic OH group (position 2 or 4) is hydrogen as a starting material, and by allowing the compound to react with formalin in the presence of a basic catalyst such as sodium hydroxide, potassium hydroxide, ammonia or tetraalkyl ammonium hydroxide.

The alkoxymethyl group-containing compound according to (c) is obtained by heating the methylol group-containing compound according to (c) in the presence of an acid catalyst such as hydrochloric acid, sulfuric acid, nitric acid or methanesulfonic acid in alcohol.

The acyloxymethyl group-containing compound according to (c) is obtained by allowing the methylol group-containing compound according to (c) to react with acyl chloride in the presence of a basic catalyst.

Examples of the frame compound in the cross-linking agent (c) include phenol compounds, naphthol compounds and hydroxyanthracene compounds in which the ortho or para position to the phenolic OH group is non-substituted, and examples of the compound available include phenol, isomers of cresol, 2,3-xylenol, 2,5-xylenol, 3,4-xylenol, 3,5-xylenol, bisphenols such as bisphenol A, 4,4'-bishydroxybiphenyl, Tris P-PA (trade name: manufactured by Honshu Chemical Co.), naphthol, dihydroxynaphthalene and 2,7-dihydroxyanthracene.

Specific examples of the cross-linking agent (c) as phenol compounds or naphthol compounds include compounds in which one or two methylol groups of trimethylol phenol, tri(methoxymethyl)phenol and trimethylol phenol are methoxymethylated; compounds in which one or two methylol groups in trimethylol-3-cresol, tri(methoxymethyl)-3-cresol or trimethylol-3-cresol are methoxymethylated; compounds in which one to three methylol groups of dimethylol cresol such as 2,6-dimethylol-4-cresol, tetramethylol bisphenol A, tetramethoxymethyl bisphenol A or tetramethylol bisphenol A are methoxymethylated; hexamethylol compounds of tetramethylol-4,4'-bishydroxybiphenyl, tetramethoxymethyl-4,4'-bishydroxybiphenyl and Tris P-PA; hexamethoxymethyl compound of Tris P-Pa; compounds in which one to five methylol groups of the hexamethylol compound of Tris P-PA are methoxymethylated; and bishydroxymethyl naphthalenediol.

Examples of the hydroxyanthracene compound include 1,6-dihydroxymethyl-2,7-dihydroxyanthracene.

Examples of the acyloxymethyl group-containing compound include compounds in which a part or all of the methylol groups of the methylol group-containing compound are acyloxymethylated.

Phenol compounds in which hexamethylol compounds of trimethylolphenol, bishydroxymethyl-p-cresol, tetramethylol bisphenol A or Tris P-PA (trade name: manufactured by Honshu Chemical Co.), or methylol groups thereof, are substituted with alkoxymethyl group or both the methylol group and alkoxymethyl group are preferable among these compounds.

The compounds according to (c) may be used alone or as a combination thereof.

The composition of the invention is not always required to contain the cross-linking agent. While the total content of the cross-linking agents (a) to (c) in the dye-containing negative curable composition is different depending on the materials, the content is preferably from 1 to 70% by mass, more preferably from 5 to 50% by mass, relative to the total solids (mass) of the composition.

—Additives—

Various additives such as fillers, polymer compounds other than those described above, adhesion accelerating agent, antioxidants, UV absorbing agents, aggregation inhibitors and transition metal complexes may be optionally blended in the dye-containing negative curable composition of the invention.

Specific examples of the additives include fillers such as glass and alumina; polymer compounds other than binding resins such as polyvinyl alcohol, polyacrylic acid, polyethyleneglycol monoalkyl ether, polyfluoroalkyl acrylate; adhesion accelerating agents such as vinyltrimethoxy silane, vinyltriethoxy silane, vinyltris(2-methoxyethoxy)silane, N-(2-aminoethyl)-3-aminopropyl methyldimethoxysilane, N-(2-aminoethyl)-3-aminopropyl trimethoxysilane, 3-aminopropyl triethoxysilane, 3-glycidoxypropyl trimethoxysilane, 3-glycidoxypropylmethyl dimethoxysilane, 2-(3,4-epoxycyclohexyl)ethyl trimethoxysilane, 3-chloropropylmethyl dimethoxysilane, 3-chloropropyl trimethoxysilane, 3-methacryloxypropyl trimethoxysilane and 3-mercaptopropyl trimethoxysilane; antioxidants such as 2,2-thiobis(4-methyl-6-t-butylphenol) and 2,6-di-t-butylphenol; UV absorbing agents such as 2-(3-t-butyl-5-methyl-2-hydroxyphenyl)-5-chlorobenzotriazole and alkoxy benzophenone; and coagulation inhibitors such as sodium polyacrylate.

A transition metal complex having a maximum molar absorbance coefficient $\epsilon$ smaller than the molar absorbance coefficient $\epsilon$ of the dye in the visible region may be used in the dye-containing negative curable composition of the invention. Negative, neutral or positive monodentate or multidentate ligands are coordinated around a transition metal atom or transition metal ion at the center in this transition metal complex, which is effective for improving light resistance of the dye-containing negative curable composition and the color filter using the composition.

The transition metal complex preferably has the maximum molar absorbance coefficient $\epsilon$ from 0 to 8000 in the visible region (380 to 780 nm) in terms of sharpness of the color. The transition metal complex preferably has a maximum absorbance coefficient $\epsilon$ from 0 to 6000, still more preferably from 0 to 3000 in the same wavelength region.

Examples of the transition metal constituting the transition metal atom or transition metal ion of the transition metal complex include scandium (Sc), titanium (Ti), vanadium (V), chromium (Cr), manganese (Mn), iron (Fe), cobalt (Co), nickel (Ni), copper (Cu), yttrium (Y), zirconium (Zr), niobium (Nb), molybdenum (Mo), technetium (Tc), ruthenium (Ru), rhodium (Rh), palladium (Pd), silver (Ag), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt) and gold (Au).

Preferable examples of the transition metal complex are those composed of transition metals belonging to the first series (fourth period in the extended periodic table), for example scandium (Sc), titanium (Ti), vanadium (V), chromium (Cr), manganese (Mn), iron (Fe), cobalt (Co), nickel (Ni) and copper (Cu). Mn, Fe, Co, Ni and Cu are preferable among them.

The ligand itself as the ligand of the transition metal complex preferably has a maximum molar absorbance coefficient $\epsilon$ from 0 to 3000, more preferably from 0 to 2000, and most preferably from 0 to 1000 in the visible region.

The molecular weight of one ligand in the transition metal complex is preferably from 20 or more to less than 300 in terms of light resistance and alkali developability.

An organic carboxylic acid, preferably a low molecular weight organic carboxylic acid with a molecular weight of 1000 or less, may be added to the composition for attempting developability of the dye-containing negative curable composition of the invention to be further improved by enhancing solubility of non-cured portions in an alkali solution.

Specific examples of the organic carboxylic acid include aliphatic monocarboxylic acids such as formic acid, acetic acid, propionic acid, butyric acid, valeric acid, pivalic acid, capronic acid, diethylacetic acid, enanthic acid and caprylic acid; aliphatic dicarboxylic acid such as oxalic acid, malonic acid, succinic acid, glutaric acid, adipic acid, pimelic acid, suberic acid, azelaic acid, cebacic acid, brassylic acid, methylmalonic acid, ethylmalonic acid, dimethylmalonic acid, methylsuccinic acid, tetramethylsuccinic acid and citraconic acid; aliphatic tricarboxylic acid such as tricarbarylic acid, aconitic acid and camphoronic acid; aromatic monocarboxylic acid such as benzoic acid, toluic acid, cuminic acid, hemellitic acid and mesitylenic acid; aromatic polycarboxylic acid such as phthalic acid, isophthalic acid, terephthalic acid, trimellitic acid, trimesic acid, mellophanic acid and pyromellitic acid; and other carboxylic acid such as phenylacetic acid, hydratropic acid, hydrocinnamic acid, mandelic acid, phenylsuccinic acid, atropic acid, cinnamic acid, methyl cinnamate, benzyl cinnamate, cinnamylidene acetic acid, coumaric acid and unberic acid.

The dye-containing negative curable composition of the invention may be favorably used as color filters used for liquid crystal display devices (LCD) and solid state image pickup devices (for example CCD and CMOS), for forming colored pixels of electroluminescence color filters, and for preparing printing inks, ink-jet inks and paints.

<<Color Filter and Production Method Thereof>>

The color filter of the invention will be described in detail by means of the production method thereof.

The color filter of the invention is produced using the dye-containing negative curable composition of the invention as hitherto described. In particular, the production process comprises forming a radiation sensitive composition layer, by a coating method such as spin coating, flow coating or roll coating of the dye-containing negative curable composition onto a substrate; and forming a negative colored pattern, by exposure through a predetermined mask pattern and developing by developer (image forming). The process may optionally include curing for curing the colored pattern formed by heating and/or exposure.

A color filter comprising a desired number of hues may be produced by repeating the image forming (and optionally the curing) according to the desired number of hues.

The light or radiation used for this process is preferably g-line, h-line or i-line of ultraviolet light.

The above-mentioned dye-containing negative curable composition of the invention is used in the color filter of the invention, and the filter preferably comprises a plurality of colored regions (for example colored regions of three colors of red (R), green (G) and blue (B)), provided on the substrate with a desired pattern (for example stripes, lattices or delta array). The color filter of the invention may be most favorably formed by the method for producing the color filter of the invention.

When colored regions of plural colors are provided on the substrate, at least two colors of the colored region constituting the color filter are preferably formed using the dye-containing negative curable composition comprising one of the combinations of two compounds (1) to (3) below:

(1) a pyrazole azo compound and a pyridone azo compound, (2) a phthalocyanine substituted with a sulfur-containing organic group and a pyrazole azo compound, or (3) a phthalocyanine substituted with a sulfur-containing organic group and a pyrazolotriazole-containing azomethine compound.

Details of the compounds in (1) to (3), and preferable aspects thereof are as described above.

Examples of the substrate include soda glass, PYLEX (trade name) glass and quartz glass and the glasses coated with a transparent conductive film used for the liquid crystal display element, and substrates for photoelectric transducer elements used for the image pickup element, for example a silicon substrate and a complementary metal oxide film semiconductor (CMOS). Black stripes for separating the pixels may be formed on the substrate.

An undercoat layer may be provided on the substrate if required for improving adhesivity to the upper layer, for preventing substances from being diffused and for planarizing the surface of the substrate.

Any developer may be used so long as the developer dissolves non-cured portions of the dye-containing negative curable composition of the invention while the cured portion is insoluble to the developer. Specifically, the developer available comprises a combination of various organic solvents or an aqueous alkali solution. The above-mentioned organic solvents used for preparing the dye-containing negative curable composition of the invention may be used as the organic solvent for the developer.

The favorably used aqueous alkali solution is prepared by dissolving an alkaline compound such as sodium hydroxide, potassium hydroxide, sodium carbonate, sodium silicate, sodium metasilicate, aqueous ammonia, ethylamine, diethylamine, dimethyl ethanolamine, tetramethyl ammonium hydroxide, tetraethyl ammonium hydroxide, choline, pyrrole, piperidine and 1,8-diazabicyclo-[5.4.0]-7-undecene in a concentration from 0.001 to 10% by mass, preferably from 0.01 to 1% by mass. In general, it is washed with water after development when the developer containing the aqueous alkali solution is used.

The color filter of the invention may be used for the liquid crystal display device (LCD) and solid state image pickup device (for example CCD and CMOS), and is particularly favorable for the CCD element and CMOS of high resolution having a pixel number exceeding $10^6$ pixels. The color filter may be used, for example, as a color filter disposed between light-receiving portions of the pixels constituting CCD and a micro-lens for focusing.

(Second Aspect)

The dye-containing negative curable composition in the second aspect of the invention, the color filter and production method thereof will be described in detail below.

<<Dye-Containing Negative Curable Composition>>

The dye-containing negative curable composition of the invention (may be referred to the "composition of the invention" hereinafter) comprises at least two organic solvent-soluble dyes (A) independently selected from a heterocyclic azo compound, a phthalocyanine compound or an azomethine compound, at least one oxime photopolymerization initiator (B), at least one radical polymerizable monomer (C), and at least one organic solvent (D), and the moisture content of the composition is less than 1% by mass of the total amount of the composition.

The composition preferably comprises a resin (binder) and a surfactant, optionally a cross-linking agent, a photosensitive agent, a sensitizer and a photoacid generating agent.

(A) Organic Solvent-Soluble Dye

The composition of the invention contains at least two dyes (A) as organic solvent-soluble dyes independently selected from a heterocyclic azo compound, a phthalocyanine compound or an azomethine compound. These dyes are effective for improving time-dependent stability and for reducing the proportion of fluctuation of pattern line width due to fluctuation of the exposure value by combining with the oxime photopolymerization initiator to be described below.

It is more preferable that the at least two organic solvent-soluble dyes are independently selected from a nitrogen-containing azo compound, a phthalocyanine compound substituted with organic substituent or an azomethine compound containing a nitrogen-containing-heterocyclic ring, more preferably selected from pyrazole azo compound, pyridone azo compound, pyridine azo compound, pyrimidine azo compound, phthalocyanine compound substituted with a sulfur-containing organic group and pyrazolotriazole-containing azomethine compound. It is further preferable that the dye comprises one of the combinations of two compounds of (1) a pyrazole azo compound and a pyridone azo compound, (2) a phthalocyanine compound substituted with a sulfur-containing organic group and a pyrazole azo compound or (3) a phthalocyanine compound substituted with a sulfur-containing organic group and a pyrazolotriazole-containing azomethine compound.

The organic solvent-soluble dye preferably comprises at least one acidic group, and it is further preferable that at least two dyes of the organic solvent-soluble dyes comprise acidic groups. The acidic groups may be contained at arbitrary positions of the organic solvent-soluble dye. While any acidic group is available so long as it is a functional group being able to be dissociated in an aqueous alkali solution, specific examples thereof include sulfonic acid, carboxylic acid, phenolic hydroxyl group, sulfonamide and phosphoric acid. These acidic groups may form salts with divalent or higher metals, and examples of the metal include magnesium, calcium, strontium, barium, zinc, aluminum, nickel, copper, cobalt and iron.

Constituting components of the composition of the invention will be described in detail hereinafter.

[Heterocyclic Azo Compound]

The heterocyclic azo compound has an azo group (—N=N—) directly linked to a heterocyclic group.

The heterocyclic group as used herein refers to a group having hetero-atoms (for example nitrogen, sulfur and oxygen atoms) in the ring. While the ring may be either a saturated ring or an unsaturated ring, an unsaturated ring is preferable. The ring may be either a single ring or a condensed ring, and may be either non-substituted or substituted with substituents.

Specific examples of the heterocyclic compound include furan, pyrrole, pyrazole, pyrazoline, imidazole, oxazole, thiazole, triazole, pyrane, pyridine, pyrimidine, pyrazine, triazine, pyridone, isothiazole, thiadiazole, benzothiazole, benzoxazole and benzoisothiazole. Heterocyclic groups containing nitrogen atoms in the ring (nitrogen-containing heterocyclic compound) are preferable among them, and pyrazole, pyridone, pyridine and pyrimidine are more preferable among them.

Specific examples of the heterocyclic azo compound are shown below. However, the invention is not restricted to these specific examples.

—Heterocyclic Azo Compound (1)—

An example of the heterocyclic azo compound is the pyridone azo compound represented by formula (A) below. The dye simultaneously satisfies high light resistance and heat resistance that have not been found in conventional azo compounds, and is able to be freely dissolved in water or in an organic solvent when necessary.

The pyridone azo compound represented by formula (A) includes tautomers.

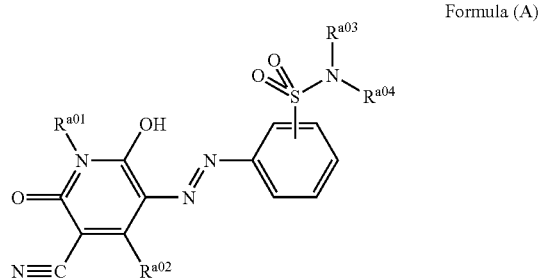

Formula (A)

In formula (A), $R^{a01}$, $R^{a03}$ and $R^{a04}$ each independently represents a hydrogen atom, an alkyl group having 1 to 21 carbon atoms, an alkenyl group having 2 to 21 carbon atoms, an aryl group having 6 to 21 carbon atoms, an aralkyl group having 7 to 21 carbon atoms or a substituent having hetero atom, and at least one of $R^{a01}$, $R^{a03}$ and $R^{a04}$ is a substituent having hetero atom. $R^{a03}$ and $R^{a04}$ may form a heterocyclic ring in combination with nitrogen atoms linked thereto. $R^{a02}$ represents an alkyl group having 1 to 10 carbon atoms, methoxymethyl group or trifluoromethyl group.

In the pyridone azo dye represented by formula (A), it is favorable that (1) $R^{a01}$ is a substituent having hetero atom, $R^{a03}$ and $R^{a04}$ each independently represents a hydrogen atom, an alkyl group having 1 to 21 carbon atoms, an alkenyl group having 2 to 21 carbon atoms, an aryl group having 6 to 21 carbon atoms or an aralkyl group having 7 to 21 carbon atoms, or (2) at least one of $R^{a03}$ and $R^{a04}$ is a substituent having hetero atom, and $R^{a01}$ represents a hydrogen atom, an alkyl group having 1 to 21 carbon atoms, an alkenyl group having 2 to 21 carbon atoms, an aryl group having 6 to 21 carbon atoms or an aralkyl group having 7 to 21 carbon atoms.

The case when the group represented by $R^{a01}$ is a substituent having hetero atom will be described first.

The "substituent having hetero atom" is not particularly restricted so long as it is a group derived from an amine containing hetero atom (for example nitrogen atoms, sulfur atoms and oxygen atoms) capable of being used for the synthesis of the pyridone ring. $R^{a01}$ may be substituted or non-substituted.

The "substituent having hetero atom" represented by $R^{a01}$ is preferably a substituent having a total number of atoms from 3 to 50, more preferably having a total number of atoms from 3 to 40, and particularly preferably having a total number of atoms from 3 to 30 in terms of chromatic valance, and a substituent having at least one of nitrogen atom sulfur atom and oxygen atom and having a total number of atoms from 3 to 30 is most preferable.

The "substituent having hetero atom" represented by $R^{a01}$ can be introduced by closing a pyridone ring with an amide compound obtained by reaction of a cyanoacetic acid ester with a primary amine. Accordingly, examples of the "substituent having hetero atom" represented by $R^{a01}$ include a group derived from a primary amine containing hetero atom described in "Aldrich Structure Index".

Specific examples of the "substituent having hetero atom" represented by $R^{a01}$ include 2-methoxyethyl group, 3-methoxypropyl group, 3-ethoxypropyl group, 3-butoxypropyl group, 2-methoxy-1-methyl-ethyl group, tetrahydrofurfuryl group, hydroxyethyl group, hydroxypropyl group, 4-hydroxybutyl group, 2-hydroxy-1-methylethyl group, hydroxyethoxyethyl group, 3-N-morphorinopropyl group, 2-N-morpholinoethyl group, 3-N-pyrrolidinonylpropyl group, 2-dimethylaminoethyl group, 3-dimethylaminopropyl group, 3-diethylaminopropyl group, 2-N-pyrrolidinylethyl group, 2-(N-methyl-2-pyrrolidinyl)ethyl group, 2-N-piperidinylethyl group, 3-(2-methyl-N-piperidinyl)propyl group and 3-isopropoxypropyl group.

3-methoxypropyl group, 3-ethoxypropyl group, 2-methoxy-1-methylethyl group, tetrahydrofurfuryl group, hydroxyethyl group, hydroxypropyl group, 4-hydroxybutyl group, 2-hydroxy-1-methylethyl group, hydroxyethoxyethyl group, 3-N-morpholinopropyl group, 2-N-morpholinoethyl group, 3-N-pyrrolidinonylpropyl group, 2-dimethylaminoethyl group, 3-dimethylaminopropyl group, 3-diethylaminopropyl group, 2-N-pyrrolidinylethyl group, 2-(N-methyl-2-pyrrolidinyl)ethyl group, 2-N-piperidinylethyl group, 3-(2-methyl-N-piperidinyl)propyl group and 3-isopropoxypropyl group are further preferable among the "substituent having hetero atom" represented $R^{a01}$ described above. 3-methoxypropyl group, 2-methoxy-1-methylethyl group, tetrahydrofurfuryl group, hydroxyethyl group, hydroxypropyl group, 4-hydroxybutyl group, hydroxyethoxyethyl group, 3-N-morpholinopropyl group, 2-N-morpholinoethyl group, 3-N-pyrrolidinonylpropyl group, 3-dimethylaminopropyl group, 3-diethylaminopropyl group, 2-(N-methyl-2-pyrrolidinyl)ethyl group, 2-N-piperidinylethyl group, 3-(2-methyl-N-piperidinyl)propyl group and 3-isopropoxypropyl group are still further preferable among them.

3-methoxypropyl group, tetrahydrofurfuryl group, hydroxypropyl group, 4-hydroxybutyl group, hydroxyethoxyethyl group, 3-N-morpholinopropyl group, 2-N-morpholinoethyl group, 3-N-pyrrolidinonylpropyl group, 3-dimethylaminopropyl group, 2-(N-methyl-2-pyrrolidinyl)ethyl group, 2-N-piperidinylethyl group, 3-(2-methyl-N-piperidinyl)propyl group and 3-isopropoxypropyl group are particularly preferable among them as the "substituent having hetero atom" represented by $R^{a01}$.

When $R^{a03}$ and/or $R^{a04}$ represent the "substituent having hetero atom", the "substituent having hetero atom" represented by $R^{a03}$ and/or $R^{a04}$ are not particularly restricted so long as the substituent is a group derived from amines having hetero atom (for example nitrogen atoms, sulfur atoms and oxygen atoms) capable of being used for the synthesis of, for example, a corresponding sulfonamide. $R^{a03}$ and/or $R^{a04}$ may be substituted or non-substituted.

The "substituent having hetero atom" represented by $R^{a03}$ and/or $R^{a04}$ is preferably a substituent having a total number of atoms from 3 to 50, more preferably having a total number of atoms from 3 to 40, and particularly having a total number of atoms from 3 to 30 in terms of chromatic valance, and a substituent having at least one of nitrogen atom, sulfur atom and oxygen atom and having a total number of atoms from 3 to 30 is most preferable.

The "substituent having hetero atom" represented by $R^{a03}$ and $R^{a04}$ can be introduced by a reaction between nitrobenzene sulfonyl chloride and primary or secondary amine. An example of the "substituent having hetero atom" represented by $R^{a03}$ and/or $R^{a04}$ is a group derived from the primary or secondary amine containing hetero atom described in "Aldrich Structure Index", or derivatives thereof.

Specific examples of the "substituent having hetero atom" represented by $R^{a03}$ and $R^{a04}$ include 2-methoxyethyl group, 3-methoxypropyl group, 3-ethoxypropyl group, 3-butoxypropyl group, 2-methoxy-1-methylethyl group, tetrahydrofurfuryl group, 2-hydroxyethyl group, 2-hydroxypropyl group, 4-hydroxybutyl group, 2-hydroxy-1-methylethyl group, hydroxyethoxyethyl group, 3-N-morpholinopropyl group, 2-N-morpholinoethyl group, 3-N-pyrrolidinonylpropyl group, 2-dimethylaminoethyl group, 3-dimethylaminopropyl group, 3-diethylaminopropyl group, 2-N-pyrrolidinylethyl group, 2-(N-methyl-2-pyrrolidinyl)ethyl group, 2-N-piperidinylethyl group, 3-(2-methyl-N-piperidinyl)propyl group, 3-isopropoxypropyl group, diethylaminoethyl group, 2,2-dimethoxyethyl group, 1,3-dioxolan-2-yl-methyl group, 3-hydroxypropyl group and 2-mercaptoethyl group.

3-methoxypropyl group, 3-ethoxypropyl group, 2-methoxy-1-methylethyl group, tetrahydrofurfuryl group, 2-hydroxyethyl group, 2-hydroxypropyl group, 4-hydroxybutyl group, 2-hydroxy-1-methylethyl group, hydroxyethoxyethyl group, 3-N-morpholinopropyl group, 2-N-morpholinoethyl group, 3-N-pyrrolidinonylpropyl group, 2-dimethylaminoethyl group, 3-dimethylaminopropyl group, 3-diethylaminopropyl group, 2-N-pyrrolidinylethyl group, 2-(N-methyl-2-pyrrolidinyl)ethyl group, 2-N-piperidinylethyl group, 3-(2-methyl-N-piperidinyl)propyl group, 3-isopropoxypropyl group, diethylaminoethyl group, 2,2-dimethoxyethyl group, 1,3-dioxolan-2-yl-methyl group, 3-hydroxypropyl group and 2-mercaptoethyl group are preferably as the "substituent having hetero atom" represented by $R^{a03}$ and $R^{a04}$ among them. 3-methoxypropyl group, 2-methoxy-1-methylethyl group, tetrahydrofurfuryl group, 2-hydroxyethyl group, 2-hydroxypropyl group, 4-hydroxybutyl group, hydroxyethoxyethyl group, 3-N-morpholinopropyl group, 2-N-morpholinoethyl group, 3-N-pyrrolidinonylpropyl group, 3-dimethylaminopropyl group, 3-diethylaminopropyl group, 2-(N-methyl-2-pyrrolidinyl)ethyl group, 2-N-piperidinylethyl group, 3-(2-methyl-N-piperidinyl)propyl group, 3-isopropoxypropyl group, diethylaminoethyl group, 2,2-dimethoxyethyl group, 1,3-dioxolan-2-yl-methyl group, 3-hydroxypropyl group and 2-mercaptoethyl group are more preferable among them.

3-methoxypropyl group, tetrahydrofurfuryl group, 2-hydroxypropyl group, 4-hydroxybutyl group, hydroxyethoxyethyl group, 3-N-morpholinopropyl group, 2-N-morpholinoethyl group, 3-N-pyrrolidinonylpropyl group, 3-dimethylaminopropyl group, 2-(N-methyl-2-pyrrolidinyl)ethyl group, 2-N-piperidinylethyl group, 3-(2-methyl-N-piperidinyl)propyl group, 3-isopropoxypropyl group, diethylaminoethyl group, 2,2-dimethoxyethyl group, 1,3-dioxolan-2-yl-methyl group, 3-hydroxypropyl group and 2-mercaptoethyl group are particularly preferable among them as the "substituent having hetero atom" represented by $R^{a03}$ and $R^{a04}$.

When $R^{a01}$, $R^{a03}$ or $R^{a04}$ is a group containing no hetero atoms in formula (A), $R^{a01}$, $R^{a03}$ and $R^{a04}$ each independently represents a hydrogen atom, an alkyl group having 1 to 21 carbon atoms, an alkenyl group having 2 to 21 carbon atoms, an aryl group having 6 to 21 carbon atoms or an aralkyl group having 7 to 21 carbon atoms, and $R^{a03}$ and $R^{a04}$ may form a heterocyclic ring including nitrogen atom linked to these groups. $R^{a01}$, $R^{a03}$ or $R^{a04}$ may have additional substituents.

The alkyl group represented by $R^{a01}$, $R^{a03}$ or $R^{a04}$ having 1 to 21 carbon atoms may be substituted or non-substituted. The alkyl group preferably has from 1 to 15 carbon atoms, more preferably from 1 to 10 carbon atoms.

The alkyl group having 1 to 21 carbon atoms represented by $R^{a01}$, $R^{a03}$ or $R^{a04}$ may be any one of linear, branched or cyclic alkyl group, and favorable examples thereof include methyl group, ethyl group, n-propyl group, n-butyl group, n-amyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, n-nonadecyl group, e-eicosanyl group, i-propyl group, sec-butyl group, i-butyl group, t-butyl group, 1-methylbutyl group, 1-ethylpropyl group, 2-methylbutyl group, i-amyl group, neopentyl group, 1,2-dimethylpropyl group, 1,1-dimethylpropyl group, t-amyl group, 1,3-dimethylbutyl group, 3,3-dimethylbutyl group, 2-ethylbutyl group, 2-ethyl-2-methylpropyl group, linear or branched heptyl group, 1-methylheptyl group, 2-ethylhexyl group, 1,5-dimethylhexyl group, t-octyl group, branched nonyl group, branched decyl group, branched undecyl group, branched dodecyl group, branched tridecyl group, branched tetradecyl group, branched pentadecyl group, branched hexadecyl group, branched heptadecyl group, branched octadecyl group, linear or branched nonadecyl group, linear or branched eicosanyl group, cyclopropyl group, cyclopropylmethyl group, cyclobutyl group, cyclobutylmethyl group, cyclopentyl group, cyclohexyl group, cyclohexylmethyl group, cycloheptyl group, cyclooctyl group, cyclohexylpropyl group, cyclododecyl group, norbornyl group, bornyl group, cis-miltanyl group, isopinocamphenyl group, noradamantyl group, adamantyl group, adamantylmethyl group, 1-(1-adamantyl)ethyl group, 3,5-dimethyladamantyl group, quinuclidinyl group, cyclopentylethyl group and bicyclooctyl group.

Methyl group, ethyl group, n-propyl group, n-butyl group, n-amyl group, n-hexyl group, n-heptyl group, n-octyl group, n-nonyl group, n-decyl group, n-undecyl group, n-dodecyl group, n-tridecyl group, n-tetradecyl group, i-propyl group, sec-butyl group, i-butyl group, t-butyl group, 1-methylbutyl group, 1-ethylpropyl group, 2-methylbutyl group, i-amyl group, neopentyl group, 1,2-dimethylpropyl group, 1,1-dimethylpropyl group, t-amyl group, 1,3-dimethylbutyl group, 3,3-dimethylbutyl group, 2-ethylbutyl group, 2-ethyl-2-methylpropyl group, linear or branched heptyl group, 1-methylheptyl group, 2-ethylhexyl group, 1,5-dimethylhexyl group, t-octyl group, branched nonyl group, branched decyl group, branched undecyl group, branched dodecyl group, branched tridecyl group, branched tetradecyl group, cyclopropyl group, cyclopropylmethyl group, cyclobutyl group, cyclobutylmethyl group, cyclopentyl group, cyclohexyl group, cyclohexylmethyl group, cycloheptyl group, cyclooctyl group, cyclohexylpropyl group, cyclododecyl group, norbornyl group, bornyl group, cis-miltanyl group, isopinocamphenyl group, noradamantyl group, adamantyl group, adamantylmethyl group, 1-(1-adamantyl)ethyl group, 3,5-dimethyladamantyl group, quinuclidinyl group, cyclopentylethyl group and bicyclooctyl group are preferable among them as the alkyl group having 1 to 21 carbon atoms represented by $R^{a01}$, $R^{a03}$ or $R^{a04}$.

Methyl group, ethyl group, n-propyl group, n-butyl group, n-amyl group, n-hexyl group, n-heptyl group, n-octyl group, n-nonyl group, n-decyl group, i-propyl group, sec-butyl group, i-butyl group, t-butyl group, 1-methylbutyl group, 1-ethylpropyl group, 2-methylbutyl group, i-amyl group, neopentyl group, 1,2-dimethylpropyl group, 1,1-dimethylpropyl group, t-amyl group, 1,3-dimethylbutyl group, 3,3-dimethylbutyl group, 2-ethylbutyl group, 2-ethyl-2-methylpropyl group, linear or branched heptyl group, 1-methylheptyl group, 2-ethylhexyl group, 1,5-dimethylhexyl group, t-octyl group, branched nonyl group, branched decyl group, cyclopropyl group, cyclopropylmethyl group, cyclobutyl group, cyclobutylmethyl group, cyclopentyl group, cyclohexyl group, cyclohexylmethyl group, cycloheptyl group, cyclooctyl group, cyclohexylpropyl group, cyclododecyl group, norbornyl group, bornyl group, noradamantyl group, adamantyl group, adamantylmethyl group, 1-(1-adamantyl)ethyl group, 3,5-dimethyladamantyl group, cyclopentylethyl group and bicyclooctyl group are particularly preferable among the above-mentioned groups as the alkyl group having 1 to 21 carbon atoms represented by $R^{a01}$, $R^{a03}$ or $R^{a04}$.

Ethyl group, n-propyl group, n-butyl group, n-amyl group, n-hexyl group, n-heptyl group, n-octyl group, n-nonyl group, n-decyl group, i-propyl group, sec-butyl group, i-butyl group, t-butyl group, 1-methylbutyl group, 1-ethylpropyl group, 2-methylbutyl group, i-amyl group, neopentyl group, 1,2-dimethylpropyl group, 1,1-dimethylpropyl group, t-amyl group, 1,3-dimethylbutyl group, 3,3-dimethylbutyl group, 2-ethylbutyl group, 2-ethyl-2-methylpropyl group, branched heptyl group, 1-methylheptyl group, 2-ethylhexyl group, 1,5-dimethylhexyl group and t-octyl group, and branched alkyl groups and cyclic alkyl groups such as branched nonyl group, branched decyl group, cyclopropyl group, cyclopropylmethyl group, cyclobutyl group, cyclobutylmethyl group, cyclopentyl group, cyclohexyl group, cyclohexylmethyl group, cycloheptyl group, cyclooctyl group, cyclohexylpropyl group, cyclododecyl group, norbornyl group, bornyl group, noradamantyl group, adamantyl group, adamantylmethyl group, 1-(1-adamantyl)ethyl group, 3,5-dimethyladamantyl group, cyclopentylethyl group and bicyclooctyl group are particularly preferable as the alkyl group having 1 to 21 carbon atoms represented by $R^{a01}$, $R^{a03}$ or $R^{a04}$ listed above in terms of improvement of heat resistance.

Alkyl groups substituted with fluorine is particularly favorable as the alkyl group listed above. Preferable examples of the fluorine-substituted alkyl group include trifluoromethyl group, trifluoroethyl group, pentafluoroethyl group, heptafluoropropyl group, nonafluorobutyl group, tridecafluorohexyl group, pentadecafluoroheptyl group, heptadecafluorooctyl group, tridecafluorooctyl group, nonadecafluorononyl group, heptadecafluorodecyl group and perfluorodecyl group. Trifluoromethyl group, pentafluoroethyl group, heptafluoropropyl group, nonafluorobutyl group, tridecafluorohexyl group and pentadecafluoroheptyl group are more preferable among them, and trifluoromethyl group, pentafluoroethyl group, heptafluoropropyl group, nonafluorobutyl group and tridecafluorohexyl group are particularly preferable.

The alkenyl group having 2 to 21 carbon atoms represented by $R^{a01}$, $R^{a03}$ or $R^{a04}$ may be substituted or non-substituted. The alkenyl groups having 2 to 15 carbon atoms are preferable, and the alkenyl groups having 2 to 10 carbon atoms are more preferable.

Favorable examples of the alkenyl group having 2 to 21 carbon atoms represented by $R^{a01}$, $R^{a03}$ or $R^{a04}$ include vinyl group, isopropenyl group, 2-propenyl group, 2-methylpropenyl group, 1-methyl-1-propenyl group, 1-butenyl group, 3-butenyl group, 1-methyl-1-butenyl group, 1,1-dimethyl-3-butenyl group, 1-pentenyl group, 2-pentenyl group, 1-ethyl-1-pentenyl group, 1-hexenyl group, 1-heptenyl group, 2,6-dimethyl-5-heptenyl group, 9-decenyl group, 1-cyclopentenyl group, 2-cyclopentenylmethyl group, cyclohexenyl group, 1-methyl-2-cyclohexenyl group, 1,4-dihydro-2-methylphenyl group, octenyl group, citronelyl group, oleyl group, geranyl group, farnesyl group and 2-(1-cyclohexenyl)ethyl group.

Vinyl group, isopropenyl group, 2-propenyl group, 2-methylpropenyl group, 1-methyl-1-propenyl group, 1-butenyl group, 3-butenyl group, 1-methyl-1-butenyl group, 1,1-dimethyl-3-butenyl group, 1-pentenyl group, 2-pentenyl group, 1-ethyl-1-pentenyl group, 1-hexenyl group, 1-heptenyl group, 1-cyclopentenyl group, 2-cyclopentenylmethyl group, cyclohexenyl group, 1-methyl-2-cyclohexenyl group and 1,4-dihydro-2-methylphenyl group are more preferable as the alkenyl group having 2 to 21 carbon atoms represented by $R^{a01}$, $R^{a03}$ or $R^{a04}$; and vinyl group, isopropenyl group, 2-propenyl group, 2-methylpropenyl group, 1-methyl-1-propenyl group, 1-butenyl group, 3-butenyl group, 1-methyl-1-butenyl group, 1,1-dimethyl-3-butenyl group, 1-pentenyl group, 2-pentenyl group, 1-ethyl-1-pentenyl group, 1-hexenyl group, 1-cyclopentenyl group, 2-cyclopentenylmethyl group, cyclohexenyl group, 1-methyl-2-cyclohexenyl group and 1,4-dihydro-2-methylphenyl group are particularly preferable.

The aryl group having 6 to 21 carbon atoms represented by $R^{a01}$, $R^{a03}$ or $R^{a04}$ may be substituted or non-substituted. The aryl groups having 6 to 15 carbon atoms are preferable, and the aryl groups having 6 to 10 carbon atoms are more preferable.

Favorable examples of the aryl group having 6 to 21 carbon atoms represented by $R^{a01}$, $R^{a03}$ or $R^{a04}$ include phenyl group, naphthyl group, biphenylenyl group, acenaphthenyl group, fluorenyl group, anthracenyl group, anthraquinonyl group and pyrenyl group. Phenyl group, naphthyl group, biphenylenyl group, acenaphthenyl group, fluorenyl group and anthracenyl group are further preferable among them; and phenyl group, naphthyl group, biphenylenyl group and fluorenyl group are particularly preferable.

The aralkyl group having 7 to 21 carbon atoms represented by represented by $R^{a01}$, $R^{a03}$ or $R^{a04}$ may be substituted or non-substituted. The aralkyl groups having 7 to 15 carbon atoms are preferable, and the aralkyl groups having 7 to 10 carbon atoms are more preferable.

Favorable examples of the aralkyl group having 7 to 21 carbon atoms represented by $R^{a01}$, $R^{a03}$ or $R^{a04}$ include benzyl group, diphenylmethyl group, 1,2-diphenylethyl group, phenylcyclopentylmethyl group, α-methylbenzyl group, phenylethyl group, α-methylphenylethyl group, β-methylphenylethyl group, 3-phenylpropyl group, 3,3-diphenylpropyl group, 4-phenylbutyl group, naphthylmethyl group, styryl group, cynnamyl group, fluorenyl group, 1-benzocyclobutenyl group, 1,2,3,4-tetrahydronaphthyl group, indanyl group, piperonyl group and pyrenemethyl group.

Benzyl group, phenylcyclopentylmethyl group, α-methylbenzyl group, phenylethyl group, α-methylphenylethyl group, β-methylphenylethyl group, 3-phenylpropyl group, 4-phenylbutyl group, styryl group, cynnamyl group, fluorenyl group, 1-benzocyclobutenyl group and 1,2,3,4-tetrahydronaphthyl group are more preferable as the aralkyl group having 7 to 21 carbon atoms represented by $R^{a01}$, $R^{a03}$ or $R^{a04}$; and benzyl group, α-methylbenzyl group, phenylethyl group, α-methylphenylethyl group, β-methylphenylethyl group, 3-phenylpropyl group, styryl group, cynnamyl group, fluorenyl group, 1-benzocyclobutenyl group and 1,2,3,4-tetrahydronaphthyl group are particularly preferable.

The group represented by $R^{a01}$, $R^{a03}$ or $R^{a04}$ may contain an ether group, and preferable examples thereof include tetrahydrofurfuryl group and 2,5-dihydro-2,5-dimethoxy furfuryl group.

$R^{a03}$ and $R^{a04}$ may form a heterocyclic ring including nitrogen atom linked thereto. Examples of favorable heterocyclic ring include 2-methylaziridine ring, azetidine ring, pyrrolidine ring, 3-pyrroline ring, piperidine ring, 1,2,3,6-tetrahydropyridine ring, hexamethyleneimine ring, piperazine ring, 1,3,3-trimethyl-6-azabicyclo[3.2.1]octane ring, decahydroquinoline ring, oxazolidine ring, morpholine ring, thiazolidine ring, thiomorpholine ring, indoline ring, isoindoline ring, 1,2,3,4-tetrahydrocarbazole ring, 1,2,3,4-tetrahydroquinoline ring, 1,2,3,4-tetrahydroisoquinoline ring, iminodibenzyl ring, phenoxazine ring, phenothiazine ring and phenazine ring.

Pyrrolidine ring, 3-pyrroline ring, piperidine ring, 1,2,3,6-tetrahydropyridine ring, hexamethyleneimine ring, piperazine ring, decahydroquinoline ring, oxazolidine ring, morpholine ring, thiazolidine ring and thiomorpholine ring are more preferable among them; and pyrrolidine ring, 3-pyrroline ring, piperidine ring, 1,2,3,6-tetrahydropyridine ring, piperazine ring, decahydroquinoline ring, oxazolidine ring, morpholine ring, thiazolidine ring and thiomorpholine ring are particularly preferable.

When the group represented by $R^{a01}$, $R^{a03}$ or $R^{a04}$, and the heterocyclic ring formed of $R^{a03}$, $R^{a04}$ and nitrogen atom have substituents, the preferable substituents include acyl group, acylamino group, acylaminocarbonylamino group, aralkylaminocarbonylamino group, arylaminocarbonylamino group, methacryloylaminocarbonylamino group, alkoxycarbonyl group, trifluoromethyl group, fluoro group, chloro group, bromo group, iodo group, hydroxy group, nitro group, methyl group, ethyl group, n-propyl group, i-propyl group, n-butyl group, i-butyl group, sec-butyl group, t-butyl group, pentyl group, hexyl group, heptyl group, octyl group, vinyl group, methoxy group, ethoxy group, butoxy group, isopropoxy group, t-butoxy group, cyclohexyloxy group, vinyloxy group, methylthio group, ethylthio group, pyrrolidinyl group, piperidinyl group, piperadinyl group, amino group, dimethylamino group, diethylamino group, phenyl group, —$SO_3M$ group and —COOM group (M represents a cation including a hydrogen atom, metal atom or nitrogen-containing compound).

Acyl group (particularly acetyl group), acylamino group, acylaminocarbonylamino group, alkoxycarbonyl group, trifluoromethyl group, fluoro group, chloro group, bromo group, hydroxy group, nitro group, methyl group, ethyl group, n-propyl group, i-propyl group, n-butyl group, i-butyl group, sec-butyl group, t-butyl group, pentyl group, hexyl group, vinyl group, methoxy group, ethoxy group, butoxy group, isopropoxy group, t-butoxy group, cyclohexyloxy group, vinyloxy group, methylthio group, ethylthio group, pyrrolidinyl group, piperidinyl group, piperadinyl group, amino group, dimethylamino group, diethylamino group, phenyl group, —$SO_3M$ group and —COOM group (M represents a cation including a hydrogen atom, metal atom or nitrogen-containing compound) are preferable among the above-described substituents; and acyl group (particularly acetyl group), acylamino group, acylaminocarbonylamino group, alkoxycarbonyl group, trifluoromethyl group, fluoro group, chloro group, bromo group, hydroxy group, nitro group, methyl group, ethyl group, n-propyl group, i-propyl group, n-butyl group, i-butyl group, t-butyl group, hexyl group, vinyl group, methoxy group, ethoxy group, isopropoxy group, cyclohexyloxy group, vinyloxy group, methylthio group, ethylthio group, pyrrolidinyl group, piperidinyl group, piperadinyl group, amino group, dimethylamino group, diethylamino group, phenyl group, —$SO_3M$ group and —COOM group (M represents a cation including a hydrogen atom, metal atom or nitrogen-containing compound) are particularly preferable.

The above-mentioned substituents may be further substituted with the same substituents plural times.

When the substituents have active hydrogen such as hydroxy group and amino group, in particular, the substituent may be substituted with acetyl group, acyl group, (meth) acryloyl group, alkylamino carbonyl group, arylamino carbonyl group (for example butylamino carbonyl group and phenylamino carbonyl group), alkyl group and aralkyl group by allowing the substituent to react with acid chlorides, acid anhydrides, halogenated compounds or isocyanates.

The alkyl group, alkenyl group, aryl group and aralkyl group represented by $R^{a01}$, $R^{a03}$ or $R^{a04}$, and the heterocyclic ring formed by $R^{a03}$, $R^{a04}$ and nitrogen atom may be further substituted with groups represented by $R^{a01}$, $R^{a03}$ and $R^{a04}$.

The total of the formula weight of the groups represented by $R^{a01}$, $R^{a03}$ and $R^{a04}$ is preferably 500 or less, more preferably 400 or less and particularly 300 or less in terms of chromatic valance ($\epsilon$/Mw). When $R^{a03}$ and $R^{a04}$ have substituents, the number of the substituents contained in $R^{a03}$ and $R^{a04}$, respectively, is preferably from 0 to 4, more preferably from 0 to 3 and particularly 0 to 2.

When the groups represented by $R^{a01}$, $R^{a03}$ and $R^{a04}$, and the heterocyclic ring formed of $R^{a03}$, $R^{a04}$ and nitrogen atom have substituents, M in the —$SO_3M$ or —COOM as examples of the substituent represents hydrogen atom, cations of metal atoms or a cation of a nitrogen-containing compound. M is preferably a cation such as H, Li, Na, K, Rb, Cs, Ag, Mg, Ca, Sr, Ba, Zn, Al, Ni, Cu, Co or Fe, or a cation of a nitrogen containing compound; more preferably a cation such as H, Na, K, Rb, Cs, Ag, Mg, Ca, Sr, Ba, Zn, Al, Cu or Fe, or a cation of a nitrogen-containing compound; and particularly preferably a cation such as H, Na, K, Mg, Ca, Ba, Sr, Zn, Al, Cu or Fe, or a cation of a nitrogen-containing compound.

The cation of the nitrogen-containing compound represented by M may be selected by taking all the factors of solubility in organic solvents and water, salt forming ability, absorbance and chromatic valance of the dye, heat resistance and light resistance of the colorant. When the cation of the nitrogen-containing compound is selected only in terms of absorbance and chromatic valance, the molecular weight of the nitrogen-containing compound is preferably as small as possible, a molecular weight of 300 or less is more preferable and a molecular weight of 280 or less is further preferable and a molecular weight of 250 or less is particularly preferable.

While specific examples of the nitrogen-containing compound that forms the cation of the nitrogen-containing compound are listed below, the invention is not restricted thereto. The cation as defined herein means a cation formed by protonation of the nitrogen-containing compound.

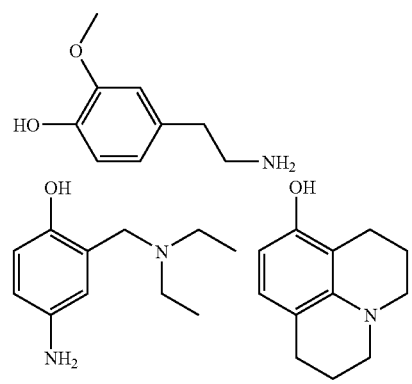

89
-continued
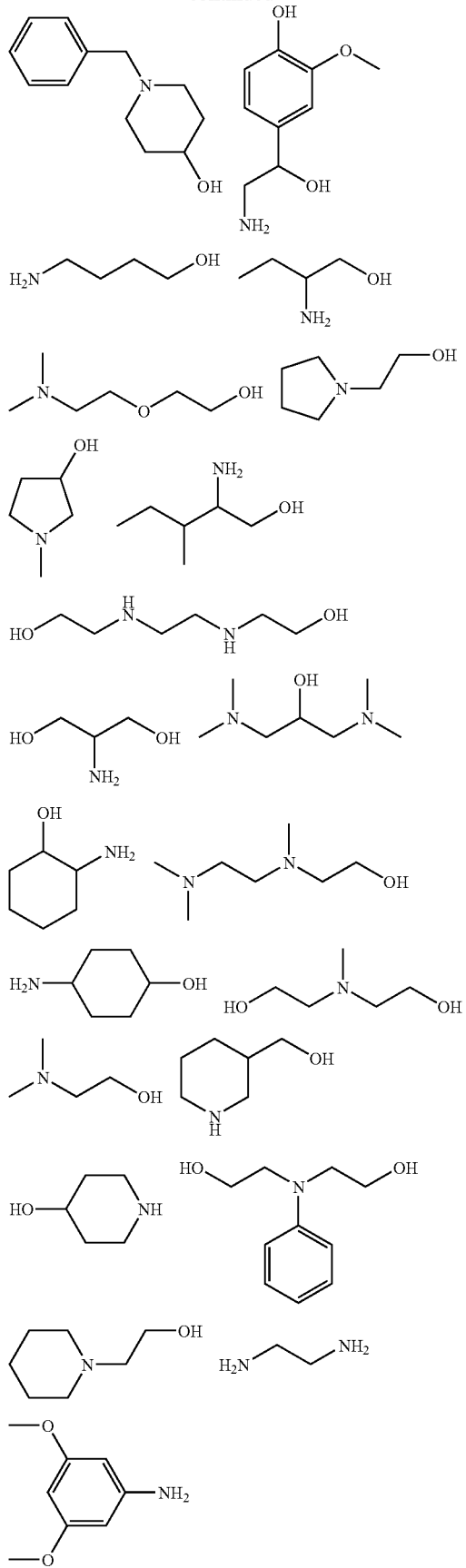
90
-continued
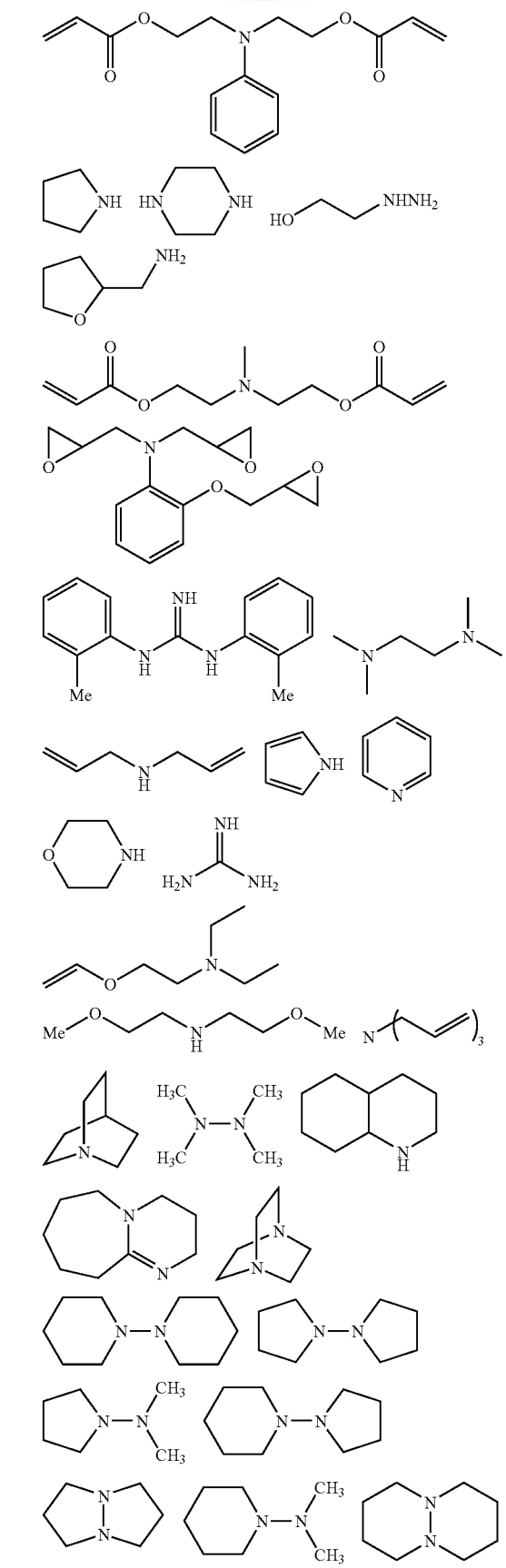

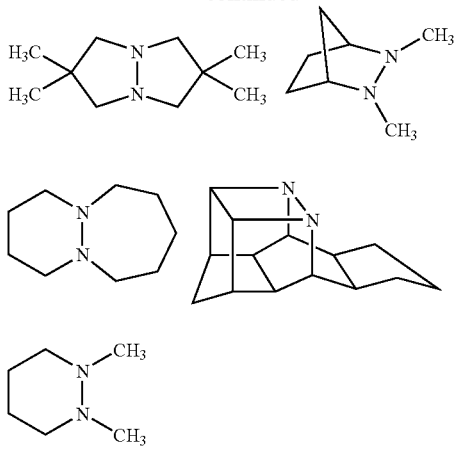

In formula (A), $R^{a02}$ represents an alkyl group having 1 to 10 carbon atoms, methoxymethyl group or trifluoromethyl group. The alkyl group having 1 to 5 carbon atoms is preferable as the alkyl group represented by $R^{a02}$. $R^{a02}$ may be substituted or non-substituted.

Specific examples of $R^{a02}$ preferably include methyl group, ethyl group, n-propyl group, isopropyl group, t-butyl group, methoxymethyl group and trifluoromethyl group. Methyl group, ethyl group, isopropyl group, t-butyl group, methoxymethyl group and trifluoromethyl group are more preferable among them; and methyl group, isopropyl group, methoxymethyl group and trifluoromethyl group are particularly preferable.

When $R^{a02}$ has a substituent, the substituent is preferably halogen atom, alkyl group or alkenyl group. Chlorine atom, fluorine atom, methyl group, ethyl group, propyl group, butyl group or 2-butenyl group are more preferable, and chlorine atom, methyl group, ethyl group, propyl group, butyl group or 2-butenyl group are particularly preferable.

The pyridone azo dye represented by formula (A) is bonded at the portions of $R^{a01}$, $R^{a03}$ and $R^{a04}$, and may have plural pigment frames.

While specific examples of the pyridone azo dye (compounds A2-1 to A2-24) represented by Formula (A) are listed below, the invention is not restricted thereto. Tautomers of the examples are also favorable.

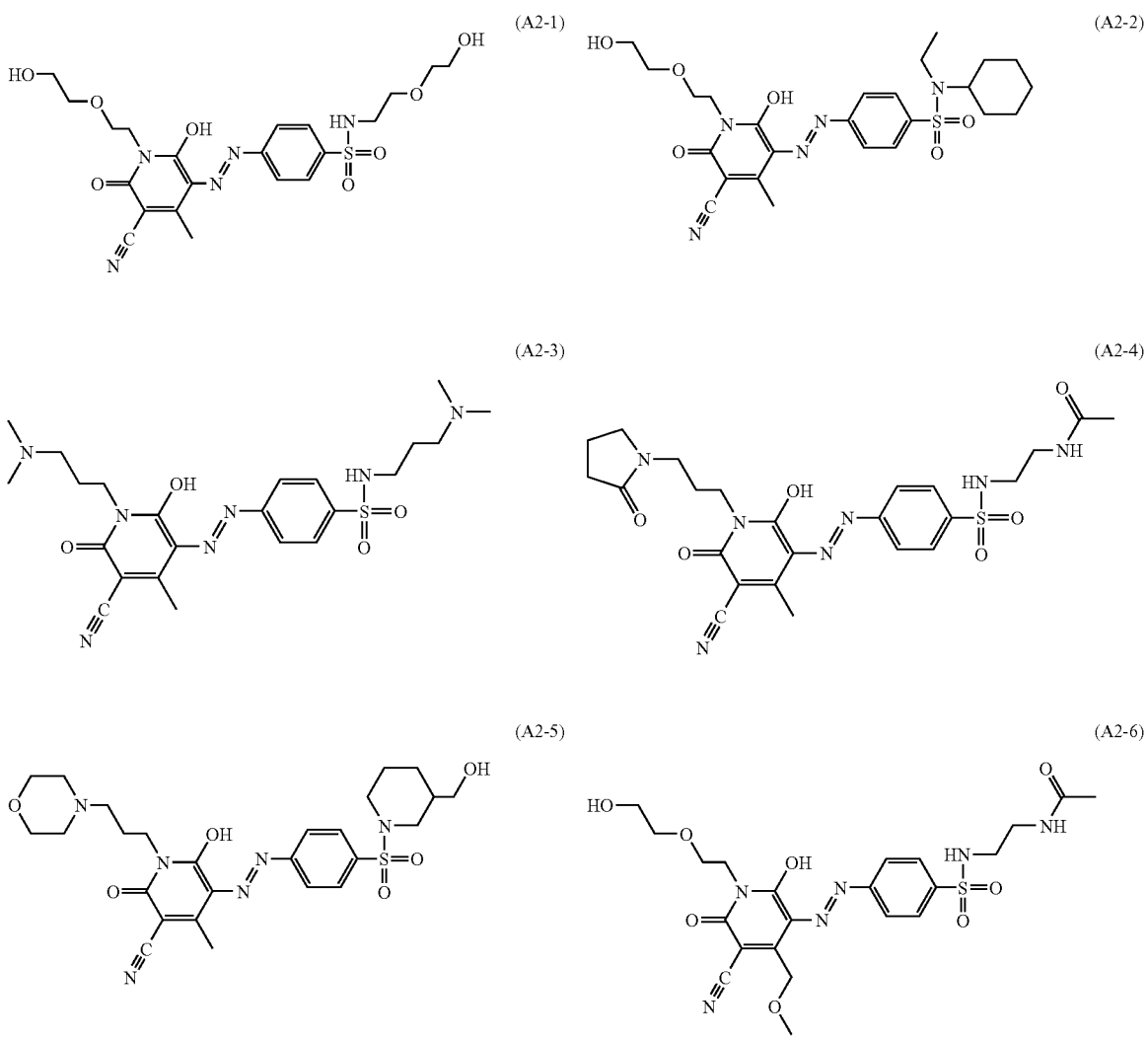

-continued
(A2-7)
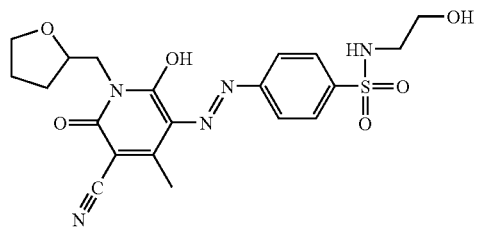
(A2-8)
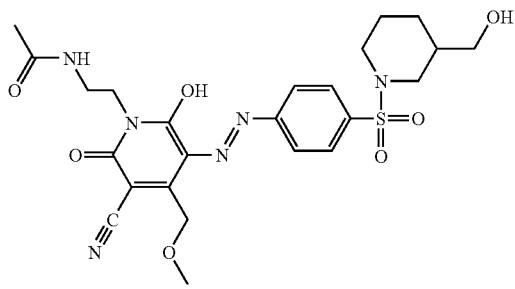
(A2-9)
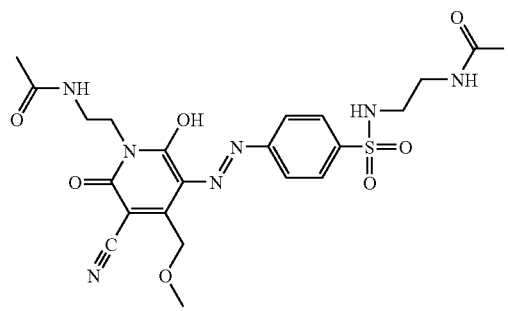
(A2-10)
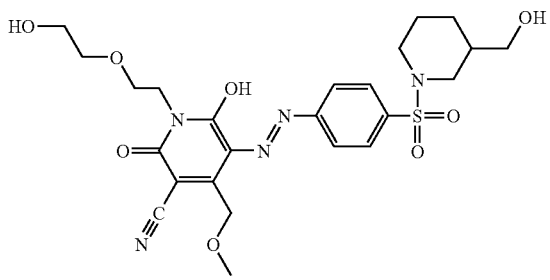
(A2-11)
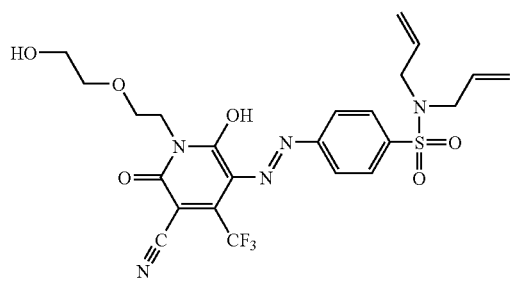
(A2-12)
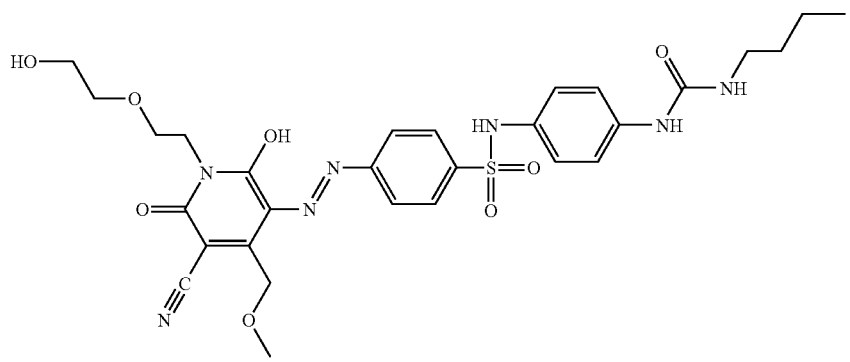
(A2-13)
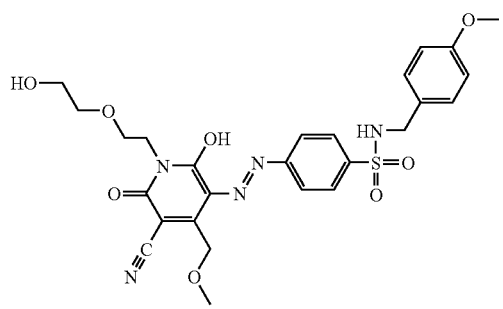
(A2-14)
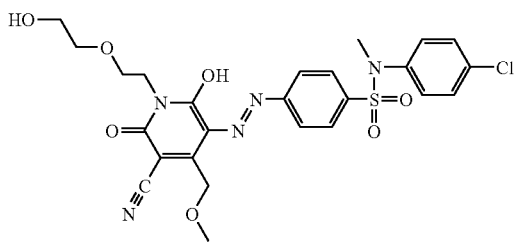

-continued
(A2-15)
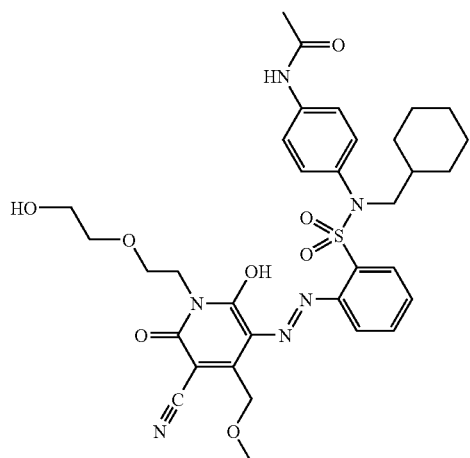
(A2-16)
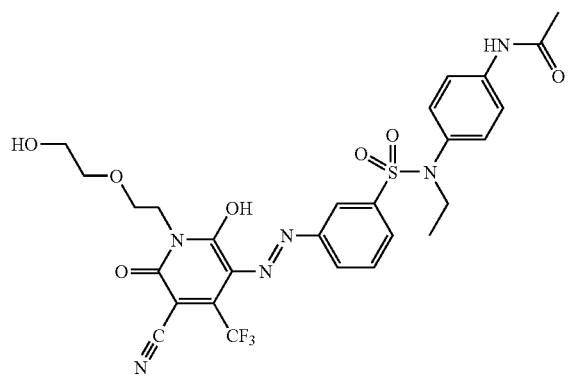
(A2-17)
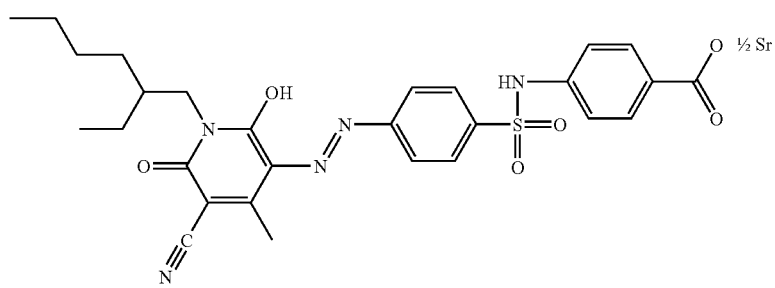
(A2-18)
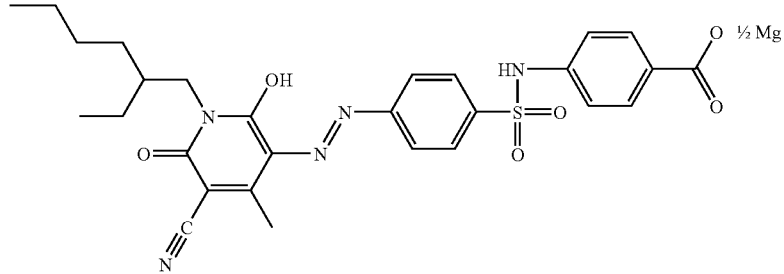
(A2-19)
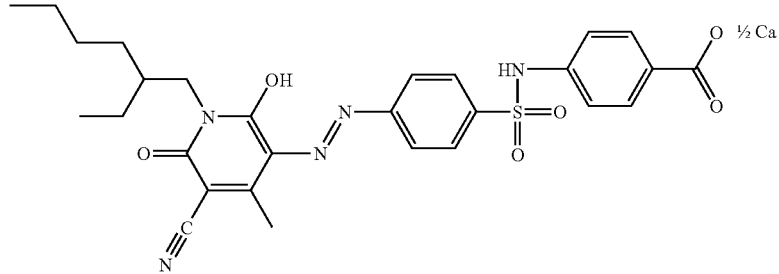
(A2-20)
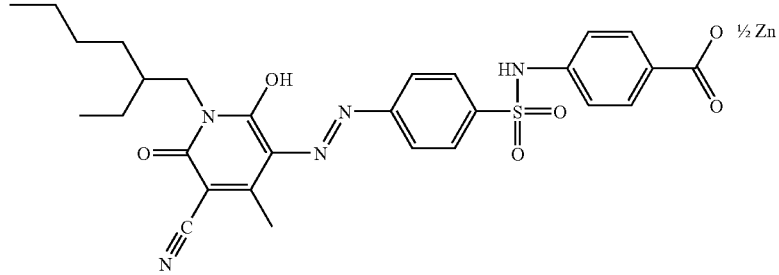

(A2-21)
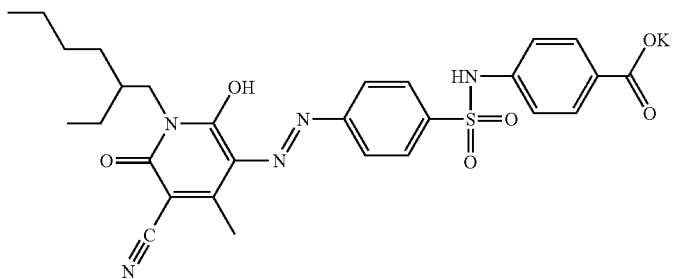
(A2-22)
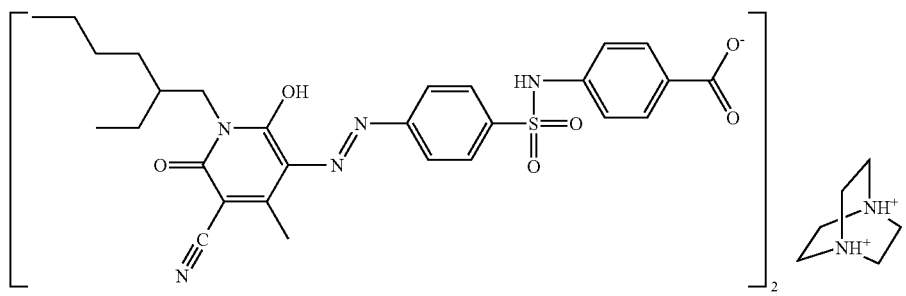
(A2-23)
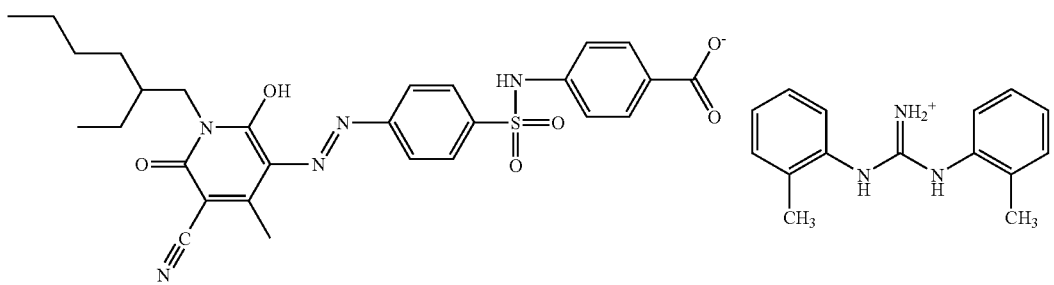
(A2-24)
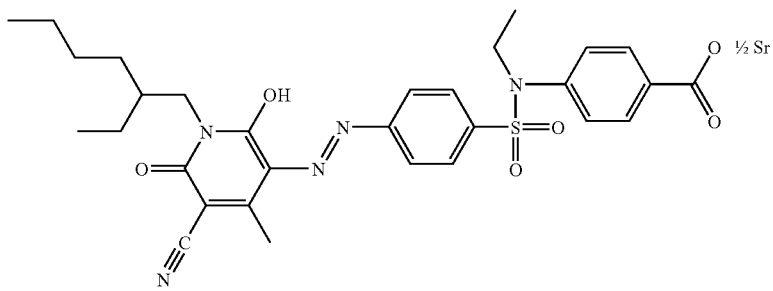

The pyridoneazo dye represented by formula (A) can be usually synthesized, for example, by forming by reducing a nitrobenzene derivatives having a desired substituent followed by converting the compound into an diazo compound, and by adding a pyridone compound having a desired substituent to the diazo compound.

Various compounds included in formula (A) may be synthesized as well by appropriately changing the nitrobenzene derivatives and substituents of the pyridone compounds.

—Heterocyclic Azo Compound (2)—

An example of other heterocyclic azo compounds is the azo dye represented by formula (B) below.

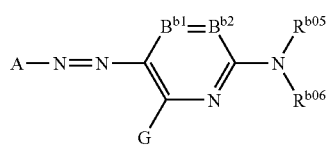

Formula (B)

In formula (B), A represents a five-membered heterocyclic ring, which is a residue of a diazo component A-NH$_2$. Examples of the heteroatom contained in the five-membered heterocyclic ring include N, O and S. The five-membered heterocyclic ring is preferably a nitrogen-containing five-membered heterocyclic ring. Aliphatic rings, aromatic rings or other heterocyclic rings may be condensed to the five-membered heterocyclic ring.

Preferable examples of A include pyrazole ring, imidazole ring, thiazole ring, isothiazole ring, thiadiazole ring, benzothiazole ring, benzoxazole ring and benzoisothiazole ring. A may have further substituents. The pyrazole ring, imidazole ring, isothiazole ring, thiadiazole ring and benzothiazole ring represented by formulae (a) to (f) below are particularly preferable.

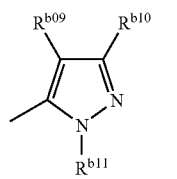
(a)

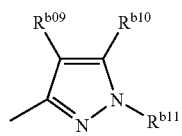
(a')

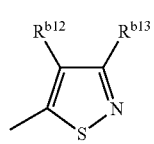
(b)

(c)

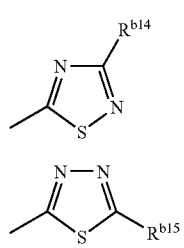

(d)

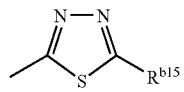

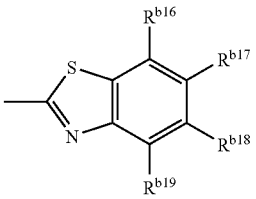
(e)

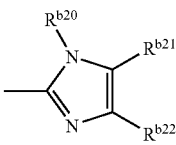
(f)

In formulae (a) to (f), $R^{b09}$ to $R^{b22}$ denote the same substituents as G, $R^{b01}$ and $R^{b02}$ in formula (B) to be described hereinafter.

The pyrazole rings and isothiazole rings represented by (a), (a') and (b) are preferable, the pyrazole rings represented by (a) are more preferable, and the pyrazole rings represented by (a) in which $R^{b11}$ is a five-membered monoheterocyclic single ring are particularly preferable as A among (a) to (f).

In formula (B), $B^{b1}$ and $B^{b2}$ represent —$CR^{b01}$= and —$CR^{b02}$=, respectively, or any one of them represents a nitrogen atom and the other represents —$CR^{b01}$= or —$CR^{b02}$=. $B^{b1}$ and $B^{b2}$ preferably represent —$CR^{b01}$= and —$CR^{b02}$=, respectively. $R^{b01}$ and $R^{b02}$ will be described below.

In formula (B), $R^{b05}$ and $R^{b06}$ each independently represents hydrogen atom, aliphatic group, aromatic group, heterocyclic group, acyl group, alkoxycarbonyl group, aryloxycarbonyl group, carbamoyl group, alkylsulfonyl group, arylsulfonyl group or sulfamoyl group. Each group may have a substituent.

$R^{b05}$ and $R^{b06}$ are preferably hydrogen atom, aliphatic group, aromatic group, heterocyclic group, acyl group, alkylsulfonyl group and arylsulfonyl group; more preferably hydrogen atom, aromatic group, heterocyclic group, acyl group, alkylsulfonyl group and arylsulfonyl group; and particularly preferably hydrogen atom, aromatic group and heterocyclic group. $R^{b05}$ and $R^{b06}$ are not simultaneously hydrogen atoms. Each substituent may be further substituted.

In formula (B), G, $R^{b01}$ and $R^{b02}$ each independently represents hydrogen atom, halogen atom, alkyl group, aliphatic group, aromatic group, heterocyclic group, cyano group, carboxyl group, carbamoyl group, alkoxycarbonyl group, aryloxycarbonyl group, acyl group, hydroxy group, alkoxy group, aryloxy group, silyloxy group, acyloxy group, carbamoyloxy group, heterocyclicoxy group, alkoxycarbonyloxy group, aryloxycarbonyloxy group; amino group substituted with alkyl group, aromatic group or heterocyclic group; acylamino group, ureido group, sulfamoylamino group, alkoxycarbonylamino group, aryloxycarbonylamino group, alkylsulfonylamino group, arylsulfonylamino group, nitro group, alkylthio group, arylthio group, heterocyclic thio group, alkylsulfonyl group, arylsulfonyl group, alkylsulfinyl group, arylsulfinyl group, sulfamoyl group or sulfo group. Each group may be further substituted.

Hydrogen atom, halogen atom, aliphatic group, aromatic group, hydroxy group, alkoxy group, aryloxy group, acyloxy group, heterocyclic oxy group; amino group substituted with alkyl group, aromatic group or heterocyclic group; acylamino group, ureido group, sulfamoyl amino group, alkoxycarbonylamino group, aryloxycarbonylamino group, alkylthio group, arylthio group and heterocyclicthio group, are preferable as G; hydrogen atom, halogen atom, alkyl group, hydroxy group, alkoxy group, aryloxy group, acyloxy group; amino group substituted with alkyl group, aromatic group or heterocyclic group; or acylamino group are more preferable; and hydrogen atom, arylamino group and acylamino group are most preferable among them. Each group may be further substituted.

Hydrogen atom, alkyl group, alkoxycarbonyl group, carboxyl group, carbamoyl group and cyano group are preferable as $R^{b01}$ and $R^{b02}$. Each group may be further substituted.

$R^{b02}$ and $R^{b05}$, and $R^{b05}$ and $R^{b06}$ may form a 5 to 6-membered ring by being joined to one another. Examples of the 5 to 6-membered rings include pyridine ring, pyrrole ring, pyrazole ring, imidazole ring and triazole ring.

When the substituents represented by A, $R^{b01}$, $R^{b02}$, $R^{b05}$, $R^{b06}$ and G are further substituted in formula (B), the substituents shown in G, $R^{b01}$ and $R^{b02}$ are also the examples of substituent.

When the dye represented by formula (B) is a water soluble dye, any one of A, $R^{b01}$, $R^{b02}$, $R^{b05}$, $R^{b06}$ and G preferably further have an ionic hydrophilic group as the substituent. Examples of the substituent as the ionic hydrophilic group include sulfo group, carboxyl group and quaternary ammonium group. The sulfo group and carboxyl group are preferable as the ionic hydrophilic group, and sulfo group is particularly preferable. The sulfo group and carboxyl group may be slats. Examples of counter-ions for forming the salts include alkali metal ions (for example sodium ion and potassium ion) and organic cations (for example tetramethyl guanidium ion).

While specific examples (A1-1 to A 1-24) of the dye represented by formula (B) are shown below, the dyes used in the invention are not restricted to these examples.

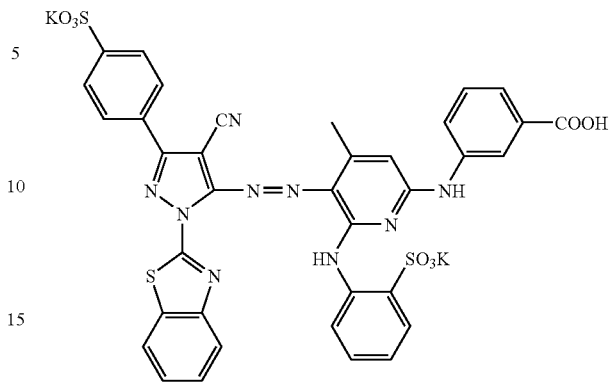
(A1-2)

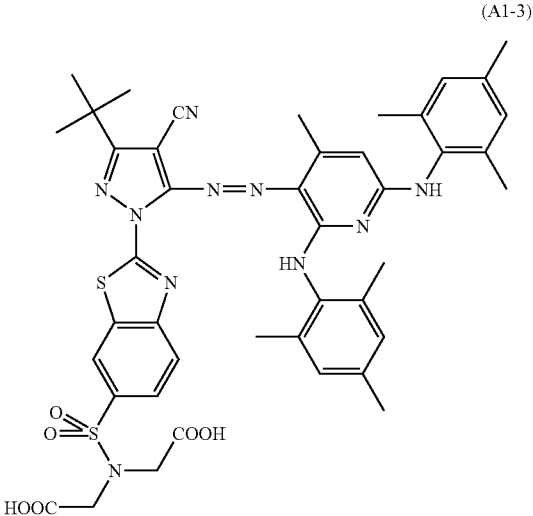
(A1-3)

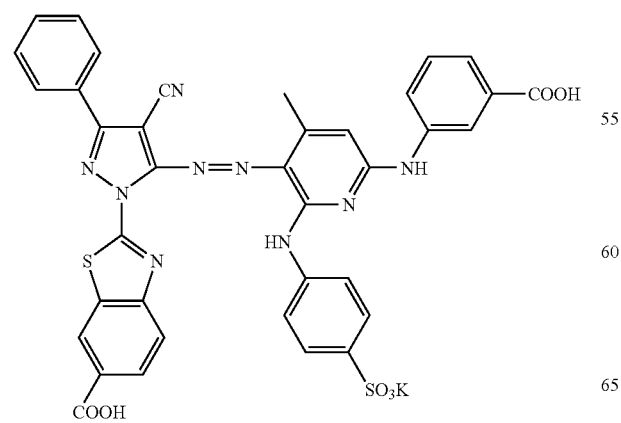
(A1-1)

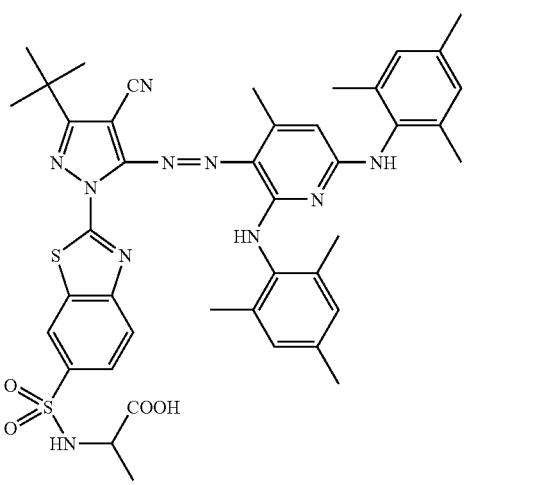
(A1-4)

-continued
(A1-5)
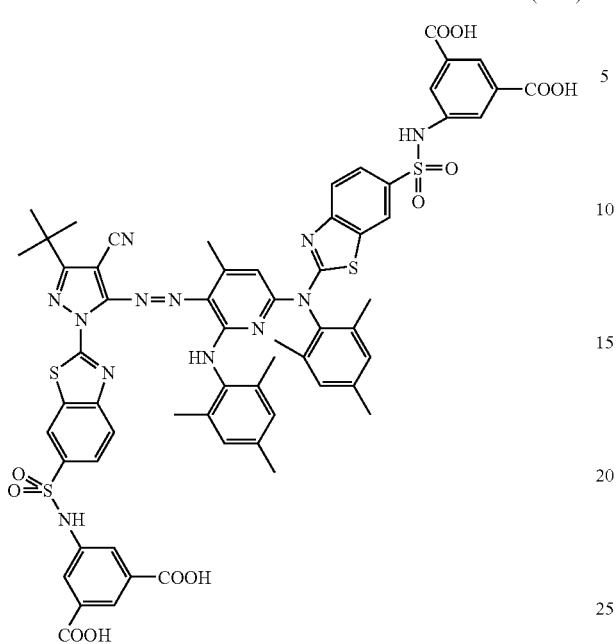
(A1-6)
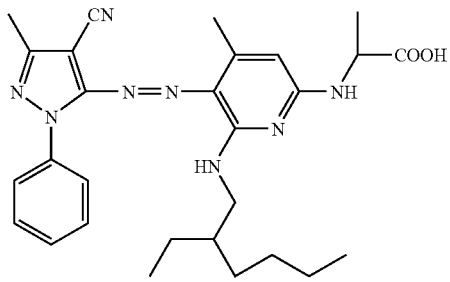
(A1-7)
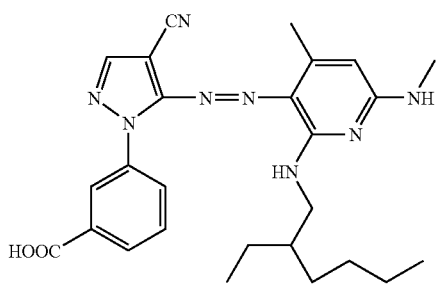
(A1-8)
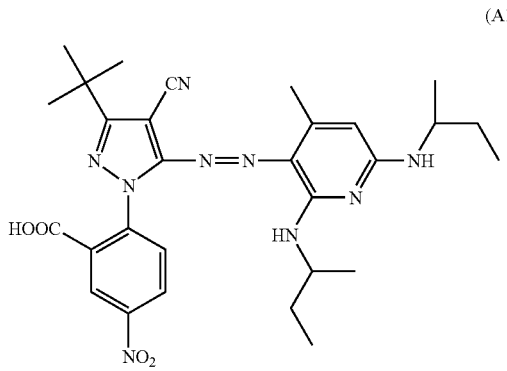
-continued
(A1-9)
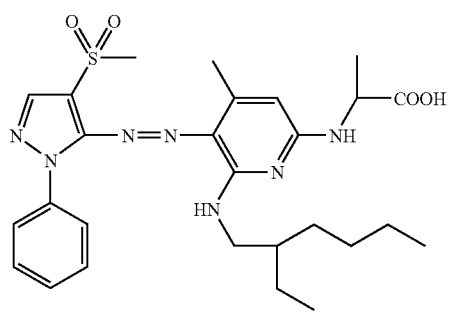
(A1-10)
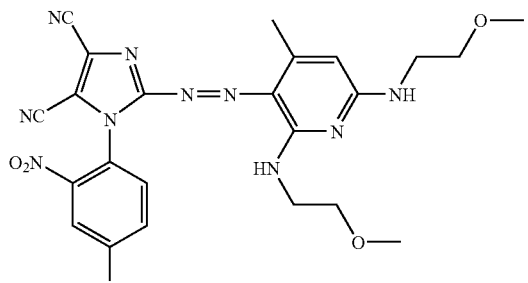
(A1-11)
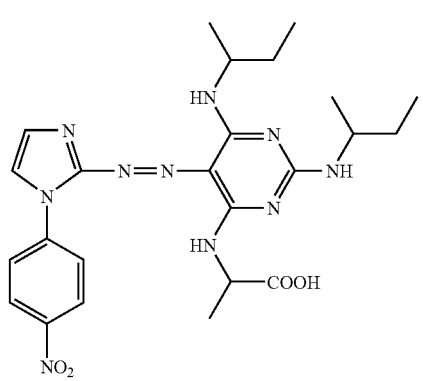
(A1-12)
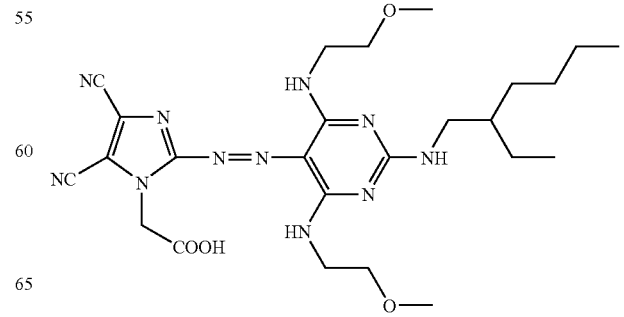

(A1-13)
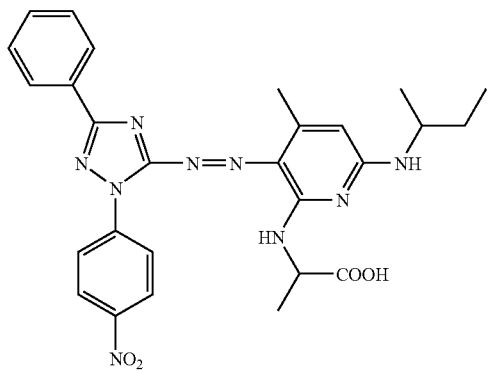
(A1-14)
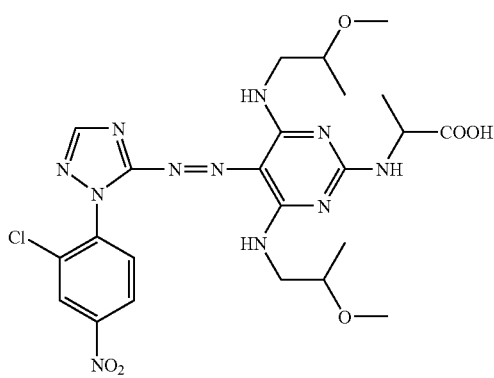
(A1-15)
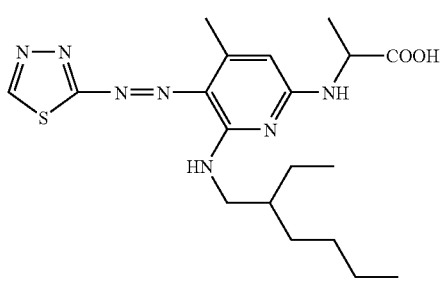
(A1-16)
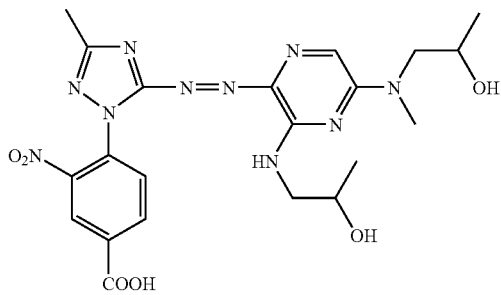
(A1-17)
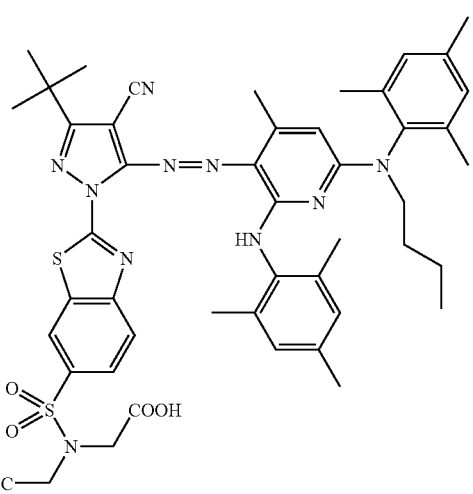
(A1-18)
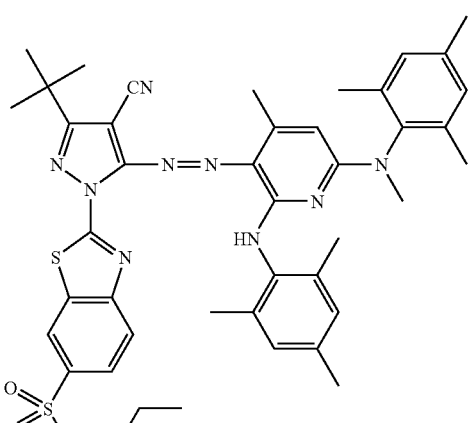
(A1-19)
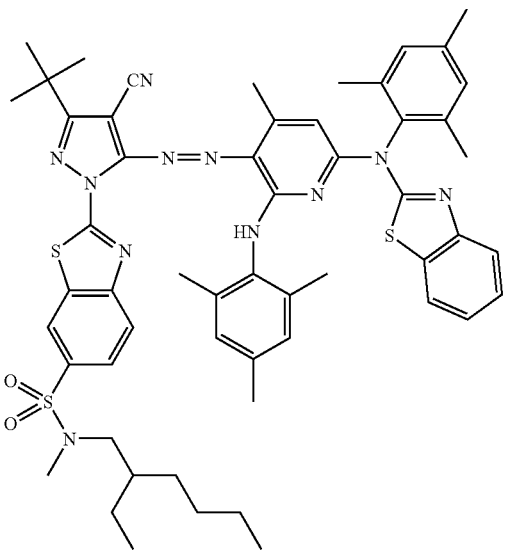

(A1-20)
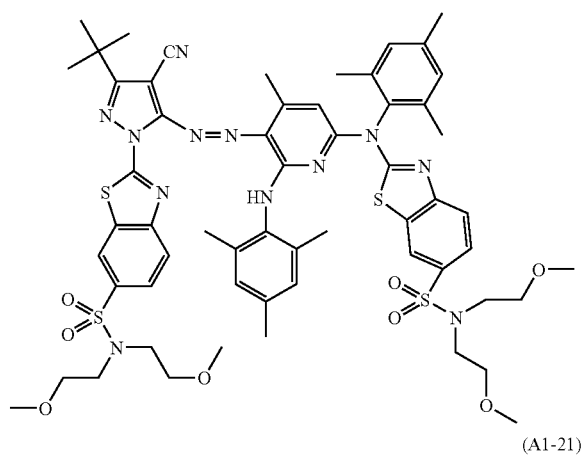
(A1-21)

(A1-22)
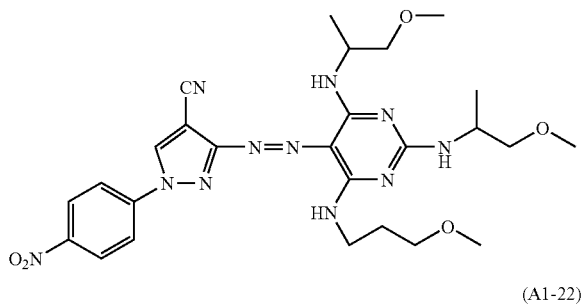

(A1-23)
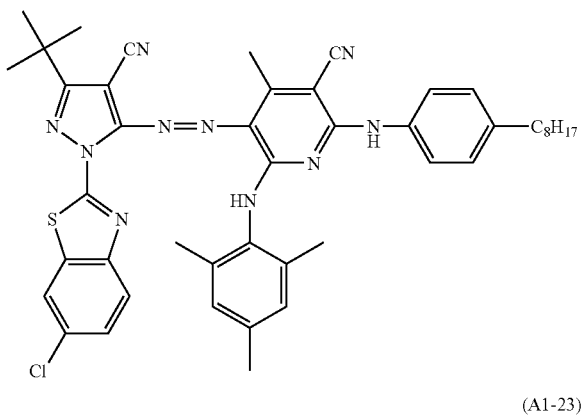

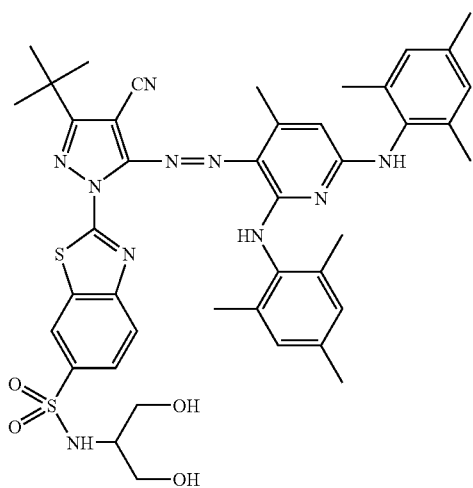

(A1-24)
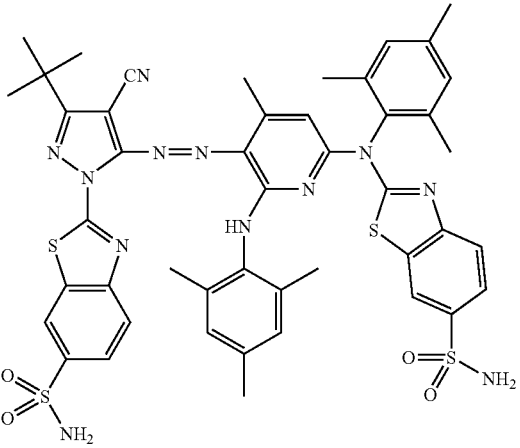

—Heterocyclic Azo Compound (3)—

Examples of other heterocyclic azo dyes include the azo dyes represented by formula (C). The azo dye has good hue, is excellent in storage stability without time-dependent precipitation when the dye is formulated into a liquid preparation applied as a coating film, especially exhibits high toughness to heat and light. A good rectangular pattern is obtained when the pattern is formed using the liquid preparation prepared by using the dye to enable residual films in the non-film forming region to be reduced.

Formula (C)

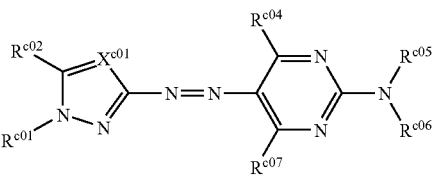

In formula (C), $R^{c01}$ represents a heterocyclic group, and $R^{c02}$ represents a hydrogen atom or a substituent. $X^{c01}$ represents —N= or —C($R^{c03}$)=, and $R^{c03}$ represents a hydrogen atom or a substituent. When $X^{c01}$ is —C($R^{c03}$)=, $R^{c02}$ and $R^{c03}$ may form a 5-, 6- or 7-membered ring by being joined to one another. $R^{c04}$ represents a hydrogen atom or a substituent. $R^{c05}$ and $R^{c06}$ each independently represents hydrogen atom, alkyl group, alkenyl group, alkynyl group, aryl group, heterocyclic group, acyl group, alkoxycarbonyl group, aryloxycarbonyl group, carbamoyl group, alkylsulfonyl group, arylsulfonyl group or sulfamoyl group. $R^{c05}$ and $R^{c06}$ may form a 5-, 6- or 7-membered ring by being joined to one another. $R^{c07}$ represents a hydrogen atom or a substituent.

The heterocyclic portion of the "heterocyclic group" in formula (C) has hetero atom (for example nitrogen atom, sulfur atom or oxygen atom) in the ring. The heterocyclic ring may be a saturated ring or unsaturated ring, may be a single ring or a condensed ring, and may be substituted or non-substituted. Examples of the heterocyclic ring include tetrahydrofuranyl group, dihydrofuranyl group, tetrahydropyranyl group, dihydropyranyl group, oxocanyl group, dioxanyl group, tetrahydrothiophenyl group, dithianyl group, pyrrolidinyl group, pyrrolinyl group, tetrahydropyridinyl group, piperazinyl group, homopiperazinyl group, piperidinyl group, pyrrolyl group, furyl group, thiophenyl group, benzopyrrolyl group, benzofuryl group, benzothiophenyl group, pyrazolyl group, isoxazolyl group, isothiazolyl group, indazolyl group, benzoisoxazolyl group, benzoisothiazolyl group, imidazolyl group, oxazolyl group, thiazolyl group, benzoimidazolyl group, benzoxazolyl group, benzothiazolyl group, pyridyl group, quinolinyl group, isoquinolinyl group, pyridazinyl group, pyrimidinyl group, pyrazinyl group, cinnolynyl group, phthaladinyl group, quinazolynyl group, quinoxalynyl group, acridinyl group, phenanthrydinyl group, phthaladinyl group, carbazolyl group, uracyl group, dithiouracyl group, carbolinyl group, purinyl group and thiadiazolyl group. These groups may be substituted or non-substituted.

Any substituent being able to be substituted may be used as the substituent in formula (C). Examples of the substituent include alkyl group, alkenyl group, alkynyl group, aryl group, heterocyclic group, acyl group, acyloxy group, acylamino group, alkyloxy group, alkenyloxy group, alkynyloxy group, aryloxy group, heterocyclic oxy group, alkyloxycarbonyl group, alkenyloxycarbonyl group, alkynyloxycarbonyl group, aryloxycarbonyl group, heterocyclic oxycarbonyl group, carbamoyl group, alkylsulfonyl group, alkenylsulfonyl group, alkynylsulfonyl group, arylsulfonyl group, heterocyclic sulfonyl group, alkylsulfonyloxy group, alkenylsulfonyloxy group, alkynylsulfonyloxy group, arylsulfonyloxy group, heterocyclic sulfonyloxy group, sulfamoyl group, alkylsulfonamide group, alkenylsulfonamide group, alkynylsulfonamide group, arylsulfonamide group, heterocyclic sulfonamide group, amino group, alkylamino group, alkenylamino group, alkynylamino group, arylamino group, heterocyclic amino group, alkyloxycarbonylamino group, alkenyloxycarbonylamino group, alkynyloxycarbonylamino group, aryloxycarbonylamino group, heterocyclic oxycarbonylamino group, alkylsulfinyl group, alkenylsulfinyl group, alkynylsulfinyl group, arylsulfinyl group, alkylthio group, alkenylthio group, alkynylthio group, arylthio group, hydroxy group, cyano group, sulfo group, carboxyl group, alkyloxyamino group, alkenyloxyamino group, alkynyloxyamino group, aryloxyamino group, carbamoylamino group, sulfamoylamino group, halogen atom, sulfamoylcarbamoyl group, carbamoylsulfamoyl group, dialkyloxyphosphynyl group, dialkenyloxyphosphinyl group, dialkynyloxyphosphinyl group, diaryloxyphosphinyl group.

The "aryl group" in the specification may be a single ring or condensed ring, and may be substituted or non-substituted (the above-described substituent; when the group has plural substituents, the substituents may be the same or different to one another).

$R^{c01}$ to $R^{c07}$ and $X^{c01}$ in formula (C) will be described in detail below.

$R^{c01}$ in formula (C) represents a heterocyclic group, preferably a heterocyclic group having 1 to 36 carbon atoms, and more preferably a heterocyclic group having 2 to 24 carbon atoms. Examples of the preferable heterocyclic group include pyrrolyl group, furyl group, thiophenyl group, benzopyrrolyl group, benzofuryl group, benzothiophenyl group, pyrrazolyl group, isoxazolyl group, isothiazolyl group, indazolyl group, benzoisoxazolyl group, benzoisothiazolyl group, imidazolyl group, oxazolyl group, thiazolyl group, benzoimidazolyl group, benzooxazolyl group, benzothiazolyl group, pyridyl group, quinolinyl group, isoquinolinyl group, pyridazynil group, pyrimidynyl group, pyrazinyl group, cynnolynyl group, phthaladinyl group, quinazolinyl group, quinoxalinyl group, acridinyl group, phenanthridinyl group, phthaladinyl group, carbazolyl group, carbolinyl group, purinyl group, triazolyl group, oxadiazolyl group and thiadiazolyl group; and 3-pyrazolyl group, 4-pyrazolyl group, 2-imidazolyl group, 4-imidazolyl group, 5-imidazolyl group, 2-oxazolyl group, 2-thiazolyl group, 2-benzimidazolyl group, 2-benzoxazolyl group, 2-benzothiazolyl group, 2-pyridyl group, 3-pyridyl group, 4-pyridyl group, 2-quinolinyl group, 4-quinolinyl group, 1-isoquinolinyl group, 3-isoquinolinyl group, 3-pyridazinyl group, 4-pyridazinyl group, 2-pyrimidinyl group, 4-pyrimidinyl group, 5-pyrimidinyl group, 2-pyrazinyl group, 2-purinyl group, 6-purinyl group, 8-purinyl group, 3-triazolyl group, 5-triazolyl group, 3-oxadiazolyl group, 5-oxadiazolyl group, 3-thiadiazolyl group and 5-thiadiazolyl group are more preferable among them.

When the heterocyclic group represented by $R^{c01}$ is a group capable of being substituted, the group may be substituted with the substituent described in "substituent" of formula (C). The substituents may be the same or different when the heterocyclic is substituted with plural substituents. The following groups are favorable for more effectively manifesting the effect of the invention.

Examples of the substituent include halogen atom (for example fluorine, chlorine and bromine), alkyl group (preferably linear, branched or cyclic alkyl group having 1 to 48 carbon atoms, for example methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl and 1-adamantyl groups), alkenyl group (preferably alkenyl group having 2 to 48 carbon atoms, for example vinyl, aryl and 3-butene-1-yl groups), aryl group (preferably aryl group having 6 to 48 carbon atoms, for example phenyl and naphthyl groups), heterocyclic group (preferably heterocyclic group having 1 to 32 carbon atoms, for example 2-thienyl, 4-pyridyl, 2-furyl, 2-pyrimidinyl, 1-pyridyl, 2-benzothiazolyl, 1-imidazolyl, 1-pyrazolyl and benzotriazol-1-yl groups), silyl group (preferably silyl group having 3 to 38 carbon atoms, for example trimethylsilyl, triethylsilyl, tributylsilyl, t-butyldimethylsilyl and t-hexyldimethylsilyl groups), hydroxyl group, cyano group, nitro group, alkoxy group (preferably alkoxy group having 1 to 48 carbon atoms, for example methoxy, ethoxy, 1-butoxy, 2-butoxy, isopropoxy, t-butoxy, dodecyloxy and cycloalkyloxy (for example cyclopentyloxy, cyclohexyloxy) groups), aryloxy group (preferably aryloxy group having 6 to 48 carbon atoms, for example phenoxy and 1-naphthoxy groups), heterocyclic oxy groups (preferably heterocyclic oxy group having 1 to 32 carbon atoms, for example 1-phenylterazole-5-oxy and 2-tetrahydropyranyloxy groups), silyloxy group (preferably silyloxy group having 1 to 32 carbon atoms, for example trimethylsilyloxy, t-butyldimethylsilyloxy and diphenylmethylsilyloxy groups), acyloxy group (preferably acyloxy group having 2 to 48 carbon atoms, for example acetoxy, pivaloyloxy, benzoyloxy and dodecanoyloxy groups), alkoxycarbonyloxy group (preferably alkoxycarbonyloxy group having 2 to 48 carbon atoms, for example ethoxycarbonyloxy, t-butoxycarbonyloxy, cycloalkylcarbonyloxy group (for example cyclohexyloxycarbonyloxy)), aryloxycarbonyloxy (preferably aryloxycarbonyloxy group having 7 to 32 carbon atoms, for example phenoxycarbonyloxy group), carbamoyloxy group (preferably carbamoyloxy group having 1 to 48 carbon atoms, for example N,N-dimethylcarbamoyloxy, N-butylcarbamoyloxy, N-phenylcarbamoyloxy, N-ethyl-N-phenylcarbamoyloxy groups), sulfamoyloxy group (preferably sulfamoyloxy group having 1 to 32 carbon atoms, for example N,N-diethylsulfamoyloxy and N-propylsulfamoyloxy groups), alkylsulfonyloxy group (preferably alkylsulfonyloxy group having 1 to 38 carbon atoms, for example methylsulfonyloxy, hexadecylsulfonyloxy and cyclohexylsulfonyloxy groups), arylsulfonyloxy group (preferably arylsulfonyloxy group having 6 to 32 carbon atoms, for example phenylsulfonyloxy group), acyl group (preferably acyl group having 1 to 48 carbon atoms, for example formyl, acetyl, pivaloyl, benzoyl, tetradecanoyl and cyclohexanoyl groups), alkoxycarbonyl group (preferably alkoxycarbonyl group having 2 to 48 carbon atoms, for example methoxycarbonyl, ethoxycarbonyl, octadecyloxycarbonyl and cyclohexyloxycarbonyl groups), aryloxycarbonyl group (preferably aryloxycarbonyl group having 7 to 32 carbon atoms, for example phenoxycarbonyl group), carbamoyl group (for example carbamoyl group having 1 to 48 carbon atoms, for example carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl and N,N-dicyclohexylcarbamoyl groups), amino group (preferably amino group having 32 or less carbon atoms, for example amino, methylamino, N,N-dibutylamino, tetradecylamino, 2-ethylhexylamino and cyclohexylamino groups), anilino group (preferably anilino group having 6 to 32 carbon atoms, for example anilino and N-methylanilino groups), heterocyclic amino group (preferably heterocyclic amino group having 1 to 32 carbon atoms, for example 4-pyridylamino group), carbonamide group (preferably carbonamide group having 1 to 32 carbon atoms, for example acetamide, benzamide, pivaloylamide, cyclohexanamide, adamantylamino and 2-ethylhexanamide groups except perfluoroalkyl carbonylamino groups), ureido group (preferably ureido group having 1 to 32 carbon atoms, for example ureido, N,N-dimethylureido and N-phenylureido group), imide group (preferably imide group having 10 or less carbon atoms, for example N-succinimide and N-phthalimide groups), alkoxycarbonylamino group (preferably alkoxycarbonylamino group having 2 to 48 carbon atoms, for example methoxycarbonyl amino, ethoxycarbonyl amino, t-butoxycarbonyl amino, octadecyloxycarbonylamino and cyclohexyloxycarbonylamino groups), aryloxycarbonylamino group (preferably aryloxycarbonylamino group having 7 to 32 carbon atoms, for example phenoxycarbonylamino group), azo group (preferably azo group having 1 to 32 carbon atoms, for example phenylazo and 3-pyrazolylazo groups), alkylthio group (preferably alkylthio group having 1 to 48 carbon atoms, for example methylthio, ethylthio, octylthio and cyclohexylthio groups), arylthio group (preferably arylthio group having 6 to 48 carbon atoms, for example phenylthio group), heterocyclic thio group (preferably heterocyclic thio group having 1 to 32 carbon atoms, for example 2-benzothiazolylthio, 2-pyridylthio and 1-phenyltetrazolylthio groups), alkylsulfinyl group (preferably alkylsulfinyl group having 1 to 32 carbon atoms, for example dodecanesulfinyl group), arylsulfinyl group (preferably arylsulfonyl group having 6 to 32 carbon atoms, for example phenylsulfinyl group), alkylsulfonyl group (preferably alkylsulfonyl group having 1 to 48 carbon atoms, for example methylsulfonyl, ethylsulfonyl, propylsulfonyl, butylsulfonyl, isopropylsulfonyl, 2-ethylhexylsulfonyl, hexadecylsulfonyl, octylsulfonyl and cyclohexylsulfonyl groups), arylsulfonyl group (preferably arylsulfonyl group having 6 to 48 carbon atoms, for example phenylsulfonyl and 1-naphthylsulfonyl group), sulfamoyl group (preferably sulfamoyl group having 32 or less carbon atoms, for example sulfamoyl, N,N-dipropylsulfamoyl, N-ethyl-N-dodecylsulfamoyl, N-ethyl-N-phenylsulfamoyl and N-cyclohexylsulfamoyl groups), sulfo group, phosphonyl group (preferably phosphonyl group having 1 to 32 carbon atoms, for example phenoxyphosphonyl, octyloxyphosphonyl and phenylphosphonyl groups), and phosphinoylamino group (preferably phosphinoylamino group having 1 to 32 carbon atoms, for example diethoxy phosphinoylamino group and dioctyloxy phosphinoylamino group).

When these substituents are able to be further substituted, the substituents may be substituted with the groups described in the "substituent" of formula (C). When the substituent is substituted with plural substituents, they may be the same or different to one another.

$R^{c02}$ in formula (C) represents a hydrogen atom or a substituent. $X^{c01}$ represents —N= or —C($R^{c03}$)=, and $R^{c03}$ represents a hydrogen atom or a substituent. $R^{c02}$ and $R^{c03}$ may be joined together to form a 5-, 6- or 7-membered ring when $X^{c01}$ is —C($R^{c03}$)=.

The substituents represented by $R^{c02}$ and $R^{c03}$, each independently, has the same meaning as the group described in the "substituent" in formula (C).

When the substituents represented by $R^{c02}$ and $R^{c03}$ are able to be further substituted, they may be substituted with the group described in the "substituent" in formula (C). When they are substituted with plural substituents, the substituents may be the same or different to one another.

The following groups are preferable as $R^{c02}$ and $R^{c03}$ for more effectively manifesting the effect of the invention.

Preferable examples of $R^{c02}$ include hydrogen atom, alkyl group, alkenyl group, alkynyl group, aryl group, acyloxy group, acylamino group, alkyloxy group, alkenyloxy group, alkynyloxy group, alkylsulfonyloxy group, alkenylsulfonyloxy group, alkynylsulfonyloxy group, arylsulfonyloxy group, alkylsulfonamide group, alkenylsulfonamide group, alkynylsulfonamide group, arylsulfonamide group, amino group, alkylamino group, alkenylamino group, alkynylamino group, arylamino group, alkyloxycarbonylamino group, alkenyloxycarbonylamino group, alkynyloxycarbonylamino group, aryloxycarbonylamino group, heterocyclic oxycarbonylamino group, hydroxy group, cyano group, sulfo group, carbamoylamino group and sulfamoylamino group. Hydrogen atom, alkyl group, alkenyl group, alkynyl group, cyano group, aryl group, acyloxy group, alkyloxy group, alkenyloxy group, alkynyloxy group, alkylsulfonyloxy group, alkenylsulfonyloxy group and alkynylsulfonyloxy group are more preferable, and hydrogen atom, alkyl group, alkenyl group, alkynyl group and cyano group are most preferable.

Preferable examples of $R^{c03}$ include alkyl group, alkenyl group, alkynyl group, aryl group, acyl group, acylamino group, alkyloxycarbonylamino group, alkenyloxycarbonylamino group, alkynyloxycarbonylamino group, aryloxycarbonyl group, carbamoyl group, alkylsulfonyl group, alkenylsulfonyl group, alkynylsulfonyl group, arylsulfonyl group, heterocyclic sulfonyl group, alkylsulfonyloxy group, alkenylsulfonyloxy group, alkynylsulfonyloxy group, arylsulfonyloxy group, alkylsulfonamide group, alkenylsulfonamide group, alkynylsulfonamide group, arylsulfonamide group, cyano group and carboxyl group, and $X^{c01}$ is preferably selected from —C($R^{c03}$)= and N= when $R^{c03}$ represents these groups. Acyl group, alkyloxycarbonylamino group, alkenyloxycarbonylamino group, alkynyloxycarbonylamino group, alkylsulfonyl group, alkenylsulfonyl group, alkynylsulfonyl group, arylsulfonyl group, cyano group and carboxyl group are more preferable as $R^{c03}$, and $X^{c01}$ is more preferably selected from —C($R^{c03}$)= and N= when $R^{c03}$ represents these groups. Alkyloxycarbonylamino group, alkenyloxycarbonylamino group, alkynyloxycarbonylamino group, alkylsulfonyl group, alkenylsulfonyl group, alkynylsulfonyl group and cyano group are most preferable as $R^{c03}$, and $X^{c01}$ is most preferably selected from —C($R^{c03}$)= and N= when $R^{c03}$ represents these groups.

The substituents represented by $R^{c04}$ and $R^{c07}$ are the groups described in the "substituent" in formula (C), and any groups are available so long as they are able to be substituted. When $R^{c04}$ and $R^{c07}$ are the groups being able to be substituted, the substituent may have the substituent described in the "substituent" in formula (C). When the substituent is substituted with plural substituents, the substituents may be the same or different to one another.

For more effectively manifesting the effect of the invention, $R^{c04}$ and $R^{c07}$ preferably represent hydrogen atom or alkyl group, alkenyl group, alkynyl group, aryl group, heterocyclic group, acyl group, acyloxy group, acylamino group, alkyloxy group, alkenyloxy group, alkynyloxy group, aryloxy group, heterocyclic oxy group, alkyloxycarbonyl group, alkenyloxycarbonyl group, alkynyloxycarbonyl group, carbamoyl group, sulfamoyl group, alkylsulfonamide group, alkenylsulfonamide group, alkynylsulfonamide group, arylsulfonamide group, heterocyclic sulfonamide group, amino group, alkylamino group, alkenylamino group, alkynylamino group, arylamino group, heterocyclic amino group, alkyloxycarbonylamino group, alkenyloxycarbonylamino group, alkynyloxycarbonylamino group, aryloxycarbonylamino group, heterocyclic oxycarbonylamino group, alkylthio group, alkenylthio group, alkynylthio group, arylthio group, heterocyclic thio group, hydroxy group, cyano group, sulfo group, carboxyl group, carbamoylamino group, sulfamoylamino group and halogen atom; more preferably represent hydrogen atom, alkyl group, alkenyl group, alkynyl group, heterocyclic group, acylamino group, alkyloxy group, alkenyloxy group, alkynyloxy group, aryloxy group, alkylsulfonamide group, alkenylsulfonamide group, alkynylsulfonamide group, arylsulfonamide group, alkylamino group, alkenylamino group, alkynylamino group, arylamino group, heterocyclic amino group, alkylthio group, alkenylthio group, alkynylthio group, arylthio group, and halogen atom; and most preferably represent alkyloxy group, alkenyloxy group, alkylamino group, alkenylamino group, arylamino group, heterocyclic amino group and alkylthio group.

$R^{c05}$ and $R^{c06}$ each independently represents hydrogen atom, alkyl group, alkenyl group, alkynyl group, aryl group, heterocyclic group, acyl group, alkoxycarbonyl group, aryloxycarbonyl group, carbamoyl group, alkylsulfonyl group, arylsulfonyl group, or sulfamoyl group. When $R^{c05}$ and $R^{c06}$ are groups being able to be substituted, the group may have the substituents described in the "substituent" in formula (C). When the substituent is substituted with plural substituents, they may be the same or different to one another. $R^{c05}$ and $R^{c06}$ may form a 5-, 6- or 7-membered ring by being joined to one another.

For manifesting the effect of the invention, $R^{c05}$ and $R^{c06}$ preferably represent hydrogen atom, alkyl group, alkenyl group, aryl group, heterocyclic group, acyl group, carbamoyl group, alkylsulfonyl group, arylsulfonyl group or sulfamoyl group; more preferably represent hydrogen atom, alkyl group, alkenyl group, aryl group, heterocyclic group, alkylsulfonyl group or arylsulfonyl group; and most preferably represent hydrogen atom, alkyl group, aryl group, heterocyclic group or alkylsulfonyl group.

Examples of the 5-, 6- or 7-membered ring formed by joining $R^{c05}$ and $R^{c06}$ to one another include a piperidinyl group, pyrrolidinyl group, azepanyl group and morpholinyl group that may be substituted, and piperidinyl group and pyrrolidinyl group are preferable.

The pigments represented by formula (C) are pigments represented by formula (C2) below.

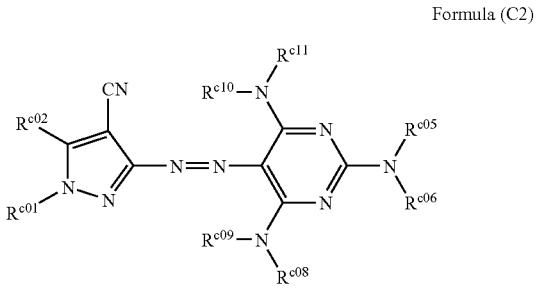

Formula (C2)

$R^{c01}$, $R^{c02}$, $R^{c05}$ and $R^{c06}$ in formula (C2) as well as preferable aspects thereof are the same as those in formula (C). In formula (C2), $R^{c08}$, $R^{c09}$, $R^{c10}$ and $R^{c11}$ each independently represents hydrogen atom, alkyl group, alkenyl group, alkynyl group, aryl group, heterocyclic group, acyl group, alkoxycarbonyl group, aryloxycarbonyl group, carbamoyl group, alkylsulfonyl group, arylsulfonyl group or sulfamoyl group. When $R^{c05}$ and $R^{c06}$ are groups being able to be substituted, the groups may have substituents described in the "substituent" in formula (C). When the group is substituted with plural substituents, they may be the same or different to one another. $R^{c05}$ and $R^{c06}$ may form a 5-, 6- or 7-membered ring by being joined to one another. For more effectively manifesting the effect of the invention, $R^{c08}$, $R^{c09}$, $R^{c10}$ and $R^{c11}$ preferably represent hydrogen atom, alkyl group, alkenyl group, aryl group, heterocyclic group, acyl group, carbamoyl group, alkylsulfonyl group, arylsulfonyl group or sulfamoyl group; more preferably represent hydrogen atom, alkyl group, alkenyl group, aryl group, heterocyclic group, alkylsulfonyl group or arylsulfonyl group; and most preferably represent hydrogen atom, alkyl group, aryl group, heterocyclic group or alkylsulfonyl group. When $R^{c08}$, $R^{c09}$, $R^{c10}$ and $R^{c11}$ are groups being able to be substituted, they may be substituted with the substituent described in the "substituent" in formula (C). When the substituent is substituted with plural substituents, they may be the same or different to one another.

More preferably, $R^{c01}$ represents 3-pyrazolyl group, 4-pyrazolyl group, 2-imidazolyl group, 4-imidazolyl group, 5-imidazolyl group, 2-oxazolyl group, 2-thiazolyl group, 2-benzimidazolyl group, 2-benzoxazolyl group, 2-benzothiazolyl group, 2-pyridyl group, 3-pyridyl group, 4-pyridyl group, 2-quinolinyl group, 4-quinolinyl group, 1-isoquinolinyl group, 3-isoquinolinyl group, 3-pyridazinyl group, 4-pyridazinyl group, 2-pyrimidinyl group, 4-pyrimidinyl group, 5-pyrimidinyl group, 2-pyrazinyl group, 2-purinyl group, 6-purinyl group, 8-purinyl group, 3-triazolyl group, 5-triazolyl group, 3-oxadiazolyl group, 5-oxadiazolyl group, 3-thiadiazolyl group or 5-thiadiazolyl group;

$R^{c02}$ represents hydrogen atom, alkyl group, alkenyl group, alkynyl group, cyano group, aryl group, acyloxy group, alkyloxy group, alkenyloxy group, alkynyloxy group, alkylsulfonyloxy group, alkenylsulfonyloxy group or alkynylsulfonyloxy group; and $R^{c05}$, $R^{c06}$, $R^{c08}$, $R^{c09}$, $R^{c10}$ and $R^{c11}$, each independently represents hydrogen atom, alkyl group, alkenyl group, aryl group, heterocyclic group, acyl group, alkoxycarbonyl group, aryloxycarbonyl group, carbamoyl group, alkylsulfonyl group, arylsulfonyl group or sulfamoyl group in the pigment represented by formula (C2).

Further preferably, $R^{c01}$ represents 3-pyrazolyl group, 4-pyrazolyl group, 2-imidazolyl group, 4-imidazolyl group, 5-imidazolyl group, 2-oxazolyl group, 2-thiazolyl group, 2-benzimidazolyl group, 2-benzoxazolyl group, 2-benzothiazolyl group, 2-pyridyl group, 3-pyridyl group, 4-pyridyl group, 2-quinolinyl group, 4-quinolinyl group, 1-isoquinolinyl group, 3-isoquinolinyl group, 3-pyridazinyl group, 4-pyridazinyl group, 2-pyrimidinyl group, 4-pyrimidinyl group, 5-pyrimidinyl group, 2-pyrazinyl group, 2-purinyl group, 6-purinyl group, 8-purinyl group, 3-triazolyl group, 5-triazolyl group, 3-oxadiazolyl group, 5-oxadiazolyl group, 3-thiadiazolyl group and 5-thiadiazolyl group;

$R^{c02}$ represents hydrogen atom, alkyl group, alkenyl group, cyano group, acyloxy group, alkyloxy group or alkylsulfonyloxy group; and $R^{c05}$, $R^{c06}$, $R^{c08}$, $R^{c09}$, $R^{c10}$ and $R^{c11}$, each independently represents hydrogen atom, alkyl group, alkenyl group, aryl group, heterocyclic group, acyl group, alkoxycarbonyl group, aryloxycarbonyl group, carbamoyl group, alkylsulfonyl group, arylsulfonyl group or sulfamoyl group in the pigment represented by formula (C2).

Most preferably, $R^{c01}$ represents 3-pyrazolyl group, 4-pyrazolyl group, 2-imidazolyl group, 4-imidazolyl group, 5-imidazolyl group, 2-oxazolyl group, 2-thiazolyl group, 2-benzimidazolyl group, 2-benzoxazolyl group, 2-benzothiazolyl group, 3-pyridazinyl group, 4-pyridazinyl group, 2-pyrimidinyl group, 4-pyrimidinyl group, 5-pyrimidinyl group, 2-pyrazinyl group, 3-triazolyl group, 5-triazolyl group, 3-oxadiazolyl group, 5-oxadiazolyl group, 3-thiadiazolyl group or 5-thiadiazolyl group;

$R^{c02}$ represents hydrogen atom, alkyl group or cyano group; and $R^{c05}$, $R^{c06}$, $R^{c08}$, $R^{c09}$, $R^{c10}$ and $R^{c11}$, each independently represents hydrogen atom, alkyl group, alkenyl group, aryl group, heterocyclic group, acyl group, alkylsulfonyl group, arylsulfonyl group or sulfamoyl group in the pigment represented by formula (C2).

The pigment represented by formula (C) or (C2) may form a salt with metal ions or cations of nitrogen-containing compounds with interposition of any one of $R^{c01}$ to $R^{c11}$. When the metal ion is a divalent or higher metal ion, the salt may involve plural pigments (may be the same or different to one another) represented by formula (C) or (C2), or form a bis, tris or multimer by being bonded with interposition of any one of $R^{c01}$ to $R^{c11}$. The metal ion is not particularly restricted so log as the metal ion is cationic and forms a salt with anions contained in the substituent of the pigment represented by formula (C) or (C2). Examples of preferable metal ions include Li, Na, K, Rb, Cs, Ag, Mg, Ca, Sr, Ba, Zn, Al, Ni, Cu, Co and Fe.

Examples of the nitrogen-containing compound include those described in JP-A No. 2005-99658, pages 12 to 20.

The molar ratio of the nitrogen-containing compound/acid dye (represented by n hereinafter) of the salt comprising the pigment represented by formula (C) or (C2) and the cation of the nitrogen-containing compound is a value that determines the molar ratio between the pigment molecule represented by formula (C) or (C2) and the nitrogen-containing compound as a counter-ion, and may be freely selected depending on salt-forming conditions between the pigment represented by formula (C) or (C2) and an amine compound. Specifically, numeric numbers of functional groups of the acid in the pigment represented by formula (C) or (C2) in the range of $0 < n \leq 5$ are frequently used in practical cases, and are selected by taking all the factors such as solubility in organic solvents and developers, salt-forming ability, absorbance, interaction with other components in curable composition, light resistance, heat resistance and required performance into consideration. The numerical value is preferably in the range of $0 < n \leq 4.5$, more preferably in the range of $0 < n \leq 4$ and particularly in the range of $0 < n \leq 3.5$ when the ratio is selected only in terms of absorbance.

While specific examples of the pigment (A3-1 to A3-24) represented by formula (C) or (C2) are shown below, the invention is not restricted thereto.

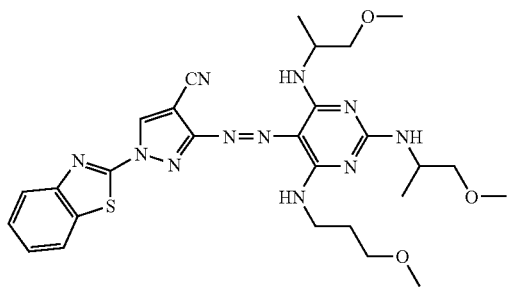

(A3-1)

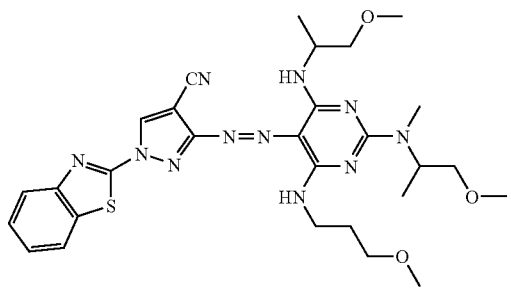

(A3-2)

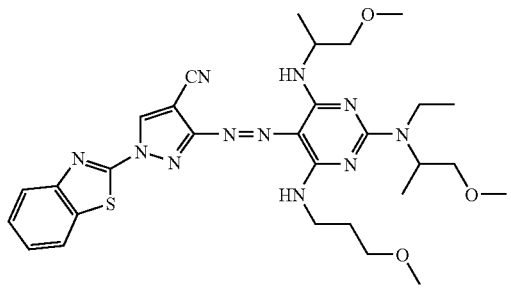

(A3-3)

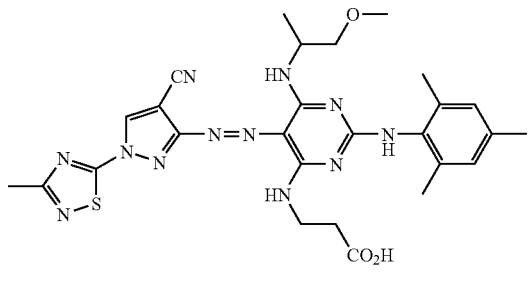

(A3-4)

-continued
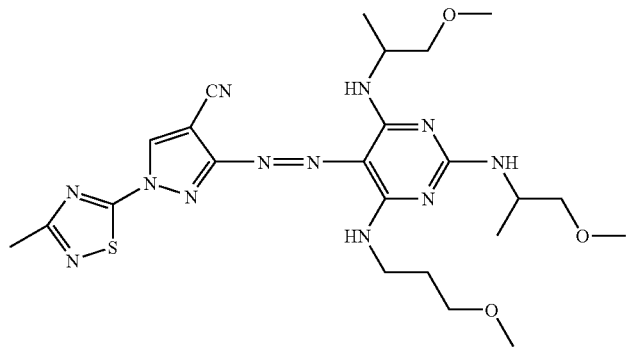
(A3-5)
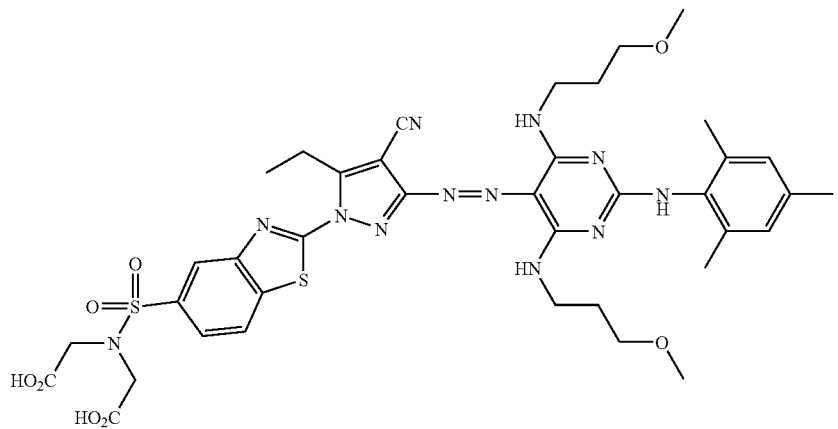
(A3-6)
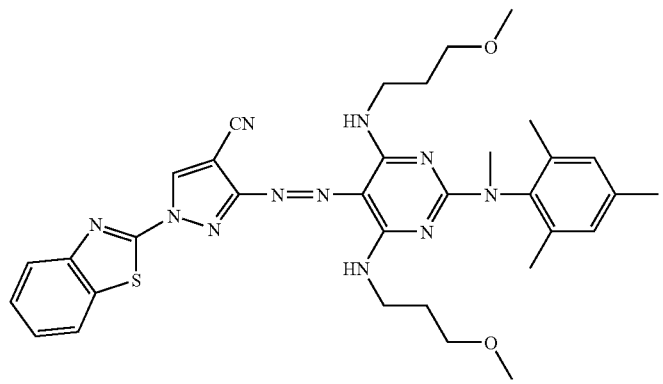
(A3-7)
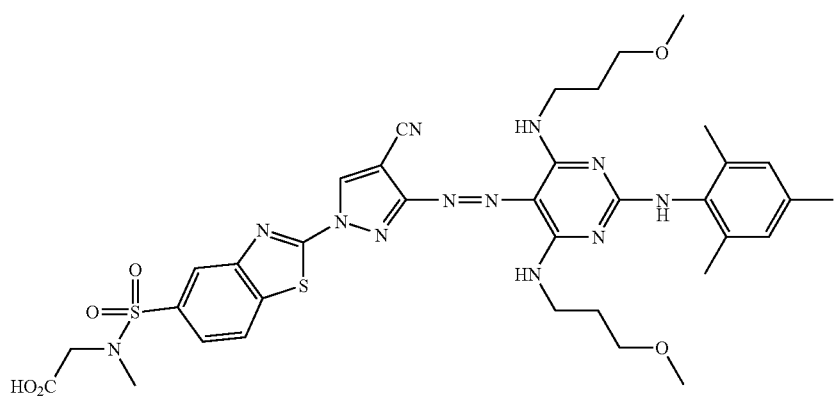
(A3-8)

-continued
(A3-9)
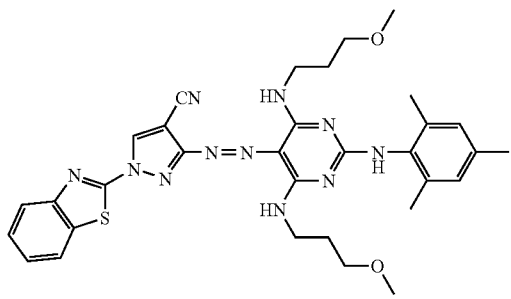
(A3-10)
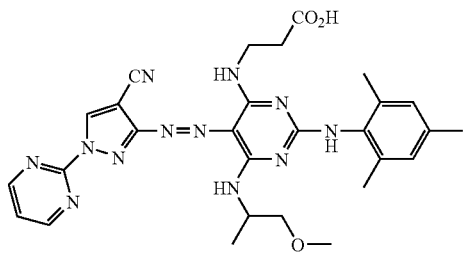
(A3-11)
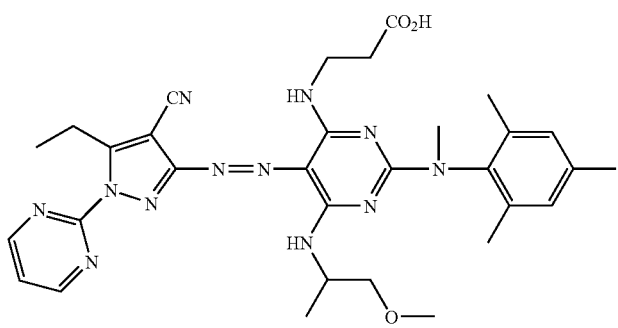
(A3-12)
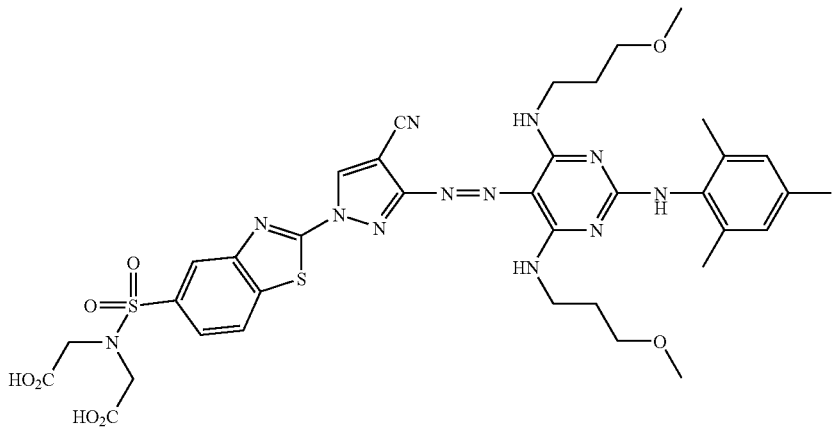
(A3-13)
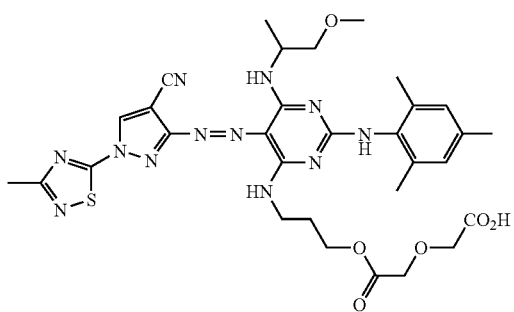
(A3-14)
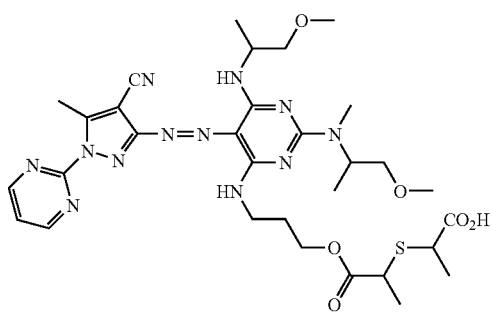

-continued
(A3-15)
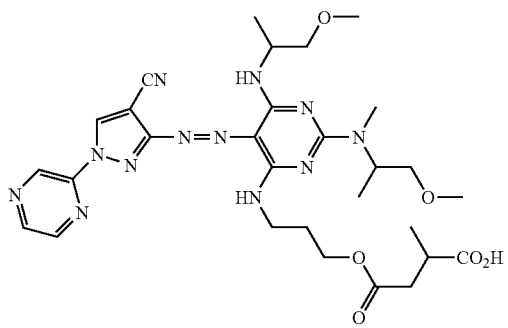
(A3-16)
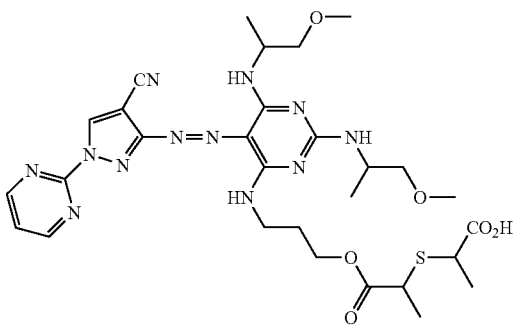
(A3-17)
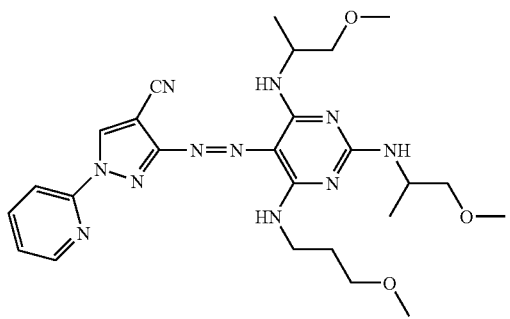
(A3-18)
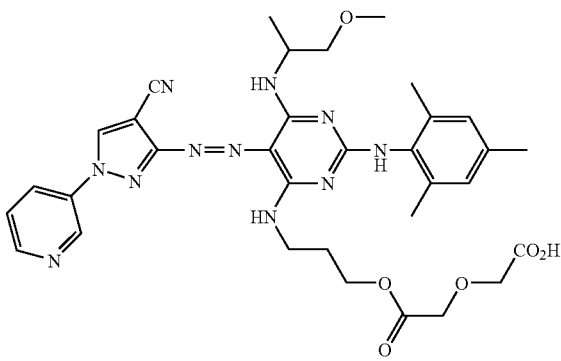
(A3-19)
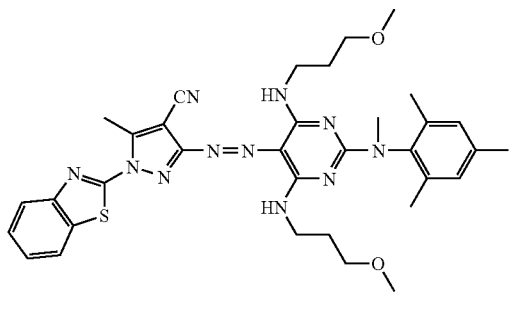
(A3-20)
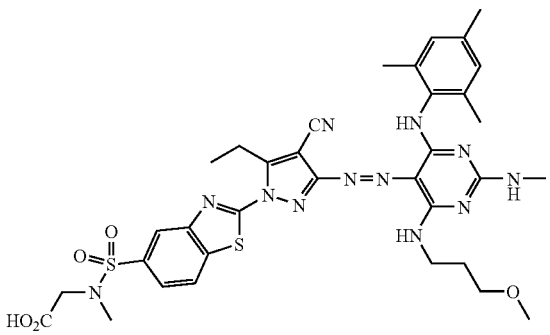
(A3-21)
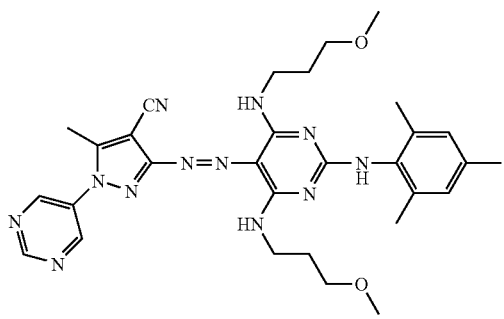
(A3-22)
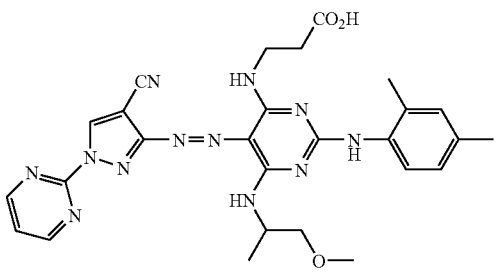

(A3-23)

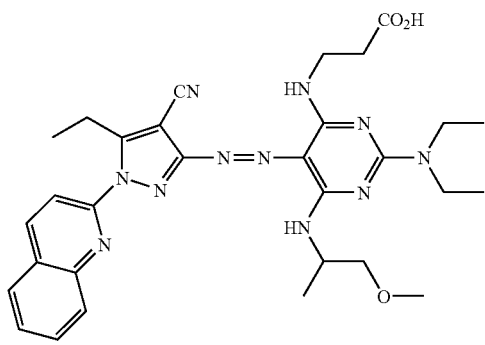

(A3-24)

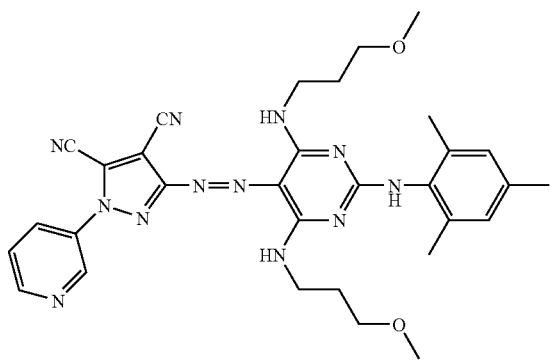

While examples of synthesis of the azo dye represented by formula (C) will be described with reference to reaction scheme A below as an example of synthesis of above-mentioned compound (1), the invention is not restricted to these examples.

[Example of Synthesis]: Synthesis of Compound A3-1 mL, 0.545 mole) was added dropwise to the solution. After completing the addition, the solution was heated at 105 to 115° C. with stirring for 7.5 hours. After completion of the reaction, the reaction solution was cooled to room temperature, and the reaction product was extracted by adding 300 mL of water and 300 mL of ethyl acetate. The ethyl acetate reaction scheme A

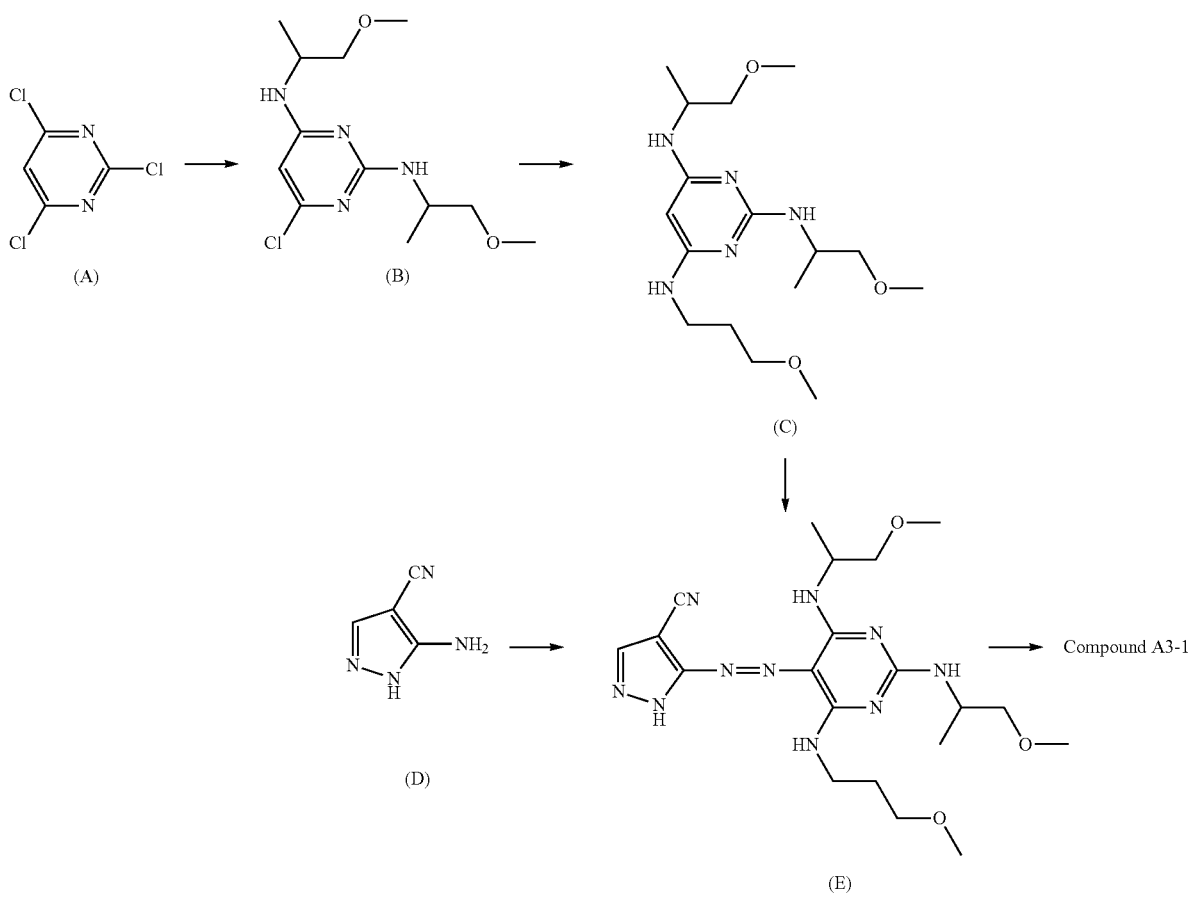

(1) Synthesis of Compound B

After adding compound A (50.0 g, 0.273 mole) dropwise into 2-amino-1-methoxypropane (61.0 g, 0.684 mole), the mixture was heated at 75° C. with stirring. Triethylamine (76 solution was washed with water, and dried over anhydrous magnesium sulfate. After concentrating the ethyl acetate solution in a vacuum, the residue was purified by silica gel chromatography (eluent: n-hexane/ethyl acetate=10/1) to obtain compound B (70.0 g, yield 88.8%). The compound A used was "2,4,6-trichloropyrimidine", manufactured by Sigma-Aldrich Co.

(2) Synthesis of Compound C

Methoxypropylamine (53.9 g, 0.605 mole) was added to the compound B (70.0 g, 0.242 mole) obtained by the above-mentioned process, and the solution was heated at an external temperature from 160 to 170° C. for 29 hours with stirring. After completing the reaction, cooling the reaction solution to room temperature, then the product was extracted by adding 400 mL of water and 400 mL of ethyl acetate. The ethyl acetate solution was washed with water, and dried over anhydrous magnesium sulfate. After concentrating the ethyl acetate solution in a vacuum, the residue was purified by silica gel chromatography (eluent: n-hexane/ethyl acetate=3/1) to obtain compound C (51.8 g, yield 62.8%).

(3) Synthesis of Compound E

A solution prepared by dissolving 5.00 g (0.046 mole) of compound (D) in phosphoric acid (56.0 mL) was stirred at 0° C., and sodium nitrite (3.51 g, 0.051 mole) was added to the solution with stirring for 1 hour. A solution of 15.3 g (0.045 mole) of compound (C) in acetic acid solution (5.0 mL) was added to the solution with stirring for 3 hours at 25° C. After adding ethyl acetate (500 mL) and water (500 mL), the solution was neutralized by adding sodium hydrogen carbonate. The organic phase was thoroughly washed with water, and the solvent was removed by evaporation. The residue was dissolved by adding 200 mL of ethyl acetate, and n-hexane (600 mL) was added to the solution. After removing the precipitated viscous solid, n-hexane (600 mL) was further added to the filtrate, and the precipitated yellow solid was separated by filtration. The crystal obtained was dried to obtain 19.0 g (yield 89.1%) of compound (E).

(4) Synthesis of Compound A3-1

Dimethylacetamide (20 mL), sodium hydrogen carbonate (2.18 g, 0.0259 mole), 2-chlorobenzothiazole (2.10 g, 0.0124 mole) and distilled water (2.0 mL) were added to the compound (E) (3.8 g, 0.0083 mole), and the solution was stirred at a temperature from 90 to 95° C. for 15 hours. After completing the reaction, the reaction solution was cooled to room temperature, and the product was extracted by adding 400 mL of water and 400 mL of ethyl acetate. After washing the ethyl acetate solution with saturated saline solution (300 mL) twice followed by washing with water, the solution was dried over anhydrous magnesium sulfate. After concentrating the ethyl acetate solution in a vacuum, the residue was purified by silica gel column chromatography (eluent: n-hexane/ethyl acetate=3/1). The product eluted from the column was dissolved in ethyl acetate (100 mL), and n-hexane (400 mL) was added to the solution. The precipitated solid was separated by filtration and washed with n-hexane (100 mL) and dried to obtain compound A3-1 (4.2 g, yield 85.7%) as a yellow crystal.

Compound A3-1 obtained was subjected to measurements of the melting point, maximum absorption wavelength (λmax) in ethyl acetate and molar absorbance coefficient (ε) using a spectrophotometer (trade name: UV-3100PC, manufactured by Shimadzu Co.) to obtain a melting point of 132 to 133° C., maximum absorption wavelength (λmax) of 437.1 nm and ε of 46,250.

[Phthalocyanine Compound]

Organic groups of the phthalocyanine compound are preferable substituted. The compound will be described in detail below.

—Phthalocyanine Compound (1)—

The preferable phthalocyanine compound is the compound represented by formula (C1) in JP-A No. 2006-133508. Descriptions of substituents in the formula, preferable examples thereof and examples of synthesis are also described in the document.

While specific examples of the phthalocyanine compounds (compound A4-1 to S4-13, A-14 to A-19) are shown below, the invention is not restricted thereto.

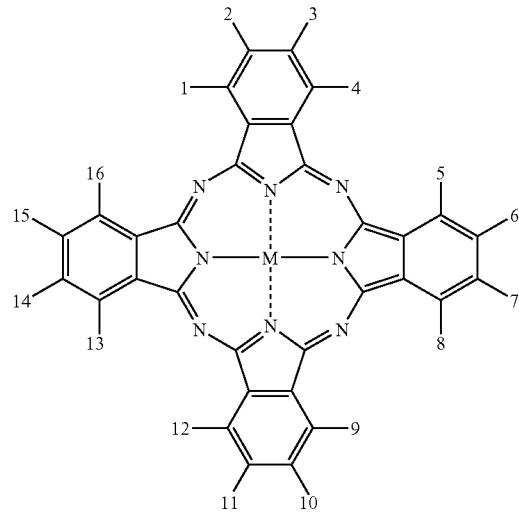

| Compound | M | Substituent at sites 1 or 4, 5 or 8, 9 or 12, 13 or 16 (other 4 sites are H) | Substituent at other 8 sites |
|---|---|---|---|
| A4-1 | Cu | —S—C₆H₄—C(O)N(CH₂CH₂OC₂H₅)₂ | H |

-continued
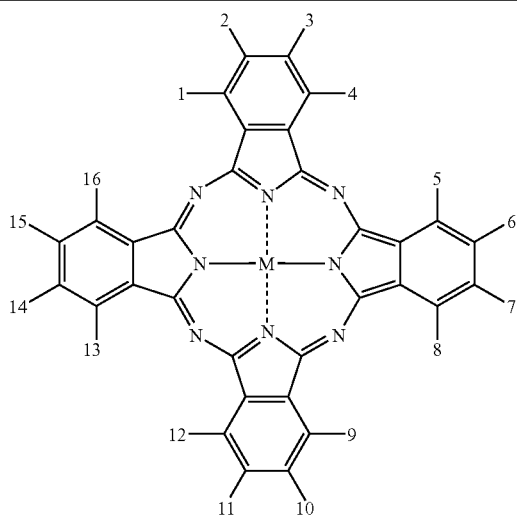
| Compound | M | Substituent at sites 1 or 4, 5 or 8, 9 or 12, 13 or 16 (other 4 sites are H) | Substituent at other 8 sites |
|---|---|---|---|
| A4-2 | Cu | —S—C$_6$H$_4$—C(O)N(CH$_2$CH$_2$OCH$_3$)$_2$ | H |
| A4-3 | Cu | —S—C$_6$H$_4$—C(O)OCH$_3$ | H |
| A4-4 | Cu | —S—C$_6$H$_4$—C(O)N(CH$_3$)CH$_2$CH$_2$OCH$_3$ | H |
| A4-5 | Cu | —S—C$_6$H$_4$—C(O)OCH(CH$_3$)CH$_2$OCH$_3$ | H |
| A4-6 | Cu | —S—C$_6$H$_4$—C(O)N(C$_2$H$_5$)CH$_2$CH$_2$OCH$_3$ | H |

-continued
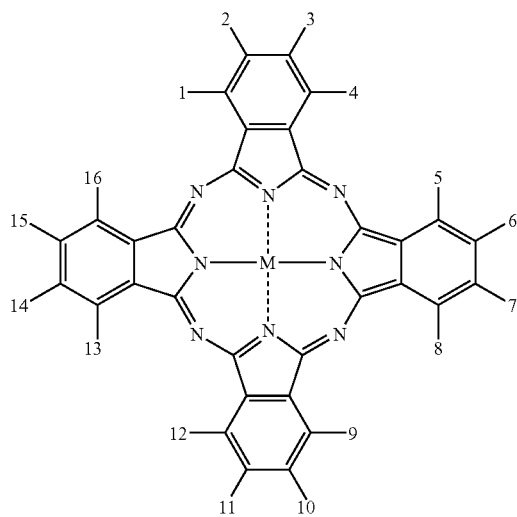
| Compound | M | Substituent at sites 1 or 4, 5 or 8, 9 or 12, 13 or 16 (other 4 sites are H) | Substituent at other 8 sites |
|---|---|---|---|
| A4-7 | Cu | 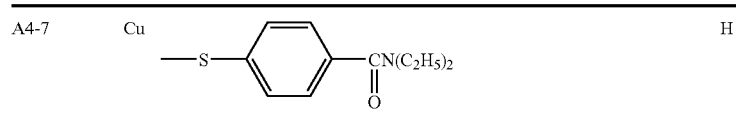 | H |
| A4-8 | Cu | 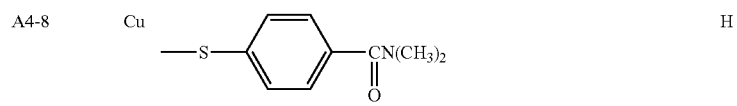 | H |
| A4-9 | Cu | 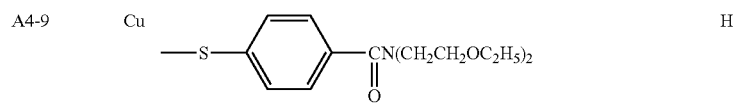 | H |
| A4-10 | Cu | 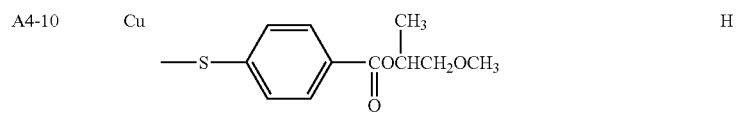 | H |
| A4-11 | Cu | 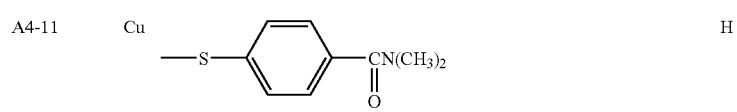 | H |

-continued
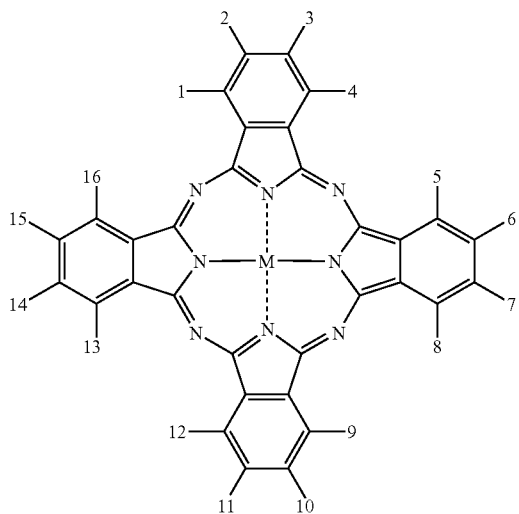
| Compound | M | Substituent at sites 1 or 4, 5 or 8, 9 or 12, 13 or 16 (other 4 sites are H) | Substituent at other 8 sites |
|---|---|---|---|
| A4-12 | Cu | 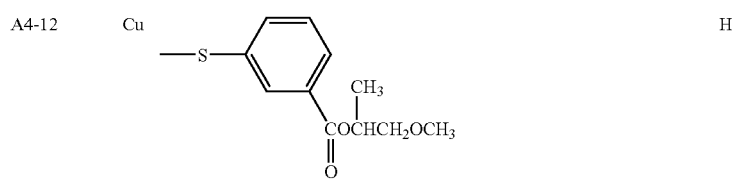 | H |
| A4-13 | Co | 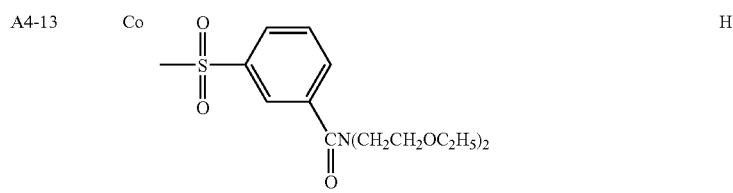 | H |
(A4-14)
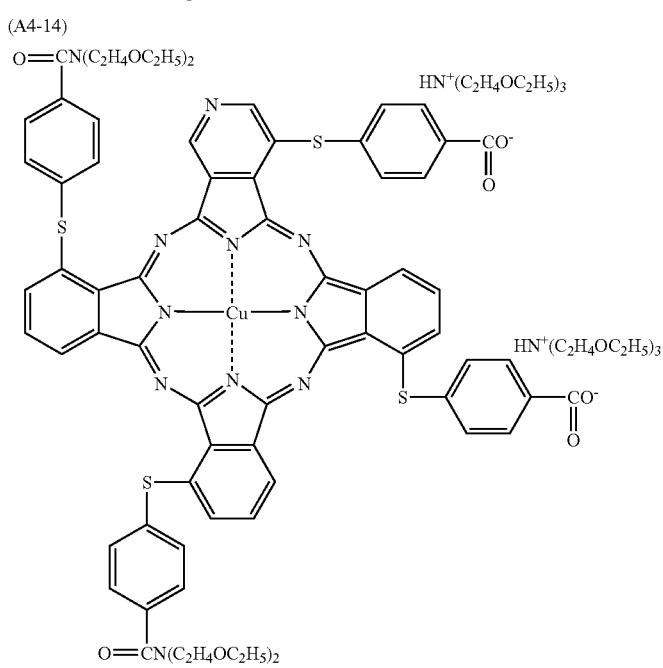

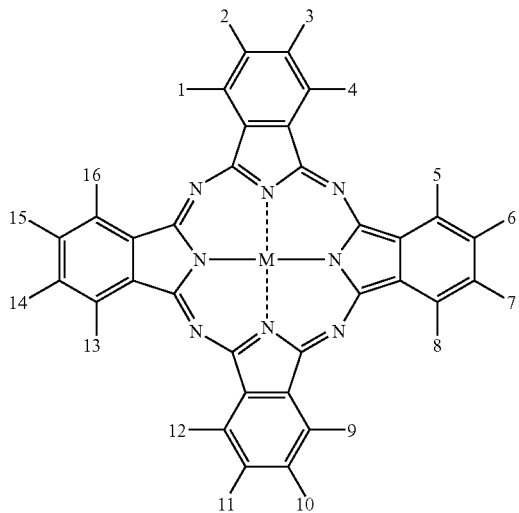
| Compound | M | Substituent at sites 1 or 4, 5 or 8, 9 or 12, 13 or 16 (other 4 sites are H) | Substituent at other 8 sites |
(A4-15)
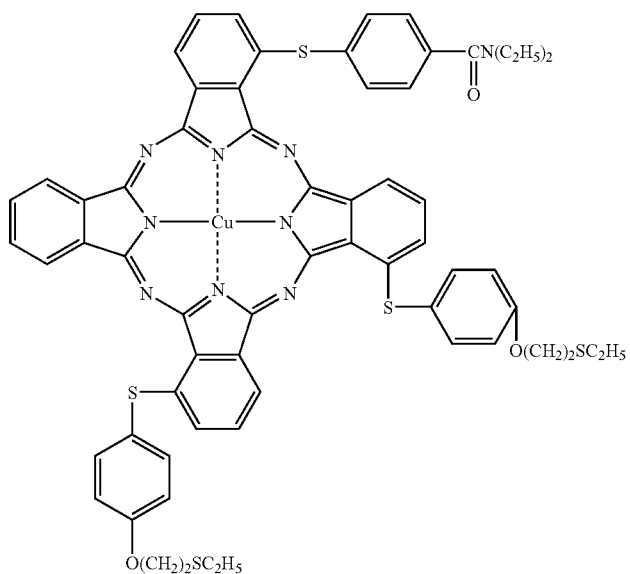

-continued
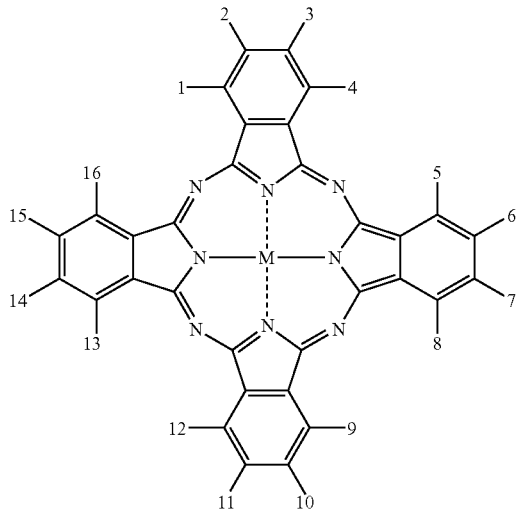
| Compound | M | Substituent at sites 1 or 4, 5 or 8, 9 or 12, 13 or 16 (other 4 sites are H) | Substituent at other 8 sites |
(A4-16)
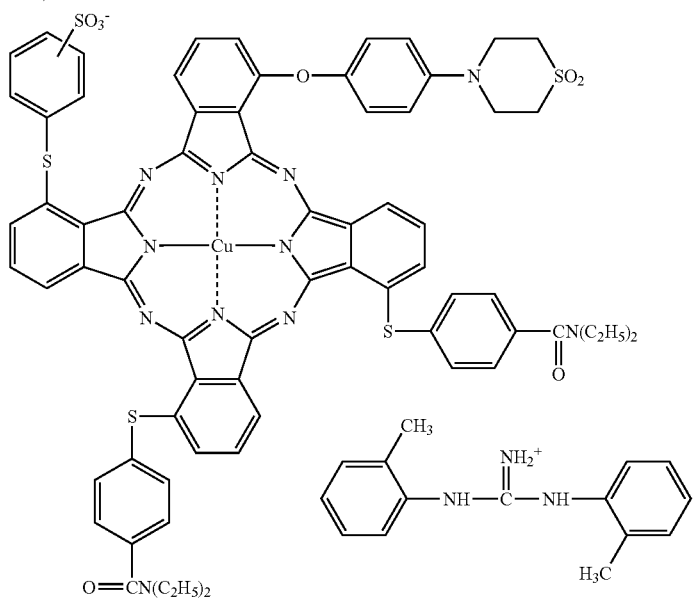

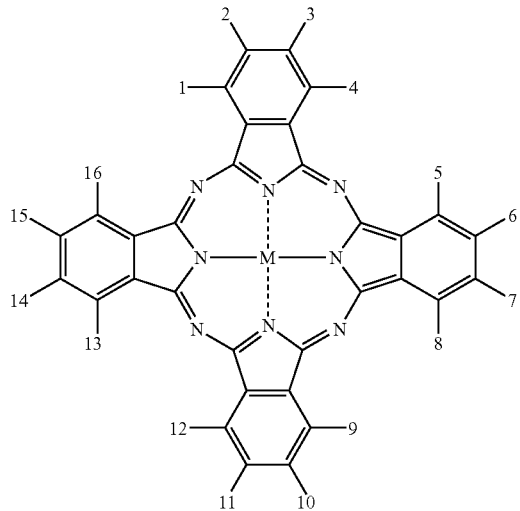
| Compound | M | Substituent at sites 1 or 4, 5 or 8, 9 or 12, 13 or 16 (other 4 sites are H) | Substituent at other 8 sites |
(A4-17)
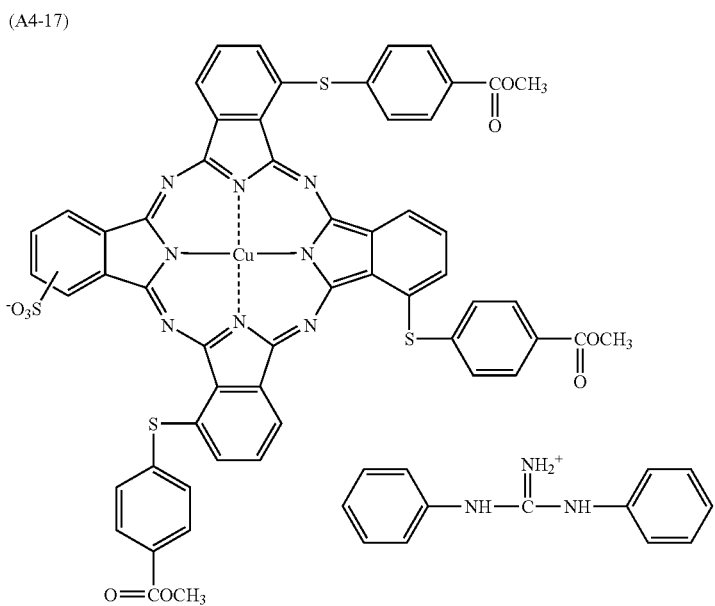

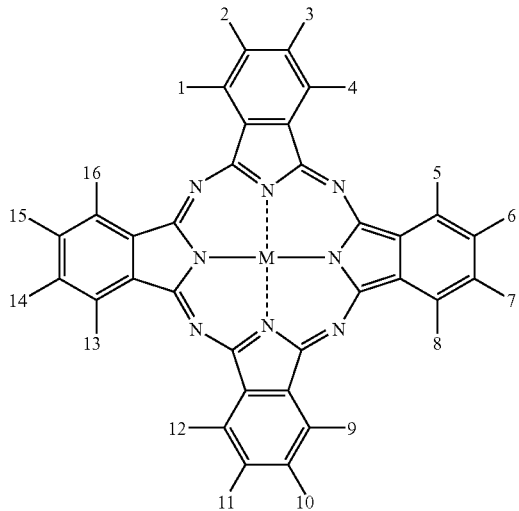
| Compound | M | Substituent at sites 1 or 4, 5 or 8, 9 or 12, 13 or 16 (other 4 sites are H) | Substituent at other 8 sites |
(A4-18)
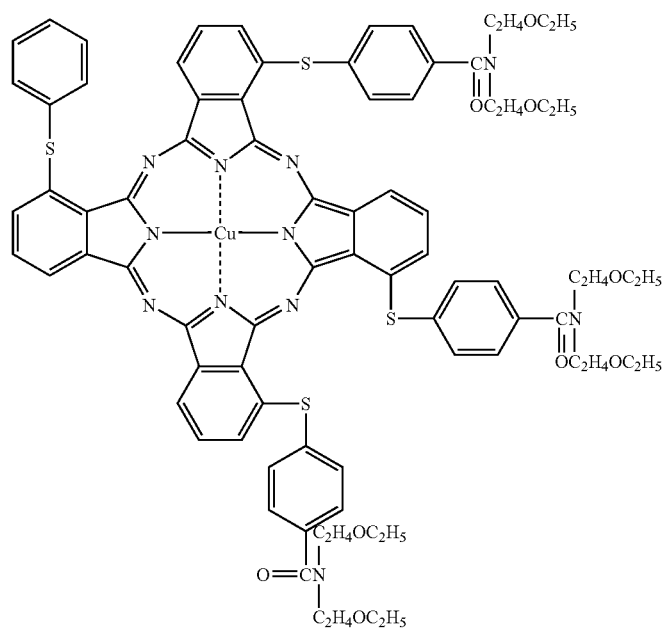

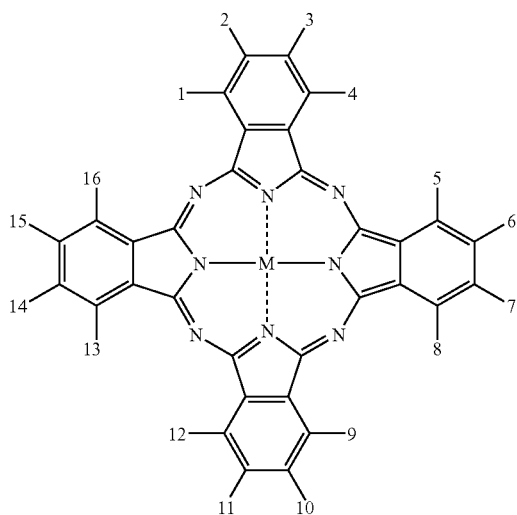

| Compound | M | Substituent at sites 1 or 4, 5 or 8, 9 or 12, 13 or 16 (other 4 sites are H) | Substituent at other 8 sites |

(A4-19)

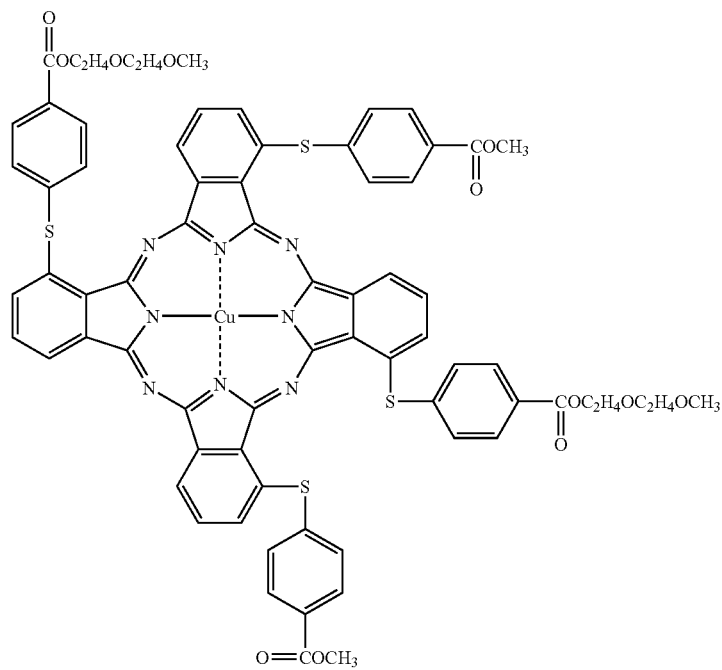

—Phthalocyanine Compound (2)—

Examples of other phthalocyanine compound include tetraazaporphyrin compound represented by formula (β) below. The compound is an organic solvent-soluble dye having a favorable molar absorbance coefficient ϵ and chromatic valance, and simultaneously satisfies higher light resistance and higher heat resistance than conventional dyes while it is readily soluble in water or organic solvents when necessary.

Formula (β)

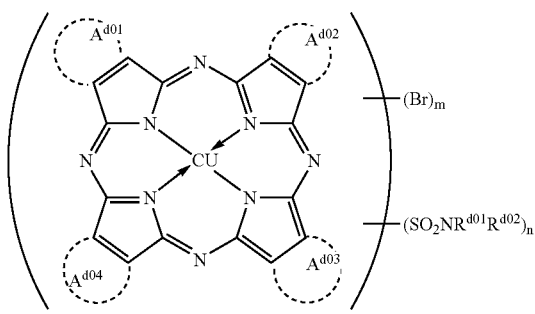

In formula (β), ring $A^{d01}$, ring $A^{d02}$, ring $A^{d03}$ and ring $A^{d04}$ each independently represents the following aromatic ring, and there are many isomers depending on the direction of condensation of the ring and substitution sites of substituents linked to the ring.

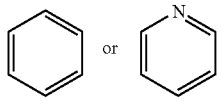

At least one of ring $A^{d01}$, ring $A^{d02}$, ring $A^{d03}$ and ring $A^{d04}$ represents the following aromatic ring.

Specific examples of the compound include the five structures of formulae (3) to (7) below as basic frames of formula (β), and positional isomers having different sites of N are present depending on the direction of condensation of the pyridine ring. There are also isomers having different substitution sites of substituents such as bromine.

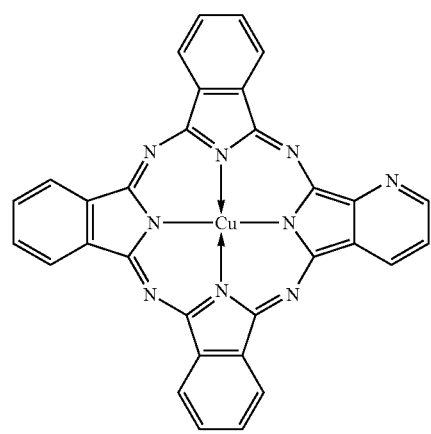
(3)

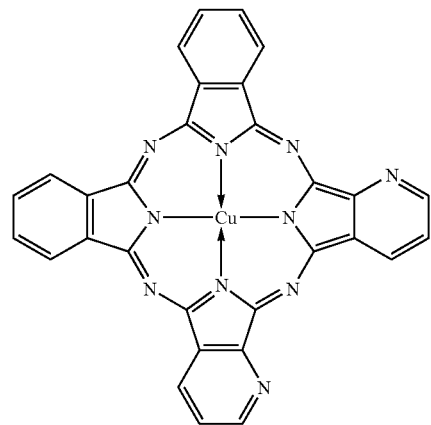
(4)

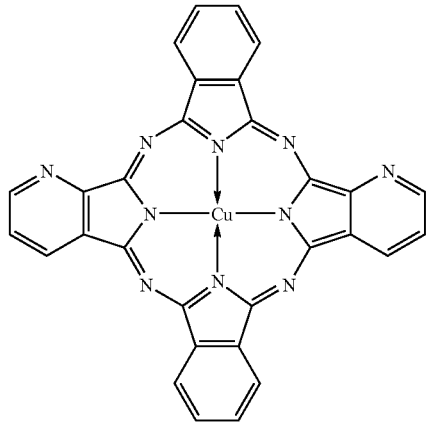
(5)

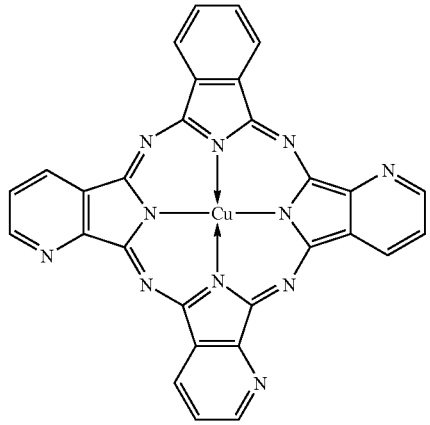
(6)

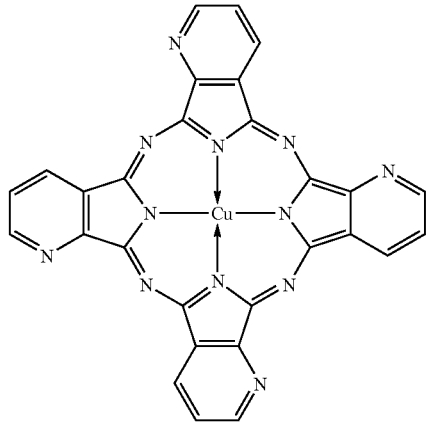
(7)

In formula (β), $R^{d01}$ and $R^{d02}$ each independently represents a hydrogen atom or substituted or non-substituted alkyl group. However, $R^{d01}$ and $R^{d02}$ do not simultaneously represent hydrogen atoms. m is an integer form 1 to 8, and n is an integer from 1 to 4.

The non-substituted alkyl group represented by $R^{d01}$ or $R^{d02}$ is preferably an alkyl group having 1 to 12 carbon atoms, for example linear or branched alkyl groups such as methyl group, ethyl group, n-propyl group, isopropyl group, n-butyl group, isobutyl group, n-hexyl group, 2-ethylhexyl group, n-octyl group and n-dodecyl group. The linear or branched alkyl groups having 4 to 12 carbon atoms are preferable among them.

The substituted alkyl group represented by $R^{d01}$ or $R^{d02}$ is preferably an alkyl group containing an oxygen atom as at least one form of an ether bond, a carbonyl bond and an ester bond. Linear, branched or cyclic substituted alkyl groups having 2 to 12 carbon atoms and containing 1 to 4 oxygen atoms as at least one form described above are more preferable as the substituted alkyl group. Examples of the preferable alkyl group include methoxymethyl group, ethoxymethyl group, butoxymethyl group, methoxyethyl group, ethoxyethyl group, 3-methoxypropyl group, 3-ethoxypropyl group, 3-butoxypropyl group, mehtoxyethoxyethyl group, ethoxyethoxyethyl group, butoxyethoxyethyl group, methoxyethoxyethoxyethyl group, ethoxyethoxyethoxyethyl group, butoxyethoxyethoxyethyl group, acetylmethyl group, acetylethyl group, propyonylmethyl group, propyonylethyl group, tetrahydrofurfuryloxymethyl group, 2,2-dimethyl-1,3-dioxolane-4-methoxymethyl group, 2-(1,3-dioxolane) ethoxymethyl group, 2-(1,3-dioxane)ethoxymethyl group, methoxycarbonylmethyl group, ethoxycarbonylethyl group, propoxycarbonylethyl group, butoxycarbonylethyl group, pentoxycarbonylbutyl group, 1-(butoxymethyl)ethyl group, 1-(methoxymethyl)propyl group, 1-(ethoxymethyl)propyl group, 1-(butoxymethyl)propyl group, 1-(2-methoxyethoxymethyl)-propyl group, 1-(2-ethoxyethoxymethyl)propyl group, 1-(2-methoxy-2-ethoxy-2-ethoxymethyl)ethyl group, 1-(2-ethoxy-2-ethoxy-2-ethoxymethyl)ethyl group, 1-(2-butoxy-2-ethoxy-2-ethoxymethyl)ethyl group, 1-(2-methoxy-2-ethoxy-2-ethoxymethyl)propyl group, 1-(2-ethoxy-2-ethoxy-2-ethoxymethyl)propyl group, 1-(2-propoxy-2-ethoxy-2-ethoxymethyl)propyl group, 1-(2-butoxy-2-ethoxy-2-ethoxymethyl)propyl group, 1-(2-methoxy-2-ethoxy-2-ethoxymethyl)butyl group, 1-(2-ethoxy-2-ethoxy-2-ethoxymethyl)butyl group, 1-(2-propoxy-2-ethoxy-2-ethoxymethyl)butyl group, 1-(2-methoxy-2-ethoxy-2-ethoxymethyl)pentyl group, 1-(2-ethoxy-2-ethoxy-2-ethoxymethyl)pentyl group, 1-(2-methoxy-2-ethoxy-2-ethoxy-2-ethoxymethyl)ethyl group, 1-(2-ethoxy-2-ethoxy-2-ethoxy-2-ethoxymethyl)ethyl group, 1-(2-methoxy-2-ethoxy-2-ethoxy-2-ethoxymethyl) propyl group, 1-(2-ethoxy-2-ethoxy-2-ethoxy-2-ethoxymethyl)propyl group, 1-(2-methoxy-2-ethoxy-2-ethoxy-2-ethoxymethyl)butyl group, 1-(2-methoxy-2-ethoxy-2-ethoxy-2-ethoxyethyl)ethyl group, 1-(2-ethoxy-2-ethoxy-2-ethoxy-2-ethoxyethyl)ethyl group, 1-(2-methoxy-2-ethoxy-2-ethoxy-2-ethoxyethyl)propyl group, 1,1-di(methoxymethyl)methyl group, 1,1-di(ethoxymethyl)methyl group, 1,1-di(propoxymethyl)methyl group, 1,1-di(butoxymethyl)methyl group, 1,1-di(2-methoxyethoxymethyl) methyl group, 1,1-di(2-ethoxy-ethoxymethyl)methyl group, 1,1-di(2-propoxyethoxymethyl)methyl group and 1,1-di(2-butoxy-ethoxymethyl)methyl group.

Preferably, $R^{d01}$ and $R^{d02}$, each independently, is a hydrogen atom ($R^{d01}$ and $R^{d02}$ do not simultaneously represent hydrogen atoms), non-substituted alkyl group, or "a substituted alkyl group containing oxygen atoms as at least one of an ether bond, a carbonyl bond or an ester bond".

It is particularly preferable in terms of high solubility in polar organic solvents that $R^{d01}$ and $R^{d02}$, each independently, is a hydrogen atom ($R^{d01}$ and $R^{d02}$ do not simultaneously represent hydrogen atoms), non-substituted alkyl group having 1 to 12 carbon atoms, or "a substituted alkyl group having 2 to 12 carbon atoms containing 1 to 4 oxygen atoms as at least one of an ether bond, a carbonyl bond or an ester bond"; or it is more particularly preferable that at least one of $R^{d01}$ and $R^{d02}$ is "a substituted alkyl group having 2 to 12 carbon atoms containing 1 to 4 oxygen atoms as at least one of an ether bond, a carbonyl bond or an ester bond".

Preferably, at least one of $R^{d01}$ and $R^{d02}$ is a substituted alkyl group having 2 to 12 carbon atoms containing 1 to 4 oxygen atoms in at least one of an ether bond, a carbonyl bond or an ester bond, and a tetraazaporphyrin compound is preferable when at least one of $R^{d01}$ and $R^{d02}$ is a substituted alkyl represented by formula ($\beta^2$) below.

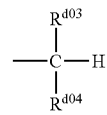

Formula ($\beta^2$)

$R^{d03}$ and $R^{d04}$ in formula ($\beta^2$) each independently represents hydrogen atom, non-substituted alkyl group, "alkyl group containing oxygen atom in at least one of ether bond, carbonyl bond or ester bond", alkylcarbonyl group or alkoxycarbonyl group. However, at least one of $R^{d03}$ and $R^{d04}$ represents "alkyl group containing oxygen atom in at least one of ether bond, carbonyl bond or ester bond", alkylcarbonyl group or alkoxycarbonyl group.

The non-substituted alkyl group represented by $R^{d03}$ or $R^{d04}$ is preferably alkyl groups having 1 to 8 carbon atoms, for example methyl group, ethyl group, propyl group, isopropyl group, butyl group, isobutyl group, pentyl group, hexyl group and octyl group.

The "substituted alkyl group containing oxygen atom in at least one of ether bond, carbonyl bond or ester bond" represented by $R^{d03}$ or $R^{d04}$ is preferably substituted alkyl groups having 2 to 10 carbon atoms containing 1 to 4 oxygen atoms. Examples thereof include methoxymethyl group, ethoxymethyl group, propoxymethyl group, butoxymethyl group, methoxyethoxymethyl group, ethoxyethoxymethyl group, propoxyethoxymethyl group, butoxyethoxymethyl group, methoxyethoxyethoxymethyl group, ethoxyethoxyethoxymethyl group, propoxyethoxyethoxymethyl group, butoxyethoxyethoxymethyl group, methoxyethoxyethoxyethoxymethyl group, ethoxyethoxyethoxyethoxymethyl group, propoxyethoxyethoxyethoxymethyl group, butoxyethoxyethoxyethoxymethyl group, acetylmethyl group, propyonylmethyl group, tetrahydrofurfuryloxymethyl group, 2,2-dimethyl-1,3-dioxolane-4-methoxymethyl group, 2-(1,3-dioxolane)ethoxymethyl group, 2-(1,3-dioxane) ethoxymethyl group, methoxycarbonylmethyl group, ethoxycarbonylmethyl group, propoxycarbonylmethyl group, butoxycarbonylmethyl group and pentoxycarbonylmethyl group.

The alkylcarbonyl group and alkoxycarbonyl group represented by $R^{d03}$ or $R^{d04}$ are preferably alkylcarbonyl groups having 2 to 10 carbon atoms or alkoxycarbonyl groups having 2 to 10 carbon atoms. Examples thereof include acetyl group, propyonyl group, propylcarbonyl group, methoxycarbonyl group, ethoxycarbonyl group, propoxycarbonyl group, butoxycarbonyl group and pentoxycarbonyl group.

In formula ($\beta$), m represents an integer from 1 to 8, preferably from 1 to 6. m is particularly preferably an integer from 1 to 4 in terms of high absorbance. n represents an integer from 1 to 4, preferably from 2 or 3, and particularly 2.

The tetraazaporphyrin compound represented by formula ($\beta$) contains a part or all of various isomers thereof.

While specific examples of the tetraazaporphylin compound represented by formula ($\beta$) (specific examples A5-1 to A5-38) are shown below, the invention is not restricted to these examples.

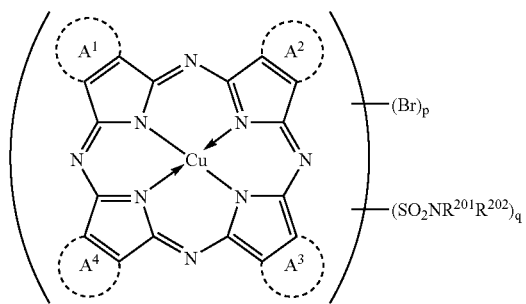

| No. of specific Example | Number (benzene) | Number (pyridine) | p | q | $R^{201}$ | $R^{202}$ |
|---|---|---|---|---|---|---|
| A5-1 | 3 | 1 | 1 | 1 | H | —$C_2H_4OC_2H_5$ |
| A5-2 | 3 | 1 | 2 | 2 | H | —$C_2H_4OC_2H_5$ |
| A5-3 | 3 | 1 | 3 | 3 | H | —$C_2H_4OC_2H_5$ |
| A5-4 | 3 | 1 | 1 | 4 | H | —$C_2H_4OC_2H_5$ |
| A5-5 | 3 | 1 | 1 | 1 | —$C_2H_4OC_2H_5$ | —$C_2H_4OC_2H_5$ |
| A5-6 | 3 | 1 | 1 | 1 | H | —$C_3H_6OC_4H_9$ |
| A5-7 | 3 | 1 | 1 | 2 | H | —$C_3H_6OC_4H_9$ |
| A5-8 | 3 | 1 | 1 | 3 | H | —$C_3H_6OC_4H_9$ |
| A5-9 | 3 | 1 | 1 | 4 | H | —$C_3H_6OC_4H_9$ |
| A5-10 | 3 | 1 | 1 | 1 | —$C_2H_4OCH_3$ | —$C_2H_4OCH_3$ |
| A5-11 | 3 | 1 | 1 | 2 | —$C_2H_4OCH_3$ | —$C_2H_4OCH_3$ |
| A5-12 | 3 | 1 | 1 | 3 | —$C_2H_4OCH_3$ | —$C_2H_4OCH_3$ |
| A5-13 | 3 | 1 | 1 | 4 | —$C_2H_4OCH_3$ | —$C_2H_4OCH_3$ |
| A5-14 | 3 | 1 | 1 | 2 | —$C_4H_9$ | —$C_4H_9$ |
| A5-15 | 3 | 1 | 1 | 1 | H | —$CH_2$—$CH(C_2H_5)$—$C_4H_9$ |
| A5-16 | 3 | 1 | 1 | 2 | H | —$CH_2$—$CH(C_2H_5)$—$C_4H_9$ |
| A5-17 | 3 | 1 | 1 | 3 | H | —$CH_2$—$CH(C_2H_5)$—$C_4H_9$ |
| A5-18 | 3 | 1 | 1 | 4 | H | —$CH_2$—$CH(C_2H_5)$—$C_4H_9$ |
| A5-19 | 3 | 1 | 1 | 1 | H | —$C_3H_6$—$OCH_2$—$CH(C_2H_5)$—$C_4H_9$ |
| A5-20 | 3 | 1 | 1 | 2 | H | —$C_3H_6$—$OCH_2$—$CH(C_2H_5)$—$C_4H_9$ |
| A5-21 | 3 | 1 | 1 | 3 | H | —$C_3H_6$—$OCH_2$—$CH(C_2H_5)$—$C_4H_9$ |
| A5-22 | 3 | 1 | 4 | 2 | H | —$C_3H_6$—$OCH_2$—$CH(C_2H_5)$—$C_4H_9$ |
| A5-23 | 3 | 1 | 5 | 2 | H | —$C_2H_4OC_2H_4OC_2H_5$ |
| A5-24 | 3 | 1 | 6 | 1 | —$C_2H_5$ | —$C_2H_4OC_2H_5$ |
| A5-25 | 3 | 1 | 8 | 1 | -i-$C_3H_7$ | —$CH_2O$—$C_2H_4$—(1,3-dioxane) |

-continued

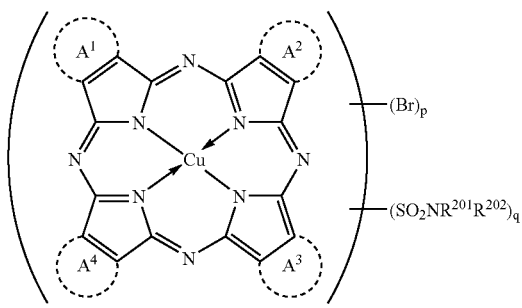

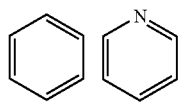

| No. of specific Example | Number (benzene) | Number (pyridine) | p | q | $R^{201}$ | $R^{202}$ |
|---|---|---|---|---|---|---|
| A5-26 | 3 | 1 | 3 | 2 | H | —CH(C$_2$H$_5$)—CH$_2$OCH$_3$ |
| A5-27 | 3 | 1 | 1 | 1 | H | —CH(C$_2$H$_5$)—CH$_2$OC$_2$H$_4$OC$_2$H$_5$ |
| A5-28 | 3 | 1 | 1 | 2 | H | —CH(C$_2$H$_5$)—CH$_2$OC$_2$H$_4$OC$_2$H$_5$ |
| A5-29 | 3 | 1 | 2 | 2 | H | —CH(C$_2$H$_5$)—CH$_2$OC$_2$H$_4$OC$_2$H$_5$ |
| A5-30 | 3 | 1 | 3 | 2 | H | —CH(C$_2$H$_5$)—CH$_2$OC$_2$H$_4$OC$_2$H$_5$ |
| A5-31 | 3 | 1 | 1 | 1 | H | —CH(i-C$_3$H$_7$)—COOCH$_3$ |
| A5-32 | 3 | 1 | 1 | 2 | H | —CH(i-C$_3$H$_7$)—COOCH$_3$ |
| A5-33 | 3 | 1 | 1 | 2 | H | —CH(i-C$_3$H$_7$)—COOCH$_3$ |
| A5-34 | 3 | 1 | 1 | 1 | H | —CH(i-C$_3$H$_7$)—COOCH$_3$ |
| A5-35 | 3 | 1 | 3 | 2 | -n-C$_8$H$_{17}$ | —CH(C$_2$H$_5$)—CH$_2$OC$_2$H$_4$OC$_2$H$_5$ |
| A5-36 | 3 | 1 | 4 | 2 | H | —CH(COOC$_2$H$_4$OC$_2$H$_5$)—COOC$_2$H$_4$OC$_2$H$_5$ |
| A5-37 | 3 | 1 | 1 | 1 | —C$_2$H$_4$OC$_2$H$_4$OC$_2$H$_5$ | —C$_2$H$_4$OC$_2$H$_4$OC$_2$H$_5$ |
| A5-38 | 2 | 2 | 1 | 1 | H | —C$_2$H$_4$OC$_2$H$_5$ |

Production Method of Tetraazaporphyrin Compound Represented by Formula (β)

The method for producing the tetraazaporphyrin compound represented by formula (β) will be described below. Outline of the representative production example is as follows.

(1) A mixture appropriately selected from the group consisting of phthalic acid, bromo-substituted phthalic acid, pyridine-2,3-dicarboxylic acid and bromo-substituted pyridine-2,3-dicarboxylic acid are allowed to react to produce a basic frame of the bromo-substituted tetraazaporphyrin compound.

(2) Subsequently, the compound is converted into a chlorosulfonyl derivative.

(3) The compound represented by formula (β) is obtained by allowing an amine to react with the chlorosulfonyl derivative of the bromo-substituted tetraazaporphyrin to obtain an amide compound.

In another synthetic method, the compound represented by formula (β) is obtained by synthesizing the tetraazaporphyrin compound by allowing a mixture of phthalic acid and pyridine-2,3-dicarboxylic acid to react, and by allowing the reaction product to react with bromine after chlorsulfonylation and amidation; or by allowing the tetraazaporphyrin compound to react with bromine followed by chlorosulfonylation and amidation.

The above-mentioned production method will be described in detail below.

In the step for forming a bromo-substituted tetraazaporphyrin ring in (1), the tetraazaporphrin ring is obtained by heating a mixture appropriately selected from phthalic acid, bromo-substituted phthalic acid, pyridine-2,3-dicarboxylic acid and bromo-substituted pyridine-2,3-dicarboxylic acid and any of copper powder, copper oxide or a copper salt at 120 to 300° C. in the presence of any of ammonia gas, an ammonium compound or urea; and ammonium molybdate as a catalyst without using any solvent or using a solvent such as tetralin, 1-chloronaphthaline, nitrobenzene, trichlorobenzene or DMI.

The ratio (molar ratio) of each component in the mixture of phthalic acid (A), bromo-substituted phthalic acid (B), pyridine-2,3-dicarboxylic acid (C) and bromo-substituted pyridine-2,3-dicarboxylic acid (D) is preferably 3.5:0.5 to 0:4, more preferably 3:1 to 0.5:3.5 and further preferable 3:1 to 1:3 as the ratio of (A)+(B):(C)+(D); and 3.5:0.5 to 0:4, more preferably 3:1 to 0.5:3.5 and further preferable 3:1 to 1:3 as the ratio of (A)+(C):(B)+(D).

Dicyano derivatives or acid anhydrides may be used in place of phthalic acid, bromo-substituted phthalic acid, pyridine-2,3-dicarboxylic acid and bromo-substituted pyridine-2,3-dicarboxylic acid.

Specific examples of bromo-substituted phthalic acid include 3-bromophthalic acid, 4-bromphthalic acid and 3,4,5,6-tetrabromophthalic acid. Specific examples of bromo-substituted pyridine-2,3-dicarboxylic acid include 5-bromopyridine-2,3-dicarboxylic acid and 6-bromopyridine-2,3-dicarboxylic acid.

In the chrolosulfonylation step (2), the bromo-substituted tetraazaporphyrin compound obtained in step (1) is added in small portions to 5 to 20 folds by mass of chlorosulfonic acid so that the temperature is maintained at 20° C. or less. After stirring the mixture for 1 hour at the same temperature, the reaction is continued for 4 hour at 155 to 160° C. The temperature is cooled to 80° C., and thionyl chloride in an amount 2 to 5 folds by mass of the tetraazaporphirin compound is added dropwise in 1 to 2 hours while the temperature is maintained at 70 to 80° C. After stirring the reaction mixture for 2 to 10 hours at the same temperature, it is cooled to 15 to 20° C. followed by stirring for 12 hours at the same temperature. This reaction solution is discharged into ice water 50 to 200 folds by mass of the amount of chlorosulfonic acid used. The precipitate is filtered off, and is washed with ice water until the filtrate becomes neutral to obtain a sulfonyl chloride derivative of the bromo-substituted tetraazaporphyrin compound.

While the tetrasulfonyl chloride derivative is mainly obtained under the above-mentioned reaction condition, mono-, di- or tri-substituted sulfonyl chloride derivative may be obtained by using a more mild reaction condition in chlorosulfonic acid, i.e., to reduce the reaction temperature or to shorten the reaction time.

In the step (3) for obtaining a sulfonamide derivative by amidation, the sulfonyl chloride derivative of the bromo-substituted tetraazaporphyrin compound obtained in step (2) is suspended in ice water, and an organic amine compound represented by $NHR^{d01}R^{d02}$ (in the formula, $R^{d01}$ and $R^{d02}$ are the same as $R^{d01}$ and $R^{d02}$ in formula (β)) is added dropwise in an amount 2 to 8 folds excess to the molar amount of the bromo-substituted tetraazaporphyrin compound so that the temperature is maintained at 15° C. or less. After the addition, the reaction mixture is stirred at 20 to 30° C. for 15 to 24 hours. The reaction product is filtered off, washed with water and dried to obtain the tetraazaporphyrin compound represented by formula (β).

While the product obtained as described above may be often a mixture of plural isomers, the mixture is also within the scope of the invention that is able to exhibit the effect of the invention.

When the product is a mixture, it may be optionally purified by conventional purification methods such as recrystallization from an organic solvent such as ethyl acetate, acetone or methanol, or column chromatography, in order to obtain an isolated compound.

[Azomethine Compound]

It is preferable that a heterocyclic ring is directly linked to the azomethine compound. The heterocyclic ring is the same as the heterocyclic ring in the section on heterocyclic azo compound in the preferable example and specific example.

—Azomethine Compound (1)—

Examples of the azomethine compound are the azomethine pigments represented by formula (γ) below. The pigment is excellent in stability without time-dependent precipitation in a liquid preparation or coating film, while it is excellent in durability to the heat and light with good developability by suppressing development residues.

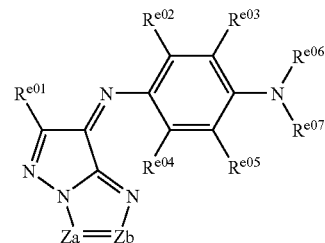

Formula (γ)

In formula (γ), $R^{e01}$ represents a hydrogen atom or substituent, $R^{e02}$, $R^{e03}$, $R^{e04}$ and $R^{e05}$ each independently represents a hydrogen atom or substituent, and $R^{e06}$ and $R^{e07}$ each independently represents an alkyl group, an alkenyl group, an aryl group or a heterocyclic group. Za and Zb each independently represents —N═ or —C($R^{d08}$)═, and $R^{d08}$ represents a hydrogen atom, an alkyl group, an alkenyl group, an aryl group or a heterocyclic group. $R^{e02}$ and $R^{e03}$, $R^{e03}$ and $R^{e06}$, $R^{e04}$ and $R^{e05}$, $R^{e05}$ and $R^{e07}$ and $R^{e06}$ and $R^{e07}$ may form 5-, 6- or 7-membered rings, respectively, by being joined to one another. $R^{e01}$ to $R^{e07}$, Za and Zb in formula (γ) will be described below.

$R^{e01}$ in formula (γ) represents a hydrogen atom or substituent. Examples of the substituent represented by $R^{e01}$ include halogen atom (for example fluorine atom, chlorine atom, bromine atom), alkyl group (preferably alkyl group having 1 to 48 carbon atoms, more preferably linear, branched or cyclic alkyl group having 1 to 18 carbon atoms; for example methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl and 1-adamantyl group), alkenyl group (alkenyl group preferably having 2 to 48 carbon atoms, more preferably 2 to 18 carbon atoms; for example vinyl, allyl or 3-buten-1-yl group), aryl group (aryl group preferably having 6 to 48 carbon atoms, more preferably 6 to 12 carbon atoms; for example phenyl or naphthyl group), heterocyclic group (heterocyclic group preferably having 1 to 32 carbon atoms, more preferably 1 to 12 carbon atoms; for example 2-thienyl, 4-pyridyl, 2-furyl, 2-pyrimidinyl, 1-pyridyl, 2-benzothiazolyl, 1-imidazolyl, 1-pyrazolyl or benzotriazol-1-yl), silyl group (silyl group preferably having 3 to 38 carbon atoms, more preferably 3 to 12 carbon atoms; for example trimethylsilyl, triethylsilyl, tributylsilyl, t-butyldimethylsilyl or t-hexyldimethylsilyl group), hydroxyl group, cyano group, nitro group, alkoxy group (alkoxy group preferably having 1 to 48 carbon atoms, more preferably 1 to 12 carbon atoms: for example methoxy, ethoxy, 1-butoxy, 2-butoxy, isopropoxy, t-butoxy, dodecyloxy or cycloalkyloxy (for example cyclopentyloxy or cyclohexyloxy) group), aryloxy group (aryloxy group preferably having 6 to 48 carbon atoms, more preferably 6 to 12 carbon atoms; for example phenoxy or 1-naphthoxy group), heterocyclic oxy group (heterocyclic oxy group preferably having 1 to 32 carbon atoms, more preferably 1 to 12 carbon atoms; for example 1-phenyltetrazole-5-oxy, 2-tetrahydropyranyloxy group), silyloxy group (silyloxy group preferably having 1 to 32 carbon atoms, more preferably 1 to 12 carbon atoms; for example trimethylsilyloxy, t-butyldimethylsilyloxy or diphenylmethylsilyloxy group), acyloxy group (acyloxy group preferably having 2 to 48 carbon atoms, more preferably 2 to 12 carbon atoms; for example acetoxy, pivaloyloxy, benzoyloxy or dodecanoyloxy group), alkoxycarbonyloxy group (alkoxycarbonyloxy group preferably having 2 to 48 carbon atoms, more preferably having 2 to 12 carbon atoms; for example ethoxycarbonyloxy, t-butoxycarbonyloxy or cycloalkyloxycarbonyloxy group (for example cyclohexyloxycarbonyloxy group), aryloxycarbonyloxy group (aryloxycarbonyloxy group preferably having 7 to 32 carbon atoms, more preferably having 7 to 18 carbon atoms; for example phenoxycarbonyloxy group); carbamoyloxy group (carbamoyloxy group preferably having 1 to 48 carbon atoms, more preferably having 1 to 12 carbon atoms; for example N,N-dimethylcarbamoyloxy, N-butylcarbamoyloxy, N-phenylcarbamoyloxy or N-ethyl-N-phenylcarbamoyloxy group); sulfamoyloxy group (sulfamoyloxy group preferably having 1 to 32 carbon atoms, more preferably having 1 to 12 carbon atoms; for example N,N-diethylsulfamoyloxy or N-propylsulfamoyloxy group);

alkylsulfonyloxy group (alkylsulfonyloxy group preferably having 1 to 38 carbon atoms, more preferably having 1 to 12 carbon atoms; for example methylsulfonyloxy, hexadecylsulfonyloxy or cyclohexylsulfonyloxy group); arylsulfonyloxy group (arylsulfonyloxy group preferably having 6 to 32 carbon atoms, more preferably having 6 to 12 carbon atoms; for example phenylsulfonyloxy group); acyl group (acyl group preferably having 1 to 48 carbon atoms, more preferably having 1 to 12 carbon atoms; for example formyl, acetyl, pivaloyl, benzoyl, tetradecanoyl or cyclohexanoyl group); alkoxycarbonyl group (alkoxycarbonyl group preferably having 2 to 48 carbon atoms, more preferably having 2 to 12 carbon atoms; for example methoxycarbonyl, ethoxycarbonyl, octadecyloxycarbonyl and cyclohexyloxycarbonyl group); aryloxycarbonyl group (aryloxycarbonyl group preferably having 7 to 32 carbon atoms, more preferably having 7 to 12 carbon atoms; for example phenoxycarbonyl group);

carbamoyl group (carbamoyl group preferably having 1 to 48 carbon atoms, more preferably having 1 to 12 carbon atoms; for example carbamoyl, N,N-diethylcarbamoyl, N-ethyl-N-octyl carbamoyl, N,N-dibutylcarbamoyl, N-propylcarbamoyl, N-phenylcarbamoyl, N-methyl-N-phenylcarbamoyl and N,N-dicyclohexylcarbamoyl group); amino group (amino group preferably having 32 or less carbon atoms, more preferably having 12 or less carbon atoms; for example amino, methylamino, N,N-dibutylamino, tetradecylamino, 2-ethylhexylamino and cyclohexylamino group); anilino group (preferably having 6 to 32 carbon atoms, more preferably having 6 to 12 carbon atoms; for example anilino and N-methylanilino group); heterocyclic amino group (heterocyclic amino group preferably having 1 to 32 carbon atoms, more preferably having 1 to 12 carbon atoms; for example 4-pyridylamino group); carbonamide group (group preferably having 2 to 48 carbon atoms, more preferably having 2 to 12 carbon atoms; for example acetamide, benzamide, tetradecanamide, pivaloyl amide, cyclohexanamide group); ureido group (preferably having 1 to 32 carbon atoms, more preferably having 1 to 12 carbon atoms; for example, ureido, N,N-dimethylureido and N-phenylureido group); imido group (imido group preferably having 20 or less carbon atoms, more preferably having 12 or less carbon atoms; for example N-succinimide and N-phthalimide group);

alkoxycarbonylamino group (alkoxycarbonylamino group preferably having 2 to 48 carbon atoms, more preferably having 2 to 12 carbon atoms; for example methoxycarbonylamino, ethoxycarbonylamino, t-butoxycarbonylamino, octadecyloxycarbonylamino, cyclohexyloxycarbonylamino group); aryloxycarbonylamino group (aryloxycarbonylamino group preferably having 7 to 32 carbon atoms, more preferably having 7 to 12 carbon atoms; for example phenoxycarbonylamino group); sulfonamide group (sulfonamide group preferably having 1 to 48 carbon atoms, more preferably having 1 to 12 carbon atoms; for example methanesulfonamide, butanesulfonamide, benzenesulfonamide, hexadecanesulfonamide and cyclohexanesulfonamide group); sulfamoylamino group (sulfamoylamino group preferably having 1 to 48 carbon atoms, more preferably having 1 to 12 carbon atoms; for example N,N-dipropylsulfamoylamino or N-ethyl-N-dodecylsulfamoylamino group); azo group (azo group preferably having 1 to 48 carbon atoms, more preferably having 1 to 24 carbon atoms; for example phenylazo or 3-pyrazolylazo group); alkylthio group (alkylthio group preferably having 1 to 48 carbon atoms, more preferably having 1 to 12 carbon atoms; for example methylthio, ethylthio, octylthio or cyclohexylthio group); arylthio group (arylthio group preferably having 6 to 48 carbon atoms, more preferably having 6 to 12 carbon atoms; for example phenylthio group); heterocyclic thio group (heterocyclic thio group preferably having 1 to 32 carbon atoms, more preferably having 1 to 12 carbon atoms; for example 2-benzothiazolylthio, 2-pyridyl thio and 1-phenyltetrazolylthio group); alkylsulfinyl group (alkylsulfinyl group preferably having 1 to 32 carbon atoms, more preferably having 1 to 12 carbon atoms; for example dodecanesulfinyl group);

arylsulfinyl group (arylsulfinyl group preferably having 6 to 32 carbon atoms, more preferably having 6 to 12 carbon atoms; for example phenylsulfinyl group); alkylsulfonyl group (alkylsulfonyl group preferably having 1 to 48 carbon atoms, more preferably having 1 to 12 carbon atoms; for example methylsulfonyl, ethylsulfonyl, propylsulfonyl, butylsulfonyl, isopropylsulfonyl, 2-ethylhexylsulfonyl, hexadecylsulfonyl, octylsulfonyl and cyclohexylsulfonyl group); arylsulfonyl group (arylsulfonyl group preferably having 6 to 48 carbon atoms, more preferably having 6 to 12 carbon atoms; for example phenylsulfonyl and 1-naphthylsulfonyl group); sulfamoyl group (sulfamoyl group preferably having 32 or less carbon atoms, more preferably having 16 or less carbon atoms; for example sulfamoyl, N,N-dipropylsulfamoyl, N-ethyl-N-dodecylsulfamoyl, N-ethyl-N-phenylsulfamoyl, N-cyclohexylsulfamoyl group); sulfo group; phosphonyl group (phosphonyl group preferably having 1 to 32 carbon atoms, more preferably having 1 to 12 carbon atoms; for example phenoxyphosphonyl, octyloxyphosphonyl and phenylphosphonyl group); phosphinoylamino group (phosphinoylamino group preferably having 1 to 32 carbon atoms, more preferably having 1 to 12 carbon atoms; for example diethoxyphosphinoylamino and dioctyloxyphosphinoyl amino group).

When the substituent represented by $R^{e01}$ is able to be further substituted, the substituent may be further substituted with $R^{e01}$. When the substituent has plural substituents, the substituents may be the same or different to one another.

$R^{e02}$ to $R^{e05}$ in formula (γ) each independently represents a hydrogen atom or substituent. The substituent represented by $R^{e02}$ to $R^{e05}$ and preferable aspects thereof are the same as the substituent represented by $R^{e01}$. The substituents represented by $R^{e02}$ to $R^{e05}$ are able to be further substituted, the substituent may be substituted with the substituent represented by $R^{e01}$. When the substituent has plural substituents, the substituents may be the same or different to one another.

$R^{e06}$ and $R^{e07}$ in formula (γ) each independently represents alkyl group, alkenyl group, aryl group or heterocyclic group. The alkyl group, alkenyl group, aryl group and heterocyclic group represented by $R^{e06}$ or $R^{e07}$, and preferable range thereof are the same as the alkyl group, alkenyl group, aryl group and heterocyclic group described in the substituent represented by $R^{e01}$.

When $R^{e06}$ and $R^{e07}$ are able to be further substituted, the substituent may be further substituted with the substituent represented by $R^{e01}$. When the substituent has plural substituents, the substituents may be the same or different to one another.

Za and Zb in formula (γ) each independently represents —N═ or —C($R^{d08}$)═. $R^{d08}$ represents hydrogen atom, alkyl group, alkenyl group, aryl group or heterocyclic group.

The alkyl group, alkenyl group, aryl group or heterocyclic group represented by $R^{d08}$, and preferable range thereof are the same as the alkyl group, alkenyl group, aryl group or heterocyclic group described in the substituent represented by $R^{e01}$. When the substituent represented by $R^{d08}$ is able to be further substituted, the substituent may be substituted with the substituent represented by $R^{e01}$. When the substituent has plural substituents, the substituent may be the same or different to one another.

Za is preferably —N═, and Zb is preferably —C($R^{d08}$)═. $R^{d08}$ is preferably alkyl group, substituted alkyl group, aryl group or substituted aryl group. The substituent is more preferably represented by formulae (γ2) or (γ3) below.

In formula (γ), $R^{e02}$ and $R^{e03}$, $R^{e03}$ and $R^{e06}$, $R^{e04}$ and $R^{e05}$, $R^{e05}$ and $R^{e07}$, and $R^{e06}$ and $R^{e07}$ may be joined to one another to form 5-, 6- or 7-membered ring. The 5-, 6- or 7-membered ring may be substituted with $R^{e01}$. When the substituent is substituted with plural substituents, the substituents may be the same or different to one another.

The azomethine pigment represented by formula (γ) is preferably represented by formula (γ2) below. $R^{e09}$ to $R^{e14}$, $R^{e31}$ to $R^{e34}$, $R^{e36}$, Zc and Zd in formula (γ2) will be described in detail below.

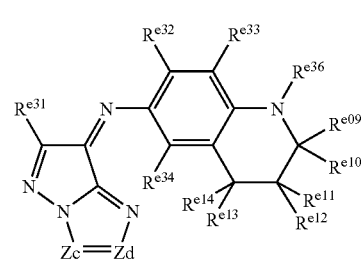

Formula (γ2)

In Formula (γ2), $R^{e09}$, $R^{e10}$, $R^{e11}$, $R^{e12}$, $R^{e13}$ and $R^{e14}$ each independently represents a hydrogen atom or substituent. The substituents represented by $R^{e09}$ to $R^{e14}$ are the same as the substituents represented by $R^{e01}$, and preferable ranges thereof are the same as the substituents represented by $R^{e01}$.

When the substituents represented by $R^{e09}$ to $R^{e14}$ are able to be further substituted, the substituent may be substituted with the substituent represented by $R^{e01}$. When the substituent is substituted with plural substituents, they may be the same or different to one another.

$R^{e31}$ in formula (γ2) represents a hydrogen atom or a substituent. The substituent represented by $R^{e31}$, and preferable range thereof are the same as the substituent $R^{e01}$ in formula (γ). When the substituent represented by $R^{e31}$ is able to be further substituted, the substituent may be further substituted with the substituent represented by $R^{e01}$. When the substituent is substituted with plural substituents, they may be the same or different to one another.

$R^{e32}$, $R^{e33}$ and $R^{e34}$ in formula (γ2) each independently represents a hydrogen atom or substituent. $R^{e32}$ and preferable aspects thereof are the same as $R^{e02}$ in formula (γ), $R^{e33}$ and preferable aspects thereof are the same as $R^{e03}$ in formula (γ), $R^{e34}$ and preferable aspects thereof are the same as $R^{e04}$ in formula (γ), and $R^{e36}$ and preferable aspects thereof are the same as $R^{e06}$ in formula (γ).

When $R^{e32}$ to $R^{e34}$ are able to be further substituted, they may be substituted with the substituents represented by $R^{e01}$. When the substituent is substituted with plural substituents, they may be the same or different to one another.

In formula (γ2), $R^{e32}$ and $R^{e33}$, $R^{e33}$ and $R^{e36}$, $R^{e36}$ and $R^{e09}$, and $R^{e34}$ and $R^{e14}$ may be joined to one another to form 5-, 6- or 7-membered ring.

Zc in formula (γ2) and preferable aspects thereof are the same as Za in formula (γ). Zd in formula (γ2) and preferable aspects thereof are the same as Zb in formula (γ).

The azomethine pigment represented by formula (γ2) is further preferably represented by formula (γ3) below.

Formula (γ3)

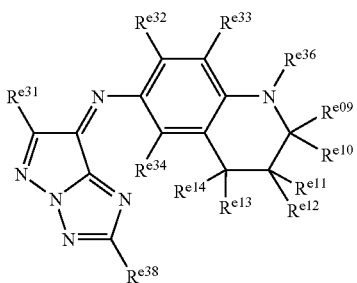

$R^{e09}$ to $R^{e14}$ and $R^{e31}$ to $R^{e34}$ in formula (γ3) are the same as $R^{e09}$ to $R^{e14}$ and $R^{e31}$ to $R^{e34}$ in formula (γ2). $R^{e38}$ represents hydrogen atom, alkyl group, alkenyl group, aryl group or heterocyclic group.

In Formula (γ3), substituents represented by $R^{e38}$ such as alkyl group, alkenyl group, aryl group and heterocyclic group, and preferable aspects thereof, are the same as the alkyl group, alkenyl group, aryl group and heterocyclic group described in the substituents represented by $R^{e01}$.

$R^{e38}$ may be substituted with the substituent described in $R^{e01}$. When the substituent is substituted with plural substituents, they may be the same or different to one another.

The azomethine pigments represented by formula (γ) is preferably represented by formula (γ2), more preferably by formula (γ3).

The preferable range of the pigment represented by formula (γ3) will be described below.

Preferably, $R^{e31}$ represents alkyl group, alkenyl group, aryl group, heterocyclic group, hydroxyl group, cyano group, alkoxy group, aryloxy group, heterocyclic oxy group, carbamoyloxy group, acyl group, alkoxycarbonyl group, aryloxycarbonyl group, carbamoyl group, imido group, azo group, alkylthio group, arylthio group, heterocyclic thio group, alkylsulfinyl group, arylsulfinyl group, alkylsulfonyl group, arylsulfonyl group, sulfamoyl group, sulfo group, phosphonyl group or phosphinoylamino group; $R^{e32}$, $R^{e33}$ and $R^{e34}$, each independently, represents hydrogen atom, halogen atom, alkyl group, alkenyl group, aryl group, heterocyclic group, alkoxy group, aryloxy group, alkoxycarbonyl group, carbamoyl group, amino group, anilino group, carbonamide group, ureido group, alkoxycarbonylamino group, sulfonamide group, sulfamoylamino group, azo group, alkylthio group, arylthio group, heterocyclic thio group, alkylsulfinyl group, arylsulfinyl group, alkylsulfonyl group, arylsulfonyl group, sulfamoyl group, sulfo group, phosphonyl group or phosphinoylamino group; $R^{e36}$ represents alkyl group, alkenyl group, aryl group or heterocyclic group; $R^{e38}$ represents hydrogen atom, alkyl group, alkenyl group, aryl group or heterocyclic group; and $R^{e09}$ to $R^{e14}$ each independently represents hydrogen atom, halogen atom, alkyl group or alkoxy group, in the azomethine pigments represented by formula (γ3).

More preferably, $R^{e31}$ represents alkyl group, alkenyl group, aryl group, heterocyclic group, alkoxycarbonyl group, carbamoyl group, imido group, alkylthio group, arylthio group, heterocyclic thio group, alkylsulfonyl group or arylsulfonyl group; $R^{e32}$, $R^{e33}$ and $R^{e34}$, each independently, represents hydrogen atom, halogen atom, alkyl group, alkoxy group, aryloxy group, alkoxycarbonyl group, carbamoyl group, carbonamide group, ureido group, alkoxycarbonylamino group, sulfonamide group, alkylthio group or arylthio group; $R^{e36}$ represents alkyl group, alkenyl group, aryl group or heterocyclic group; $R^{e38}$ represents hydrogen atom, alkyl group, alkenyl group, aryl group or heterocyclic group; and $R^{e09}$ to $R^{e14}$ each independently represents hydrogen atom, or alkyl group, in the azomethine pigments represented by formula (γ3).

Further preferably, $R^{e31}$ represents alkyl group, aryl group, heterocyclic group, alkoxycarbonyl group, carbamoyl group, alkylthio group, arylthio group, alkylsulfonyl group or arylsulfonyl group; $R^{e32}$, $R^{e33}$ and $R^{e34}$, each independently, represents hydrogen atom, halogen atom, alkyl group, alkoxy group, aryloxy group, alkoxycarbonyl group, carbamoyl group, carbonamide group, ureido group, alkoxycarbonylamino group, sulfonamide group, alkylthio group or arylthio group; $R^{e36}$ represents alkyl group or aryl group; $R^{e38}$ represents hydrogen atom, alkyl group, alkenyl group, aryl group or heterocyclic group; and $R^{e09}$ to $R^{e14}$ each independently represents hydrogen atom, or alkyl group, in the azomethine pigments represented by formula (γ3).

Further preferably, $R^{e31}$ represents alkyl group; $R^{e32}$, $R^{e33}$ and $R^{e34}$, each independently, represents hydrogen atom, halogen atom, alkyl group or alkoxy group; $R^{e36}$ represents alkyl group; $R^{e38}$ represents, alkyl group, alkenyl group, aryl group or heterocyclic group; and $R^{e09}$ to $R^{e14}$ each independently represents hydrogen atom, or alkyl group, in the azomethine pigments represented by formula (γ3).

Most preferably, $R^{e31}$ represents tertiary alkyl group; $R^{e32}$, $R^{e33}$ and $R^{e34}$, each independently, represents hydrogen atom, halogen atom, alkyl group or alkoxy group; $R^{e36}$ represents alkyl group; $R^{e38}$ represents alkyl group, alkenyl group, aryl group or heterocyclic group; $R^{e09}$ and $R^{e10}$ represent alkyl groups; $R^{e11}$ to $R^{e13}$ represent hydrogen atoms; and $R^{e14}$ represents alkyl group in the azomethine pigments represented by formula (γ3).

While specific examples of the azomethine pigment (pigments A6-1 to A6-29) represented by formulae (γ) to (γ3) are shown below, the invention is not restricted thereto.

-continued
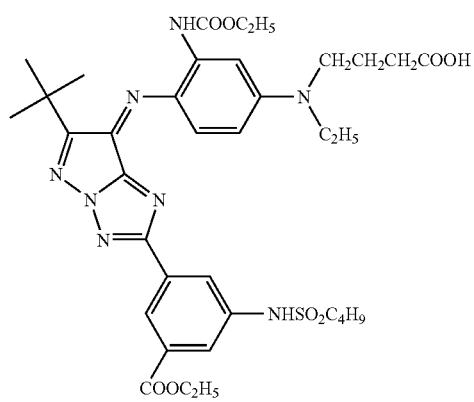
(A6-3)
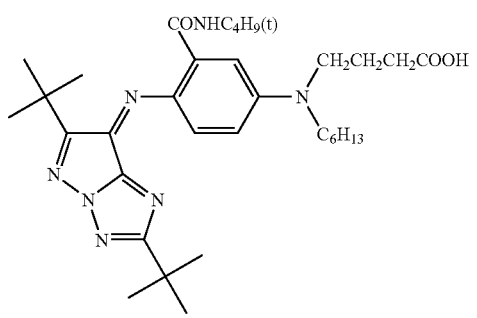
(A6-4)
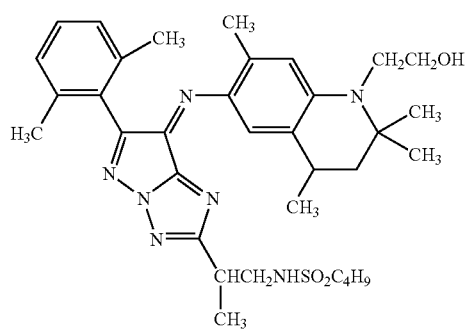
(A6-5)
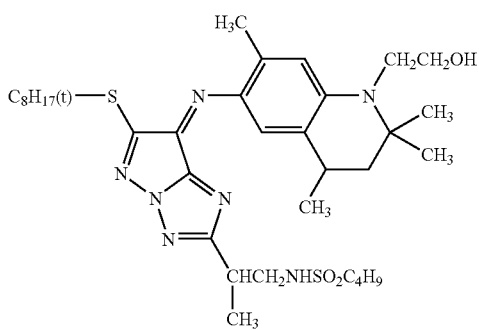
(A6-6)
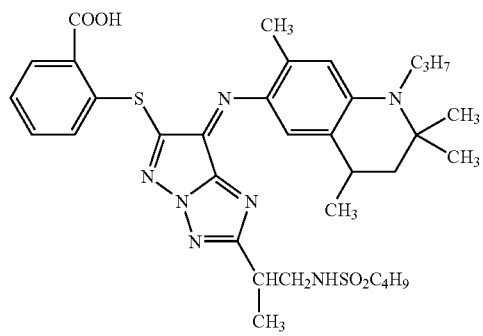
(A6-7)
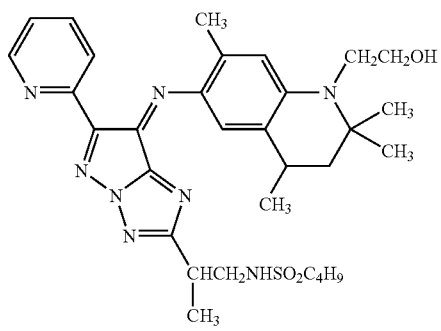
(A6-8)
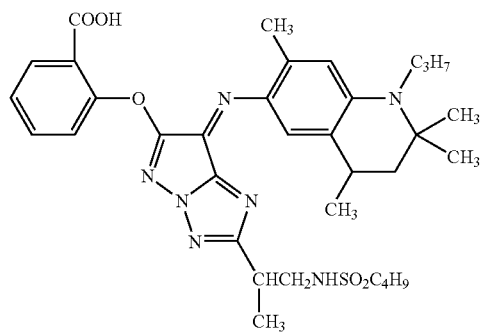
(A6-9)
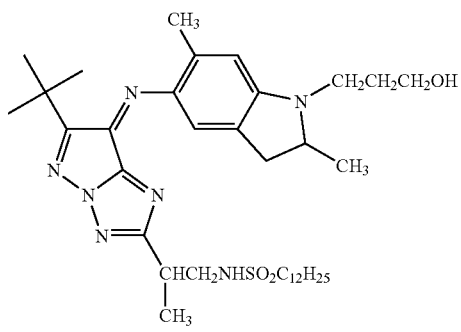
(A6-10)

-continued
(A6-11)
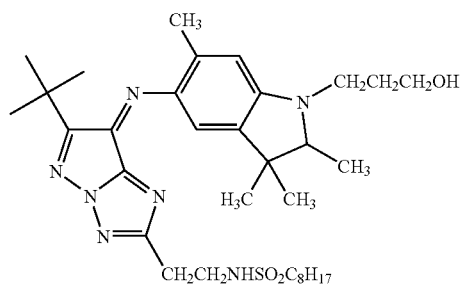
(A6-12)
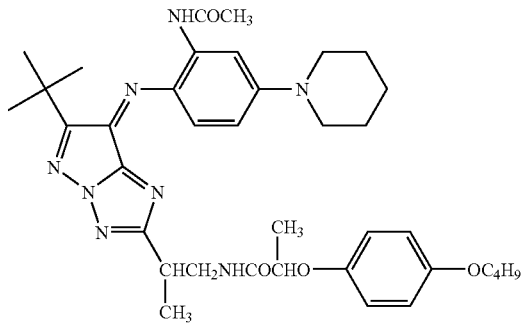
(A6-13)
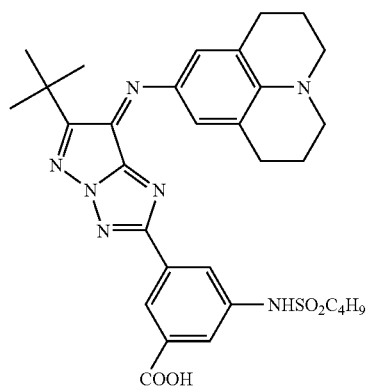
(A6-14)
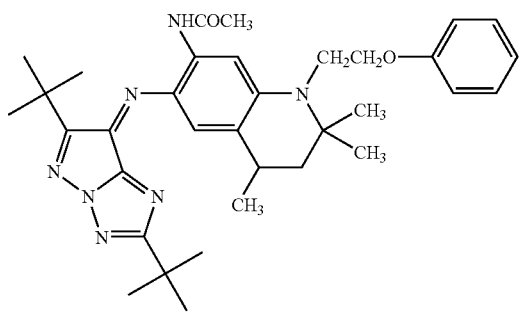
(A6-15)
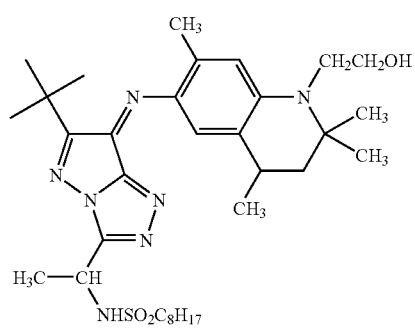
(A6-16)
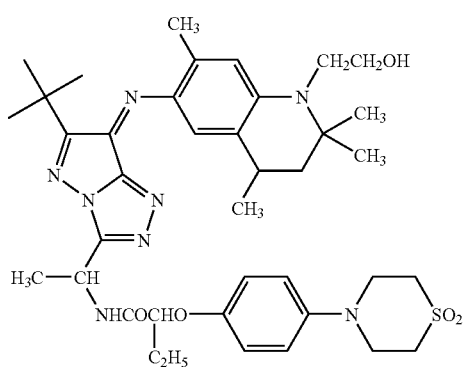
(A6-17)
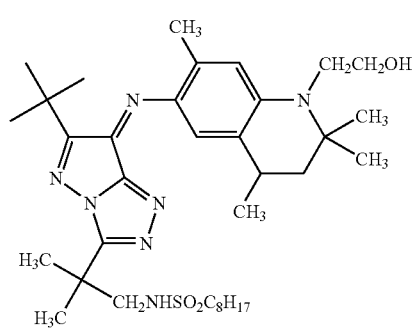
(A6-18)
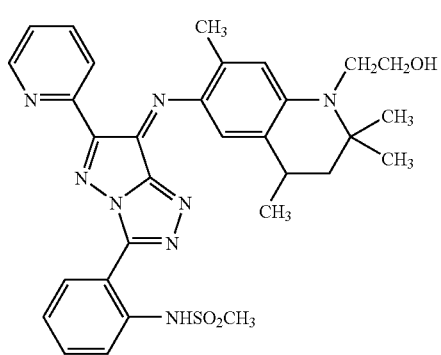

-continued
(A6-19)
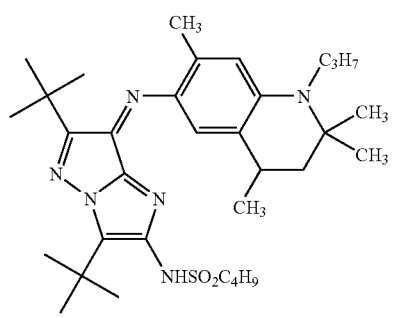
(A6-20)
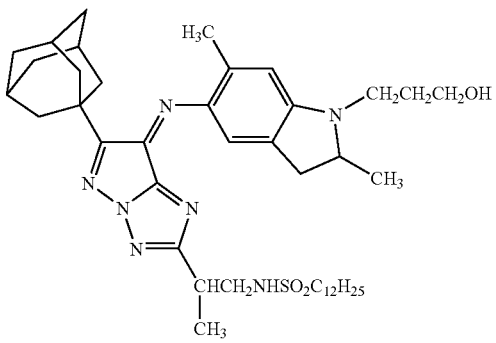
(A6-21)
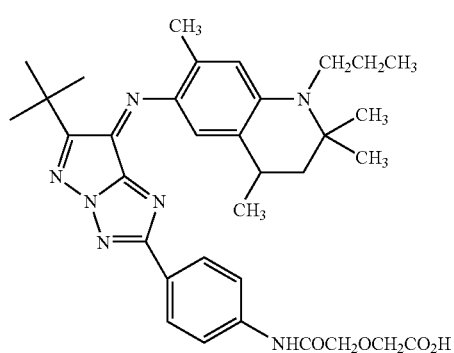
(A6-22)
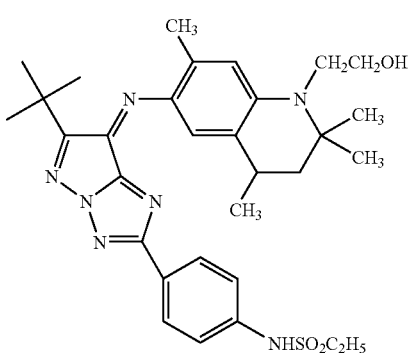
(A6-23)
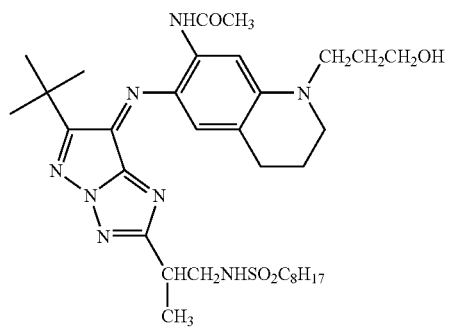
(A6-24)
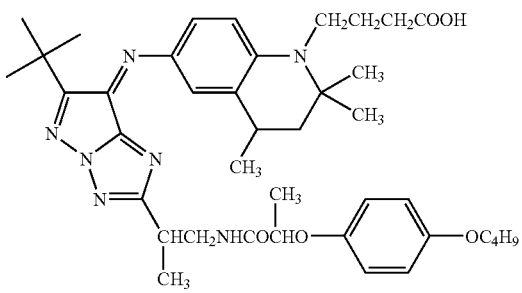
(A6-25)
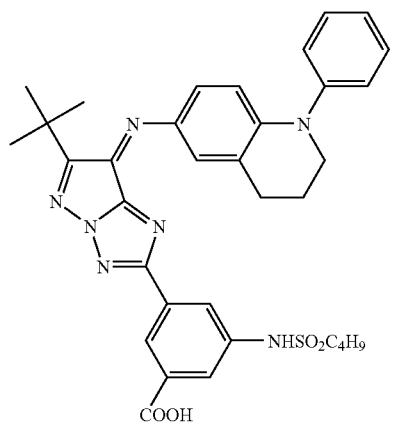
(A6-26)
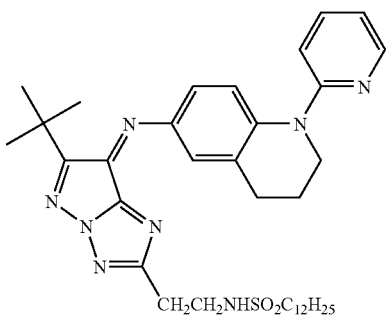

(A6-27)
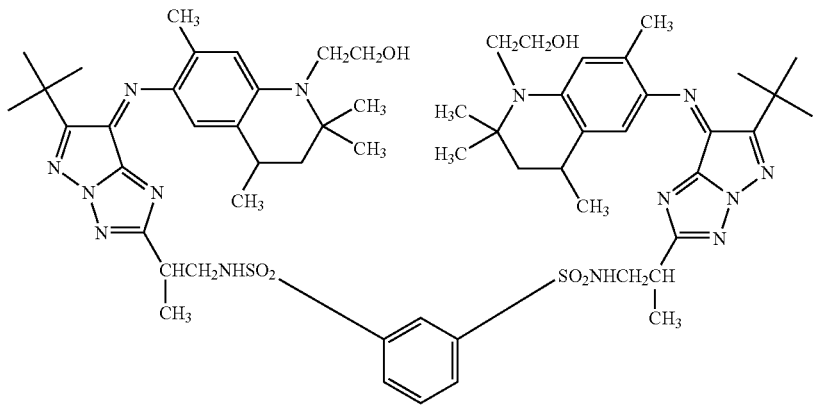
(A6-28)
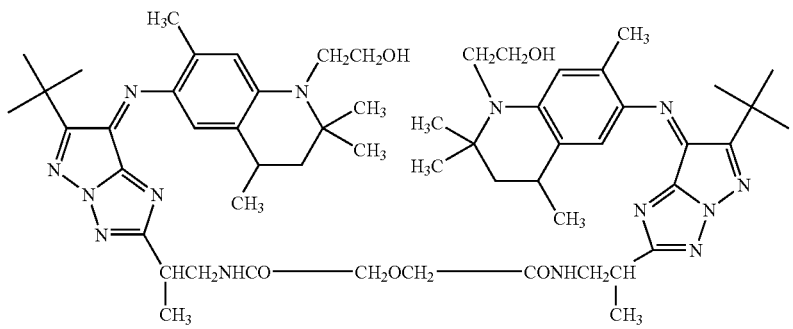
(A6-29)
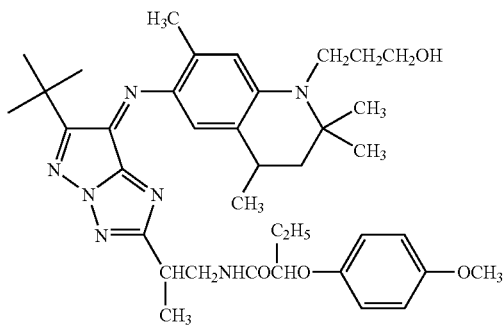
Synthesis of the azomethine pigment represented by formula (γ) will be described with reference to reaction scheme A below as an example of synthesis of pigment A6-29. However, the invention is not restricted to the example, and other pigments other than pigment A6-29 can be obtained by similar methods.
<<Example of Synthesis>>: Synthesis of Pigment A6-29
Reaction scheme A
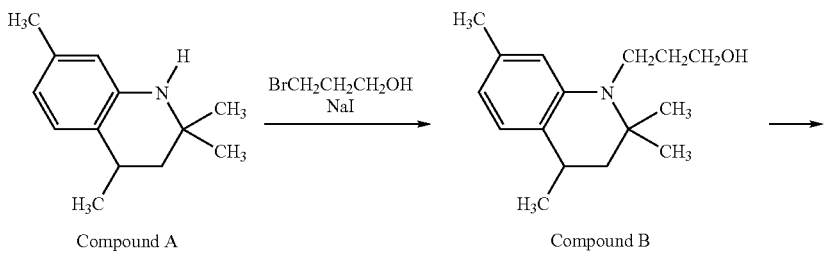

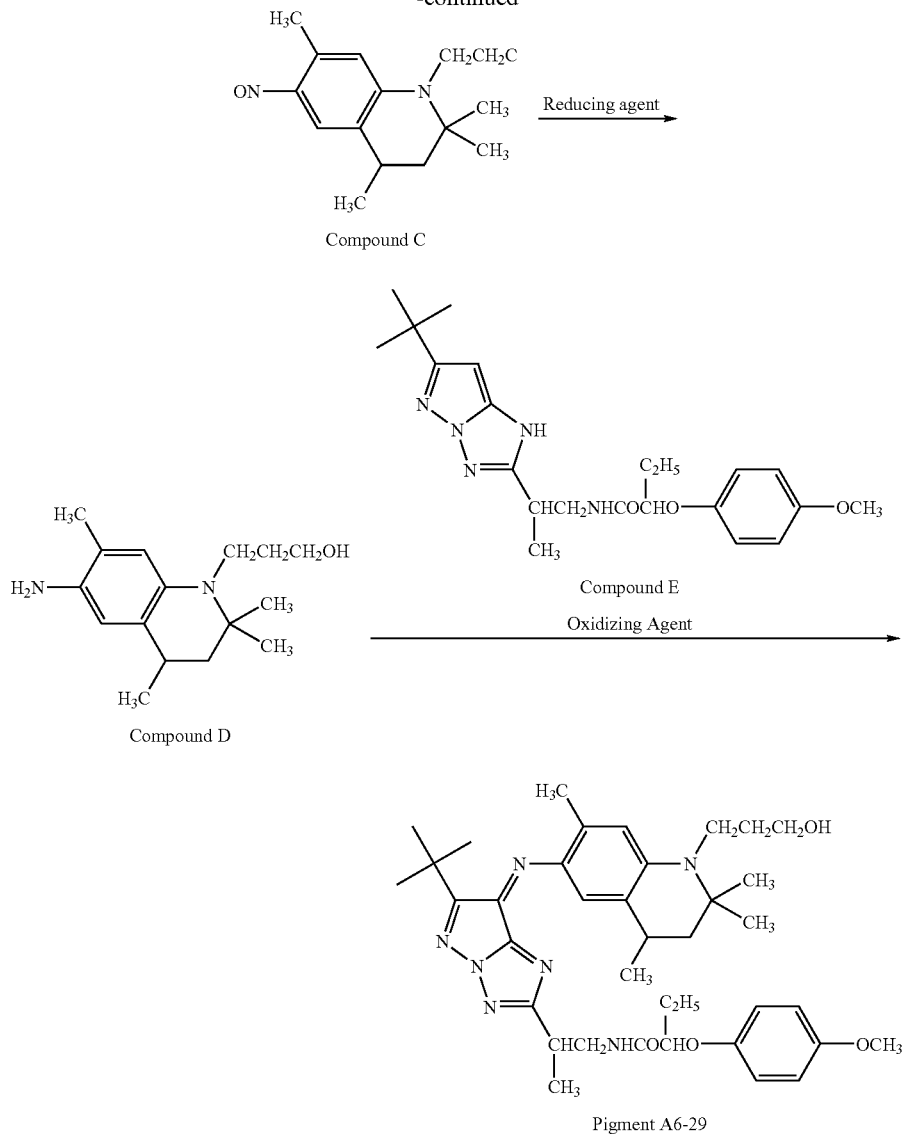

(1) Synthesis of Compound B

Dimethylimidazolidinone (300 mL) was added to compound A (94.7 g, 0.5 mole; manufactured by Sigma-Aldrich Co.), sodium iodide (37.5 g, 0.25 mole) and sodium hydrogen carbonate (126 g, 1.5 mole), and the mixture was heated at 95° C. with stirring. 3-bromopropanol (90.3 g, 0.65 mole) was added dropwise to this solution. After completing to add dropwise, the reaction was completed by heating the reaction mixture at 95 to 100° C. for 5 hours with stirring. After the reaction, the reaction solution was cooled to room temperature, and the product was extracted by adding 600 mL of water and 500 mL of ethyl acetate. The ethyl acetate solution was washed with water, and was dried over anhydrous magnesium sulfate. After concentrating the ethyl acetate solution in a vacuum, the residue was purified by silica gel column chromatography (eluent: n-hexane/ethyl acetate=10/1) to obtain the compound B (90.5 g, yield 73.2%).

(2) Synthesis of Compound C

Then, methanol (270 mL) was added to compound B (90 g, 0.364 mole) obtained above, and the solution was cooled to 5° C. with stirring. After adding conc. hydrochloric acid (93.7 mL, 1.09 mole) dropwise, a solution containing sodium nitrite (27.6 g, 0.4 mole) dissolved in 75 mL of water was added dropwise while the temperature is maintained at 5 to 10° C. After the addition, the reaction solution was stirred for 2 hours at 5 to 10° C. to complete the reaction. After completing the reaction, ethyl acetate (500 mL) and water (1000 mL) were added to the reaction solution. The solution was neutralized by adding sodium hydrogen carbonate (84 g) in small portions, and the aqueous phase was removed. The ethyl acetate solution was washed with water, and dried over anhydrous magnesium sulfate. Crystals were precipitated by concentrating the ethyl acetate solution in a vacuum. The precipitated crystal was dispersed by adding n-hexane (200 mL) and ethyl acetate (200 mL) with stirring. The crystal was filtrated off, and dried to obtain the compound C (78 g, yield 77.6%).

(3) Synthesis of Compound E

Compound E was synthesized by the method shown in the following scheme.

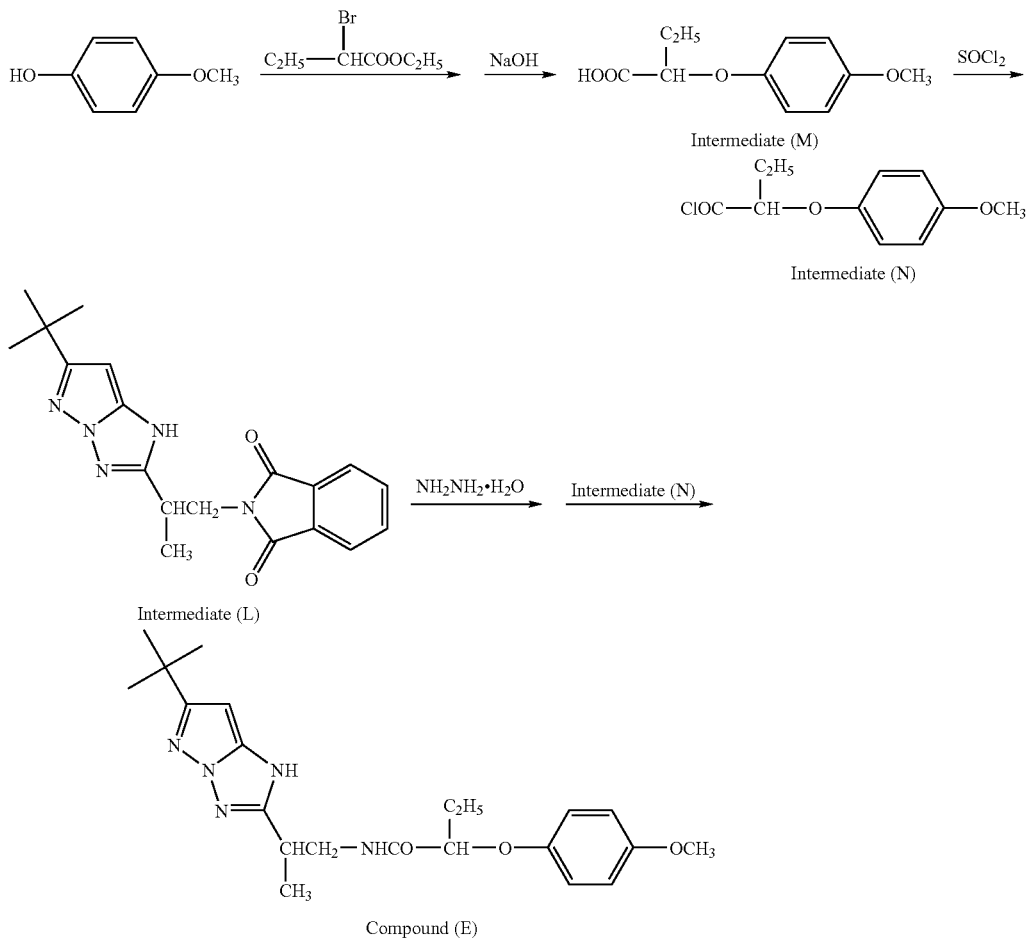

Intermediate (L)

Compound (E)

—Synthesis of Intermediate (M)—

Dimethylacetamide (600 mL) was added to 4-methoxyphenol (112 g, 0.9 mole) with stirring at room temperature. A 28% methanol solution (196 mL) of sodium methoxide was added to this solution. After completing to add, ethyl 2-bromobutanate (190 g, 0.97 mole) was added dropwise to this solution. After the addition, the reaction mixture was stirred at room temperature for 3 hours to complete the reaction.

Water (1000 mL) and ethyl acetate (1000 mL) were added to the reaction solution, and the product was extracted with ethyl acetate. After washing the ethyl acetate solution with saline solution, ethyl acetate was removed in a vacuum, and methanol (250 mL) was added to the residue with stirring at room temperature. An aqueous solution of sodium hydroxide (144 g) dissolved in 1000 mL of water was added to the solution followed by heating at 50 to 55° C. with stirring for 2 hours. After completing the reaction, conc. hydrochloric acid (340 mL) was added dropwise to the reaction solution to acidify the solution. The reaction product was extracted by adding 1000 mL of ethyl acetate, and the extracted solution was washed with saline solution followed by drying over anhydrous sodium sulfate. The ethyl acetate solution was concentrated in vacuum to quantitatively obtain the intermediate (M).

—Synthesis of Intermediate (N)—

Toluene (400 mL) was added to the intermediate (M) (93.1 g, 0.433 mole), and the solution was heated at 85 to 90° C. with stirring. Thionyl chloride (50 mL) was added dropwise to this solution, and the solution was heated for 3 hours with stirring. After completing the reaction, toluene and excess thionyl chloride were removed in a vacuum. After cooling to room temperature ethyl acetate (100 mL) was added to the reaction solution to obtain an ethyl acetate solution of intermediate (N). This ethyl acetate solution of intermediate (N) was used in the following step.

—Synthesis of Compound E—

Intermediate L was obtained by changing 5-amino-3-methylpyrazole as a starting material to 5-amino-3-tert-butylpyrazole (synthesized by the method described in Japanese Patent No. 2670943) according to the method described in JP-A No. 2-201443.

2-Propanol (570 mL) was added to the intermediate L (189 g, 0.538 mole), and the mixed solution was heated with stirring. Hydrazine monohydrate (33.6 g, 0.673 mole) was added dropwise to this solution, and the mixed solution was heated for 2 hours with stirring. After completing the reaction, 2-propanol (about 400 mL) was removed in a vacuum. Sodium hydrogen carbonate (420 g), water (1500 mL) and ethyl acetate (1200 mL) were added to the residue with stirring at room temperature. Subsequently, an ethyl acetate solution of the intermediate (N) was added dropwise to the solution, the mixed solution was stirred for 2 hours at room temperature after completing dropwise addition, and the aqueous phase was removed. Crystals were precipitated by washing the ethyl acetate solution with water. n-hexane (1200 mL) was added to this dispersion solution followed by stirring for 1 hour, and the compound E (159 g, yield 86.9%) was obtained by filtration, washing with water and drying of the crystal.

(4) Synthesis of Pigment A6-29

Methanol (50 mL), ethyl acetate (100 mL) and water (100 mL) were added to the compound C (7.35 g, 0.0266 mole) obtained above, and the mixture was heated at 40° C. with stirring. Sodium hydrosulfite (25 g) was added to this solution in small portions, after completing the addition, the mixture was allowed to react at 40° C. for 1 hour. After completing the reaction, the reaction solution was cooled to room temperature followed by adding ethyl acetate (100 mL) and water (200 mL) to obtain an ethyl acetate solution containing compound D by removing the aqueous phase. The ethyl acetate solution was used in the following step.

Subsequently, methanol (100 mL) and water (200 mL) were added to the compound E (10.0 g, 0.0242 mole) and sodium hydrogen carbonate (21 g) with stirring at room temperature. All the quantity of the above-mentioned ethyl acetate solution was added to the methanol/water solution, and an aqueous solution of ammonium persulfate (12 g) dissolved in 100 mL of water was further added dropwise to the solution. After completing the addition, the reaction was allowed to proceed at room temperature for 1 hour. After the reaction, the aqueous phase was removed, and the ethyl acetate solution was washed with water and concentrated in a vacuum. The residue was purified by silica gel column chromatography (eluent: n-hexane/ethyl acetate=1/1) to obtain pigment A6-29 as an amorphous state.

The maximum absorption wavelength $\lambda_{max}$ and molar absorbance coefficient $\epsilon$ of the pigment in the ethyl acetate solution were $\lambda_{max}$: 556 nm and $\epsilon$: 55,000, respectively, from the results of measurement using a spectrophotometer (trade name: UV-2500PC, manufactured by Shimadzu Co.).

—Description of Substituent—

The substituent in the second aspect of this specification will be described below.

The substituent in the second aspect of this specification denotes an arbitrary group irrespective of inorganic and organic groups, and specifically denotes hydrogen atom, halogen atom, hydroxyl group, cyano group, nitro group, carboxylic acid group, sulfonic acid group, sulfinic acid group, alkyl group (including linear, branched and cyclic groups), alkenyl group (including linear, branched and cyclic groups), alkynyl group, aryl group, heterocyclic group, formyl group, or a group as a combination of one partial group selected from group (A) with one partial group selected from alkyl group, alkenyl group, alkynyl group, aryl group and heterocyclic group:

group A: ether group, amino group, thioether group, ketone group, ester group, amide group, urethane group (carbamoyl group, —O—CO—N—(R)—), urea group (—N(R)—CO—N(R)—), sulfinyl group, (—SO—), sulfonyl group (—SO$_2$—), sulfonic acid ester group (—SO$_2$—O—), sulfonamide group (—SO$_2$—N(R)—), imide group (—CO—N(R)—CO—), sulfonylamide group (—SO$_2$—N(R)—CO—), disulfonylimide group (—SO$_2$—N(R)—SO$_2$—).

R linked to the nitrogen atom in group (A) represents any one of hydrogen atom, alkyl group, alkenyl group, aryl group and heterocyclic group.

The alkyl group in the substituent may be any one of linear, branched and cyclic groups. The cyclic group may be any one of the monocyclic and polycyclic group. The alkyl group is preferably an alkyl group having 1 to 30 carbon atoms, and specific examples of the alkyl group include methyl, ethyl, n-propyl, i-propyl, n-butyl, cyclopentyl, cyclohexyl, norbornyl and adamantyl groups. These alkyl groups may have further substituent at an arbitrary position of the alkyl group, and the additional substituent include all the above-mentioned alkyl groups including the alkyl group itself. In the case of the cyclic alkyl group, a partial structure selected from group (A) may be inserted into an arbitrary position of the carbon-carbon bond constituting the ring.

The alkenyl group in the above-mentioned substituent may be any one of the linear, branched and cyclic groups. The cyclic group may be any one of the monocyclic and polycyclic groups. The alkenyl group preferably has 2 to 20 carbon atoms, and specific examples of them include vinyl, allyl, 1-methylvinyl, 3-buten-1-yl, cyclopentan-2-ene-1-yl, cyclohexan-2-ene-1-yl and cyclohexan-1-ene-1-yl groups. These alkenyl groups may have other substituents at arbitrary positions thereof, and the additional substituents include all the above-mentioned substituents. A partial structure selected from group (A) may be inserted into an arbitrary position of the carbon-carbon bond constituting the ring.

While the alkynyl group in the above-mentioned substituent is an ethynyl group, hydrogen atom in the ethynyl group may be substituted with another substituent. The substituents include all the above-mentioned substituents.

The aryl group in the above-mentioned substituent may be a monocyclic or condensed ring group so long as it is an aromatic ring, and an aryl group having 6 to 30 carbon atoms is preferable. Specific examples include phenyl group, naphthyl group, anthrile group, phenanthryl group and pyrenyl group. An arbitrary position of these aryl groups may be further substituted with another substituent, and the additional substituents include all the above-mentioned substituents.

The heterocyclic group in the above-mentioned substituent has hetero atoms (for example nitrogen, sulfur and oxygen atoms) in the ring, which may be a saturated ring or unsaturated ring, or a single ring or condensed ring. Examples of the heterocyclic group include tetrahydrofuranyl group, dihydrofuranyl group, tetrahydropyranyl group, dihydropyranyl group, oxocanyl group, dioxanyl group, tetrahydrothiophenyl group, dithianyl group, pyrrolidinyl group, pyrrolinyl group, tetrahydropyridinyl group, piperazinyl group, homopiperazinyl group, piperidinyl group, pyrrolyl group, furyl group, thiophenyl group, benzopyrrolyl group, benzofuryl group, benzothiophenyl group, pyrazolyl group, isoxazolyl group, isothiazolyl group, indazolyl group, benzoisoxazolyl group, benzoisothiazolyl group, imidazolyl group, oxazolyl group, thiazolyl group, benzoimidazolyl group, benzoxazolyl group, benzothiazolyl group, pyridyl group, quinolinyl group, isoquinolinyl group, pyridazinyl group, pyrimidinyl group, pyrazinyl group, cinnolinyl group, phthalazinyl group, quinazolynyl group, quinoxalinyl group, acridinyl group, phenanthrydinyl group, phthalazinyl group, carbazolyl group, uracil group, dithiouracil group, carbolynyl group, purinyl group and thiadiazolyl group. An arbitrary position of these heterocyclic groups may be further substituted with another substituent, and the additional substituents include all the above-mentioned substituents.

The above-mentioned organic group denotes a substituent containing at least carbon atoms of the above-mentioned substituents.

Other Organic Solvent-soluble Dyes (A')

Other organic solvent-soluble dyes (A') other than the organic solvent-soluble dye (A) that may be contained in the composition of the invention will be described below.

The other organic solvent-soluble dyes that may be contained are not particularly restricted, and known dyes that have been used for the filter may be used. The pigments available include those described in JP-A Nos. 64-90403, 64-91102, 1-94301, 6-11614, 5-333207, 6-35183, 6-51115, 6-194828, Japanese Patent No. 2592207, U.S. Pat. Nos. 4,808,501 5,667,920 and 5,059,500.

Examples of the chemical structure include those of azo dyes other than those described above; triphenyl methane, anthraquinone, benzylidene, oxonol and phenothiazine dyes; and azomethine dye other than those described above, xanthene dyes, phthalocyanine dyes, benzopyrane dyes, indigo dyes and anthrapyridone dyes.

At least one of acid dyes and derivatives thereof may be favorably used for completely removing the dye by development, when a resist system developed with water or an alkali is constructed. It is also advantageous to use at least one dye appropriately selected from direct dyes, basic dyes, mordant dyes, acidic mordant dyes, azoic dyes, dispersion dyes, oil-soluble dyes and food dyes, and derivatives thereof.

Acid dyes and derivatives thereof will be described below. While the acid dye is not particularly restricted so long as it is a pigment having an acidic group such as sulfonic acid, carboxylic acid or phenolic hydroxyl group, the dye is selected in terms of all the required performance such as solubility in organic solvents and developers used for preparation of the composition and development treatment, salt forming ability with basic compound, light absorbance, interaction with other components in the curable composition, light resistance and heat resistance.

While specific examples and preferable examples of the acid dye are described in JP-A No. 2005-227722, the invention is not restricted thereto.

Since solubility of the acid dye as a constituting component in organic solvents used for preparation of the composition may be insufficient in some cases, the acid dye is preferably used as a derivative.

Derivatives of the acid dye available include inorganic salts of the acid dye having an acidic group such as sulfonic acid and carboxylic acid, salts of acid dye and nitrogen-containing compound and a sulfonamide derivative of the acid dye. While the derivative is not particularly restricted, it is selected in terms of all the required performance such as solubility in organic solvents and developers used for preparation of the composition and development treatment, light absorbance, interaction with other components in the curable composition, light resistance and heat resistance.

Salts of the acid dye and nitrogen-containing compounds will be described below. The method for forming a salt between the acid dye and nitrogen-containing compound may be effective in some cases for improving solubility (solubilize in organic solvents), heat resistance and light stability of the acid dye.

The nitrogen-containing organic compound that forms a salt with the acid dye, and the nitrogen-containing compound for obtaining sulfonamide of the acid dye by forming an amide bond with the acid dye are selected by taking all of features such as solubility of the salt or amide compound in organic solvents and developers used for preparation or development, salt-forming ability, absorbance and chromatic valance of the dye, interaction of the dye with other components in the dye-containing negative curable composition, and heat resistance and light resistance as a colorant into consideration. The molecular weight of the nitrogen-containing compound is preferably as low as possible when the nitrogen-containing compound is selected only in terms of absorbance and chromatic valance. In particular, the molecular weight is 300 or less, more preferably 280 or less and particularly 250 or less.

The molar ratio of the nitrogen-containing compound to the acid dye (referred to "n" hereinafter) in the salt between the acid dye and nitrogen-containing compound is described below. The molar ratio n is a value that determines the molar ratio between the acid dye molecule and an amine compound as a counter-ion, and may be freely selected depending on the condition for forming a salt of the acid dye-amine compound. Specifically, n is a value satisfying the relation of $0 < n \leq 10$ of the number of functional groups in the acid dye in most of the practical purposes, and may be selected by taking all the required performance such as solubility in organic solvents and developers used for preparation of the composition and development treatment, salt forming ability, light absorbance, interaction with other components in the curable composition, light resistance and heat resistance into consideration. When the ratio is selected only in terms of the absorbance, n is preferably a value satisfying the relation of $0 < n \leq 4.5$, more preferably the relation of $0 < n \leq 4$, and particularly the relation of $0 < n \leq 3.5$.

Since above-described acid dye is prepared by introducing an acidic group into the structure, it may be converted into a non-acid dye by changing the substituent. While the acid dye may be favorably used in alkali development, the dye may cause over-development. The non-acid dye may be favorably used in such cases.

The organic solvent-soluble dye and/or other organic solvent-soluble dyes that are essential in the invention may have at least one addition polymerizable ethylenically unsaturated double bond in their structure. The organic solvent-soluble dye may be linked to a resin.

The maximum value of the molar absorbance coefficient $\epsilon$ of the organic solvent-soluble dye that are essential in the invention and/or other organic solvent-soluble dyes in the visible light region is usually from 10,000 to 100,000, preferably from 15,000 to 80,000, and particularly from 20,000 to 50,000. Sensitivity decreases when the maximum value of $\epsilon$ is lower than 10,000 since the amount of addition of the dye should be increased. On the other hand, control of hue becomes difficult when the maximum value of $\epsilon$ exceeds 100,000.

The ratio of (the maximum value of the molar absorbance coefficient $\epsilon$ of the transition metal complex according to the invention in the visible light region)/(the maximum value of the molar absorbance coefficient $\epsilon$ of the organic solvent-soluble dye that are essential in the invention and/or other organic solvent-soluble dye in the visible light region) is usually from 0.01 to 0.7, preferably from 0.05 to 0.5, and particularly from 0.1 to 0.3. Light resistance is deteriorated when the ratio is less than 0.01 and hue is not stabilized when the ratio is over 0.7.

The concentration of the organic solvent-soluble dye in the dye-containing negative curable composition relative to the total solids is usually from 0.5 to 97% by mass, preferably from 40 to 95% by mass, and particularly preferably from 45 to 90% by mass, although the concentration differs depending on the kind of the dye.

(B) Oxime Photopolymerization Initiator

The dye-containing negative curable composition of the invention contains at least one oxime photopolymerization initiator (the initiator according to the invention). Specific examples of the oxime photopolymerization initiator described above, in oxime photopolymerization initiators of the first aspect of the invention, may be used.

An arbitrary mass ratio of the plural oxime photopolymerization initiators may be used in the invention.

The composition of the invention preferably contains other photopolymerization initiators in addition to the oxime photopolymerization initiator.

Specific examples of the other photopolymerization initiators used in combination with the oxime photopolymerization initiator described above, in other photopolymerization initiators used in combination with the oxime photopolymerization initiator of the first aspect of the invention, may be used.

The total quantity of the photopolymerization initiators in the dye-containing negative curable composition is usually 5% by mass or more, preferable 9% by mass or more, and more preferably 12% by mass or more relative to the total solids of the invention. The upper limit of the total quantity is usually 40% by mass, preferably 30% by mass or less, and more preferably 20% by mass or less.

The content of the initiator of the invention (oxime photopolymerization initiator) in the above-mentioned total quantity is preferably from 100 to 30% by mass, more preferably from 100 to 40% by mass, in terms of the effect of the invention.

The mass ratio (B'/C') of the total amount (B') of the photopolymerization initiator including the oxime photopolymerization initiator (B) to the total amount (C') of the radical polymerizable monomer (C) to be described below is usually from 0.1 or more to 1 or less, preferably from 0.25 or more to 0.75 or less, and more preferably from 0.3 or more to 0.70 or less. Polymerization reaction may favorably proceed when the mass ratio (B'/C') is within the above-described range to render the polymerization ratio to be larger and the molecular weight to be lower so that the film strength may not be weaken.

In the present invention, oxime photopolymerization initiator is used preferably in combination with two compounds of a pyrazole azo compound and a pyridone azo compound, a phthalocyanine substituted with a sulfur-containing organic group and a pyrazole azo compound, or a phthalocyanine substituted with a sulfur-containing organic group and a pyrazotriazole-containing azomethine compound.

A heat polymerization inhibitor is preferably added in combination with the above photopolymerization initiator. Examples of the useful heat polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and 2-mercaptobenzoimidazole.

(C) Radical Polymerizable Monomer

The dye-containing negative curable composition of the invention contains at least one radical polymerizable monomer. Specific examples of the radical polymerizable monomer described above, in radical polymerizable monomer of the first aspect of the invention, may be used.

(D) Organic Solvent

At least one organic solvent (may be simply referred to "solvent" in the specification of the invention) may be used for the dye-containing negative curable composition of the invention. While the solvent is basically not restricted so long as it satisfies solubility of each component and applicability of the dye-containing negative curable composition, the solvent is preferably selected by taking into account the solubility of the dye and alkali-soluble binder, applicability and safety.

Preferable examples of the organic solvent include esters such as ethyl acetate, n-butyl acetate, isobutyl acetate, amyl formate, isoamyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate;

3-oxypropionic acid alkyl esters such as methyl 3-oxypropionate and ethyl 3-oxypropionate, for example methyl 3-methoxypropionate, ethyl 3-methoxypropionate, methyl 3-ethoxypropionate and ethyl 3-ethoxypropionate; 2-oxypropionic acid alkyl esters such as methyl 2-oxypropionate, ethyl 2-oxypropionate and propyl 2-oxypropionate, for example methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methyl propionate and ethyl 2-ethoxy-2-methylpropionate; methylpyruvate, ethyl pyruvate, propyl pyruvate, methyl acetoacetate, ethyl acetoacetate, methyl 2-oxobutanate and ethyl 2-oxobutanate;

ethers such as diethyleneglycol dimethyl ether, tetrahydrofuran, ethyleneglycol monomethyl ether, ethyleneglycol monoethyl ether, methyl cellosolve acetate, ethyl cellosolve acetate, ethyl carbitol acetate, butyl carbitol acetate, diethyleneglycol monomethyl ether, diethyleneglycol monoethyl ether, diethyleneglycol monobutyl ether, propyleneglycol methyl ether, propyleneglycol methyl ether acetate, propyleneglycol ethyl ether acetate and propyleneglycol propyl ether acetate;

ketones such as methylethyl ketone, cyclohexanone, cyclopentanone, 2-heptanone and 3-heptanone; and aromatic hydrocarbons such as toluene and xylene.

Methyl 3-ethoxypropionate, ethyl 3-ethoxypropionate, ethyl cellosolve acetate, ethyl lactate, diethyleneglycol dimethyl ether, butyl acetate, methyl 3-methoxypropionate, 2-heptanone, cyclohexanone, cyclopentanone, ethyl carbitol acetate, butyl carbitol acetate, propyleneglycol methyl ether and propyleneglycol methyl ether acetate are more preferable among them.

Preferable aspect is that the solvent is selected from at least one of cyclohexanone, ethyl lactate, propyleneglycol monomethylether acetate, propyleneglycol monomethylether and ethyl 3-ethoxypropionate in terms of applicability and sensitivity, and is more preferably selected from propyleneglycol monomethylether and ethyl 3-ethoxypropionate in terms of resolution.

The content of the organic solvent in the dye-containing negative curable composition is preferably from 5 to 99.5% by mass, more preferably from 10 to 90% by mass, and most preferably from 15 to 80% by mass in the total amount of the composition.

Uniform coating may be impossible due to high viscosity when the content is less than 5% by mass, while coating with a sufficient thickness (about 3 μm) may be impossible due to low viscosity when the content exceeds 99.5% by mass. Therefore, the above-described range is preferable.

(E) Transition Metal Complex

The dye-containing negative curable composition of the invention preferably includes the transition metal complex having a maximal value of the molar absorbance coefficient $\epsilon$ in the visible light region that is smaller than the molar absorbance coefficient $\epsilon$ of the organic solvent-soluble dye.

Negative, neutral or positive monodentate or multidentate ligands are coordinated to the transition metal atom or transition metal ion at the center in the transition metal complex, which is useful for improving light resistance of the dye-containing negative curable composition and the color filter using the composition.

The transition metal complex of the invention preferably has a maximum value of the molar absorbance coefficient $\epsilon$ from 0 or more to 8,000 or less in the visible light region (380 to 780 nm) in terms of sharpness of the color. The maximum value of the molar absorbance coefficient $\epsilon$ of the transition metal complex in the above-mentioned wavelength region is more preferably from 0 or more to 6,000 or less, further preferably from 0 or more to 3,000 or less.

Preferable examples of the transition metal constituting the transition metal atom and transition metal ion of the transition metal complex are those described in JP-A No. 2004-295116.

Particularly preferable examples of the transition metal complex include cobalt (II) acetylacetonate, cobalt (II) hexafluoroacetylacetonate hydrate, nickel (II) acetylacetonate and di-n-butyldithiocarbamate nickel (II).

Cobalt (II) acetylacetonate and cobalt (II) hexafluoroacetylacetonate hydrate are most preferable among the transition metal complexes.

The content of the transition metal complex in the dye-containing negative curable composition is preferably 40% by mass or less, more preferably 30% by mass or less, further preferably 20% by mass or less, and most preferably from 0.5 to 15% by mass relative to the amount of the organic solvent-soluble dye.

The shape of the pattern and pattern strength may be deteriorated when the content exceeds 40% by mass.

(F) Other Components
—Resin (Binder)—

A resin (binder) is preferably used in the dye-containing negative curable composition of the invention. The resin may be selected from known resins irrespective of alkali-soluble or alkali-insoluble.

An alkali-soluble resin (referred to an alkali-soluble binder hereinafter) is favorable as the resin. The contents described in the item of the first aspect of the invention may be incorporated herein by way of reference with respect to the alkali-soluble binder. Specific examples of the alkali-soluble binder described above, in alkali-soluble binder of the first aspect of the invention, may be used.

—Surfactant—

A surfactant may be used in the composition of the invention. Specific examples of the surfactant described above, in surfactant of the first aspect of the invention, may be used.

—Cross-linking Agent—

A highly cured film may be obtained in the invention by optionally using the cross-linking agent. Specific examples of the cross-linking agent described above, in cross-linking agent of the first aspect of the invention, may be used.

—Additives—

Additives such as a filler, polymer compounds other than those as hitherto described, an adhesion enhancing agent, an antioxidant, ultraviolet absorber and a coagulation inhibitor may be optionally used in the dye-containing negative curable composition of the invention if desired.

Specific examples of the additives are fillers such as glass and alumina, polymer compounds other than binding resins such as polyvinyl alcohol, polyacrylic acid, polyethyleneglycol monoalkyl ether, polyfluoroalkyl acrylate; adhesion accelerating agents such as vinyltrimethoxy silane, vinyltriethoxy silane, vinyltris(2-methoxyethoxy)silane, N-(2-aminoethyl)-3-aminopropyl methyldimethoxysilane, N-(2-aminoethyl)-3-aminopropyl trimethoxysilane, 3-aminopropyl triethoxysilane, 3-glycidoxypropyl trimethoxysilane, 3-glycidoxypropylmethyl dimethoxysilane, 2-(3,4-epoxycyclohexyl)ethyl trimethoxysilane, 3-chloropropylmethyl dimethoxysilane, 3-chloropropyl trimethoxysilane, 3-methacryloxypropyl trimethoxysilane and 3-mercaptopropyl trimethoxysilane; antioxidants such as 2,2-thiobis(4-methyl-6-t-butylphenol) and 2,6-di-t-butylphenol; UV absorbing agents such as 2-(3-t-butyl-5-methyl-2-hydroxyphenyl)-5-chlorobenzotriazole and alkoxy benzophenone; and coagulation inhibitors such as sodium polyacrylate.

An organic carboxylic acid, preferably a low molecular weight organic carboxylic acid with a molecular weight of 1000 or less, may be added to the composition for attempting developability of the dye-containing negative curable composition of the invention to be further improved by enhancing solubility of non-cured portions in an alkali solution.

Specific examples of the organic carboxylic acid include aliphatic monocarboxylic acids such as formic acid, acetic acid, propionic acid, butyric acid, valeric acid, pivalic acid, capronic acid, diethylacetic acid, enanthic acid and caprylic acid; aliphatic dicarboxylic acid such as oxalic acid, malonic acid, succinic acid, glutaric acid, adipic acid, pimelic acid, suberic acid, azelaic acid, cebacic acid, brassylic acid, methylmalonic acid, ethylmalonic acid, dimethylmalonic acid, methylsuccinic acid, tetramethylsuccinic acid and citraconic acid; aliphatic tricarboxylic acid such as tricarbarylic acid, aconitic acid and camphoronic acid; aromatic monocarboxylic acid such as benzoic acid, toluic acid, cuminic acid, hemellitic acid and mesitylenic acid; aromatic polycarboxylic acid such as phthalic acid, isophthalic acid, terephthalic acid, trimellitic acid, trimesic acid, mellophanic acid and pyromellitic acid; and other carboxylic acid such as phenylacetic acid, hydratropic acid, hydrocinnamic acid, mandelic acid, phenylsuccinic acid, atropic acid, cinnamic acid, methyl cinnamate, benzyl cinnamate, cinnamylidene acetic acid, coumaric acid and unberic acid.

Specific examples include compounds having carboxylic groups of above mentioned component (D).

<Moisture Content of the Composition>

The composition of the invention is required to contain less than 1.0% by mass of water when it is filled in a hermetically sealed vessel such as a glass, metal or plastic vessel as the dye-containing negative curable composition.

When the moisture content of the composition of the invention is restricted to less than 1.0% by mass, time-dependent stability of the composition is improved while fluctuation of the pattern due to fluctuation of the amount of exposure is reduced.

The moisture content is preferably less than 0.7% by mass, more preferably less than 0.5% by mass.

The moisture content of the composition of the invention is less than 0.7% by mass is preferable in terms of time-dependent stability.

The moisture content as used in the invention refers to the proportion of water in the total amount of the composition, and is represented by % by mass.

The moisture content of the composition used in the invention may be determined by known methods such as Karl Fischer's method, which used in the present invention.

The method for obtaining a composition having a moisture content of less than 1.0% by mass comprises: heating each component constituting the composition of the invention and optionally added components at a temperature not decomposing the components and drying under a reduced pressure; heating a solution of an organic solvent of each component constituting the composition and optionally added components under a reduced pressure to remove water by distillation; preparing each component constituting the composition and optionally added components by dehydration using a molecular sieve (manufactured by Showa Co.); and directly treating a solution of an organic solvent of each component constituting the composition and optionally added components with the molecular sieve. However, the method is not restricted thereto so long as the moisture content in each composition could be reduced.

The dye-containing negative curable composition of the invention may be favorably used for color filters used in the liquid display device (LCD) and solid state image pickup element (such as CCD and CMOS), and color filters used in electroluminescence for forming colored pixels, and for manufacturing printing inks, ink-jet inks and paints.

<<Color Filter and Production Method Thereof>>

The color filter of the invention will be described in detail by means of the production method thereof.

The color filter of the invention is produced using the dye-containing negative curable composition of the invention as hitherto described.

The method for producing the color filter of the invention comprises carrying out forming a pattern by, exposure through a mask and development after applying the dye-containing negative curable composition of the invention onto a substrate, at least one or more times.

In particular, the production process comprises: forming a radiation sensitive composition layer, by a coating method such as spin coating, flow coating or roll coating of the dye-containing negative curable composition onto a substrate; and forming a negative colored pattern, by exposure through a predetermined mask pattern and developing by developer (image forming). The process may optionally include curing, for curing the colored pattern formed by heating and/or exposure.

A color filter comprising a desired number of hues may be produced by repeating the image forming (and optionally the curing) according to the desired number of hues.

The light or radiation used for this process is preferably g-line, h-line or i-line ultraviolet light.

The above-mentioned dye-containing negative curable composition of the invention is used in the color filter of the invention, and the filter preferably comprises one or more colors of the colored regions (for example colored regions of three colors of red (R), green (G) and blue (B)), provided on the substrate with a desired pattern (for example, stripes, lattice, or delta array). The color filter of the invention may be most favorably formed by the method for producing the color filter of the invention.

When a colored region of at least one color is provided on the substrate, at least one color of the colored region constituting the color filter is preferably formed using the dye-containing negative curable composition containing at least one of the combinations of two compounds (1) to (3) below:

(1) a pyrazole azo compound and a pyridone azo compound;

(2) a phthalocyanine compound substituted with a sulfur-containing organic group and a pyrazole azo compound; or (3) a phthalocyanine compound substituted with a sulfur-containing organic group and a pyrazolotriazole-containing azomethine compound.

Details and preferable aspects of the compounds in (1) to (3) are as described previously.

Examples of the substrate include soda glass, PYLEX (trade name) glass and quartz glass used for the liquid crystal display element and the glasses coated with a transparent conductive film, and substrates for photoelectric transducer elements used for the image pickup element, for example a silicon substrate and a complementary metal oxide film semiconductor (CMOS). Black stripes for separating the pixels may be formed on the substrate.

An undercoat layer may be provided on the substrate if required for improving adhesivity to the upper layer, for preventing substances from being diffused and for planarizing the surface of the substrate.

Any developer may be used so long as the developer dissolves non-cured portions of the dye-containing negative curable composition of the invention while the cured portion is insoluble in the developer. Specifically, the developer available comprises a combination of various organic solvents or an aqueous alkali solution. The above-mentioned organic solvents used for preparing the dye-containing negative curable composition of the invention may be used as the organic solvent for the developer.

The favorably used aqueous alkali solution is prepared by dissolving an alkaline compound such as sodium hydroxide, potassium hydroxide, sodium carbonate, sodium silicate, sodium metasilicate, aqueous ammonia, ethylamine, diethylamine, dimethyl ethanolamine, tetramethyl ammonium hydroxide, tetraethyl ammonium hydroxide, choline, pyrrole, piperidine and 1,8-diazabicyclo-[5.4.0]-7-undecene in a concentration from 0.001 to 10% by mass, preferably from 0.01 to 1% by mass. In general, it is washed with water after development when the developer containing the aqueous alkali solution is used.

The color filter of the invention may be used for the liquid crystal display device (LCD) and solid state image pickup device (for example CCD and CMOS), and is particularly favorable for the CCD element and CMOS of high resolution having a pixel number exceeding $10^6$ pixels. The color filter may be used, for example, as a color filter disposed between light-receiving portions of the pixels constituting CCD and a micro-lens for focusing.

A first aspect of the invention, it is based on the findings that a combination of a specified dye and oxime photopolymerization initiator is effective for time-dependent stabilization after preparation and for improvement and stabilization of the pattern Exemplified embodiments are as follows:

<1> a dye-containing negative curable composition containing at least two dyes (A) independently selected from a heterocyclic azo compound, a phthalocyanine compound or an azomethine compound, at least one oxime photopolymerization initiator (B) and at least one radical polymerizable monomer (C);

<2> the dye-containing negative curable composition according to <1>, wherein the at least two dyes are independently selected from a nitrogen-containing-heterocyclic azo compound, a phthalocyanine compound substituted with an organic group or an azomethine compound containing a nitrogen-containing heterocyclic group;

<3> the dye-containing negative curable composition according to <1> or <2>, wherein the at least two dyes are independently selected from pyrazole azo compound, pyridone azo compound, pyridine azo compound, pyrimidine azo compound, phthalocyanine compound substituted with sulfur-containing organic group or pyrazolotriazole-containing azomethine compound;

<4> the dye-containing negative curable composition according to any one of <1> to <3>, wherein the at least two dyes comprise at least one of the combinations of two compounds (1) to (3) below:

(1) a pyrazole azo compound and a pyridone azo compound;

(2) a phthalocyanine compound substituted with a sulfur containing organic group and a pyrazole azo compound; or (3) a phthalocyanine compound substituted with a sulfur containing organic group and a pyrazolotriazole-containing azomethine compound;

<5> the dye-containing negative curable composition according to any one of <1> to <4>, wherein the at least one of the dyes comprises an acid group;

<6> the dye-containing negative curable composition according to any one of <1> to <5>, wherein the at least two of the dyes comprise acid groups;

<7> the dye-containing negative curable composition according to any one of <1> to <6>, wherein the mass ratio (B'/C') of the total amount (B') of the photopolymerization initiator containing the oxime photopolymerization initiator (B) to the total amount (C') of the radical polymerizable monomer (C) is in the range from 0.25 to 0.75;

<8> the dye-containing negative curable composition according to any one of <1> to <7>, wherein the content of the oxime photopolymerization initiator (B) is 9% by mass or more relative to the total solids in the dye-containing negative curable composition;

<9> the dye-containing negative curable composition according to <8>, wherein the content of the oxime photopolymerization initiator (B) is 12% by mass or more relative to the total solids in the dye-containing negative curable composition;

<10> the dye-containing negative curable composition according to any one of (1) to (9), wherein the content of the dye (A) is 40% by mass or more relative to the total solids in the dye-containing negative curable composition;

<11> the dye-containing negative curable composition according to <10>, wherein the content of the dye (A) is 45% by mass or more and 90% by mass or less relative to the total solids in the dye-containing negative curable composition;

<12> the dye-containing negative curable composition according to any one of <1> to <11> further comprising an organic solvent (D);

<13> the dye-containing negative curable composition according to any one of <1> to <12> comprising other photopolymerization initiators other than the oxime photopolymerization initiator;

<14> the dye-containing negative curable composition according to any one of <1> to <13> further comprising a resin;

<15> the dye-containing negative curable composition according to any one of <1> to <14> further comprising a surfactant;

<16> the dye-containing negative curable composition according to any one of <12> to <15>, wherein the organic solvent (D) is at least one of cyclohexanone, ethyl lactate, propyleneglycol monomethylether acetate, propyleneglycol monomethylether and ethyl 3-ethoxypropionate;

<17> the dye-containing negative curable composition according to <16>, wherein the organic solvent (D) is at least one of propyleneglycol monomethylether and ethyl 3-ethoxypropionate;

<18> a color filter formed using the dye-containing negative curable composition according to any one of <1> to <17>;

<19> the color filter according to <18> having a colored region with a plurality of colors on a substrate, wherein at least two colors of the colored region comprise one of the combinations of two compounds (1) to (3) below;

(1) a pyrazole azo compound and a pyridone azo compound;

(2) a phthalocyanine compound substituted with a sulfur-containing organic group and a pyrazole azo compound; or (3) a phthalocyanine compound substituted with a sulfur-containing organic group and a pyrazolotriazole containing azomethine compound; and <20> a method for producing a color filter comprising: applying the dye-containing negative curable composition according to any one of <1> to <17> onto a substrate; forming a pattern by exposing through a mask and developing.

One or plural times of the above-mentioned steps are used in the method for producing the color filter, and the color filter is produced by forming a monochromatic or polychromatic colored region.

A second aspect of the invention provides a composition combining a specified dye and a photopolymerization initiator, and having specified moisture content. Exemplified embodiments are as follows;

<1> a dye-containing negative curable composition containing at least two organic solvent-soluble dyes (A) independently selected from heterocyclic azo compounds, phthalocyanine compounds and azomethine compounds, at least one oxime photopolymerization initiator (B), at least one radical polymerizable monomer (C) and at least one organic solvent (D), wherein a moisture content of the composition is less than 1% by mass relative to the total amount of the composition;

<2> the dye-containing negative curable composition according to <1>, wherein at least two dyes of the organic solvent-soluble dyes are selected from nitrogen-containing heterocyclic azo compounds, phthalocyanine compounds substituted with an organic group or azomethine compounds containing nitrogen-containing heterocyclic group;

<3> the dye-containing negative curable composition according to <1> or <2>, wherein at least two dyes of the organic solvent-soluble dyes are selected from pyrazole azo compound, pyridone azo compound, pyridine azo compound, pyrimidine azo compound, phthalocyanine compound substituted with sulfur-containing organic group or pyrazolotriazole containing azomethine compound;

<4> the dye-containing negative curable composition according to any one of <1> to <3> further containing a transition metal complex (E) having a maximum values of the molar absorbance coefficient ε in the visible light region smaller than the molar absorbance coefficient ε of the organic solvent-soluble dye;

<5> the dye-containing negative curable composition according to any one of <1> to <3>, wherein at least two dyes of the organic solvent-soluble dyes comprise one of the combinations of two compounds (1) to (3) below:

(1) a pyrazole azo compound and a pyridone azo compound;

(2) a phthalocyanine compound substituted with a sulfur-containing organic group and a pyrazole azo compound; or (3) a phthalocyanine compound substituted with a sulfur-containing organic group and a pyrazolotriazole containing azomethine compound;

<6> the dye-containing negative curable composition according to any one of <1> to <5>, wherein at least one of the organic-solvent soluble dyes (A) contains an acid group;

<7> the dye-containing negative curable composition according to any one of <1> to <6>, wherein at least two of the organic-solvent soluble dyes (A) contain acid groups;

<8> the dye-containing negative curable composition according to any one of <1> to <7>, wherein the ratio (B'/C') of the total amount (B') of the photopolymerization initiator containing the oxime photopolymerization initiator (B) to the total amount (C') of the radical polymerizable monomer (C) is in the range from 0.25 to 0.75;

<9> the dye-containing negative curable composition according to any one of <1> to <8>, wherein the content of the oxime photopolymerization initiator (B) is 9% by mass or more in the total solids in the dye-containing negative curable composition;

<10> the dye-containing negative curable composition according to any one of <1> to <9>, wherein the content of the oxime photopolymerization initiator (B) is 12% by mass or more in the total solids in the dye-containing negative curable composition;

<11> the dye-containing negative curable composition according to any one of <1> to <10>, wherein the content of the organic solvent-soluble dye (A) is from 40% by mass or more to 95% by mass or less of the total solid fraction in the composition;

<12> the dye-containing negative curable composition according to any one of <1> to <11>, wherein the content of the organic solvent-soluble dye (A) is from 45% by mass or more to 90% by mass or less of the total solid fraction in the composition;

<13> the dye-containing negative curable composition according to any one of <1> to <12> further comprising other photopolymerization initiators other than the oxime photopolymerization initiator (B);

<14> the dye-containing negative curable composition according to any one of <1> to <13> further comprising a resin;

<15> the dye-containing negative curable composition according to any one of <1> to <14> further comprising a surfactant;

<16> the dye-containing negative curable composition according to any one of <1> to <15>, wherein the organic solvent (D) is at least one of cyclohexanone, ethyl lactate, propyleneglycol monomethylether acetate, propyleneglycol monomethylether or ethyl 3-ethoxypropionate;

<17> the dye-containing negative curable composition according to <16>, wherein the organic solvent (D) is at least one of propyleneglycol monomethylether or ethyl 3-ethoxypropionate;

<18> a color filter formed using the dye-containing negative curable composition according to any one of <1> to <17>;

<19> a color filter having a colored region of at least one color on a substrate, wherein at least one color of the colored region comprises one of the combinations of two compounds (1) to (3) below as an organic solvent-soluble dyes (A) and at least one of the oxime photopolymerization initiators (B), and the moisture content of the composition is less than 1% by mass of the total amount of the composition;

(1) a pyrazole azo compound and a pyridone azo compound;

(2) a phthalocyanine compound substituted with a sulfur-containing organic group and a pyrazole azo compound; or (3) a phthalocyanine compound substituted with a sulfur-containing organic group and a pyrazolotriazole-containing azomethine compound; and <20> a method for producing a color filter comprising at least one time of applying the dye-containing negative curable composition according to any one of <1> to <17> onto a substrate forming a pattern by exposing through a mask and developing.

EXAMPLES

While the first aspect of the present invention is described in detail below with reference to examples, the invention is not restricted to the examples within the range not exceeding the spirit of the invention. "Parts" in the following examples denote "part by mass".

Examples 1 to 10, Comparative Examples 1 to 5

(1) Preparation of Resist Solution

A resist solution was prepared by mixing and dissolving the following compositions.

| | |
|---|---|
| propyleneglycol monomethylether acetate (PGMEA) | 19.20 parts |
| ethyl lactate | 36.67 parts |
| resin (binder) [benzyl methacrylate/methacrylic acid/methacrylic acid-2-hydroxyethyl copolymer: 41% PGMEA solution with a molar ratio = 60/20/20] | 30.51 parts |
| dipentaerythritol hexaacrylate (photopolymerizable compound) | 12.20 parts |
| polymerization inhibitor (p-methoxyphenol) | 0.0061 parts |
| fluorinated surfactant (F-475, manufactured by Dainippon Ink & Chemicals, Inc.) | 0.83 parts |
| photopolymerization initiator (TAZ-107: trihalomethyl triazine photopolymerization initiator, manufactured by Midori Chemical Co.) | 0.586 parts |

(2) Production of Silicon Wafer Substrate with Undercoat Layer

Silicon wafer (6 inches) was heated at 200° C. for 30 minutes or more in an oven. Then, the resist solution was coated on the silicon wafer at a drying thickness of 2 µm, and an undercoat layer was formed by heating and drying the wafer after coating in an oven at 220° C. for 1 hour to obtain the wafer with the undercoat layer.

(3) Preparation of Dye-containing Negative Curable Composition

The components shown in Table 1 (in the amounts shown in Table 1) were dissolved in the solvents shown in Table 1 to prepare the dye-containing negative curable compositions N-1 to N-15.

(4) Exposure and Development of the Dye-containing Negative Curable Composition (Image-forming Step)

The dye-containing negative curable compositions N-1 to N-15 obtained in (3) were filtered. After filtration, the dye-containing negative curable composition N-1 to N-15 were applied on respective undercoat layers on respective silicon wafers having the undercoat layer obtained in (2) using a spin coater so that the thickness of the coating film is 0.8 µm, and each coating film was pre-baked at 100° C. for 120 seconds.

Subsequently, the coating film obtained above was irradiated with a light at a wavelength of 365 nm through a mask with a line width of 2 µm using an i-line reducing projection exposure apparatus by changing the exposure values in steps of 100 mJ/cm². After irradiation, the exposed film was developed at 23° C. for 60 seconds using a developer of 60% CD-2000 (trade name: manufactured by Fuji Film Electronics Materials Co.). Then, the developed film was rinsed in running water for 20 seconds followed by spray drying to obtain a colored filter film (color filter). The image formed was confirmed by a conventional method using an optical microscope and SEM photograph.

(5) Evaluation

The dye-containing negative curable compositions N-1 to N-15 and color filters obtained in the above-mentioned examples and comparative examples were evaluated with respect to the rate of variability of line width by changing exposure values and increased number of coating defects with time by the following method. The results of evaluation are shown in Table 1.

—1. Evaluation of Rate of Variability of Line Width by Changing Exposure Values—

An exposure value when the ratio between the dot width and space width is 1:1 was defined as a proper exposure value (sensitivity) of patterns having a width of 2 μm, and the rate of variability of the line width when the exposure value was changed 100 mJ/cm² from the proper exposure value was calculated from the following equation. "| |" in the equation denotes the absolute value.

Rate of variability of line width (%)=|(line width* when the exposure value is shifted 100 mJ/cm² form the proper exposure value)−(line width at proper exposure value)|/(line width at proper exposure value)×100

The total number of defects observed on one sheet of the 6 inch wafer was determined. Subsequently, the dye-containing negative curable compositions N-1 to N-15 were stored at 25° C. for 2 weeks, and the total number of coating defects was also determined after coating the composition on respective wafers by the same method as described above. The increased number of coating defects with time was calculated from the following equation, and the result was used as an index showing the time-dependent stability of the dye-containing negative curable composition. The smaller number of increment shows better stability with time.

Increased number of coating defects with time=(number of coating defects after 2 weeks' time lapse)−(number of coating defects immediately after preparation)

TABLE 1

| Composition | Dye (A) Name | Dye (A) Amount of addition (parts) | Photopolymerization initiator (B) Name | Photopolymerization initiator (B) Amount of addition (parts) | Radical polymerizable monomer (C) Name | Radical polymerizable monomer (C) Amount of addition (parts) | Resin (binder) Name | Resin (binder) Amount of addition (parts) | Surfactant Name | Surfactant Amount of addition (parts) | Organic solvent (D) Name | Organic solvent (D) Amount of addition (parts) | Increased number of coating defects with time | Rate of variability of line width (%) |
|---|---|---|---|---|---|---|---|---|---|---|---|---|---|---|
| Example 1 | N-1 | A1-5 / A2-2 | 39 / 17 | B-1 | 16 | C-1 | 28 | — | — | — | — | D-1 / D-2 | 200 / 200 | 0 | 1.4 |
| Example 2 | N-2 | A1-12 / A2-16 | 37 / 20 | B-2 | 15 | C-1 | 28 | — | — | — | — | D-1 / D-3 | 300 / 100 | 0 | 1.3 |
| Example 3 | N-3 | A1-18 / A2-24 | 38.5 / 18.5 | B-1 | 15.5 | C-1 | 27.5 | — | — | — | — | D-1 / D-4 | 200 / 200 | 0 | 1.4 |
| Example 4 | N-4 | A3-6 / A4-1 | 20 / 29 | B-1 | 14 | C-1 | 32 | E-1 | 5 | — | — | D-2 / D-3 | 250 / 150 | 0 | 1.1 |
| Example 5 | N-5 | A3-10 / A4-12 | 20 / 30 | B-2 | 13.5 | C-1 | 36 | — | — | F-1 | 0.5 | D-1 / D-5 | 200 / 200 | 0 | 1.2 |
| Example 6 | N-6 | A3-22 / A4-14 | 19 / 29 | B-2 | 12 | C-1 | 32 | E-1 | 8 | — | — | D-1 / D-2 | 300 / 100 | 0 | 1.1 |
| Example 7 | N-7 | A5-7 / A6-1 | 30 / 14 | B-1 / B-3 | 10.5 / 10.5 | C-1 | 35 | — | — | — | — | D-1 / D-2 | 250 / 150 | 1 | 1.5 |
| Example 8 | N-8 | A5-10 / A6-6 | 32 / 15.5 | B-1 / B-4 | 12 / 3.5 | C-1 | 37 | — | — | — | — | D-2 / D-3 | 200 / 200 | 0 | 1.3 |
| Example 9 | N-9 | A5-20 / A6-18 | 29.5 / 13.5 | B-2 / B-5 | 13 / 5.5 | C-1 | 38.5 | — | — | — | — | D-2 / D-3 | 300 / 100 | 1 | 1.6 |
| Example 10 | N-10 | A5-32 / A6-23 | 30 / 16 | B-1 / B-6 | 16 / 4 | C-1 | 34 | — | — | — | — | D-1 / D-2 | 100 / 300 | 0 | 1.4 |
| Comparative example 1 | N-11 | A1-5 / H-1 | 39 / 17 | B-1 | 16 | C-1 | 28 | — | — | — | — | D-1 / D-2 | 200 / 200 | 7 | 5.6 |
| Comparative example 2 | N-12 | H-2 / A2-2 | 39 / 17 | B-1 | 16 | C-1 | 28 | — | — | — | — | D-1 / D-2 | 200 / 200 | 12 | 5.8 |
| Comparative example 3 | N-13 | A3-6 / H-3 | 20 / 29 | B-1 | 14 | C-1 | 32 | E-1 | 5 | — | — | D-2 / D-3 | 250 / 150 | 6 | 6.9 |
| Comparative example 4 | N-14 | A5-10 / H-4 | 32 / 15.5 | B-1 / B-4 | 12 / 3.5 | C-1 | 37 | — | — | — | — | D-2 / D-3 | 200 / 200 | 8 | 7.8 |
| Comparative example 5 | N-15 | A1-5 / A2-2 | 39 / 17 | B-3 | 16 | C-1 | 28 | — | — | — | — | D-1 / D-2 | 200 / 200 | 5 | 4.8 |

* Of the line widths corresponding to an increase or a decrease of 100 mJ/cm² from the proper exposure value, the line width that shows larger shift from the line width at the proper exposure value was used for the calculation. The smaller rate of variability of line width shows better performance.

—2. Evaluation of Increased Number of Coating Defects with Time—

The dye-containing negative curable compositions N-1 to N-15 immediately after preparation in (3) were applied on the undercoat layers of the silicon wafer having the undercoat layer obtained in (2) by the same method as described above. The coating film was observed under an optical microscope in order to count the number of holes and radial coating defects.

Details of each component in Table 1 are shown below.
(A) Dye
  The column of names in examples denotes the number of compound of the dye.
Dyes H-1 to H-4 in Comparative Examples
  H-1: Valifast Yellow 1101
  H-2: C.I. Acid Red 249
  H-3: Valifast Blue 2620
  H-4: C.I. Acid Red 80
(B) Photopolymerization Initiator
  B-1: IRGACURE OXE 01 (manufactured by Ciba Specialty Chemicals, Inc., initiator according to the invention)
  B-2: CGI-242 (manufactured by Ciba Specialty Chemicals, Inc., initiator according to the invention)

B-3: IRGACURE 369 (manufactured by Ciba Specialty Chemicals, Inc., α-aminoketone photopolymerization initiator)

B-4: TAZ-107 (manufactured by Midori Chemical Co., trihalomethyl triazine photopolymerization initiator)

B-5: IRGACURE 819 (manufactured by Ciba Specialty Chemicals, Inc., acylphosphine photopolymerization initiator)

B-6: 2,2'-bis(2,4-dichlorophenyl)-4,4',5,5'-tetraphenyl-1,2'-biimidazole (C) Radical Polymerizable Monomer C-1: mixture of above-mentioned compound (M-2) of radical polymerizable monomer and dipentaerythritol hexaacrylate (3:7)

(D) Organic Solvent

D-1: cyclohexanone

D-2: ethyl lactate

D-3: propyleneglycol monomethylether acetate (PGMEA)

D-4: propyleneglycol monomethylether

D-5: ethyl 3-ethoxypropionate (E) Other Components

Resin (Binder)

E-1: benzyl methacrylate/methacrylic acid (=70/30 (molar ratio) copolymer, weight average molecular weight: 30,000)

Surfactant

F-1: fluorinated surfactant F-475 (manufactured by Dainippon Ink & Chemicals, Inc.)

As shown in Table 1, pattern forming ability was excellent in the examples since the increased number of coating defects with time was small and the rate of variability of the line width of the pattern was small. On the contrary, the number of coating defects with time remarkably increased with large rate of variability of the line width of the pattern, and pattern forming ability was poor in comparative examples.

While the second aspect of the present invention is described in detail below with reference to examples, the invention is not restricted to the examples within the range not exceeding the spirit of the invention. "Parts" in the following examples denote "part by mass".

Examples 11 to 20, Comparative Examples 6 to 11

(1) Preparation of Resist Solution

The resist solution was prepared by mixing and dissolving the compounds in the following composition.

| | |
|---|---|
| propyleneglycol monomethylether acetate (PGMEA) | 19.20 parts |
| ethyl lactate | 36.67 parts |
| resin (binder) (41% PGMEA solution of benzyl methacrylate/methacrylic acid/2-hydroxyethyl methacrylate copolymer (molar ratio = 60:20:20, weight average molecular weight = 30,000)) | 30.51 part |
| dipentaerythritol hexaacrylate (photopolymerizable compound) | 12.20 parts |
| polymerization inhibitor (p-methoxyphenol) | 0.0061 parts |
| fluorinated surfactant (F-475, manufactured by Dainippon Ink & Chemicals, Inc.) | 0.83 parts |
| photopolymerization initiator (TAZ-107 (trihalomethyl triazine photopolymerization initiator), manufactured by Midori Chemical Co.) | 0.586 parts |

(2) Preparation of Glass Substrate with Undercoat Layer

Silicon wafer (6 inches) was heated at 200° C. for 30 minutes or more in an oven. Then, the resist solution was coated on the silicon wafer at a drying thickness of 2 μm, and an undercoat layer was formed by drying the wafer in an oven at 220° C. for 1 hour to obtain the wafer substrate with the undercoat layer.

(3) Preparation of Dye-containing Negative Curable Composition

The components (the amounts are as shown in Table 2) shown in Table 2 were dissolved in respective organic solvents shown in Table 2 below. Molecular sieve 4A (1 g, pellets) was added to 10 g of each solution, and the solution was stirred for 12 hours. The solution was filtered in dry nitrogen atmosphere to remove the molecular sieve, and dye-containing negative curable compositions N-16 to N-31 were obtained. However, only the compositions N-27 and N-28 were not subjected to the treatment with molecular sieve 4A.

(3-1) Measurement of Moisture Content in the Composition

The dye-containing negative curable compositions N-16 to N-31 obtained in (3) were sampled by 50 μl, respectively, and moisture content in each composition was measured with Karl-Fisher's moisture meter MKC-120 (trade name: manufactured by Kyoto Electronics Co.).

(4) Exposure and Development of the Dye-containing Negative Curable Composition (Image-forming Step)

The dye-containing negative curable compositions N-16 to N-31 obtained in (3) were filtered. After filtration, the dye-containing negative curable composition N-16 to N-31 were applied on respective undercoat layers on respective silicon wafers having the undercoat layer obtained in (2) using a spin coater so that the thickness of the coating film is 0.8 μm, and each coating film was pre-baked at 100° C. for 120 seconds.

Subsequently, the coating film obtained above was irradiated with a light at a wavelength of 365 nm through a mask with a line width of 2 μm using an i-line reducing projection exposure apparatus by changing the exposure values in steps of 100 mJ/cm$^2$. After irradiation, the exposed film was developed at 23° C. for 60 seconds using a developer of 60% CD-2000 (trade name: manufactured by Fuji Film Electronics Materials Co.). Then, the developed film was rinsed in running water for 20 seconds followed by spray drying to obtain a colored filter film (color filter). The image formed was confirmed by a conventional method using an optical microscope and SEM photograph.

(5) Evaluation

The dye-containing negative curable compositions N-16 to N-31 and color filters obtained in the above-mentioned examples and comparative examples were evaluated with respect to the rate of variability of line width by changing exposure values and increased number of coating defects with time by the following method. The results of evaluation are shown in Table 2.

—1. Evaluation of Rate of Variability of Line Width by Changing Exposure Values—

An exposure value when the ratio between the dot width and space width is 1:1 was defined as a proper exposure value (sensitivity) of patterns having a width of 2 μm, and the rate of variability of the line width when the exposure value was changed 100 mJ/cm$^2$ from the proper exposure value was calculated from the following equation. "| |" in the equation denotes the absolute value.

Rate of variability of line width (%)=|(line width* when the exposure value is shifted 100 mJ/cm$^2$ form the proper exposure value)−(line width at proper exposure value)|/(line width at proper exposure value)×100

* Of the line widths corresponding to an increase or a decrease of 100 mJ/cm$^2$ from the proper exposure value, the line width that shows larger shift from the line width at the proper exposure value was used for the calculation. The smaller rate of variability of line width shows better performance.

—2. Evaluation of Increased Number of Coating Defects with Time—

The dye-containing negative curable compositions N-16 to N-31 immediately after preparation in (3) were applied on the undercoat layers of the silicon wafer having the undercoat layer obtained in (2) by the same method as described above. The coating film was observed under an optical microscope in order to count the number of holes and radial coating defects. The total number of defects observed on one sheet of the 6 inch wafer was determined. Subsequently, the dye-containing negative curable compositions N-16 to N-31 were stored at 25° C. for 2 weeks, and the total number of coating defects was also determined after coating the composition on respective wafers by the same method as described above. The increased number of coating defects with time was calculated from the following equation, and the result was used as an index showing the time-dependent stability of the dye-containing negative curable composition. The smaller number of increment shows better stability with time.

Increased number of coating defects with time=(number of coating defects after 2 weeks' time lapse)−(number of coating defects without lapse of time)

3. Evaluation of Rate of Variability of Line Width with Time

The dye-containing negative curable compositions N-16 to N-31 obtained in (3) were applied onto the undercoat layer of respective silicon wafer substrates coated with the undercoat layer obtained in (2) by the same method as in (4) to obtain coating films.

Light with a wavelength of 365 nm was exposed onto the coating film obtained above at an exposure value of 800 mJ/cm$^2$ through a mask with a line width of 2 μm using an i-line reducing exposure apparatus such as a stepper. After irradiation, the film was developed as in (4), and the line width of the 2 μm width pattern after exposure at 800 mJ/cm$^2$ was determined by observation of SEM photographs.

In addition, separate samples of the dye-containing negative curable compositions N-16 to N-31 obtained in (3) were stored at 25° C. for 2 weeks, then coating films obtained by using the above-mentioned compositions were exposed and developed as described above, and the line width of the 2 μm width patterns after exposure at 800 mJ/cm$^2$ were determined by observation of SEM photographs. The rate of variability of the line width with time was calculated from the following equation, and was evaluated.

"| |" in the equation denotes the absolute value. The smaller rate of variability of line width shows better performance.

Rate of variability of line width with time (%)=|(line width without lapse of time)−(line width after two-weeks' lapse of time)|/(line width without lapse of time)×100

TABLE 2

| | | Dye (A) | | Photopolymerization initiator (B) | | Radical Polymerizable Monomer (C) | | Other Components | | Organic Solvent (D) | | Moisture content (%) | Rate of Variability (%) by the Change of Exposure Value (%) | Increased Number of Coating Defects with Time | Rate of Variability of Line Width with Time (%) |
|---|---|---|---|---|---|---|---|---|---|---|---|---|---|---|---|
| | No. of composition | Name | Amount of Addition (parts) | Name | Amount of Addition (parts) | Name | Amount of Addition (parts) | Name | Amount of Addition (parts) | Name | Amount of Addition (parts) | | | | |
| Example 11 | N-16 | A1-5<br>A2-2 | 39<br>17 | B-1 | 16 | C-1 | 28 | — | — | D-1<br>D-2 | 200<br>200 | 0.35 | 1 | 0 | 1.2 |
| Example 12 | N-17 | A1-12<br>A2-16 | 37<br>20 | B-2 | 15 | C-1 | 28 | — | — | D-1<br>D-3 | 300<br>100 | 0.57 | 1.2 | 0 | 1.4 |
| Example 13 | N-18 | A1-18<br>A2-24 | 38.5<br>18.5 | B-1 | 15.5 | C-1 | 27.5 | — | — | D-1<br>D-4 | 200<br>200 | 0.44 | 1.3 | 0 | 1.4 |
| Example 14 | N-19 | A3-6<br>A4-1 | 20<br>29 | B-1 | 14 | C-1 | 32 | E-1 | 5 | D-2<br>D-3 | 250<br>150 | 0.09 | 0.9 | 0 | 1 |
| Example 15 | N-20 | A3-10<br>A4-12 | 20<br>30 | B-2 | 13.5 | C-1 | 36 | F-1 | 0.5 | D-1<br>D-5 | 200<br>200 | 0.5 | 1.1 | 0 | 1.2 |
| Example 16 | N-21 | A3-22<br>A4-1 | 19<br>29 | B-2 | 12 | C-1 | 32 | E-2 | 8 | D-1<br>D-2 | 300<br>100 | 0.45 | 1.1 | 0 | 1.2 |
| Example 17 | N-22 | A5-28<br>A6-1 | 30<br>14 | B-1<br>B-3 | 10.5<br>10.5 | C-1 | 35 | — | — | D-1<br>D-2 | 250<br>150 | 0.48 | 1.4 | 1 | 1.6 |
| Example 18 | N-23 | A5-29<br>A6-6 | 32<br>15.5 | B-1<br>B-4 | 12<br>3.5 | C-1 | 37 | — | — | D-2<br>D-3 | 200<br>200 | 0.37 | 1.2 | 0 | 1.4 |
| Example 19 | N-24 | A5-30<br>A6-18 | 29.5<br>13.5 | B-2<br>B-5 | 13<br>5.5 | C-1 | 38.5 | — | — | D-2<br>D-3 | 300<br>100 | 0.53 | 1.5 | 1 | 1.5 |
| Example 20 | N-25 | A5-32<br>A6-23 | 30<br>16 | B-1<br>B-6 | 16<br>4 | C-1 | 34 | — | — | D-1<br>D-2 | 100<br>300 | 0.64 | 1.2 | 0 | 1.3 |
| Comparative example 6 | N-26 | A1-5<br>H-1 | 39<br>17 | B-1 | 16 | C-1 | 28 | — | — | D-1<br>D-2 | 200<br>200 | 0.35 | 6 | 8 | 6.4 |
| Comparative example 7 | N-27 | A1-5<br>A2-2 | 39<br>17 | B-1 | 16 | C-1 | 28 | — | — | D-1<br>D-2 | 200<br>200 | 1.21 | 5.8 | 14 | 7.5 |
| Comparative example 8 | N-28 | A3-6<br>H-3 | 20<br>29 | B-1 | 14 | C-1 | 32 | E-1 | 5 | D-2<br>D-3 | 250<br>150 | 1.53 | 5.6 | 25 | 25.3 |
| Comparative example 9 | N-29 | A5-7<br>A6-1 | 30<br>14 | B-4<br>B-3 | 10.5<br>10.5 | C-1 | 35 | — | — | D-2<br>D-3 | 250<br>150 | 0.44 | 6.9 | 19 | 6.5 |
| Comparative example 10 | N-30 | A5-10<br>H-4 | 32<br>15.5 | B-1<br>B-4 | 12<br>3.5 | C-1 | 37 | — | — | D-2<br>D-3 | 200<br>200 | 0.37 | 7.1 | 7 | 6.9 |
| Comparative example 11 | N-31 | H-5 | 11.7 | B-4 | 5.1 | C-2 | 50.7 | F-1<br>G-1<br>I-1 | 2.02<br>30.45<br>0.03 | D-3 | 900 | 0.2 | 8.3 | 12 | 5.4 |

As shown in Table 2, the samples in Examples 11 to 20 were excellent since they showed small increased numbers of coating defects with time with small rates of variability of the line width. On the other hand, the samples in Comparative Examples 6 to 11 showed remarkably increased number of coating defects with time with large rates of variability of the line width of the pattern, and were inferior to the samples in the examples.

Details of each component in Table 2 are shown below.

(A) Dye

The column of name in the example denotes the number of the compound of the organic solvent-soluble dye. Synthetic examples of a part of the dyes used are described hereinafter.

Dyes in Comparative Examples H-1 to H5:
  Dyes in Comparative Examples
  H-1: Valifast Yellow 1101
  H-2: C.I. Acid Red 249
  H-3: Valifast Blue 2620
  H-4: C.I. Acid Red 80
  H-5: Valifast Red 1360

(B) Photopolymerization Initiator
  B-1: IRGACURE OXE01 (trade name: manufactured by Ciba Specialty Chemicals, Inc., the initiator according to the invention)
  B-2: CGI-242 (trade name: manufactured by Ciba Specialty Chemicals, Inc., the initiator according to the invention)
  B-3: IRGACURE 369 (trade name: manufactured by Ciba Specialty Chemicals, Inc., α-aminoketone photopolymerization initiator)
  B-4: TAZ-107 (trade name: manufactured by Midori Chemical Co., trihalomethyl triazine photopolymerization initiator)
  B-5: IRGACURE 819 (trade name: manufactured by Ciba Specialty Chemicals, Inc., amylphosphine photopolymerization initiator)
  B-6: 2,2'-bis(2,4-dichlorophenyl)-4,4',5,5'-tetraphenyl-1,2'-biimidazole (biimidazole photopolymerization initiator)

(C) Radical Polymerizable Monomer
  C-1: a mixture of the above-described compound (M-2) of the radical polymerizable monomer and dipentaerythritol hexaacrylate (3:7)
  C-2: dipentaerythritol hexaacrylate (D) Organic Solvent
  D-1: cyclohexanone
  D-2: ethyl lactate
  D-3: propyleneglycol monomethylether acetate (PGMEA)
  D-4: propyleneglycol monomethylether
  D-5: ethyl 3-ethoxypropionate (E) Transition Metal Complex
  E-1: cobalt (II) acetylacetonate
  E-2: di-n-butyl dithiocarbamate nickel (II)

(F) Other Components
  Surfactant
    F-1: Fluorinated surfactant F-475 (trade name: manufactured by Dainippon Ink & Chemicals, Inc.
  Resin (Binder)
    G-1: benzyl methacrylate/methacrylic acid/2-hydroxyethyl methacrylate copolymer (7/2/1 in molar ratio), Mw=25,000, Mn/Mw=2.5
  Polymerization Inhibitor
    I-1: p-methoxyphenol —Synthetic Example—

An example of synthesis of dyes is described in detail below with reference to the synthesis of dye A4-1.

(Synthesis of Dye A4-1)

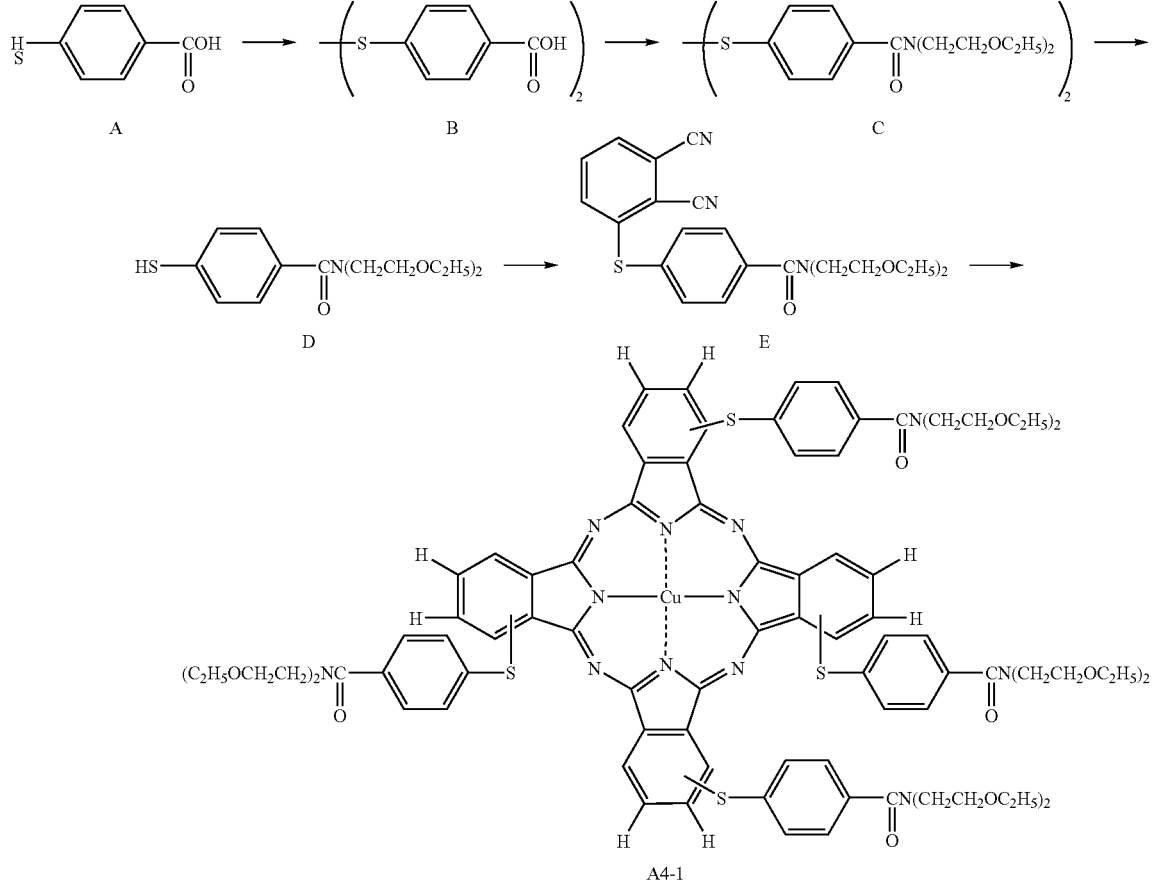

A4-1

<Synthesis of Intermediate Product B>

Compound A (25.0 g, 0.162 mole) was dissolved in a mixed solvent of methanol (100 mL) and triethylamine (23 mL), and the solution was cooled at 5° C. with stirring and 30% hydrogen peroxide (9 mL) was added dropwise to the solution while the inner temperature is maintained below 25° C. The reaction solution after the dropwise addition was further stirred at 25° C. for 30 minutes, and was cooled to 5° C. again for dripping conc. hydrochloric acid (15 mL) with stirring, followed by adding water (200 mL) with stirring at 25° C. for 1 hour. Precipitated crystals were filtered off, thoroughly washed with water and dried to obtain an intermediate product B (24.7 g, yield 99.5%) as white crystals.

<Synthesis of Intermediate Products C, D and E>

Toluene (100 mL) and dimethyl acetamide (0.25 mL) were added to the intermediate product B (17.5 g, 0.114 mole) obtained above, and thionyl chloride (25 mL) was added dropwise in 10 minutes with reflux. After continuing to reflux with heating for additional 1 hour, the reaction solution was concentrated in vacuum to obtain a viscous liquid. Dimethyl acetamide (10 mL) and acetonitrile (100 mL) were added to diethoxyethylamine (38.0 g, 0.235 mole) with stirring at 10° C., and the viscous liquid was added to the mixed solution in 15 minutes while the temperature is maintained below 15° C. After stirring the reaction solution for additional 30 minutes, the solution was poured into a mixed solvent of water (100 mL) and ethyl acetate (100 mL). The ethyl acetate phase was separated, and washed with water (100 mL) twice. The ethyl acetate phase was dried over anhydrous magnesium sulfate, and ethyl acetate was removed by distillation in vacuum to obtain intermediate compound C as a pale yellow viscous liquid.

Subsequently, water (50 mL), ethanol (200 mL) and zinc powder (12 g) were added to the intermediate compound C, and an aqueous solution of sulfonic acid (10 mL) in water (40 mL) was added dropwise to the solution in 20 minutes with reflux by heating. The reaction solution was cooled after heating for 30 minutes, and insoluble substances were filtered off. Saturated saline solution (50 mL) and ethyl acetate (100 mL) were added to the solution obtained, and the ethyl acetate phase was separated and washed with water (100 mL) twice. The ethyl acetate phase was dried over anhydrous magnesium sulfate, and ethyl acetate was removed by evaporation in vacuum to obtain intermediate product D as a pale yellow viscous liquid.

Dimethylacetamide (70 mL) and potassium carbonate (15 g, 0.108 mole) were added to intermediate product D with stirring in nitrogen atmosphere, and 3-nitrophthalonitrile (19.7 g, 0.113 mole) was slowly added to the solution with stirring at 20° C. while the temperature is maintained below 25° C. After stirring the solution for additional 30 minutes, water (300 mL) was poured into the solution with stirring. The crystal obtained was filtered off, and thoroughly washed with water. The crystal obtained was recrystallized from methanol (70 mL), the precipitated crystal was washed with cold methanol (30 ml) and dried to obtain intermediate E (35.0 g, yield 72.6%) as white crystals.

<Synthesis of Dye A4-1>

Butanol (150 mL), ammonium carbonate (6.7 g, 0.070 mole) and copper chloride (4.7 g, 0.035 mole) were added to intermediate compound E (34.4 g, 0.081 mole), and the mixture was heated for 7 hours with stirring. Butanol was removed by distillation in vacuum, and the remaining solid was purified by silica gel column chromatography to obtain a powder (25 g, yield 72.7%) of dye A4-1. The maximum absorption wavelength ($\lambda_{max}$) and molar absorbance coefficient $\epsilon$ of the dye obtained in ethyl acetate were $\lambda_{max}$: 706.8 nm and $\epsilon$: 55,600, respectively, as measured with a spectrophotometer (trade name: UV-2400 PC, manufactured by Shimadzu Co.).

<Synthesis of Dye A4-12>

Dye A4-12 was obtained by the same method as in the synthesis of dye A4-1, except that compound A was changed to compound A', diethoxyethylamine was changed to 1 methoxypropanol and 3-nitrophthalonitrile was changed to 4-nitrophthalonitrile.

Compound A'

<Synthesis of Dye A5-28>

Phthalic anhydride (29.6 g), 4-bromophthalic anhydride (22.2 g), pyridine-2,3-dicarboxylic acid (16.7 g), urea (144 g), cuprous chloride (9.9 g) and ammonium molybdate (1.6 g) were added to 1-chloronaphthalene (400 mL), and the suspension was stirred at 190 to 220° C. for 5 hours. The reaction mixture was poured into methanol (250 mL) and filtrated, the precipitate was sequentially washed with methanol, water and acetone, and dried to obtain blue bromo-substituted tetraazaporphyrin compound (31.3 g).

The bromo-substituted tetraazaporphyrin compound (13.1 g) was added to chlorosulfonic acid (100 g) in small portions for 30 minutes at a temperature of 20° C. or lower. The temperature was then increased to 70 to 80° C. and, after stirring at the same temperature for 1 hour, the temperature was increased to 140 to 145° C. in 2 hours. After the reaction for 4 hours at the same temperature, the reaction mixture was cooled to 80° C. Thionyl chloride (30 g) was added dropwise in 1 hour while the temperature is maintained at 70 to 80° C., the reaction solution was stirred for 4 hours at 70 to 80° C. The reaction mixture was cooled to 15 to 20° C., and stirred for additional 12 hours at the same temperature. The reaction mixture was discharged into ice water (1000 g) in small portions, and the precipitate was filtered off and washed with ice water until the filtrate becomes neutral to obtain a hydrated paste of sulfonyl chloride of the bromo-substituted tetraazaporphyrin compound. Ice water (400 g) was immediately poured into the product and, after dispersing with stirring at a temperature of 10° C. or less for 30 minutes, 2-amino-1-(2-ethoxyethoxy)butane (30 g) was added dropwise to the above-mentioned compound. Then, the temperature as increased to 20 to 30° C. and, after stirring for 18 hours at the same temperature, the product was filtered off. The product was dispersed in water (200 g) again and was filtered. After repeating dispersion and filtration twice, the product was dried at 60° C. for 16 hours to obtain a blue powder (18 g). The powder was recrystallized from ethyl acetate to obtain a blue crystal (10 g).

It was confirmed from X-ray fluorescence analysis of the blue crystal that the compound has an average of 1.9 sulfonamide groups and 1.2 bromine atoms per one molecule from the intensity ratios among copper as a central metal of the bromo-substituted tetraazaporphyrin frame, and sulfur atom in the sulfonamide group and bromine atom.

The blue crystal (5 g) obtained was separated and purified by silica gel column chromatography using a mixed solution of ethyl acetate/methanol to obtain a purified blue powder (1.5 g). It was confirmed from X-ray fluorescence analysis of the purified blue powder that the compound has an average of 2 sulfonamide groups and 1 bromine atoms per one molecule from the intensity ratios among copper as a central metal of the bromo-substituted tetraazaporphyrin frame, and sulfur atom in the sulfonamide group and bromine atom. The result of FD-MS analysis showed m/z of 1100.2, which indicates that the compound mainly comprises above-mentioned dye A5-28 having one introduced pyridine ring.

<Synthesis of Dye A5-29>

Phthalic anhydride (14.8 g), 4-bromophthalic anhydride (45.4 g), pyridine-2,3-dicarbonic acid (16.7 g), urea (144 g), cuprous chloride (9.9 g) and ammonium molybdate (1.6 g) were suspended in 1,3-dimethyl-2-imidazolidinone (400 mL), and the suspension was stirred at 190 to 220° C. for 5 hours. The reaction mixture was subjected to post-treatment as in the synthesis of A5-28 to obtain a bromo-substituted tetraazaporphyrin compound (41.1 g). Blue crystals (15.5 g) were obtained by sequentially applying chlorosulfonation, amidation and post-treatment as in the synthesis of A5-28.

It was confirmed from X-ray fluorescence analysis of the blue crystal that the compound has an average of 2.1 sulfonamide groups and 2.2 bromine atoms per one molecule from the intensity ratios among copper as a central metal of the bromo-substituted tetraazaporphyrin frame, and sulfur atom in the sulfonamide group and bromine atom.

The blue crystal (5 g) obtained was separated and purified by silica gel column chromatography using a mixed solution of ethyl acetate/methanol to obtain a purified blue powder (1.0 g). It was confirmed from X-ray fluorescence analysis of the purified blue powder that the compound has an average of 2 sulfonamide groups and 2 bromine atoms per one molecule from the intensity ratios among copper as a central metal of the bromo-substituted tetraazaporphyrin frame, and sulfur atom in the sulfonamide group and bromine atom. The result of FD-MS analysis showed m/z of 1178.1, which indicates that the compound mainly comprises above-mentioned dye A5-29 having one introduced pyridine ring.

<Synthesis of Dye A5-30>

4-bromophthalic anhydride (68.1 g), pyridine-2,3-dicarbonic acid (16.7 g), urea (144 g), cuprous chloride (9.9 g) and ammonium molybdate (1.6 g) were suspended in 1,3-dimethyl-2-imidazolidinone (400 mL), and the suspension was stirred at 190 to 220° C. for 5 hours. The reaction mixture was subjected to post-treatment as in the synthesis of A5-28 to obtain a bromo-substituted tetraazaporphyrin compound (25 g). Blue crystals (9.9 g) were obtained by sequentially applying chlorosulfonation, amidation and post-treatment as in the synthesis of A5-28.

The blue crystal obtained (5 g) was separated and purified by silica gel column chromatography to obtain a purified blue powder (3.0 g). It was confirmed from X-ray fluorescence analysis of the purified blue powder that the compound has an average of 2 sulfonamide groups and 3 bromine atoms per one molecule from the intensity ratios among copper as a central metal of the bromo-substituted tetraazaporphyrin frame, and sulfur atom in the sulfonamide group and bromine atom. The result of FD-MS analysis showed m/z of 1256.0, which indicates that the compound mainly comprises above-mentioned dye A5-30 having one introduced pyridine ring.

Other compounds may be synthesized by the same method by changing the compounds to desired compounds corresponding to the desired dye.

The dye-containing negative curable composition involves the following new problems, and further improvements are required. They are:

(1) the dye or complexes of the dye with other components are gradually precipitated after the preparation of the curable composition;

(2) since the dye has low solubility in aqueous alkaline solution, or the dye interacts by itself or often interacts with other components in the curable composition, there is little difference of solubility (developability) between the cured portion and non-cured portion to fail in obtaining a good pattern (deterioration of pattern shapes); or the pattern size is largely fluctuated by a slight difference of the exposure value (decrease of exposure latitude); and (3) a large amount of dyes should be added when the molar absorbance coefficient ($\epsilon$) of the dye is low so that the amounts of other components such as the polymerizable compound (monomer), binder and photopolymerization initiator are forced to be relatively decreased to consequently increase the exposure value required for forming the pattern (low sensitivity).

Since a thickness of 1.5 µm or less is required for forming the film using the curable composition for producing a color filter for the solid state image pickup element different from producing a film for a semiconductor, a large quantity of the pigment should be added in the curable composition. Therefore, the same problem as described above may be caused.

The problems of time-dependent stability after preparing the composition and variation of the pattern line width due to fluctuation of the exposure value could not be solved even by applying a technology for using organic solvent-soluble dyes. In particular, the above-mentioned problem is evident when a transition metal complex is added to the composition.

Since a thickness of 1.5 µm or less of the film is required for forming the color filter for the solid image pickup element different from the film for forming semiconductors, a large amount of the pigment should be added to the curable composition. The above-mentioned problems are more evident in this case.

According to the first aspect of the invention, it is provided that a dye-containing negative curable composition excellent in time dependent stability by reducing the amount of precipitation of insoluble substances after producing the composition while the composition is excellent in pattern forming ability with fewer fluctuation of line width of the pattern due to fluctuation of the exposure value; a color filter that is excellent in hue and resolution, and has favorable pattern shape and high productivity (high cost performance); and a method for producing the color filter.

According to the second aspect of the invention, it is provided a dye-containing negative curable composition excellent in time dependent stability by reducing the amount of precipitation of insoluble substances after producing the composition while the composition is excellent in pattern forming ability with fewer fluctuation of line width of the pattern due to fluctuation of the exposure value; a color filter that is excellent in chromatic valance and resolution, and has favorable pattern shape and high productivity (high cost performance); and a method for producing the color filter with filter with high productivity (high cost performance).

All publications, patent applications, and technical standards mentioned in this specification are herein incorporated by reference to the same extent as if each individual publication, patent application, or technical standard was specifically and individually indicated to be incorporated by reference.

What is claimed is:

1. A dye-containing negative curable composition comprising at least two dyes (A) independently selected from a heterocyclic azo compound, a phthalocyanine compound or an azomethine compound, at least one oxime photopolymerization initiator (B) and at least one radical polymerizable monomer (C); and wherein the at least two dyes (A) include a heterocyclic azo compound having an azo group directly linked to a heterocycle selected from the group consisting of furan, pyrrole, pyrazoline, imidazole, oxazole, pyran, pyridine, pyrimidine, pyrazine, triazine, pyridone, isothiazole, and benzoxazole; and at least one of the dyes comprises an acid group.

2. The dye-containing negative curable composition according to claim 1, wherein at least two of the dyes comprise acid groups.

3. The dye-containing negative curable composition according to claim 1, wherein the mass ratio (B'/C') of the total amount (B') of the photopolymerization initiator containing the oxime photopolymerization initiator (B) to the total amount (C') of the radical polymerizable monomer (C) is in the range from 0.25 to 0.75.

4. The dye-containing negative curable composition according to claim 1, wherein the content of the oxime photopolymerization initiator (B) is 9% by mass or more relative to the total solids in the dye-containing negative curable composition.

5. The dye-containing negative curable composition according to claim 1 further comprising an organic solvent (D).

6. A color filter formed using the dye-containing negative curable composition according to claim 1.

7. A method for producing a color filter comprising: applying the dye-containing negative curable composition according to claim 1 onto a substrate; then forming a pattern by exposing the applied composition through a mask and developing.

8. The dye-containing negative curable composition according to claim 1, wherein the heterocycle is pyridone, pyridine or pyrimidine.

9. A dye-containing negative curable composition comprising at least two organic solvent-soluble dyes (A) independently selected from heterocyclic azo compounds, phthalocyanine compounds or azomethine compounds, at least one oxime photopolymerization initiator (B), at least one radical polymerizable monomer (C) and at least one organic solvent (D), wherein the moisture content of the composition is less than 1% by mass relative to the total amount of the composition; and wherein the at least two dyes (A) include a heterocyclic azo compound having an azo group directly linked to a heterocycle selected from the group consisting of furan, pyrrole, pyrazoline, imidazole, oxazole, pyran, pyridine, pyrimidine, pyrazine, triazine, pyridone, isothiazole, and benzoxazole; and at least one of the organic solvent-soluble dyes contains an acid group.

10. The dye-containing negative curable composition according to claim 9, wherein at least two of the organic solvent-soluble dyes contain acid groups.

11. The dye-containing negative curable composition according to claim 9, wherein the mass ratio (B'/C') of the total amount (B') of the photopolymerization initiator containing the oxime photopolymerization initiator (B) to the total amount (C') of the radical polymerizable monomer (C) is in the range from 0.25 to 0.75.

12. The dye-containing negative curable composition according to claim 9, wherein the content of the oxime photopolymerization initiator (B) is 9% by mass or more relative to the total solids in the dye-containing negative curable composition.

13. The dye-containing negative curable composition according to claim 9 further comprising other photopolymerization initiators other than the oxime photopolymerization initiator (B).

14. A color filter formed using the dye-containing negative curable composition according to claim 9.

15. A method for producing a color filter comprising: applying the dye-containing negative curable composition according to claim 9 onto a substrate; forming a pattern by exposing the applied substrate through a mask and developing.

16. The dye-containing negative curable composition according to claim 9, wherein the heterocycle is pyridone, pyridine or pyrimidine.

17. The dye-containing negative curable composition according to claim 9, wherein the heterocyclic azo compound is a pyridone azo compound represented by the following formula (A):

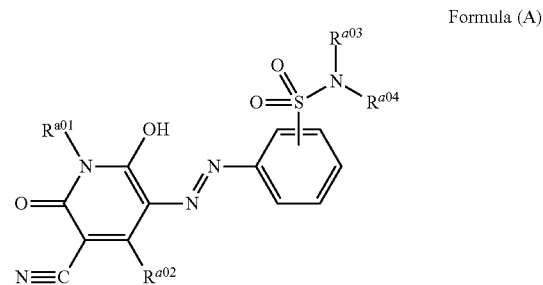

Formula (A)

wherein $R^{a01}$, $R^{a03}$ and $R^{a04}$ each independently represents a hydrogen atom, an alkyl group having 1 to 21 carbon atoms, an alkenyl group having 2 to 21 carbon atoms, an aryl group having 6 to 21 carbon atoms, an aralkyl group having 7 to 21 carbon atoms or a substituent having a hetero atom; at least one of $R^{a01}$, $R^{a03}$ and $R^{a04}$ is a substituent having a hetero atom; $R^{a03}$ and $R^{a04}$ may form a heterocyclic ring in combination with a nitrogen atom linked thereto; $R^{a02}$ represents an alkyl group having 1 to 10 carbon atoms, a methoxymethyl group or a trifluoromethyl group.

* * * * *